United States Patent
Cooper et al.

(10) Patent No.: US 12,417,136 B2
(45) Date of Patent: *Sep. 16, 2025

(54) SYSTEM AND METHOD FOR ADAPTIVE PROTOCOL CACHING IN EVENT-DRIVEN DATA COMMUNICATION NETWORKS

(71) Applicant: AtomBeam Technologies Inc., Moraga, CA (US)

(72) Inventors: Joshua Cooper, Columbia, SC (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/044,355

(22) Filed: Feb. 3, 2025

(65) Prior Publication Data
US 2025/0181432 A1    Jun. 5, 2025

Related U.S. Application Data

(63) Continuation-in-part of application No. 18/827,741, filed on Sep. 7, 2024, now Pat. No. 12,218,697, which is a continuation-in-part of application No. 18/644,019, filed on Apr. 23, 2024, now Pat. No. 12,136,934, which is a continuation-in-part of application No. 18/501,987, filed on Nov. 4, 2023, now Pat. No. 11,967,974, which is a
(Continued)

(51) Int. Cl.
*H03M 7/00* (2006.01)
*G06F 9/54* (2006.01)
*G06F 12/0891* (2016.01)

(52) U.S. Cl.
CPC .......... *G06F 9/547* (2013.01); *G06F 12/0891* (2013.01)

(58) Field of Classification Search
CPC ... H03M 7/3059; H03M 7/6005; G06N 20/00
USPC ..................................... 341/50, 51
See application file for complete search history.

(56) References Cited

U.S. PATENT DOCUMENTS 6,885,749 B1    4/2005  Chang et al.
7,103,538 B1    9/2006  Gao
(Continued)

*Primary Examiner* — Jean B Jeanglaude
(74) *Attorney, Agent, or Firm* — Galvin Patent Law LLC; Brian R Galvin

(57) ABSTRACT

A system for adaptively caching network communication protocols provides improved efficiency and performance through a multi-level cache architecture. The system monitors performance metrics and synchronizes cache contents across distributed nodes using a hierarchical structure. Protocol cache requirements are predicted based on usage patterns, enabling proactive cache management. The system compresses cached protocols using existing codebooks to optimize storage and transmission efficiency. Integration with event-driven data communication systems enables seamless protocol selection and translation. The caching system works in conjunction with transaction managers and protocol predictors to enhance network communication performance. The system maintains cache coherency across local, regional, and global cache levels while minimizing network overhead and optimizing protocol availability. By predicting and pre-caching likely needed protocols, the system reduces protocol negotiation latency and improves overall network communication efficiency.

18 Claims, 76 Drawing Sheets

Related U.S. Application Data continuation-in-part of application No. 18/190,044, filed on Mar. 24, 2023, now Pat. No. 11,831,343.

(56) References Cited

U.S. PATENT DOCUMENTS

| | | |
|---|---|---|
| 7,519,228 B2 | 4/2009 | Cho et al. |
| 7,629,922 B2 | 12/2009 | Winstead et al. |
| 8,291,097 B2 | 10/2012 | Feingold et al. |
| 8,401,104 B2 | 3/2013 | Clerckx et al. |
| 8,533,456 B2 | 9/2013 | Kholidy |
| 8,677,226 B2 | 3/2014 | Pons et al. |
| 8,688,627 B2 | 4/2014 | Arthursson |
| 8,934,630 B2 | 1/2015 | Hazay et al. |
| 9,071,623 B2 | 6/2015 | Arthursson et al. |
| 9,167,259 B1 | 10/2015 | Eshet et al. |
| 9,503,434 B2 | 11/2016 | Yeh et al. |
| 9,742,557 B2 | 8/2017 | Hazay et al. |
| 10,037,306 B2 | 7/2018 | Lin et al. |
| 10,095,635 B2 | 10/2018 | Abbas et al. |
| 10,264,262 B2 | 4/2019 | Swaminathan et al. |
| 10,317,221 B2 | 6/2019 | Ikeda |
| 10,329,410 B2 | 6/2019 | Vange et al. |
| 10,346,043 B2 | 7/2019 | Golden et al. |
| 10,373,458 B2 | 8/2019 | Selinger et al. |
| 10,785,545 B2 | 9/2020 | Metzler et al. |
| 11,057,634 B2 | 7/2021 | Schroers et al. |
| 11,128,935 B2 | 9/2021 | Li |
| 11,451,242 B2 | 9/2022 | Choi et al. |
| 11,561,797 B2 | 1/2023 | Patel |
| 2014/0169444 A1* | 6/2014 | Ottaviano ............. H04N 19/63 375/240.01 |
| 2017/0347100 A1* | 11/2017 | Chou ................. H03M 7/3059 |
| 2018/0196609 A1 | 7/2018 | Niesen |
| 2023/0127149 A1 | 4/2023 | Ezrielev et al. |

\* cited by examiner

SYSTEM AND METHOD FOR ADAPTIVE PROTOCOL CACHING IN EVENT-DRIVEN DATA COMMUNICATION NETWORKS

CROSS-REFERENCE TO RELATED APPLICATIONS

Priority is claimed in the application data sheet to the following patents or patent applications, each of which is expressly incorporated herein by reference in its entirety:
Ser. No. 18/827,741
Ser. No. 18/644,019
Ser. No. 18/501,987

BACKGROUND OF THE INVENTION

Field of the Art

The present invention is in the field of network protocol optimization, and in particular the usage of adaptive caching combined with data encoding for enhanced communication efficiency and protocol management.

Discussion of the State of the Art

As network complexity continues to grow, particularly with the proliferation of diverse devices and protocols, efficient protocol management has become increasingly critical. Modern networks must handle communications between legacy systems, current technologies, and emerging protocols simultaneously. This diversity creates significant overhead in protocol negotiation and translation, impacting network performance and reliability.

Traditional approaches to protocol management rely heavily on real-time negotiation and translation, requiring substantial computational resources and introducing latency into network communications. While protocol prediction and translation systems have improved efficiency, they still face challenges with response time and resource utilization when handling large numbers of protocol interactions.

Transmission bandwidth remains a critical bottleneck, particularly in large-scale deployments. Current protocol negotiation methods often require multiple round-trips and repeated translations, consuming valuable network resources. This is especially problematic in environments with billions of connected devices, where even small inefficiencies in protocol handling can create significant performance impacts.

While existing systems for protocol encoding and translation provide important capabilities, they lack efficient mechanisms for caching and reusing frequently accessed protocols and translations. The ability to intelligently cache and predict protocol requirements could significantly reduce negotiation overhead and improve system performance.

What is needed is a system and method for adaptive protocol caching that works in conjunction with event-driven data transmission and protocol translation systems.

SUMMARY OF THE INVENTION

The inventor has developed a system and method for adaptive protocol caching in distributed network environments. The system implements a multi-level cache structure that maintains protocol information across local, regional, and global cache levels. The system actively monitors performance metrics and synchronizes cache contents across distributed nodes using a hierarchical organization. The system predicts protocol cache requirements by analyzing usage patterns and proactively manages cache contents. Cached protocols are compressed using existing codebooks to optimize storage efficiency. The system seamlessly integrates with event-driven data communication systems for protocol selection and translation, enhancing overall network performance. This comprehensive approach enables efficient protocol caching and management while maintaining compatibility with existing protocol prediction and translation systems.

According to a preferred embodiment, a system and method for adaptive protocol caching, comprising: a computing device comprising at least a memory and a processor; wherein a plurality of programming instructions stored in the memory and operating on the processor cause the computing device to: maintain a multi-level protocol cache structure; monitor cache performance metrics; synchronize cache contents across distributed nodes using a hierarchical structure; predict protocol cache requirements based on usage patterns; compress cached protocols using existing codebooks; and integrate with event-driven data communication systems for protocol selection and translation, is disclosed.

According to another aspect, the multi-level protocol cache structure comprises a local cache level for immediate access, a regional cache level for commonly shared protocols within a geographic or network region, and a global cache level that maintains consistency across the entire network.

According to another aspect, performance monitoring includes tracking cache hit rates to measure efficiency and measuring protocol negotiation latency to optimize response times. The system uses these metrics to continuously adjust caching strategies and improve overall performance.

According to another aspect, cache synchronization is implemented using a Merkle tree structure that enables efficient verification and updating of cache contents across the distributed network, ensuring consistency while minimizing data transfer requirements.

According to another aspect, protocol cache requirement prediction utilizes sophisticated analysis of historical usage patterns combined with real-time evaluation of current network conditions, enabling proactive cache management and optimization.

According to another aspect, protocol compression leverages existing codebook entries while implementing delta compression between similar protocols, significantly reducing storage requirements while maintaining rapid access capabilities.

According to another aspect, integration with event-driven data communication systems is achieved through direct interfaces with transaction managers and protocol predictors, ensuring seamless operation with existing network infrastructure.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION OF THE INVENTION

Figure 1:
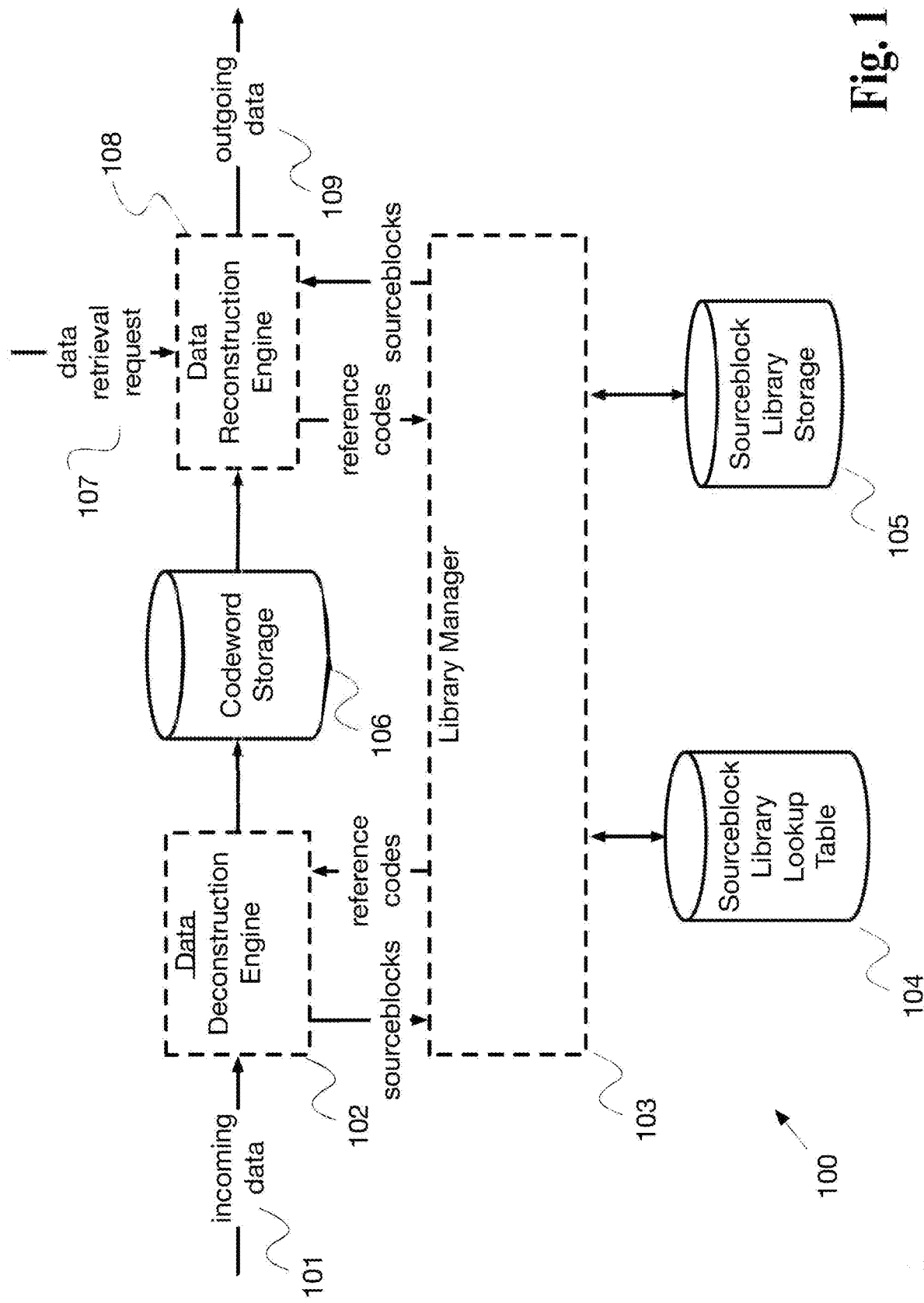
FIG. 1 is a diagram showing an embodiment of the system in which all components of the system are operated locally.

The inventor has conceived, and reduced to practice, a system and method for adaptive protocol caching in distributed network environments that utilizes a multi-level cache structure to optimize protocol storage and retrieval across network nodes. The system employs sophisticated monitoring and synchronization mechanisms to maintain cache coherency while predicting and pre-fetching protocols based on usage patterns. The cache contents are compressed using existing codebooks and seamlessly integrated with event-driven data communication systems for efficient protocol selection and translation.

The ability to cache and efficiently manage protocols across distributed nodes offers several significant advantages in modern network environments. By maintaining frequently used protocols in a multi-level cache structure, the system significantly reduces protocol negotiation latency, as local caches provide immediate access to commonly used protocols while regional and global cache levels ensure broader protocol availability without sacrificing performance. This hierarchical structure optimizes resource utilization across the network, allowing local nodes to maintain only their most relevant protocols while less frequently used protocols are stored at regional or global levels, reducing redundant storage while maintaining accessibility.

Through continuous monitoring of usage patterns and network conditions, the system predicts which protocols will be needed and pre-caches them at appropriate levels. This proactive approach minimizes negotiation overhead and improves response times. The system's integration with existing transaction managers and protocol predictors ensures seamless operation within established network infrastructures while adding sophisticated caching capabilities that enhance overall system performance.

In an embodiment, the cache manager forms the core of the adaptive protocol caching system by implementing a sophisticated entry structure that maintains detailed information about each cached protocol. Cache entries may contain protocol descriptors, performance metrics, and usage statistics that enable intelligent cache management decisions. The system tracks metrics such as success rates, negotiation latency, and bandwidth utilization for each cached protocol, allowing for data-driven optimization of cache contents.

The eviction algorithm employs a multi-factor scoring system that considers weighted criteria when determining which protocols to maintain in cache. Success rates, access frequency, age, resource costs, and network context all factor into eviction decisions. This approach ensures that the most valuable protocols remain readily available while less useful entries are removed to optimize cache utilization.

The system implements cache compression using existing codebooks, leveraging the same encoding mechanisms used for protocol transmission to reduce cache storage requirements. In some implementations, delta compression between similar protocols further optimizes storage efficiency by maintaining only the differences between related protocol versions. This compression approach significantly reduces the memory footprint while maintaining rapid access capabilities.

Cache synchronization across distributed nodes may utilize a Merkle tree implementation that enables efficient verification and updating of cache contents. This hierarchical structure allows nodes to quickly determine which portions of their cache require updates and minimize data transfer requirements during synchronization operations. The system employs differential updates to propagate changes efficiently, transmitting only modified portions of cache entries rather than complete protocol definitions.

The cache system integrates with existing transaction managers and protocol predictors, enhancing their capabilities through intelligent protocol caching. When a transaction manager requires a specific protocol, the cache system can often provide it immediately from local cache, eliminating the need for protocol negotiation. In cases where a protocol is not cached locally, the system transparently retrieves it from regional or global cache levels while simultaneously using this access pattern to inform future caching decisions.

The performance monitoring system continuously tracks key metrics across the cache hierarchy to enable data-driven optimization of the caching system. A performance monitor may collect data on cache hit rates, protocol negotiation latency, bandwidth utilization, and resource consumption across local, regional, and global cache levels. This comprehensive monitoring enables the system to identify performance bottlenecks and optimization opportunities in real-time.

In an embodiment, the monitoring system analyzes both cached protocol performance and cache system efficiency. Success rate tracking evaluates how frequently cached protocols are successfully used in negotiations, while cache hit analysis determines the effectiveness of protocol prediction and pre-fetching strategies. The system aggregates this performance data to generate insights that drive cache optimization decisions.

The pre-fetch predictor works in conjunction with the performance monitoring system to anticipate protocol requirements before they are needed. By analyzing historical usage patterns and current network conditions, the predictor identifies protocols that are likely to be required in the near future. These predictions inform cache warming operations, where predicted protocols are pre-loaded into appropriate cache levels to minimize future negotiation latency.

Integration with the base system's ML/AI engine enhances the prediction capabilities by incorporating sophisticated pattern recognition and machine learning techniques. The predictor continuously refines its models based on actual usage patterns and prediction success rates, improving accuracy over time. This learning system adapts to changing network conditions and evolving protocol usage patterns to maintain optimal cache performance.

The cache synchronization framework ensures consistency across the distributed cache hierarchy while minimizing network overhead. Regional cache clusters aggregate and manage protocol caches for geographically or logically grouped nodes, while the global cache coordinator maintains overall system consistency. This hierarchical approach balances the need for cache coherency with the practical constraints of distributed systems.

The cache compression system leverages the existing codebook infrastructure to minimize the storage footprint of cached protocols while maintaining rapid access capabilities. Through integration with the codebook generator, the system creates optimized protocol appendices that enable efficient storage and retrieval of cached protocol data. The compression system dynamically adjusts its strategy based on protocol characteristics, cache level requirements, and available system resources.

When compressing cached protocols, the system considers both storage efficiency and retrieval speed requirements. Local cache entries may maintain full protocol definitions for immediate access, while regional and global caches can utilize more aggressive compression strategies. In some implementations, the system employs delta compression between protocol versions, storing only the differences between related protocols rather than complete duplicate entries.

The error handling system provides robust recovery mechanisms to maintain cache system reliability. Through continuous monitoring of cache operations, the system can detect and respond to various failure scenarios including cache corruption, synchronization failures, and resource exhaustion. Recovery procedures may include automatic cache rebuilding, incremental synchronization, and failover to redundant cache systems.

Health monitoring components proactively identify potential issues before they impact system performance. The system tracks cache coherency metrics, monitors resource utilization trends, and validates cached protocol integrity. When potential issues are detected, the system can initiate preventive measures such as cache rebalancing, protocol revalidation, or resource reallocation to maintain optimal operation.

The entire caching system maintains close integration with the existing transaction managers and protocol prediction framework. This integration enables seamless operation where cached protocols transparently enhance system performance without requiring modifications to existing applications or services. The system's modular design allows for flexible deployment across various network architectures while maintaining consistent performance optimization capabilities.

The system architecture enables flexible deployment across various network environments through a modular design approach. A central system communication bus facilitates interaction between major components including the cache management system, synchronization system, performance monitoring system, and pre-fetch prediction system. This architecture allows components to be distributed across network nodes while maintaining efficient communication and coordination.

In an embodiment, the system configuration manager provides centralized control over cache system behavior, allowing administrators to tune performance parameters and optimization strategies. The security gateway ensures that cache operations comply with network security policies while protecting cached protocol data from unauthorized access or modification. These management components integrate with existing network management systems to provide comprehensive control over the caching infrastructure.

Integration with base system components occurs through the integration controller, which manages interactions with enhanced transaction managers, protocol prediction modules, and protocol translation modules. When a transaction manager requests a protocol, the integration controller coordinates with the cache management system to either provide a cached protocol or initiate protocol negotiation through existing mechanisms. This seamless integration enhances system performance while maintaining compatibility with existing protocol management functions.

The external network interface facilitates communication between distributed cache system components and enables integration with external protocol repositories and management systems. Through this interface, the cache system can participate in broader protocol management ecosystems while maintaining local optimization capabilities. The interface supports various network protocols and security mechanisms to ensure secure and efficient communication across diverse network environments.

The system's data flow comprises several key operational sequences that enable efficient protocol caching and retrieval. In one embodiment, during cache operations, three primary flows govern system behavior, namely cache lookup, cache update, and cache synchronization.

In an embodiment, cache lookup flow begins when a transaction manager requires a protocol for communication. The system may first check the local cache level for the requested protocol. When a protocol is found, it can be immediately returned to the transaction manager. In cases where the protocol is not found in local cache, the system may concurrently initiate a regional cache lookup while preparing for potential protocol negotiation. When the protocol exists in regional cache, it may be retrieved and cached locally before being returned to the transaction manager. The system can record cache hit/miss data during this process to inform future prediction and pre-fetching decisions.

According to one embodiment, cache update flow is triggered when new or modified protocols are identified. When a transaction manager successfully negotiates a new protocol version, the system may first validate it against existing cache entries. The system can then update local cache entries while simultaneously preparing update notifications for regional and global cache levels. In some implementations, delta compression may be applied to minimize storage requirements, particularly when storing multiple versions of similar protocols. The system may maintain consistency through a two-phase commit process that ensures all cache levels are properly updated before confirming the change.

In another embodiment, cache synchronization flow maintains consistency across distributed cache nodes through a hierarchical Merkle tree structure. Each node may periodically generate hashes of its cache contents, which can be compared against peer nodes to identify inconsistencies. In cases where differences are detected, the system may initiate targeted synchronization operations that transfer only the necessary delta updates. This approach can minimize network overhead while ensuring cache coherency across the distributed system.

According to various embodiments, protocol selection flow implements a cache-first strategy that reduces protocol negotiation overhead. When a protocol is requested, the system may first attempt to serve it from cache before falling back to the base protocol prediction system. The process may include initial cache lookup across local and regional levels, followed by success or failure notification to performance monitoring. The system can evaluate pre-fetch triggers based on access patterns, potentially falling back to protocol prediction in the event of a cache miss, and feeding results back to update cache contents and prediction models.

According to an embodiment, implementation considerations for the adaptive protocol caching system address several key operational aspects. The system may employ multiple fault tolerance mechanisms to ensure reliable operation in distributed environments. For example, when a cache node becomes unresponsive, the system can automatically redirect requests to alternate cache levels while initiating recovery procedures. The system may maintain redundant copies of frequently accessed protocols across different cache levels, enabling continuous operation even during partial system failures.

In one embodiment, security implications are addressed through a comprehensive access control framework. The system can encrypt cached protocol data using existing codebook mechanisms, providing an additional layer of protection beyond standard network security measures. Access to cached protocols may be controlled through configurable policies that define which transaction managers and network nodes can retrieve specific protocol entries. The system may also maintain detailed audit logs of all cache access operations, enabling security monitoring and compliance verification.

According to various embodiments, performance optimization involves dynamic adjustment of cache parameters based on observed system behavior. The system may analyze protocol usage patterns to optimize cache level distribution, potentially moving frequently accessed protocols to local caches while less common protocols are stored at regional or global levels. Cache compression ratios can be dynamically adjusted based on available system resources and access latency requirements. In some implementations, the system may predict and pre-cache protocols based on historical usage patterns and current network conditions.

In an embodiment, integration with the enhanced transaction manager involves sophisticated coordination between cache operations and protocol negotiation processes. When a transaction manager initiates a protocol request, the cache system may intercept this request and attempt to serve it from cached entries before engaging in full protocol negotiation. The system can track the success rates of cached protocol usage and adjust caching strategies accordingly. Transaction managers may provide feedback about protocol utilization patterns, enabling the cache system to optimize its contents for anticipated future requests.

The protocol prediction module may interact with the cache system through a bidirectional feedback mechanism. In one implementation, cache hit and miss patterns can inform the prediction algorithms, improving their accuracy over time. The prediction module may trigger pre-fetching operations when it anticipates future protocol requirements, allowing the cache system to prepare for expected demands. This integration enables sophisticated protocol management that combines historical usage data with predictive analytics to optimize cache performance.

In another embodiment, the protocol translation module interfaces with the cache system to store and retrieve common translation patterns. The system may cache frequently used protocol translations, reducing the computational overhead of repeated translation operations. When a new translation is performed, the cache system can analyze its characteristics to determine whether it should be stored for future use. The translation module may provide feedback about translation success rates, enabling the cache system to identify and retain the most valuable translation patterns while allowing less useful entries to be evicted.

According to one implementation, integration with the codebook generator enables efficient compression of cached protocol data. The cache system may utilize existing codebooks to compress protocol entries before storage, significantly reducing memory requirements while maintaining rapid access capabilities. In some cases, the system can generate specialized protocol appendices specifically optimized for cache storage requirements. The codebook generator may analyze cache access patterns to optimize compression strategies for different cache levels, potentially using more aggressive compression for rarely accessed protocols while maintaining faster access to frequently used entries.

In an embodiment, the ML/AI engine provides sophisticated learning capabilities that enhance cache operation. The system may utilize machine learning algorithms to identify complex usage patterns that inform cache management decisions. The ML/AI engine can process historical cache performance data to generate predictive models that guide pre-fetching operations. According to some implementations, the system may dynamically adjust cache parameters based on ML/AI insights, such as modifying eviction policies or adjusting compression ratios to optimize overall system performance.

Cache consistency maintenance may be achieved through a hierarchical synchronization protocol. The system can employ vector clocks to track update sequences across distributed cache nodes, ensuring proper ordering of cache modifications. When consistency conflicts are detected, the system may apply resolution policies that consider factors such as timestamp ordering, node priority, and protocol version information. In some implementations, the system can maintain temporary version histories to facilitate conflict resolution while minimizing impact on cache performance.

According to another embodiment, resource management involves dynamic allocation based on observed system behavior. The cache system may monitor resource utilization across different cache levels and adjust allocation accordingly. When memory pressure is detected, the system can initiate selective compression or eviction operations to maintain optimal performance. The system may implement adaptive throttling of cache operations to prevent resource exhaustion while ensuring critical protocols remain readily available.

In an embodiment, monitoring and maintenance functions are conducted continuously during system operation. The system may track key performance metrics including cache hit rates, access latency, and resource utilization across all cache levels. Performance data can be aggregated and analyzed to identify potential optimization opportunities or emerging bottlenecks. According to some implementations, the system may generate alerts when performance metrics deviate significantly from expected ranges, enabling proactive intervention before issues impact overall system operation.

According to one embodiment, protocol lifecycle management encompasses several automated processes. The system can track protocol usage patterns to determine optimal cache retention policies. When protocols approach their configured time-to-live limits, the system may evaluate recent usage patterns to decide whether to extend retention or allow eviction. In some cases, the system can maintain partial protocol entries when full protocol definitions are not required, reducing storage overhead while preserving essential functionality.

Network bandwidth optimization may be achieved through sophisticated transfer scheduling. The system can batch multiple cache updates together when synchronizing across distributed nodes, reducing protocol overhead.

According to some implementations, the system may prioritize cache synchronization traffic based on protocol importance and current network conditions. Delta encoding techniques can be employed to minimize the amount of data transferred during cache updates, with the system maintaining efficient delta chains between protocol versions.

In another embodiment, emergency operation procedures ensure continued functionality during adverse conditions. The system may implement graduated degradation policies that progressively reduce cache functionality while maintaining essential operations. When resource constraints are detected, the system can temporarily disable non-critical features such as pre-fetching or aggressive compression. According to some implementations, the system may maintain an emergency protocol set that remains cached even under extreme resource pressure, ensuring critical communication capabilities are preserved.

Access control and security management may be implemented through multiple complementary mechanisms. The system can enforce role-based access controls that restrict cache operations based on node identity and authorization level. Cached protocol data may be protected through encryption mechanisms that leverage existing codebook structures. In some embodiments, the system can maintain detailed audit trails of cache access patterns, enabling security analysis and compliance verification.

In an embodiment, protocol version management incorporates sophisticated handling of multiple protocol variants. The system may maintain relationships between different versions of the same base protocol, enabling efficient storage and retrieval of protocol families. When protocol updates occur, the system can evaluate the changes to determine optimal storage strategies, potentially maintaining delta-encoded differences rather than complete protocol copies. According to some implementations, the system may track compatibility relationships between protocol versions to ensure appropriate protocol selection during cache hits.

Recovery operations may be implemented through a multi-phase approach during system failures. The system can initiate automatic recovery procedures when cache inconsistencies or corruption are detected. According to one embodiment, the recovery process may begin with local cache validation, proceeding through regional cache synchronization, and culminating in global cache coherency verification. The system can maintain recovery checkpoints that enable rapid restoration of cache state while minimizing data loss during failure scenarios.

In another embodiment, adaptive load balancing functions distribute cache operations across available system resources. The system may monitor load patterns across cache nodes and adjust distribution of cached protocols accordingly. When load imbalances are detected, the system can initiate protocol migration operations to equalize resource utilization. According to some implementations, the system may maintain dynamic routing tables that direct cache requests to optimal cache nodes based on current load conditions and network status.

Protocol popularity tracking may influence cache management decisions throughout the system. The system can maintain weighted access counters that reflect both historical and recent protocol usage patterns. According to one embodiment, popularity metrics may decay over time, ensuring cache decisions reflect current system requirements rather than historical patterns. The system may adjust protocol placement across cache levels based on evolving popularity measurements, promoting frequently accessed protocols to faster cache tiers while demoting less popular entries.

Cache warmup operations may be conducted during system initialization and recovery scenarios. The system can utilize historical access patterns to identify essential protocols for initial cache population. According to some implementations, the warmup process may proceed in phases, prioritizing critical protocols before loading lower-priority cache entries. The system may coordinate warmup operations across distributed nodes to prevent network congestion while ensuring rapid restoration of cache functionality.

Protocol prediction refinement may incorporate feedback from multiple system components. The system can track prediction accuracy across different operational contexts, enabling continuous improvement of prediction models. According to one embodiment, the prediction subsystem may adjust its weighting factors based on observed cache hit patterns and protocol usage trends. When prediction accuracy falls below configured thresholds, the system may initiate retraining operations to incorporate recent operational data.

In an embodiment, bandwidth management functions adapt to varying network conditions. The system can monitor available network capacity and adjust synchronization operations accordingly. During periods of network congestion, the system may prioritize essential cache updates while deferring lower-priority synchronization operations. According to some implementations, the system can compress cache synchronization traffic using protocol-specific optimizations that leverage known data patterns.

Cache entry validation may occur through an ongoing verification process. The system can periodically verify the integrity of cached protocols using cryptographic checksums. According to one embodiment, validation frequency may vary based on protocol criticality and usage patterns. When validation failures are detected, the system may initiate automatic repair operations that restore protocol integrity through synchronization with verified cache copies.

In another embodiment, performance optimization includes dynamic adjustment of cache parameters. The system may modify cache sizes, retention policies, and compression settings based on observed performance metrics. According to some implementations, the system can maintain separate optimization policies for different cache levels, reflecting their distinct operational requirements. The system may implement A/B testing of cache configurations to identify optimal parameters for specific operational contexts.

Resource allocation management may adapt to changing system demands. The system can monitor resource utilization across compute, memory, and network dimensions. According to one embodiment, the system may implement resource reservation mechanisms that ensure critical cache operations maintain access to required resources. When resource constraints are detected, the system can initiate graceful degradation procedures that preserve essential functionality while reducing resource consumption.

Protocol appendix management may involve dynamic updates based on operational requirements. The system can evaluate protocol appendix effectiveness through ongoing monitoring of compression ratios and access patterns. According to one embodiment, the system may generate specialized appendices optimized for different cache levels or operational contexts. When appendix performance metrics indicate suboptimal operation, the system may trigger regeneration processes that incorporate recent protocol characteristics.

In an embodiment, cache coherency maintenance extends beyond basic synchronization operations. The system can implement vector clock mechanisms that track update sequences across distributed cache nodes. According to some implementations, the system may maintain temporary version histories to facilitate conflict resolution during concurrent updates. When coherency violations are detected, the system may initiate targeted repair operations that minimize impact on cache availability.

Transaction coordination may incorporate sophisticated state management functions. The system can track protocol negotiation states across multiple cache levels to ensure consistent operation. According to one embodiment, the system may maintain transaction logs that enable recovery from partial completion scenarios. When transaction anomalies are detected, the system may initiate rollback procedures that restore cache consistency while preserving operational continuity.

In another embodiment, protocol translation caching involves analysis of translation patterns and effectiveness. The system can track translation success rates to identify candidates for cached translation rules. According to some implementations, the system may maintain translation hint caches that accelerate common protocol conversions. When translation patterns change significantly, the system may adjust its caching strategy to reflect new operational requirements.

Cache optimization operations may incorporate machine learning insights from multiple sources. The system can analyze patterns across protocol usage, network conditions, and resource utilization to inform caching decisions. According to one embodiment, the system may maintain separate optimization models for different operational contexts or network regions. When significant pattern changes are detected, the system may trigger model retraining operations that incorporate recent operational data.

Security auditing mechanisms may be integrated throughout cache operations. The system can maintain detailed audit trails of cache access patterns, protocol modifications, and synchronization operations. According to one embodiment, audit data may be stored in a compressed format using existing codebook mechanisms. When security anomalies are detected, the system may trigger automated investigation procedures while maintaining operational continuity.

In an embodiment, fault isolation procedures protect system integrity during component failures. The system can implement containment boundaries that prevent fault propagation across cache levels. According to some implementations, the system may maintain separate operational states for different cache regions, enabling partial system operation during localized failures. When faults are detected, the system may initiate isolation procedures that preserve critical functionality while containing the impact of failures.

Cache eviction policy refinement may incorporate multiple operational factors. The system can evaluate protocol importance based on usage patterns, resource costs, and system requirements. According to one embodiment, the system may maintain separate eviction policies for different cache levels or operational contexts. When eviction decisions prove suboptimal, the system may adjust its policy parameters to improve future decision quality.

In another embodiment, diagnostic capabilities enable detailed system analysis. The system can capture operational metrics across multiple dimensions including cache performance, resource utilization, and network behavior. According to some implementations, the system may maintain diagnostic histories that facilitate trend analysis and problem investigation. When operational anomalies are detected, the system may initiate automated diagnostic procedures to identify root causes.

Protocol dependency management may ensure consistent cache operation across related protocols. The system can track interdependencies between cached protocols to maintain operational integrity. According to one embodiment, the system may evaluate dependency relationships during cache operations to prevent inconsistent states. When dependency violations are detected, the system may trigger corrective actions that restore cache consistency while preserving essential functionality.

In an embodiment, data flow through the adaptive protocol caching system follows several distinct paths depending on operation type. According to one implementation, when a transaction manager initiates a protocol request, the request flow may begin at the integration controller, which directs it to the cache management system. The cache management system can first attempt a local cache lookup, potentially returning the protocol immediately if found.

When a local cache miss occurs, the system may initiate parallel operations. According to some implementations, the system can begin a regional cache lookup while simultaneously preparing for potential protocol negotiation through the base system. The request may flow through the cache hierarchy until either a cache hit occurs or the system determines the protocol must be obtained through normal negotiation channels.

In another embodiment, update flow begins when new or modified protocols enter the system. The protocol data may first pass through validation procedures before entering the cache hierarchy. According to one implementation, the system can apply compression using existing codebooks before storing the protocol. The update may then flow through the synchronization system, which coordinates distribution across cache levels while maintaining consistency.

Protocol prediction flow may operate continuously during system operation. The system can analyze transaction patterns and cache performance data to generate protocol predictions. According to some implementations, these predictions may flow to the pre-fetch subsystem, which initiates cache warming operations. When predictions prove accurate, the system may adjust prediction weights to reinforce successful patterns.

In an embodiment, synchronization flow maintains cache consistency through periodic and event-driven updates. The system can generate cache state hashes that flow through the hierarchy for comparison. According to one implementation, when inconsistencies are detected, the system may initiate targeted update flows that minimize network utilization while restoring cache coherency.

Result feedback flow may involve multiple system components. The system can track cache hits, misses, and protocol negotiation outcomes as they flow through the system. According to one embodiment, this feedback data may flow into both performance monitoring and prediction subsystems, informing future system behavior. When significant pattern changes are detected, the feedback flow may trigger adaptation in multiple system components.

In an embodiment, error recovery flow follows specific pathways through the system. Initial error detection may trigger diagnostic data collection that flows through analysis components. According to some implementations, the system can initiate recovery flows that progress from local to global cache levels as needed. The recovery process may generate verification data that flows back through the system to confirm successful operation restoration.

Cache management flow may incorporate multiple data streams. The system can process configuration updates, performance metrics, and optimization directives as they flow through management interfaces. According to one embodiment, management decisions may flow outward from central coordination components to distributed cache nodes. When configuration changes occur, the system may generate validation flows that confirm proper implementation across the cache hierarchy.

In another embodiment, security-related data flows through dedicated pathways. The system can route access control decisions and audit data through security components for validation and logging. According to some implementations, security events may trigger specialized flows that enable rapid response to potential threats. When security violations are detected, the system may initiate containment flows that protect cache integrity.

Resource management flow may adapt to changing system conditions. The system can process resource utilization data as it flows through monitoring components. According to one embodiment, resource allocation decisions may flow through the system as directives that adjust operational parameters. When resource constraints are detected, the system may initiate optimization flows that rebalance system operation.

Protocol translation flow may involve several stages of data movement. The system can capture translation patterns as they flow through the cache hierarchy. According to one embodiment, frequently used translations may flow into specialized translation caches for rapid access. When translation requirements change, the system may initiate adaptation flows that update cached translation rules.

In an embodiment, machine learning data flows through dedicated analytical pathways. The system can collect operational metrics that flow into ML/AI processing components. According to some implementations, resulting model updates may flow back through the system to adjust operational parameters. When significant pattern changes are detected, the system may initiate retraining flows that incorporate new operational data.

Cache compression flow may adapt based on multiple factors. The system can process protocol data through compression stages that utilize existing codebooks. According to one embodiment, compression decisions may flow through evaluation components that consider access patterns and resource constraints. When compression effectiveness changes, the system may initiate optimization flows that adjust compression strategies.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The term "codebook" refers to a database containing sourceblocks each with a pattern of bits and reference code unique within that library. The terms "library" and "encoding/decoding library" are synonymous with the term codebook.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio", and as used herein all mean the size of the original data relative to the size of the compressed data (e.g., if the new data is 70% of the size of the original, then the deflation/compression ratio is 70% or 0.7.)

The term "data" means information in any computer-readable form.

The term "data set" refers to a grouping of data for a particular purpose. One example of a data set might be a word processing file containing text and formatting information.

The term "effective compression" or "effective compression ratio" refers to the additional amount data that can be stored using the method herein described versus conventional data storage methods. Although the method herein described is not data compression, per se, expressing the additional capacity in terms of compression is a useful comparison.

The term "source packet" as used herein means a packet of data received for encoding or decoding. A source packet may be a portion of a data set.

The term "sourceblock" as used herein means a defined number of bits or bytes used as the block size for encoding or decoding. A source packet may be divisible into a number of sourceblocks. As one non-limiting example, a 1 megabyte source packet of data may be encoded using 512 byte sourceblocks. The number of bits in a sourceblock may be dynamically optimized by the system during operation. In one aspect, a sourceblock may be of the same length as the block size used by a particular file system, typically 512 bytes or 4,096 bytes.

The term "codeword" refers to the reference code form in which data is stored or transmitted in an aspect of the system. A codeword consists of a reference code to a sourceblock in the library plus an indication of that sourceblock's location in a particular data set.

Conceptual Architecture

Figure 57:
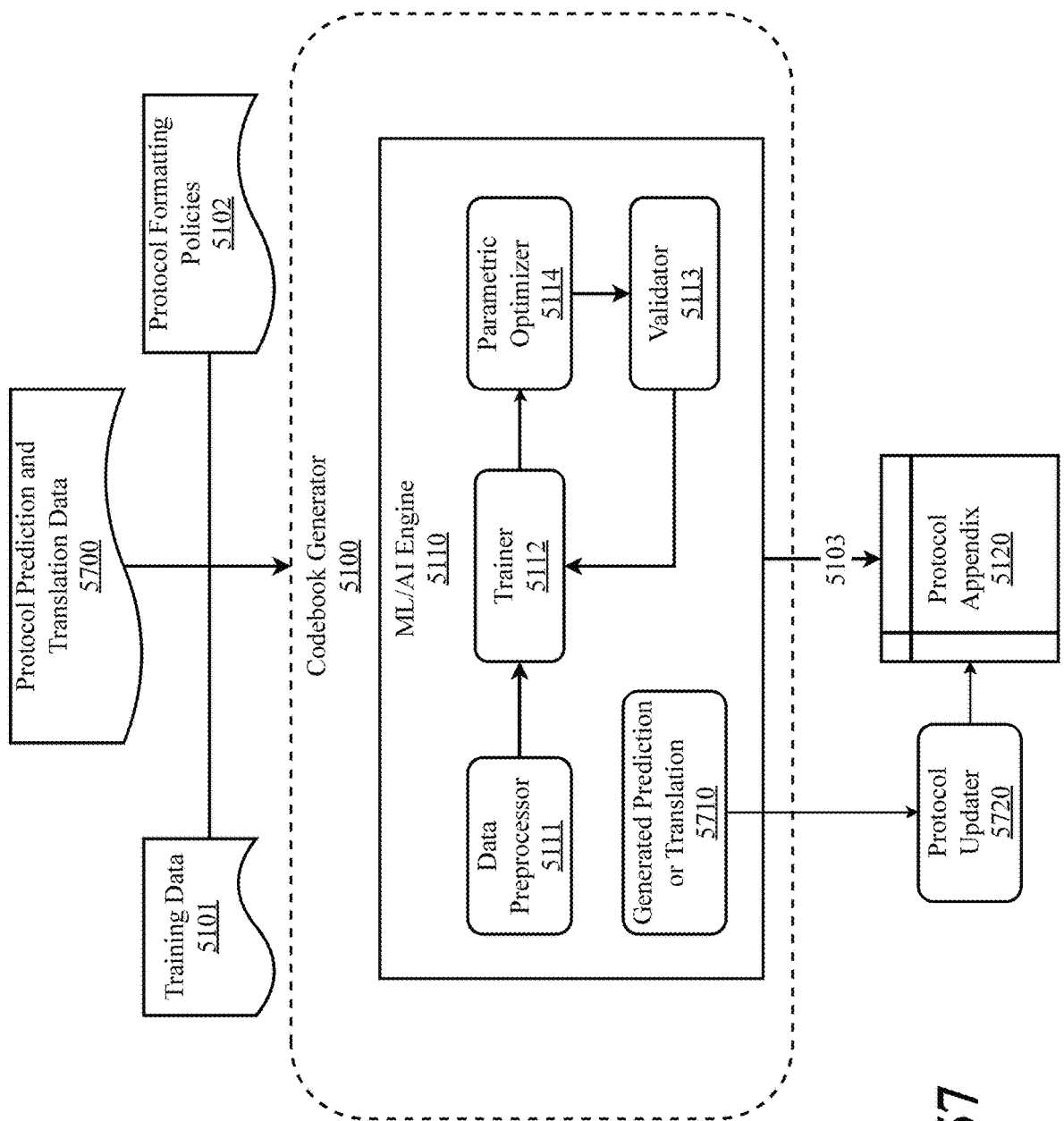
FIG. 57 is a block diagram illustrating an exemplary system architecture for event-driven data communication using codebooks with protocol prediction and translation, according to an embodiment.

FIG. 57 is a block diagram illustrating an exemplary system architecture for event-driven data communication using codebooks with protocol prediction and translation, according to an embodiment. In one embodiment, the codebook generator 5100 may been enhanced to incorporate adaptive communication capabilities through the addition of protocol prediction and translation functionalities. This enhancement is achieved by introducing new components: protocol prediction and translation data 5700, generated prediction or translation 5710, and protocol updater 5720. These components work in conjunction with the existing elements of the codebook generator to create a more dynamic and responsive system for protocol adaptation.

The protocol prediction and translation data 5700 represents an input of historical communication patterns, protocol characteristics, and translation rules. This data is aids in training the machine learning and artificial intelligence (ML/AI) engine 5110 to predict optimal protocols for upcoming communications and to facilitate translations between different protocols when necessary. The data may include logs of past communications, performance metrics of various protocols under different conditions, and mappings between different protocol specifications.

As the ML/AI engine 5110 processes the training data 5101, protocol formatting policies 5102, and the newly introduced protocol prediction and translation data 5700, it generates predictions or translations 5710. These outputs represent the system's adaptive responses to the current communication context. For example, the generated prediction might suggest switching to a more efficient protocol based on the current network conditions and the nature of the data being transmitted. Alternatively, a generated translation might provide a mapping between two different protocols, allowing seamless communication between systems that don't natively support the same protocol.

A protocol updater 5720 acts as an interface between the ML/AI engine's outputs and the protocol appendix 5120. When a new prediction or translation is generated, the protocol updater 5720 assesses its relevance and potential impact on the current communication. If the update is deemed beneficial, the protocol updater 5720 modifies the protocol appendix 5120 accordingly. This might involve adding new protocol options, updating translation rules, or adjusting protocol selection criteria.

To illustrate how these new components integrate into the codebook generator, consider a scenario where two systems are communicating using a standard protocol. The ML/AI engine 5110, continuously analyzing the communication patterns and network conditions, might predict that an upcoming large file transfer would benefit from switching to a different protocol optimized for bulk data transfer. The engine generates this prediction, which is then passed to the protocol updater 5720. The updater modifies the protocol appendix 5120 to include this new protocol option and the conditions under which it should be used.

In another example, the system might encounter a legacy device that doesn't support the current optimal protocol. The ML/AI engine 5110, drawing from its training on protocol specifications, could generate a translation between the optimal protocol and one supported by the legacy device. The protocol updater 5720 would then incorporate this translation into the protocol appendix 5120, allowing the two systems to communicate effectively despite their protocol mismatch.

These enhancements to the codebook generator enable it to adapt dynamically to changing communication needs and environments. By leveraging machine learning and artificial intelligence, the system can proactively optimize protocol selection and facilitate communication between diverse systems, ultimately improving efficiency and compatibility in complex networking scenarios.

Figure 58:
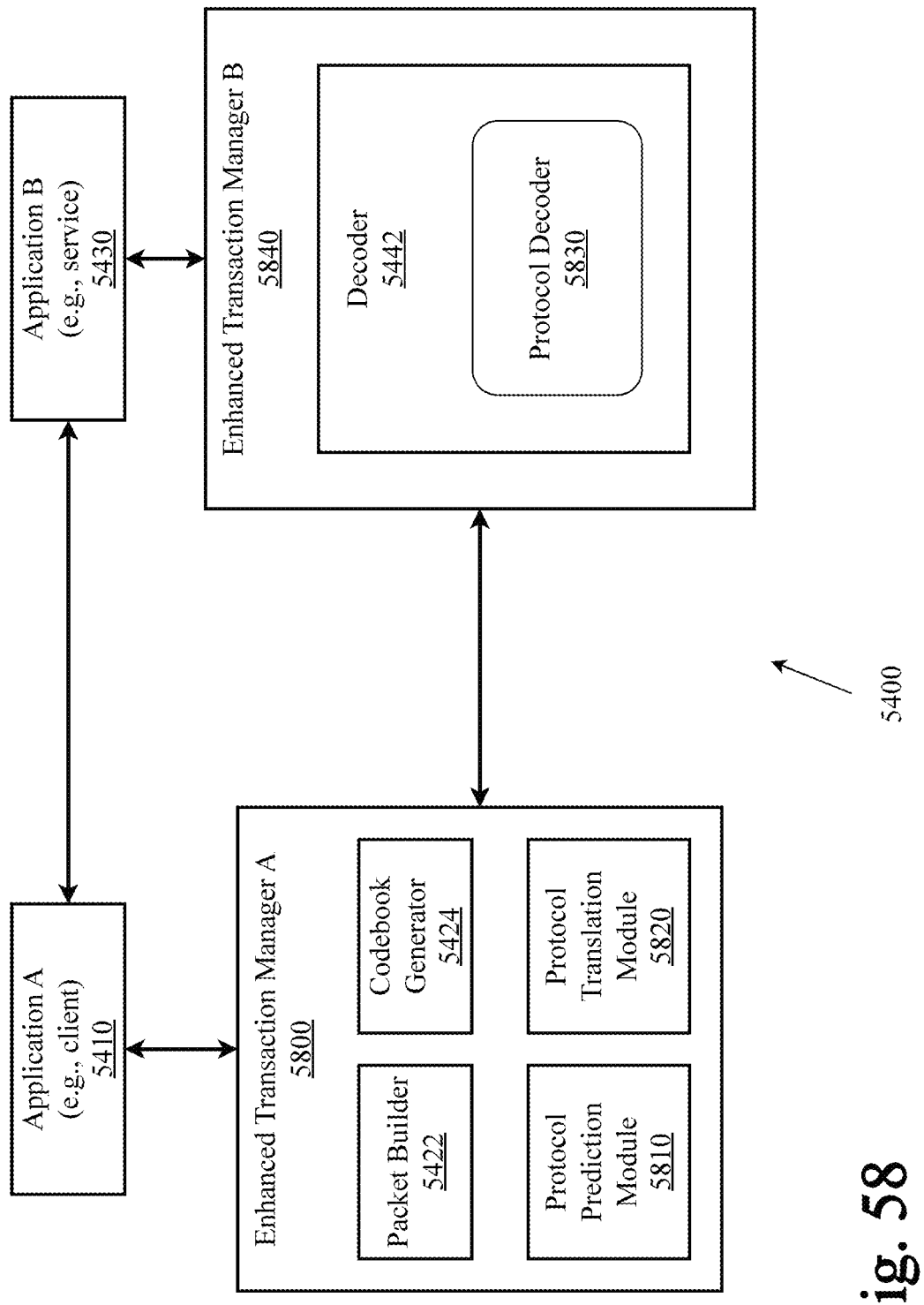
FIG. 58 is a block diagram illustrating an exemplary system architecture for an enhanced transaction manager, according to an embodiment.

FIG. 58 is a block diagram illustrating an exemplary system architecture for an enhanced transaction manager, according to an embodiment. The system comprises two applications, application A 5410 (e.g., a client) and application B 5430 (e.g., a service), each associated with an enhanced transaction manager. These enhanced transaction managers, labeled as enhanced transaction manager A 5800 and enhanced transaction manager B 5840, include sophisticated modules for protocol prediction and translation.

Enhanced transaction manager A 5800 integrates several key components to facilitate adaptive communication. The codebook generator 5424, which now incorporates the protocol updater described in the previous figure, works in tandem with the packet builder 5422 to create and maintain up-to-date codebooks and protocol appendices. This integration allows for real-time updates to the communication protocols based on machine learning predictions and translations.

In one embodiment an enhanced transaction managers may further comprise a protocol prediction module 5810. This module utilizes machine learning algorithms to analyze current communication patterns, network conditions, and historical data. By doing so, it can anticipate optimal protocols for upcoming data transfers or communication sessions. For instance, if the module detects that a large file transfer is imminent, it might predict that switching to a protocol optimized for bulk data transfer would be beneficial.

Complementing the prediction module is the protocol translation module 5820. This component comes into play when communicating systems don't share a common protocol. Using its trained model, the translation module can effectively 'translate' between different protocols in real-time, ensuring seamless communication even in heterogeneous environments. For example, if application A uses a newer, more efficient protocol that application B doesn't support, the translation module can bridge this gap, allowing the two applications to communicate effectively.

On the receiving end, enhanced transaction manager B 5840 includes a decoder 5442 with an integrated protocol decoder 5830. This decoder is designed to interpret and adapt to various incoming protocols, including those that might have been predicted or translated by the sending transaction manager. The protocol decoder 5830 works in conjunction with the protocol prediction and translation modules to ensure that incoming data is correctly interpreted, regardless of the protocol used for transmission.

To illustrate the system's operation, consider a scenario where application A needs to send a large dataset to application B. The protocol prediction module 5810 in enhanced transaction manager A 5800 might anticipate this need based on previous patterns and current context. It could then signal the codebook generator 5424 to update the protocol appendix with a more suitable protocol for large data transfers. The packet builder 5422 would use this updated information to construct the data packets.

If enhanced transaction manager B 5840 supports this new protocol, communication proceeds efficiently using the optimized protocol. However, if it doesn't, the protocol translation module 5820 in enhanced transaction manager A 5800 comes into play. It translates the optimized protocol into one that B can understand. On the receiving end, the protocol decoder 5830 in enhanced transaction manager B 5840 interprets this incoming data, potentially with assistance from its own protocol translation module if necessary.

This enhanced architecture allows for a highly adaptive and efficient communication system. By integrating protocol prediction, translation, and decoding capabilities directly into the transaction managers, the system can dynamically optimize communication protocols based on current needs and capabilities. This results in improved performance, better compatibility between diverse systems, and the ability to seamlessly integrate both legacy and cutting-edge communication technologies within the same network.

Figure 59:
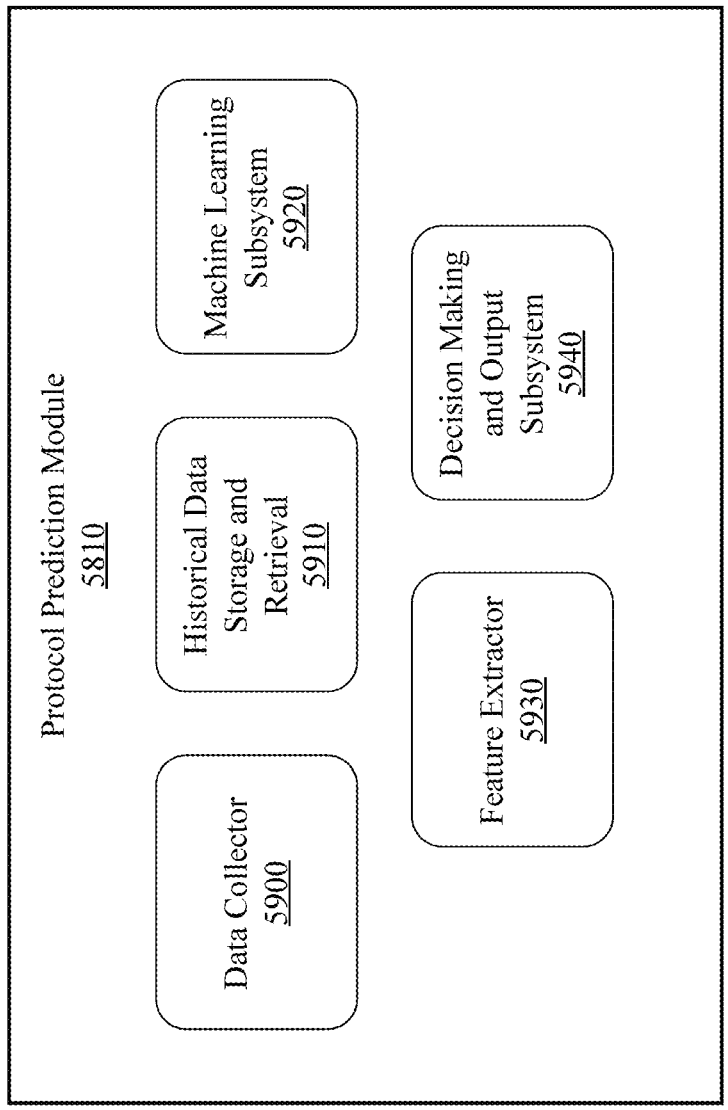
FIG. 59 is a block diagram illustrating an exemplary embodiment of a component of a system for event-driven data communication using codebooks with protocol prediction and translation, a protocol prediction module.

FIG. 59 is a block diagram illustrating an exemplary embodiment of a component of a system for event-driven data communication using codebooks with protocol prediction and translation, a protocol prediction module.

Figure 60:
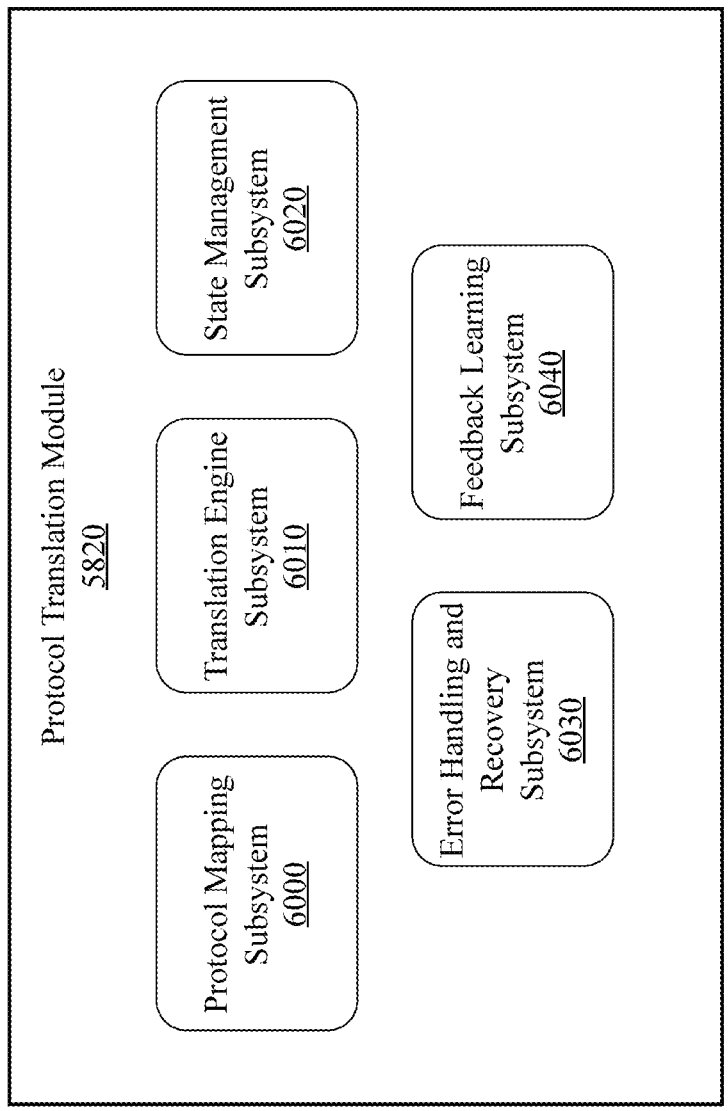
FIG. 60 is a block diagram illustrating an exemplary embodiment of a component of a system for event-driven data communication using codebooks with protocol prediction and translation, a protocol translation module.

FIG. 60 is a block diagram illustrating an exemplary embodiment of a component of a system for event-driven data communication using codebooks with protocol prediction and translation, a protocol translation module. The protocol translation module 5820 represents an approach to ensuring seamless communication across diverse network environments, embodying a sophisticated system of inter-operating components that work in harmony to bridge protocol gaps. This module's power lies in its ability to dynamically adapt and translate between different communication protocols in real-time, effectively eliminating compatibility barriers that have long plagued heterogeneous networks.

At the core of this module is a protocol mapping subsystem 6000, which serves as a comprehensive knowledge base of protocol specifications and their interrelationships. This subsystem maintains a detailed understanding of how various protocols structure their data, handle commands, and manage metadata. By mapping the intricacies of different protocols, it lays the foundation for accurate and efficient translations.

Working in close conjunction with the mapping subsystem, a translation engine subsystem 6010 forms the beating heart of the module. This engine leverages both rule-based algorithms and machine learning models to perform the intricate task of translating between protocols. Its strength lies in its ability to handle not just straightforward mappings, but also complex scenarios where protocols might have fundamentally different approaches to handling certain types of data or commands. The translation engine's adaptive nature allows it to evolve its strategies over time, becoming more adept at handling nuanced translation challenges.

A state management subsystem 6020 plays a role in maintaining the integrity of ongoing communications, especially when dealing with stateful protocols. This component keeps track of the current state of a communication session, ensuring that important context is not lost during the translation process. By preserving state information, it allows for seamless protocol transitions even in the middle of complex, multi-step communications.

Recognizing that perfect translation is not always possible, an error handling and recovery subsystem 6030 provides a vital safety net. This component implements sophisticated error detection mechanisms and fallback strategies to manage inconsistencies or incompatibilities that may arise during translation. Its presence ensures that communication can proceed smoothly even when faced with challenging translation scenarios, greatly enhancing the robustness and reliability of cross-protocol communications.

A feedback learning subsystem 6040 represents the module's capacity for continuous improvement. By collecting and analyzing data on the outcomes of various translation operations, this subsystem enables the entire module to refine its strategies over time. It feeds valuable insights back into the other subsystems, allowing the protocol mapping to become more comprehensive, the translation engine to become more accurate, and the error handling mechanisms to become more effective.

In one example, when a communication session begins, the protocol mapping subsystem 6000 identifies the structures of both the source and target protocols. The translation engine 6010 then leverages this mapping to begin the translation process, while the state management subsystem keeps track of the session's progress. If an incompatibility is encountered, the error handling subsystem 6030 steps in to resolve the issue, perhaps by finding an alternative way to represent the data. Throughout this process, the feedback learning subsystem 6040 observes and learns, gathering data that will be used to improve future translations. This dynamic, adaptive approach to protocol translation offers numerous benefits to the overall communication system. It allows for the seamless integration of legacy systems with cutting-edge technologies, enabling organizations to modernize their networks gradually without sacrificing interoperability. The module's ability to handle complex translation scenarios in real-time also opens up new possibilities for creating more flexible and resilient network architectures.

The continuous learning and adaptation facilitated by the feedback learning subsystem ensure that the module becomes increasingly efficient over time. As it encounters and successfully navigates more diverse translation scenarios, it builds a rich knowledge base that enhances its ability to handle future challenges. This self-improving capability makes the protocol translation module a key asset in future-proofing network communications, allowing systems to adapt to new protocols and standards as they emerge. By enabling seamless communication across diverse protocols, this module not only enhances the efficiency of data transfers but also expands the possibilities for interconnectivity in our increasingly networked world. It paves the way for more inclusive and flexible communication ecosystems, where the barriers between different technologies and standards are effectively dissolved, fostering innovation and collaboration across previously incompatible systems.

Figure 61:
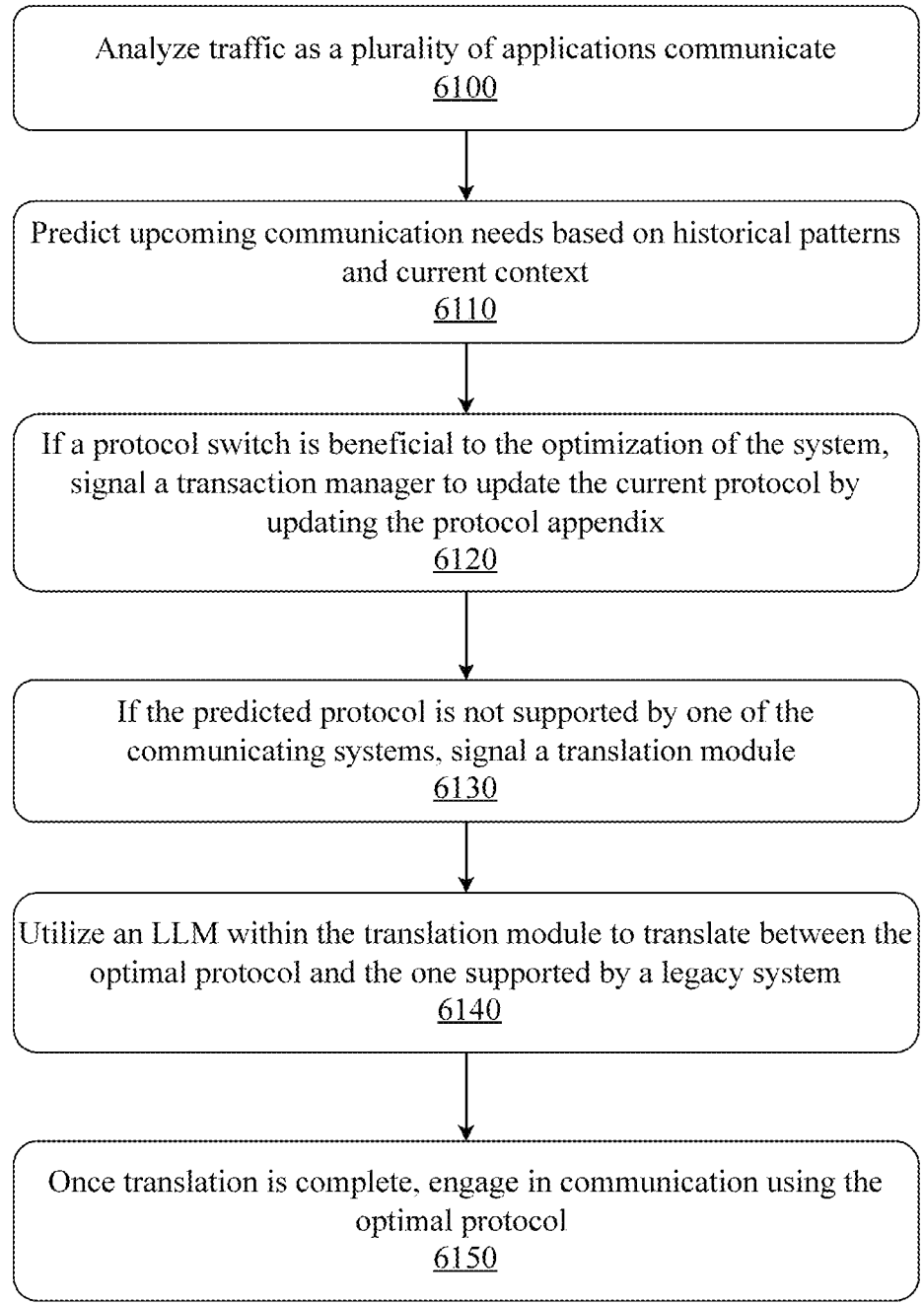
FIG. 61 is a flow diagram illustrating an exemplary method for event-driven data communication using codebooks with protocol prediction and translation, according to an embodiment.

FIG. 61 is a flow diagram illustrating an exemplary method for event-driven data communication using codebooks with protocol prediction and translation, according to an embodiment. In a first step 6100, the system begins by analyzing traffic as a plurality of applications communicate. This continuous monitoring forms the foundation of the adaptive process, allowing the system to maintain a real-time understanding of the network's state and the nature of ongoing communications. By closely observing traffic patterns, data types, and network conditions, the system builds a comprehensive picture of the current communication landscape.

In a step 6110, the system predicts upcoming communication needs based on historical patterns and current context. This predictive capability represents a significant advancement over reactive systems. By leveraging machine learning algorithms and historical data, the system can anticipate future communication requirements before they arise. This foresight allows for proactive optimization, potentially preventing performance issues before they occur.

In a step 6120, if a protocol switch is deemed beneficial to the optimization of the system, a signal is sent to a transaction manager to update the current protocol by updating the protocol appendix. This step demonstrates the system's ability to dynamically adapt to changing conditions. The decision to switch protocols is based on a complex analysis of predicted needs, current network conditions, and potential performance gains. By updating the protocol appendix, the system ensures that all components are aligned with the new communication strategy.

In a step 6130, if the predicted optimal protocol is not supported by one of the communicating systems, the system signals a translation module. This step showcases the system's flexibility in dealing with heterogeneous environments. Rather than being limited by the capabilities of the least advanced component, the system can bridge technological gaps to maintain optimal performance.

In a step 6140, the system utilizes an LLM within the translation module to translate between the optimal protocol and the one supported by a legacy system. This sophisticated translation capability allows for seamless communication between disparate systems. The use of an LLM for this task enables nuanced, context-aware translations that can handle complex protocol differences effectively.

In a step 6150, once the translation is complete, the system engages in communication using the optimal protocol. This final step represents the culmination of the adaptive process, where the system has successfully optimized the communication protocol while ensuring compatibility across all involved systems. Together, these steps form a powerful, self-optimizing communication system. By continuously analyzing, predicting, adapting, and translating, the system can maintain optimal performance across a wide range of scenarios and system capabilities. This approach not only improves efficiency and reliability but also extends the lifespan of legacy systems and facilitates the gradual adoption of new technologies. The result is a highly flexible, future-proof communication infrastructure capable of seamlessly integrating diverse technologies and adapting to evolving network environments.

Figure 54:
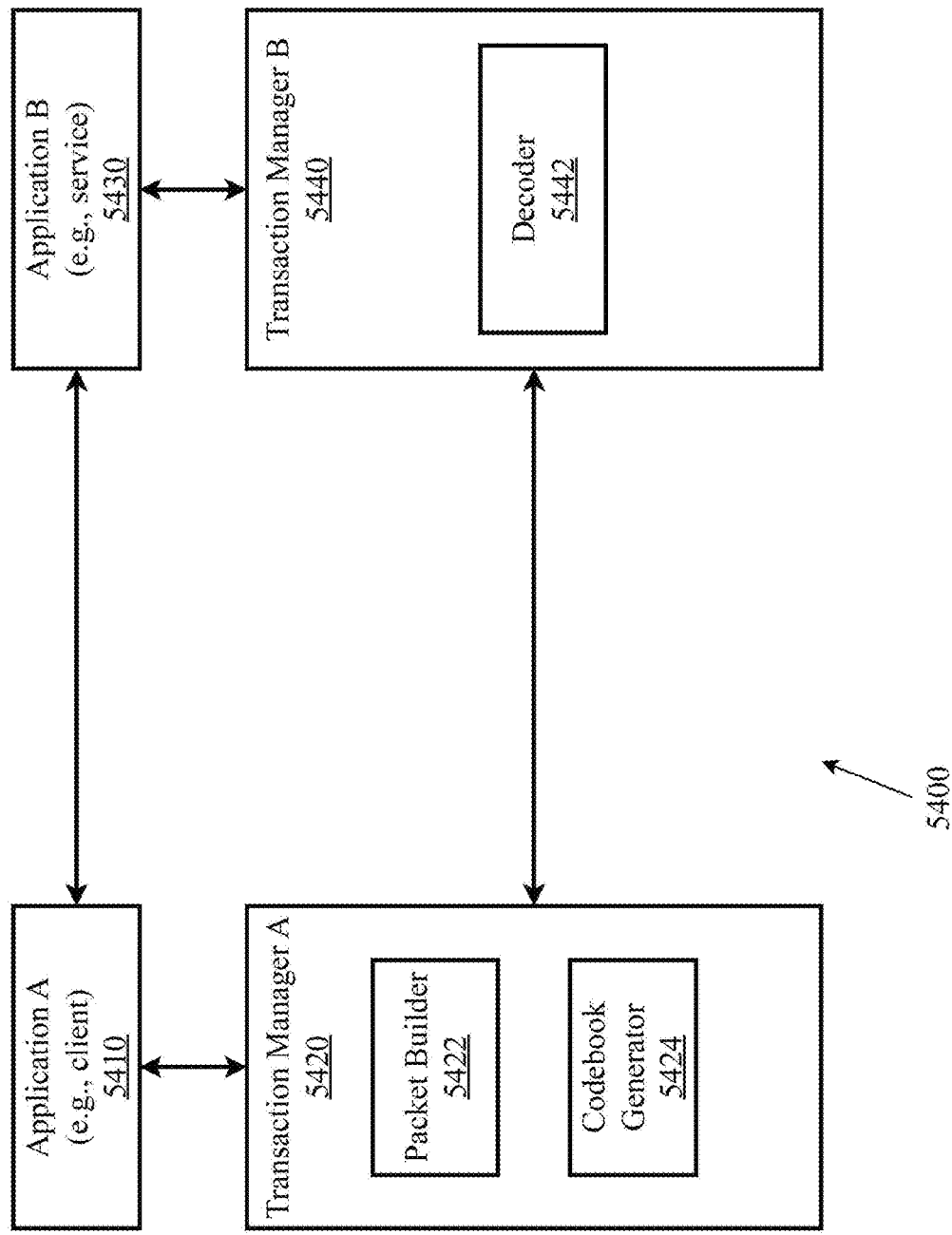
FIG. 54 is a block diagram illustrating an exemplary system architecture for event-driven data transmission using codebooks and protocol adaption, according to an embodiment.

FIG. 54 is a block diagram illustrating an exemplary system architecture 5400 for event-driven data transmission using codebooks and protocol adaption, according to an embodiment. In the embodiment, the system enables application programs to complete a transaction. Exemplary components in a transaction include a transaction manager 5420, 5440, the initiator 5410, and various resource managers. The transaction managers coordinate the outcome of the transaction. In the exemplary embodiment of FIG. 54, only two applications programs are involved in the transaction. In other embodiments, there may be any plurality of application programs involved in a transaction. For example, the transaction managers may be represented as a cascading or nested tree or hierarchy. Transaction managers may support several transaction protocols. Each has different characteristics regarding performance, feature set, and partners that understand them. Transaction managers may utilize a protocol appendix to select the appropriate protocol to facilitate the transaction. In some embodiments, a protocol appendix may be included in propagation information to provide an advanced protocol which can be selected for use by a transaction manager employing a decoder 5442.

Transaction managers may be added to a transaction through a process known as propagation. Propagation involves an application component already in the transaction and an application component that is not in the transaction exchanging information about their transaction managers. This is illustrated in FIG. 54. Propagation carries information about transaction manager A 5420 so that transaction manager B 5440 knows about the transaction and the existence of transaction manager A 5420. As shown, application A 5420 is in the transaction, and is coordinated through transaction manager A 5420. Application A 5410 uses an application protocol to send a message to application B 5430 which carries propagation information that application B 5430 provides to transaction manager B 5440. This information is used to connect transaction manager B 5440 to transaction manager A 5420 using a transaction protocol determined using a protocol appendix encoded in the propagation information. In some embodiments, the message that application A 5410 sends to transaction manager A 5420 may be an encoded message encoded using a codebook developed using one or more the components and methods described herein. In various embodiments, any of the various messages being communicated between and among the components of system 5400 as packets of information may be or comprise encoded data encoded using a codebook.

Aspects of the system and methods disclosed herein provide a mechanism for transparently encoding sufficient information into a propagation information packet (that was not designed to carry such information) to derive possible advanced protocols that may be used in addition to a standard or common protocol. The standard protocol may include, for example, the web services atomic transaction (WS-AT) protocol. Each transaction manager performs aspects of the invention illustrated and described herein to upgrade the protocol for communication with another transaction manager. Aspects of the invention provide for the propagation information to carry enough information (i.e., protocol appendix) that the decision on the transformation protocol may be made by transaction manager B 5440 after transaction manager B 5440 has been "discovered".

In some embodiments, the information related to the supported protocols, known as propagation information, is either associated with or embedded in the propagation information packet transmitted to another application. Alternatively, in another embodiment, the location of the propagation information is conveyed to the other application, allowing direct access to the information at that specified location. Another possibility involves no explicit transmission of propagation information or its location to the other application. In such cases, the other application possesses prior knowledge of the propagation information, possibly gained through an earlier handshake or communication with the application.

In embodiments where propagation information is incorporated into the propagation information packet, transaction manager A 5420 generates a packet containing this information, which is then provided to application A 5410. This packet includes details about the location of transaction manager A 5420, wherein the relevant alternative advanced protocols are encoded via a protocol appendix. The encoding is executed in a manner that aligns seamlessly with a standard protocol, ensuring proper utilization. For instance, the location information could be expressed as a Uniform Resource Locator (URL), with the additional details (e.g., protocol appendix) encoded either as query parameters or within the path. In this embodiment, the standard protocol operates using the unaltered URL, and transaction manager A 5420 appropriately processes the unmodified URL. In this embodiment, the URL may be encoded using a codebook trained on URL data. Provided is an exemplary URL where the UpgradedProtocol and UpgradeProtocolPort name-value pairs specify, respectively, an upgrade protocol and protocol-specific upgrade information (e.g., communication port):

```
http://foobar321.com/Registration?Tx=802a391a30db-4425-
ab7fb06eb20ed6dc&UpgradeProtocol=4&UpgradeProtocolPort=2372
```

In this exemplary URL, the propagation information comprises information about an advanced protocol that may be utilized by a transaction manager. For example, UpgradeProtocol=4 may indicate that transaction manager is to select a stored protocol appendix at position 4 to format the transaction according to the protocol associated with protocol appendix at position 4. In other embodiments, the 4 (or any other number) may indicate a location in the protocol appendix which determines the advanced protocol used to communicate be applications and transaction managers.

In another embodiment, the location of transaction manager A 5420 is encoded in simple object access protocol (SOAP) format. There are defined private extensibility fields that may contain any kind of additional element (e.g., a protocol appendix). This advanced protocol information is encoded in these fields and rules similar to the encoding in the URL example above. The extended fields are ignored by recipients who do not specifically recognize and understand the extended fields. An exemplary SOAP excerpt is show below. The extensibility fields include the "txex" fields.

```
<s:Envelopes>
  <S:Headers>
    <wscoor:CoordinationContext>
      <wscoor:Identifiers-urn:uuid:802a391a-30db-4425
ab7f-b06eb2Oedôdc-3 wScoor:Identifiers>
...
    <txex:Upgrade>
      <txex:Address-txex://foobar321.com:2372, Registration</txex>
    <txex:Upgrade>
  <wscoor:CoordinationContext>
...
  <S:Headers>
</s:Envelopes>
```

In an embodiment, the location of transaction manager A 5420 is encoded within a SOAP header, with its MustUnderstand attribute configured as true. Supplementary locations are encoded in SOAP headers, but their MustUnderstand attribute is set to false. Recipients familiar with the initial location can optionally inspect the set of SOAP headers within the message, specifically searching for protocol headers with recognized names and schemas. Headers that are not recognized are disregarded.

The propagation information packet is passed by application A 5410 to application B 5430. Application B 5430 supplies the propagation information packet to transaction manager B 5440. If transaction manager B 5440 only supports the standard protocol, the location information is simply used without any further processing. Transaction manager B 5440, in that case connects to transaction manager A 5410 using the standard protocol. Alternatively, if transaction manger 2 5440 supports one or more of the advanced protocols, transaction manager B 5440 decodes the additional data (e.g., protocol appendix information) in the location information about transaction manager A 5420. Transaction manager B 5440 uses this to determine if there are advanced protocols supported by transaction manager A 5420 and transaction manager B 5440. If so, transaction manager B 5440 selects one indicated by one or more protocol appendices which may be included in the propagation information.

In implementations where the propagation information is transmitted separately to application B 5430, distinct from the propagation information packet (e.g., as out-of-band data), the advanced protocol details are stored in a location accessible to transaction manager B 5440. This location may be a lookup service accessible to transaction manager B 5440 or local configuration data. Transaction manager A 5420 generates information detailing the storage location of the propagation information. Subsequently, transaction manager A 5420 conveys this location information to application A 5410 Transaction manager B 5440 utilizes this location information to ascertain and choose the stored protocol appendix to use as a communication protocol. Alternatively, in another implementation, transaction manager A 5420 might already be aware of the location information, the propagation information, protocol appendix itself, having obtained it through a preceding handshake or exchange between the relevant applications.

In general, standard transaction protocol propagation includes sufficient information for the recipient to name and locate the originator's transaction manager. Consequently, the information included in the propagation message may contain the transaction manager's name and location information, or the information may include a key or token allowing the recipient to find those details in out-of-band data. The location information may comprise a protocol appendix or a key or token pointing to the location of the protocol appendix if stored.

According to some aspects, the standard protocol is designed to either incorporate the name and location information of the transaction manager within its propagation information or allow for obtaining these details from out-of-band data. The standard propagation information serves, in at least two ways, to assess the feasibility of a "negotiate-up" operation. Firstly, the standard protocol might possess a flexible definition for conveying the partner name within the protocol. In such instances, the data essential for making a negotiate-up decision may be directly encoded into the name, a facet inherently overlooked by the standard protocol. As an example, if a protocol adopts a URL string to represent a transaction manager name, the supplementary information could be stored as query data (e.g., following the "?" in the URL) or as trailing directory names. In this case, the standard protocol remains indifferent to this data, and the partner providing the name correctly responds even if used without modification.

In other implementations, the standard protocol may not have a flexible definition for the passing partner name. In this case, the name is used as a key to look up one or more protocol appendices to be used for advanced protocol transmission.

In one implementation, the propagation information is transmitted without alterations concerning the standard form. Yet, if transaction manager B 5440 possesses the capability to negotiate up, it can utilize the location information (i.e., protocol appendix) or an agreed subset thereof to identify details about transaction manager A 5420. At this point in the transaction, transaction manager B 5440 assesses the availability of a suitable advanced protocol by identifying and selecting a protocol appendix and establishes a connection back to transaction manager A 5420 using that protocol appendix. A decoder 5442 module may be operable on transaction manager B 5440 and configured to use the selected protocol appendix of the location information to establish a connection via a decoded protocol.

In one embodiment, application A 5410 determines that it needs the functionality provided by application B 5420 to complete a transaction. Application A 5410 asks transaction manager A 5420 for propagation information or other data that otherwise identifies transaction manager A 5420 and enables another transaction manager to locate and communicate with transaction manager A 5420. This data may be formatted in a plurality of ways dependent upon the use case, application, and services used. For example, the data may take the form of a binary large object ("blob" of data) or other implementation-specific data. This data may be encoded via a codebook and stored on transaction manager A 5420. This data may be further represented as encoded data with a codebook and a protocol appendix. In some embodiments, the protocol appendix may be transmitted as location information encoded in a packet. Transaction manager A 5420 may utilize a codebook generator 5424 which generates the protocol appendices which describe, among other items, a plurality of communication protocols supported by transaction manager A 5420. The protocol appendix may be stored in a database accessible by transaction manager A 5420. Transaction manager A 5420 may utilize a packet builder 5422 which may be configured to receive requests from application A 5410 for propagation information. The propagation information, stored in a storage location, includes one or more protocol appendices describing a plurality of communication protocols. Packet builder 5422 may generate location information identifying the storage location of the one or more protocol appendices. Packet builder 5422 may encode (via a codebook) and embed or otherwise associates the location information into a propagation information packet. The packet may also include support for a standard protocol supported by transaction manager B 5440. Packet builder 5422 can then provide the propagation information packet to application A 5410 which communicates the packet to application B 5430. Transaction manager B 5440 uses the location information to access the propagation information in the storage location. Transaction manager B 5440 may use a decoder 5442 on the access propagation information, e.g., a protocol appendix to select a communication protocol supported by both transaction managers.

Figure 55:
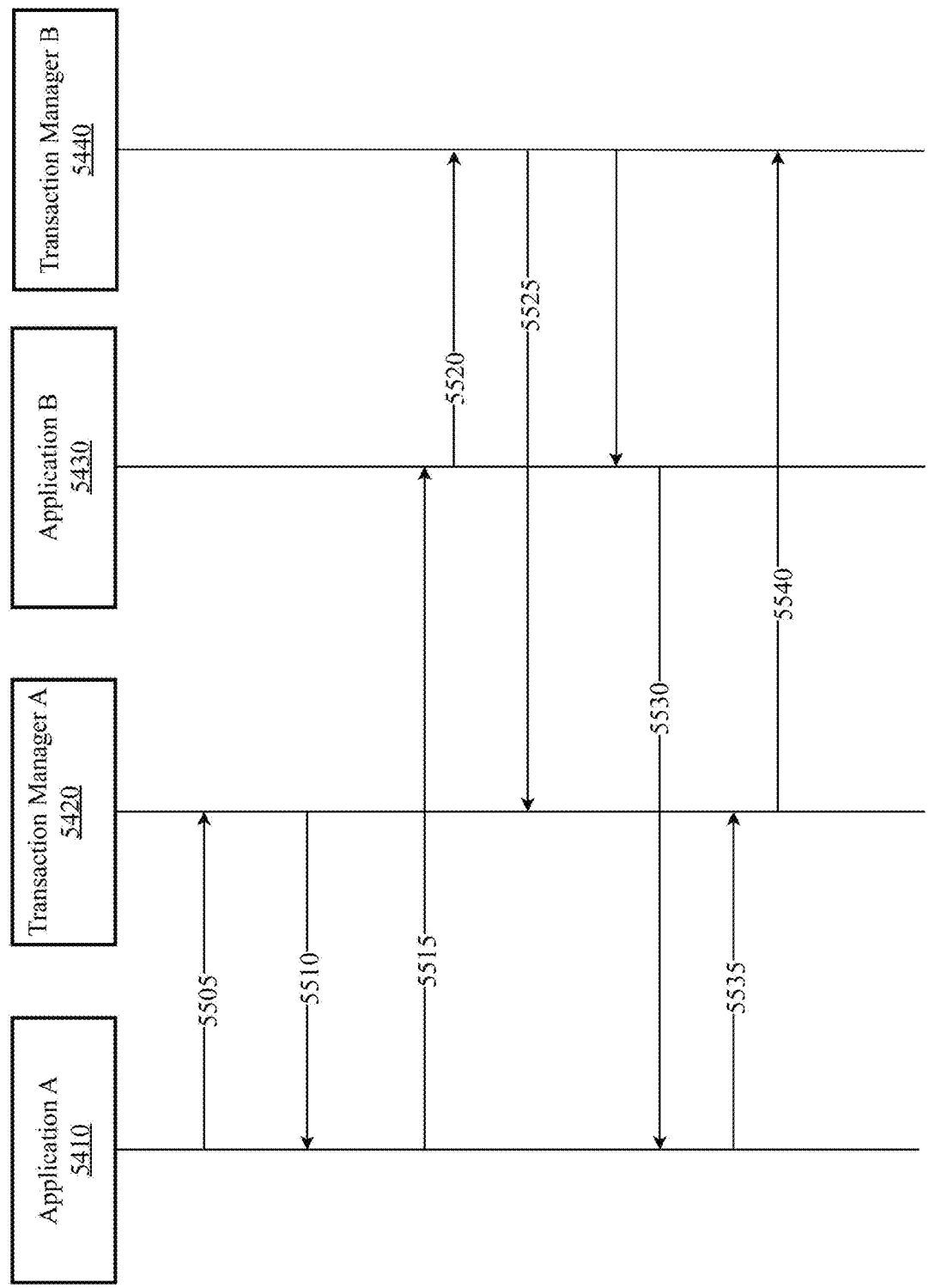
FIG. 55 is a message flow diagram illustrating an exemplary exchange of messages and packets between various components of a system for event-driven data transmission using codebooks and protocol adaption, according to an embodiment.

FIG. 55 is a message flow diagram illustrating an exemplary exchange of messages and packets between various components of a system for event-driven data transmission using codebooks and protocol adaption, according to an embodiment. According to the embodiment, operation of system 5400 may begin when application A 5410 requests 5505 transaction manager A 5420 for propagation information or other data that identifies transaction manager A 5420 and enables another transaction manager to locate and communicate with transaction manager A 5420. The data object is provided 5510 by transaction manager A 5420 to application A 5410. Application A 5410 inserts the data object into a message or token sent 5515 to application B 5430. For example, the propagation information (e.g., protocol appendix) may be associated with, or embedded into, the message representing the propagation information packet. Application B 5430 present 5520 the data object to transaction manager B 5440. Transaction manager B 5440 selects a protocol using the protocol appendix and decoder and communicates 5525 with transaction manager A 5420. Application B 5430 completes the designated operations in the transaction and sends 5530 the status and/or results to application A 5410. Finally, application A 5410 informs 5535 transaction manager A 5420 of the completion of the transaction. Transaction manager A 5420 may initiate a two-phase commit (or other committal process) by communicating 5540 with transaction manager B 5440.

Figure 56:
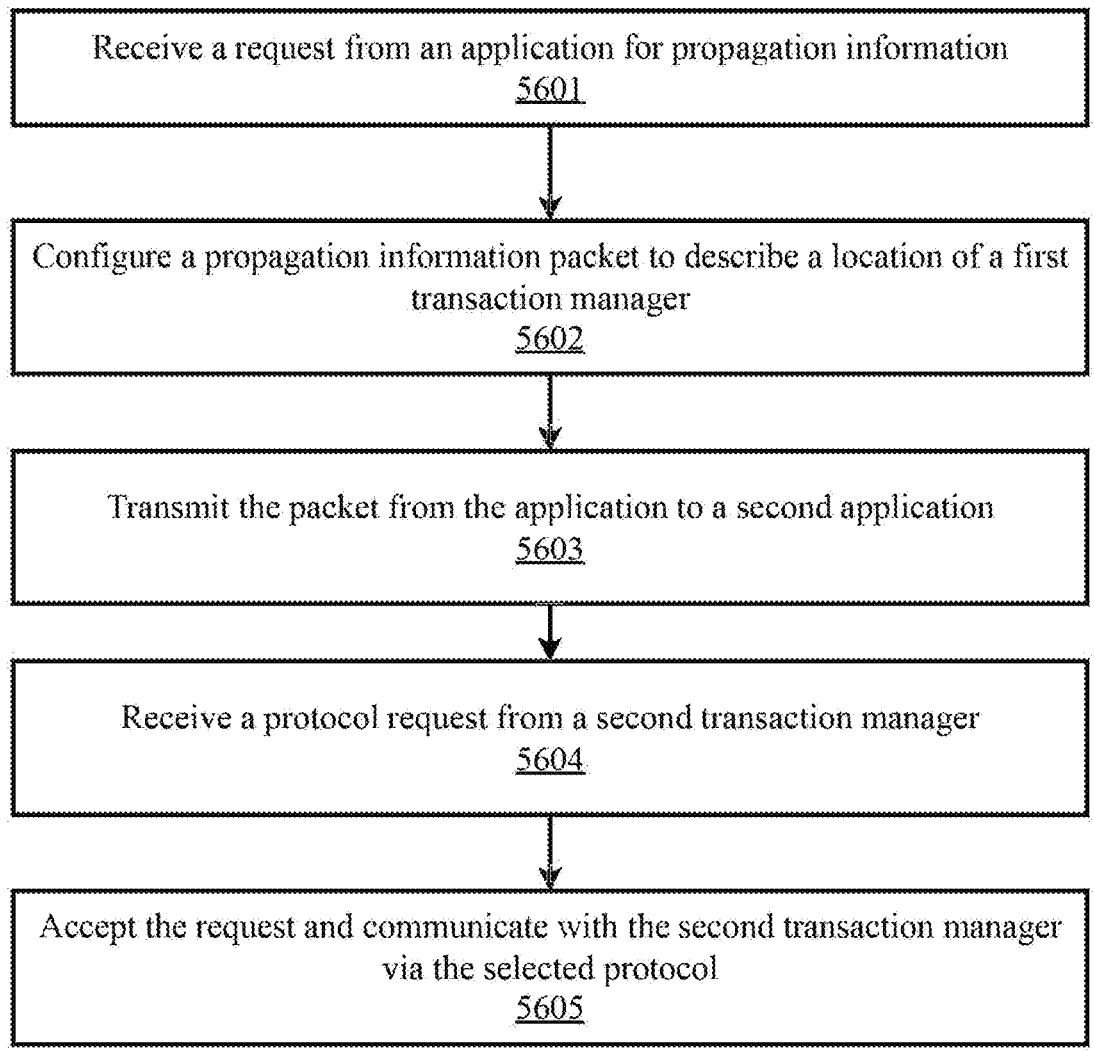
FIG. 56 is a flow diagram illustrating an exemplary method for event-driven data transmission using codebooks with protocol adaption, according to an embodiment.

FIG. 56 is a flow diagram illustrating an exemplary method 5600 for event-driven data transmission using codebooks with protocol adaption, according to an embodiment. According to the embodiment, the process begins at step 5601 when a first transaction manager receives a request from an application for propagation information. At a next step 5602, the first transaction manager configures a propagation information packet to describe the location of the first transaction manager. The propagation information may be a one or more protocol appendices, according to an embodiment. In other embodiments, the propagation information may indicate a specific location within a stored or transmitted protocol appendix. In some embodiments, the propagation information may be encoded using a codebook and an associated protocol appendix attached to the codebook. In such embodiments, the propagation information packet may comprise the codebook, the protocol appendix, or some combination thereof.

At step 5603 the packet is provided to the application for delivery to another application. The other application can have a second transaction manager. At a next step 5604, the first transaction manager receives a protocol request from the second transaction manager. The protocol request can be a request for the first transaction manager to communicate with the second transaction manager via a selected communication protocol associated with the protocol appendix. The communication protocol may be selected by the second transaction manager by decoding the protocol appendix, or a subset thereof, thereby selecting the protocol encoded therein. The communication protocol may be selected by the second transaction manager, accessing the memory area associated with the stored protocol appendix, from the description of the plurality of communication protocols in the memory area. If the selected protocol is not supported by the first transaction manager then the first transaction manager denies the request. If instead, the selected protocol is supported by the first transaction manager then the first transaction manager accepts the request and communicates with the second transaction manager via the selected/decoded protocol to complete the transaction at step 5605.

Figure 51:
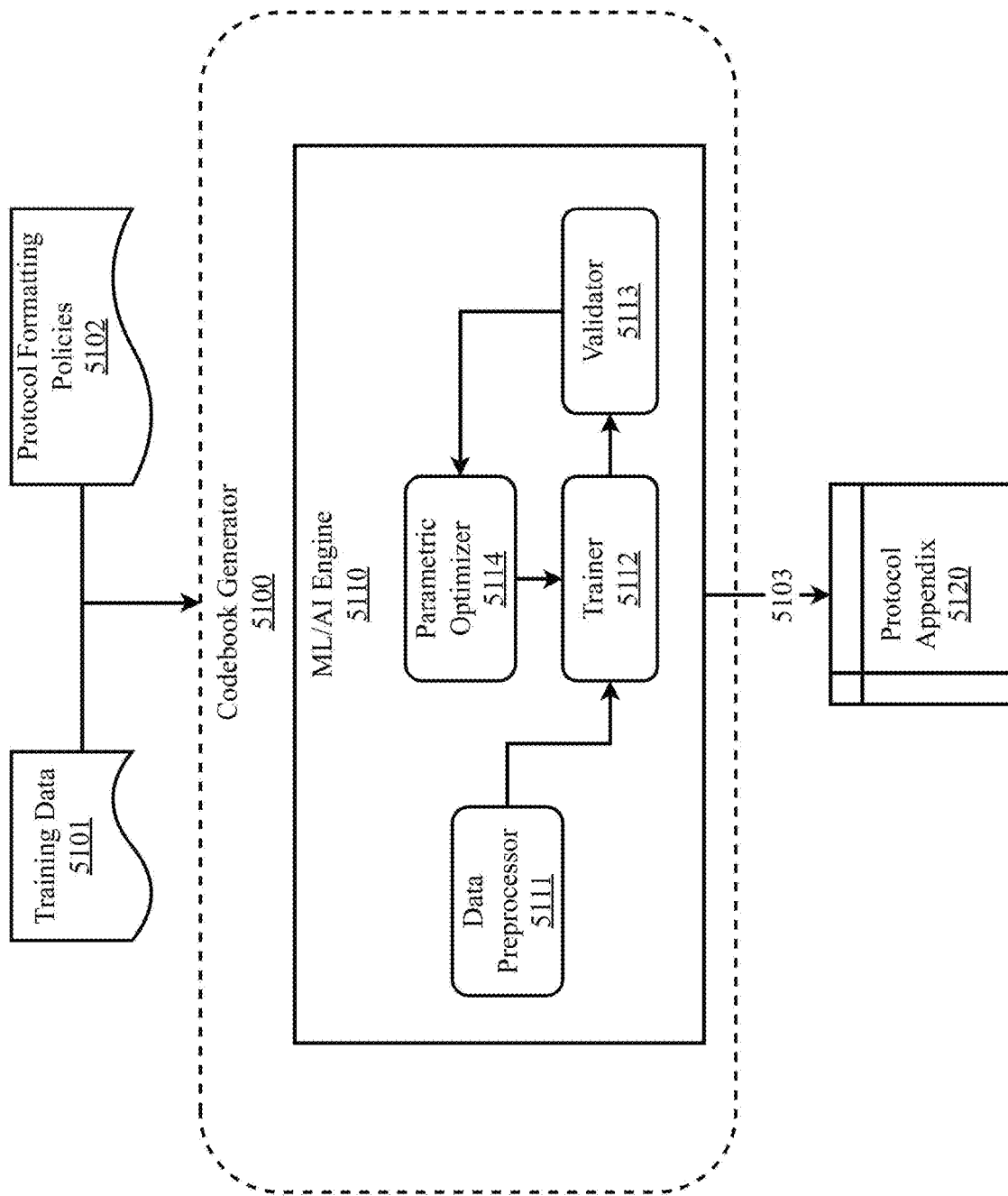
FIG. 51 is a block diagram illustrating an exemplary embodiment of a component of a system for providing compaction with protocol adaption, a codebook generator comprising a machine learning engine.

FIG. 51 is a block diagram illustrating an exemplary embodiment of a component of a system for providing compaction with protocol adaption, a codebook generator comprising a machine learning engine. According to the embodiment, codebook generator 5100 is configured, in addition to codebook generation processes described herein, to generate a protocol appendix 5120 which may be implemented at a decoder, enabling the decoder to return protocol formatted data based on the encoded data. Present in this implementation is a machine learning engine 5110 which may utilize one or more machine/deep learning algorithms and/or artificial intelligence models to aid in the creation of protocol appendix.

As shown, machine learning (ML) engine 5110 may comprise a data preprocessor 5111 configured to receive various types of data which may be used for model/algorithm training, validation, and testing processes. In this exemplary illustration, ML engine 5110 inputs include training data 5101 and protocol policies 5102. The training data 5101 and protocol policies 5102 represent a diverse dataset containing examples of input data from various protocols. Each data sample may be labeled with the corresponding protocol format it represents. For instance, the dataset might contain examples of JSON, XML, Protocol Buffers, and other data formats.

In some implementations, protocol policies may comprise a set of rules, guidelines, and best practices that govern how data should be structured, formatted, transmitted, and handled within an organization or a system. The policy defines the standards and expectations for data exchange and communication, ensuring consistency, security, and interoperability among different components or entities that interact with the data. The specific contents of a data protocol policy can vary depending on the organization's needs, industry, and the types of data being managed. However, a comprehensive data protocol policy may include (but is not limited to) the following elements: data format and structure (e.g., allowed formats and their structures), message protocol standards (e.g., guidelines for using specific communication protocols (HTTP, MQTT, AMQP, etc.)), data transmission and encryption protocols (e.g., TLS/SSL), data validation and sanitation rules, error handling and reporting, data versioning (e.g., evolving data formats, the policy may include guidelines on versioning to ensure backward compatibility and smooth data migration as protocols or data structures evolve), data ownership and access control, data documentation, compliance and regulations, and monitoring and auditing processes.

ML engine 5110 comprises a data preprocessor 5111 configured to receive the plurality of training data 5101 and protocol policies 5102 and perform various data preprocessing tasks including, but not limited to, preparing a training, validation, and test dataset from the plurality of training/protocol data. In some implantations, data preprocessor 511 may perform one or more of, or none of, the following data preprocessing steps: data cleansing, data transformation, data reduction, data normalization, and/or data splitting. Data cleansing may involve, for example, handling missing values (e.g., depending upon the situation, either remove the rows or columns containing missing values, impute them with mean, median, or mode values, or use more advanced techniques like interpolation or regression to fill in the missing data) and removing outliers. Data transformation may comprise feature scaling (e.g., scale numerical features to a similar range to avoid any feature dominating the model due to its larger magnitude; scaling methods include min-max scaling (normalization) and z-score scaling (standardization)), one-hot encoding (e.g., convert categorical variables into binary vectors, making them suitable for machine learning algorithms; each category is represented by a binary vector with a value of 1 in the corresponding category and 0 in all other categories.), and/or feature engineering (e.g., create new features from existing data that may better represent patterns in the data or capture domain-specific insights; may involve combining features, creating interaction terms, or extracting relevant information). Data reduction may comprise dimensionality reduction (e.g., using principal component analysis or t-distributed stochastic neighbor embedding) and/or sampling techniques (e.g., if the dataset is significantly imbalanced, use sampling techniques like oversampling or under sampling to balance the class distribution and avoid biasing the model towards the majority class). Data splitting may comprise dividing the dataset into training, validation, and test sets. The training set is used to train the model, the validation set is used to tune hyperparameters and assess model performance, and the test set is used to evaluate the final model's generalization on unseen data.

In some implementations, data preprocessor 5111 may be configured to perform feature extraction on the dataset to extract relevant features from the input data to represent it in a format that can be processed by the machine learning algorithm. For text based protocols, features might include tokenization, n-grams, or statistical properties of the data.

A preprocessed training dataset may be sent to trainer 5112 which is configured to manage the training, deployment, and storage of one or more machine learning algorithms. The one or more machine/deep learning algorithms may be selected according to the embodiment and particular use case. Suitable algorithms can include, but are not limited to, decision trees, random forest, k-nearest neighbors, support vector machines, or deep learning models like convolutional neural networks. The selected model may be trained on the training data. The model learns to identify patterns and relationships between the extracted features and the labeled characteristics. Characteristics may include, but are not limited to, message structure (e.g., the overall structure of a message, including any headers, metadata, and the actual data payload. The message structure might include information such as message type, version, length, and other relevant fields), data encoding (e.g., how the data within the message is encoded or serialized to be transmitted over a communication channel. Common encoding formats include JSON, XML, Protocol Buffers, and MessagePack, among others), field definitions (e.g., protocol format defines the specific fields within the message and their data types), message semantics (e.g., the meaning and interpretation of the data contained within it; clarifies the purpose of the message and how the data should be processed by the receiver), headers and metadata, and payload.

A validator 5113 is present and configured to evaluate the trained (or in training) model on the validation dataset to assess its performance and fine-tune hyperparameters if necessary, via parametric optimizer 5114. Validator 5113 may utilize evaluation metrics such accuracy, precision, recall, or F1-score. In some implementations, domain knowledge may be incorporated into the analysis process. For example, knowledge of specific network protocols or common data patterns associated with certain file types can guide feature selection and interpretation of the model's output.

A parametric optimizer 5114 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

The output 5103 of the trained model may contribute to the generation of the protocol index 5120, which can be used to provide data manipulation rules such as mapping, transformation, encryption in order to return protocol formatted data at a decoder. For example, unique defining features and characteristics may be identified by a trained model which can then be used to create mappings between the data and the identified features and characteristics which enable protocol appendix to transform encoded data into protocol formatted data.

Figure 52:
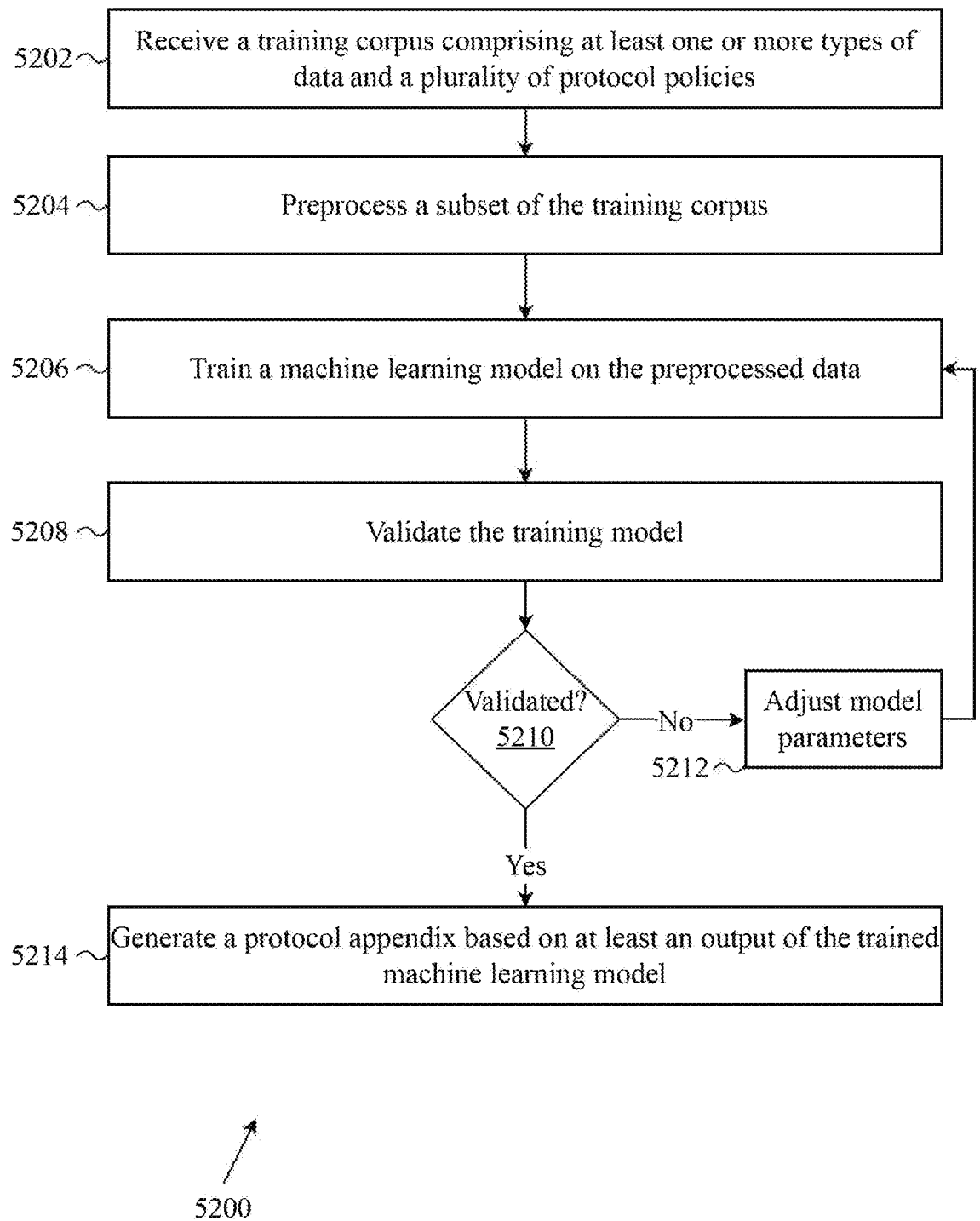
FIG. 52 is a flow diagram illustrating an exemplary method for training a machine/deep learning algorithm configured to generate a protocol appendix, according to an embodiment.

FIG. 52 is a flow diagram illustrating an exemplary method 5200 for training a machine/deep learning algorithm configured to generate a protocol appendix, according to an embodiment. According to the embodiment, the process begins at step 5202 when a codebook generator 5100 receives a training corpus comprising at least one or more types of data and a plurality of protocol policies. For example, if the one or more types of data are to be communicated over a TCP/IP connection, then the plurality of protocol policies may include the TCP/IP protocol, which can result in a protocol appendix which can decode data and format it according to the TCP/IP protocol. Other types of data and protocols (e.g., Hypertext Transfer Protocol, Simple Mail Transfer Protocol, File Transfer Protocol, Simple Network Management Protocol, Message Queuing Telemetry Transport, Extensible Messaging and Presence Protocol, Simple Object Access Protocol, Simple Object Access Protocol, Representational State Transfer, and Websocket, to name a few) may be used. At step 5204 codebook generator 5100 may preprocess a subset of training corpus to prepare one or more datasets for training one or more machine/deep learning algorithms. In some implementations, preprocessing the subset of corpus can include dividing the preprocessed data into a training dataset, a validation dataset, and a test dataset. Codebook generator 5100 may use the training dataset to train one or more machine/deep learning algorithms. The training process may be iterative, wherein the algorithm is trained, validated at step 5208, and if the model does not pass the validation check of 5210, then the process proceeds to step 5212 wherein a parametric optimizer 5114 may be used to adjust model parameters and hyperparameters, and then the process repeats until some criteria is satisfied which indicates the algorithm is validated. For example, after a model has been trained and validated, its performance may be evaluated on the test dataset to get an accurate measure of its accuracy. Once a model has been validated and tested it can be used to generate a protocol appendix at step 5214. The protocol appendix may be appended or otherwise linked to a codebook, thereby forming an appended codebook that can be used by a decoder to decode encoded data into protocol formatted data.

Figure 53:
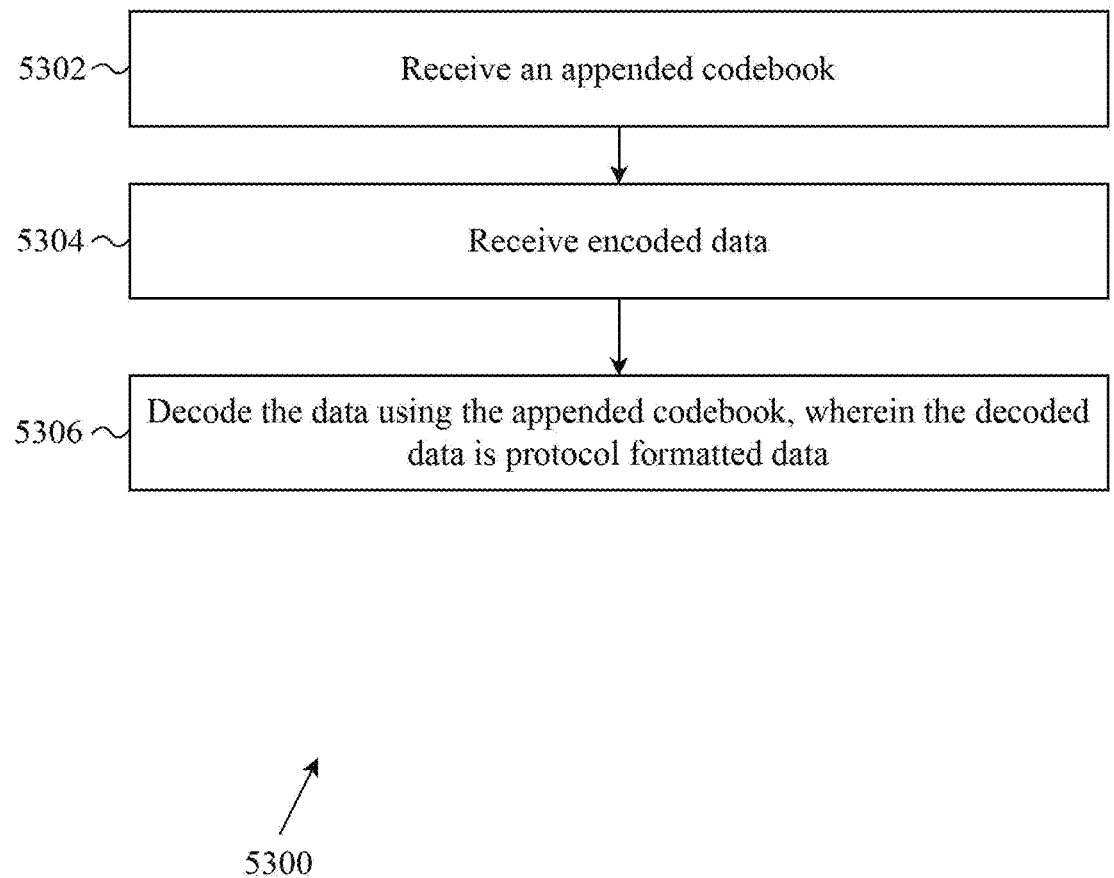
FIG. 53 is a flow diagram illustrating an exemplary method for decoding encoded data into protocol formatted data, according to an embodiment.

FIG. 53 is a flow diagram illustrating an exemplary method 5300 for decoding encoded data into protocol formatted data, according to an embodiment. According to the embodiment, the process begins at step 5302 when a decoder receives an appended codebook from codebook generator 5100. Next, the decoder receives encoded data corresponding to the appended codebook at step 5304. At step 5306 the decoder uses the appended codebook to decode the encoded data, wherein the decoded data is protocol formatted data.

FIG. 1 is a diagram showing an embodiment 100 of the system in which all components of the system are operated locally. As incoming data 101 is received by data deconstruction engine 102. Data deconstruction engine 102 breaks the incoming data into sourceblocks, which are then sent to library manager 103. Using the information contained in sourceblock library lookup table 104 and sourceblock library storage 105, library manager 103 returns reference codes to data deconstruction engine 102 for processing into codewords, which are stored in codeword storage 106. When a data retrieval request 107 is received, data reconstruction engine 108 obtains the codewords associated with the data from codeword storage 106, and sends them to library manager 103. Library manager 103 returns the appropriate sourceblocks to data reconstruction engine 108, which assembles them into the proper order and sends out the data in its original form 109.

Figure 2:
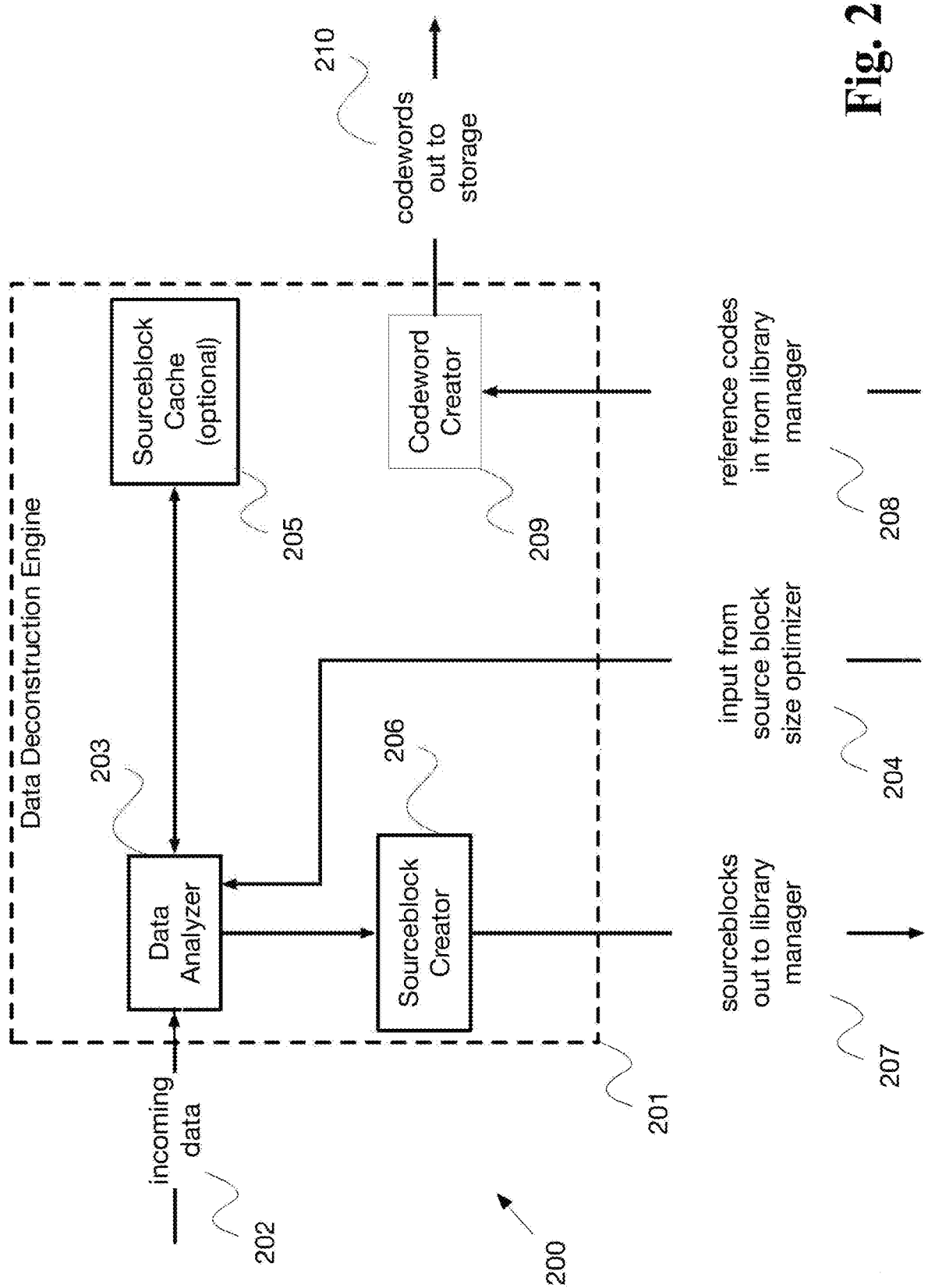
FIG. 2 is a diagram showing an embodiment of one aspect of the system, the data deconstruction engine.

FIG. 2 is a diagram showing an embodiment of one aspect 200 of the system, specifically data deconstruction engine 201. Incoming data 202 is received by data analyzer 203, which optimally analyzes the data based on machine learning algorithms and input 204 from a sourceblock size optimizer, which is disclosed below. Data analyzer may optionally have access to a sourceblock cache 205 of recently-processed sourceblocks, which can increase the speed of the system by avoiding processing in library manager 103. Based on information from data analyzer 203, the data is broken into sourceblocks by sourceblock creator 206, which sends sourceblocks 207 to library manager 203 for additional processing. Data deconstruction engine 201 receives reference codes 208 from library manager 103, corresponding to the sourceblocks in the library that match the sourceblocks sent by sourceblock creator 206, and codeword creator 209 processes the reference codes into codewords comprising a reference code to a sourceblock and a location of that sourceblock within the data set. The original data may be discarded, and the codewords representing the data are sent out to storage 210.

Figure 3:
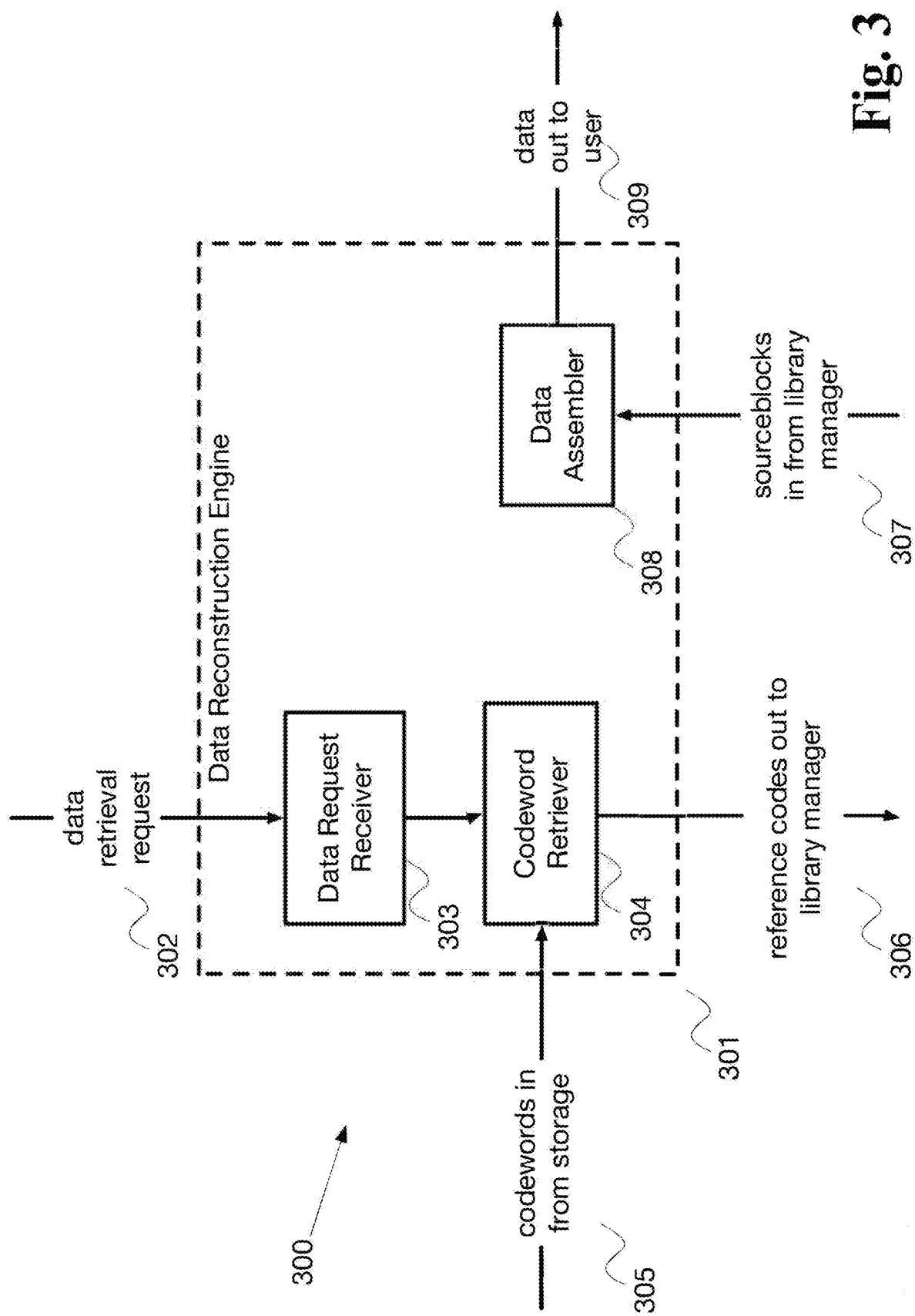
FIG. 3 is a diagram showing an embodiment of one aspect of the system, the data reconstruction engine.

FIG. 3 is a diagram showing an embodiment of another aspect of system 300, specifically data reconstruction engine 301. When a data retrieval request 302 is received by data request receiver 303 (in the form of a plurality of codewords corresponding to a desired final data set), it passes the information to data retriever 304, which obtains the requested data 305 from storage. Data retriever 304 sends, for each codeword received, a reference codes from the codeword 306 to library manager 103 for retrieval of the specific sourceblock associated with the reference code. Data assembler 308 receives the sourceblock 307 from library manager 103 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 309 in its original form.

Figure 4:
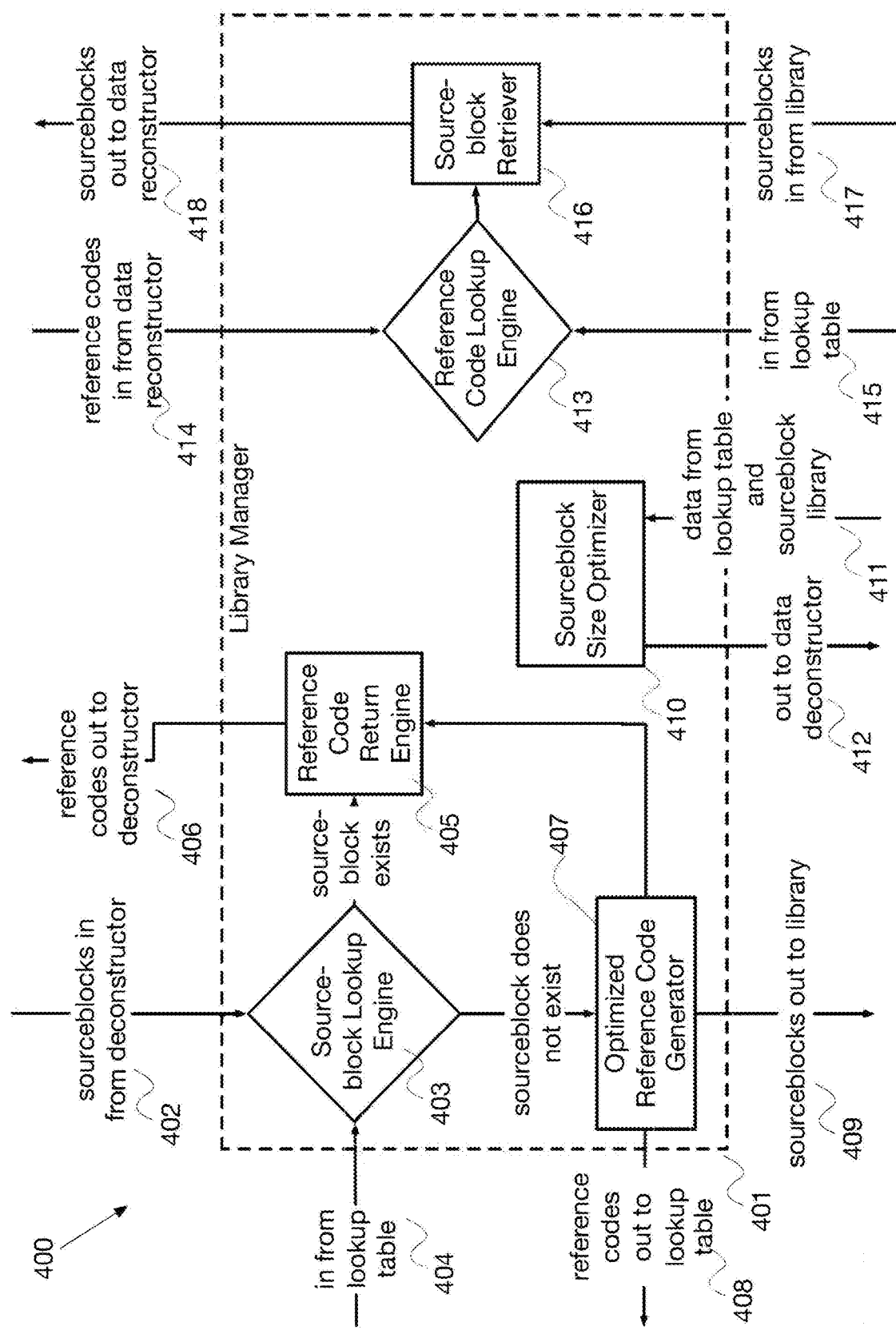
FIG. 4 is a diagram showing an embodiment of one aspect of the system, the library management module.

FIG. 4 is a diagram showing an embodiment of another aspect of the system 400, specifically library manager 401. One function of library manager 401 is to generate reference codes from sourceblocks received from data deconstruction engine 301. As sourceblocks are received 402 from data deconstruction engine 301, sourceblock lookup engine 403 checks sourceblock library lookup table 404 to determine whether those sourceblocks already exist in sourceblock library storage 105. If a particular sourceblock exists in sourceblock library storage 105, reference code return engine 405 sends the appropriate reference code 406 to data deconstruction engine 301. If the sourceblock does not exist in sourceblock library storage 105, optimized reference code generator 407 generates a new, optimized reference code based on machine learning algorithms. Optimized reference code generator 407 then saves the reference code 408 to sourceblock library lookup table 104; saves the associated sourceblock 409 to sourceblock library storage 105; and passes the reference code to reference code return engine 405 for sending 406 to data deconstruction engine 301. Another function of library manager 401 is to optimize the size of sourceblocks in the system. Based on information 411 contained in sourceblock library lookup table 104, sourceblock size optimizer 410 dynamically adjusts the size of sourceblocks in the system based on machine learning algorithms and outputs that information 412 to data analyzer 203. Another function of library manager 401 is to return sourceblocks associated with reference codes received from data reconstruction engine 301. As reference codes are received 414 from data reconstruction engine 301, reference code lookup engine 413 checks sourceblock library lookup table 415 to identify the associated sourceblocks; passes that information to sourceblock retriever 416, which obtains the sourceblocks 417 from sourceblock library storage 105; and passes them 418 to data reconstruction engine 301.

Figure 5:
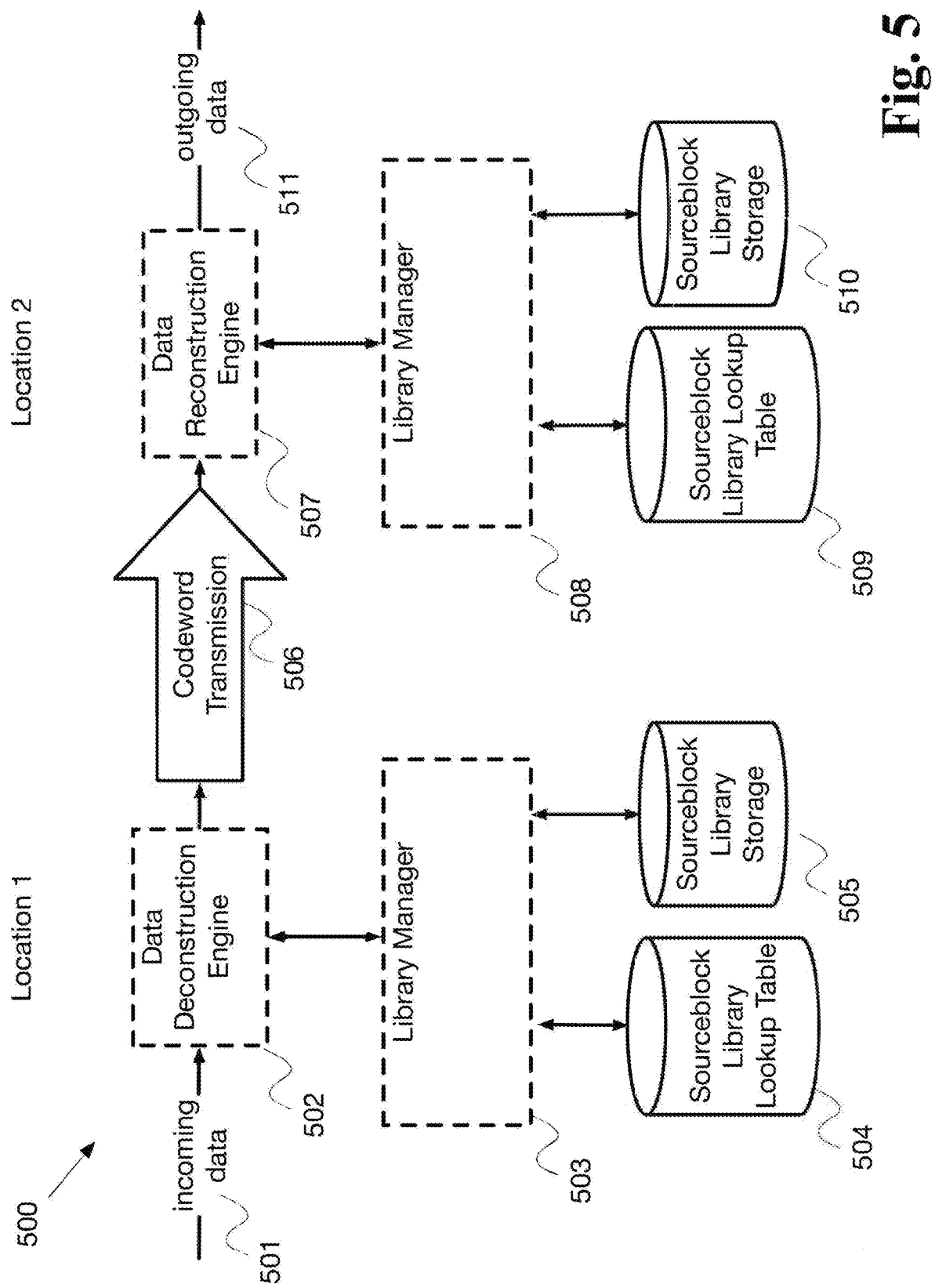
FIG. 5 is a diagram showing another embodiment of the system in which data is transferred between remote locations.

FIG. 5 is a diagram showing another embodiment of system 500, in which data is transferred between remote locations. As incoming data 501 is received by data deconstruction engine 502 at Location 1, data deconstruction engine 301 breaks the incoming data into sourceblocks, which are then sent to library manager 503 at Location 1. Using the information contained in sourceblock library lookup table 504 at Location 1 and sourceblock library storage 505 at Location 1, library manager 503 returns reference codes to data deconstruction engine 301 for processing into codewords, which are transmitted 506 to data reconstruction engine 507 at Location 2. In the case where the reference codes contained in a particular codeword have been newly generated by library manager 503 at Location 1, the codeword is transmitted along with a copy of the associated sourceblock. As data reconstruction engine 507 at Location 2 receives the codewords, it passes them to library manager module 508 at Location 2, which looks up the sourceblock in sourceblock library lookup table 509 at Location 2, and retrieves the associated from sourceblock library storage 510. Where a sourceblock has been transmitted along with a codeword, the sourceblock is stored in sourceblock library storage 510 and sourceblock library lookup table 504 is updated. Library manager 503 returns the appropriate sourceblocks to data reconstruction engine 507, which assembles them into the proper order and sends the data in its original form 511.

Figure 6:
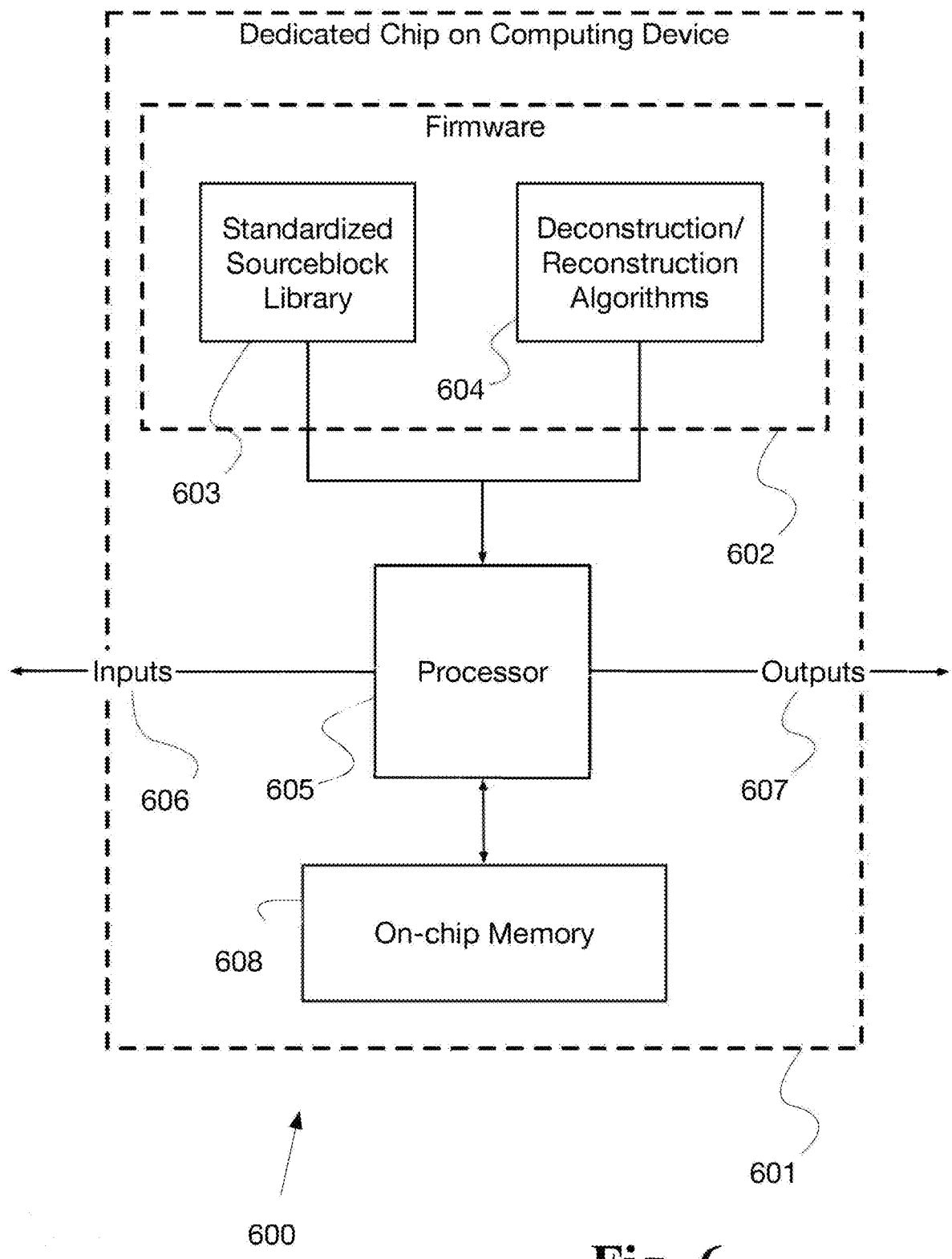
FIG. 6 is a diagram showing an embodiment in which a standardized version of the sourceblock library and associated algorithms would be encoded as firmware on a dedicated processing chip included as part of the hardware of a plurality of devices.

FIG. 6 is a diagram showing an embodiment 600 in which a standardized version of a sourceblock library 603 and associated algorithms 604 would be encoded as firmware 602 on a dedicated processing chip 601 included as part of the hardware of a plurality of devices 600. Contained on dedicated chip 601 would be a firmware area 602, on which would be stored a copy of a standardized sourceblock library 603 and deconstruction/reconstruction algorithms 604 for processing the data. Processor 605 would have both inputs 606 and outputs 607 to other hardware on the device 600. Processor 605 would store incoming data for processing on on-chip memory 608, process the data using standardized sourceblock library 603 and deconstruction/reconstruction algorithms 604, and send the processed data to other hardware on device 600. Using this embodiment, the encoding and decoding of data would be handled by dedicated chip 601, keeping the burden of data processing off device's 600 primary processors. Any device equipped with this embodiment would be able to store and transmit data in a highly optimized, bandwidth-efficient format with any other device equipped with this embodiment.

Figure 12:
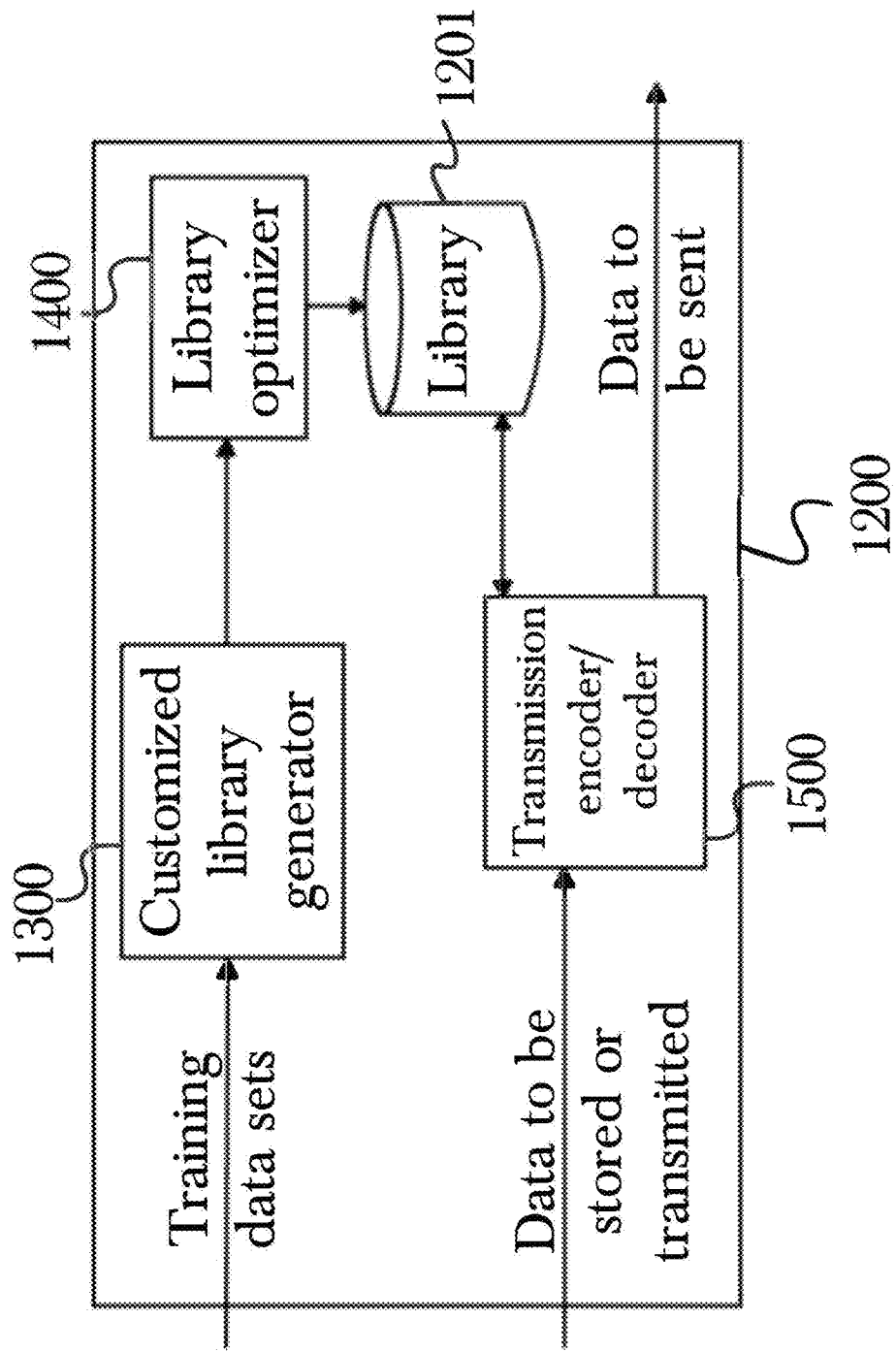
FIG. 12 is a diagram showing an exemplary system architecture, according to a preferred embodiment of the invention.

FIG. 12 is a diagram showing an exemplary system architecture 1200, according to a preferred embodiment of the invention. Incoming training data sets may be received at a customized library generator 1300 that processes training data to produce a customized word library 1201 comprising key-value pairs of data words (each comprising a string of bits) and their corresponding calculated binary Huffman codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data intended for storage or transmission, process the data using a word library 1201 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1200 provides near-instantaneous source coding that is dictionary-based and learned in advance from sample training data, so that encoding and decoding may happen concurrently with data transmission. This results in computational latency that is near zero, but the data size reduction is comparable to classical compression. For example, if N bits are to be transmitted from sender to receiver, the compression ratio of classical compression is C, the ratio between the deflation factor of system 1200 and that of multi-pass source coding is p, the classical compression encoding rate is $R_C$ bit/s and the decoding rate is $R^D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1200 will be (assuming that encoding and decoding happen at least as quickly as network latency):

$$T_{new} = \frac{N_p}{CS}$$

so that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C$=1.1·10$^{12}$, $R_D$=4.2·10$^{12}$, S=10$^{11}$, giving $$\frac{CS}{R_C} + \frac{S}{R_D} = 0.053 \ldots ,$$

such that system 1200 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$\text{delay}_{invention} = \frac{tp}{CS}$$

since encoding and decoding occur concurrently with data transmission. On the other hand, the latency associated with classical compression is $$\text{delay}_{priorart} = \frac{N}{R_C} + \frac{N}{CS} + \frac{N}{CR_D}$$

chosen above as well as N=512K, t=10, and p=1.05, this results in $\text{delay}_{invention} \approx 3.3 \cdot 10^{-10}$ while $\text{delay}_{priorart} \approx 1.3 \cdot 10^{-7}$, a more than 400-fold reduction in latency.

A key factor in the efficiency of Huffman coding used by system 1200 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1200 addresses this by restriction of data types and density estimation; training data is provided that is representative of the type of data anticipated in "real-world" use of system 1200, which is then used to model the distribution of binary strings in the data in order to build a Huffman code word library 1200.

Figure 13:
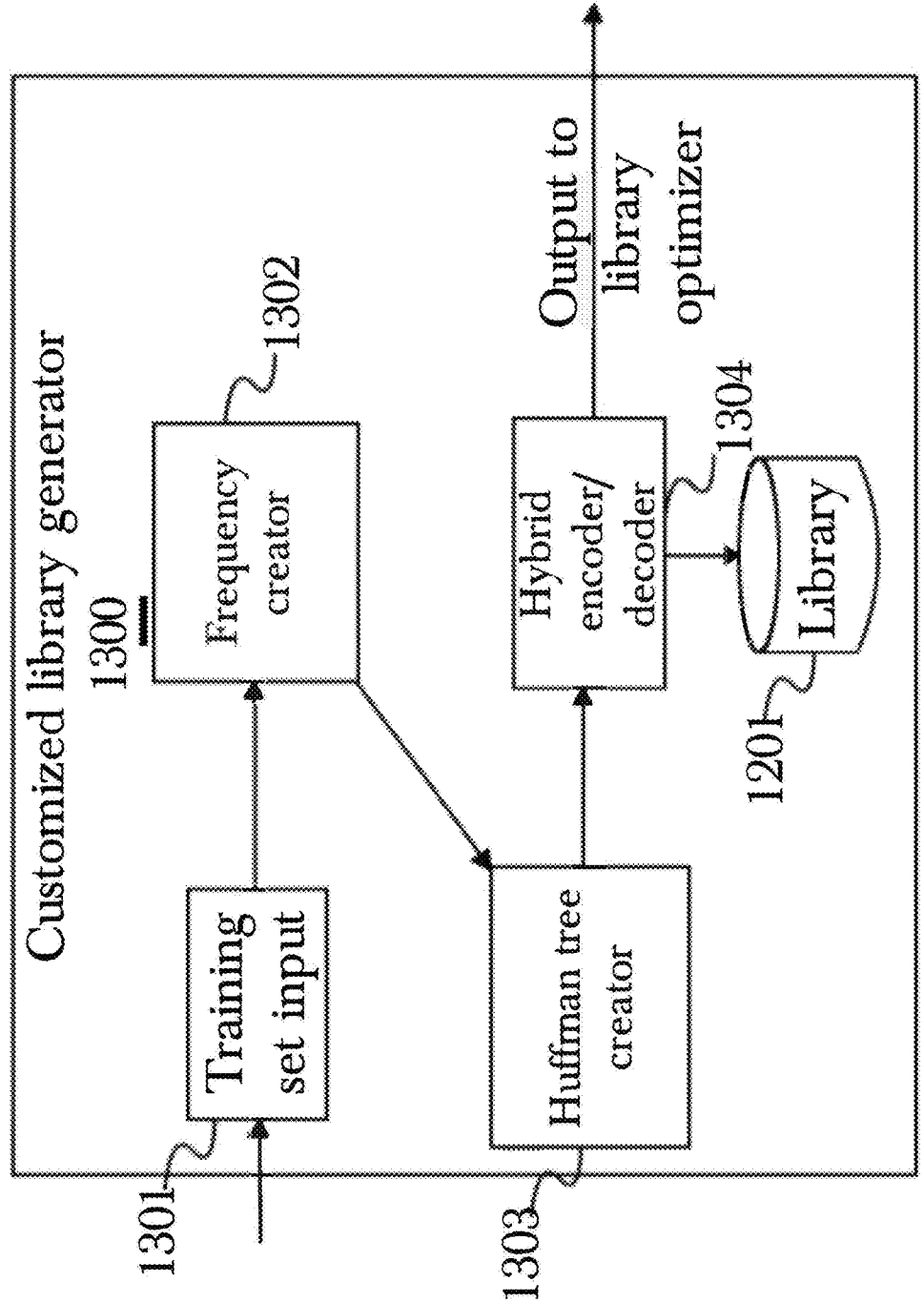
FIG. 13 is a diagram showing a more detailed architecture for a customized library generator.

FIG. 13 is a diagram showing a more detailed architecture for a customized library generator 1300. When an incoming training data set 1301 is received, it may be analyzed using a frequency creator 1302 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yields better results when used with real-world data (rather than, for example, being only based on a single training data set that may not be very similar to a received non-training data set). A second Huffman tree creator 1303 may be utilized to identify words that do not match any existing entries in a word library 1201 and pass them to a hybrid encoder/decoder 1304, that then calculates a binary Huffman codeword for the mismatched word and adds the codeword and original data to the word library 1201 as a new key-value pair. In this manner, customized library generator 1300 may be used both to establish an initial word library 1201 from a first training set, as well as expand the word library 1201 using additional training data to improve operation.

Figure 14:
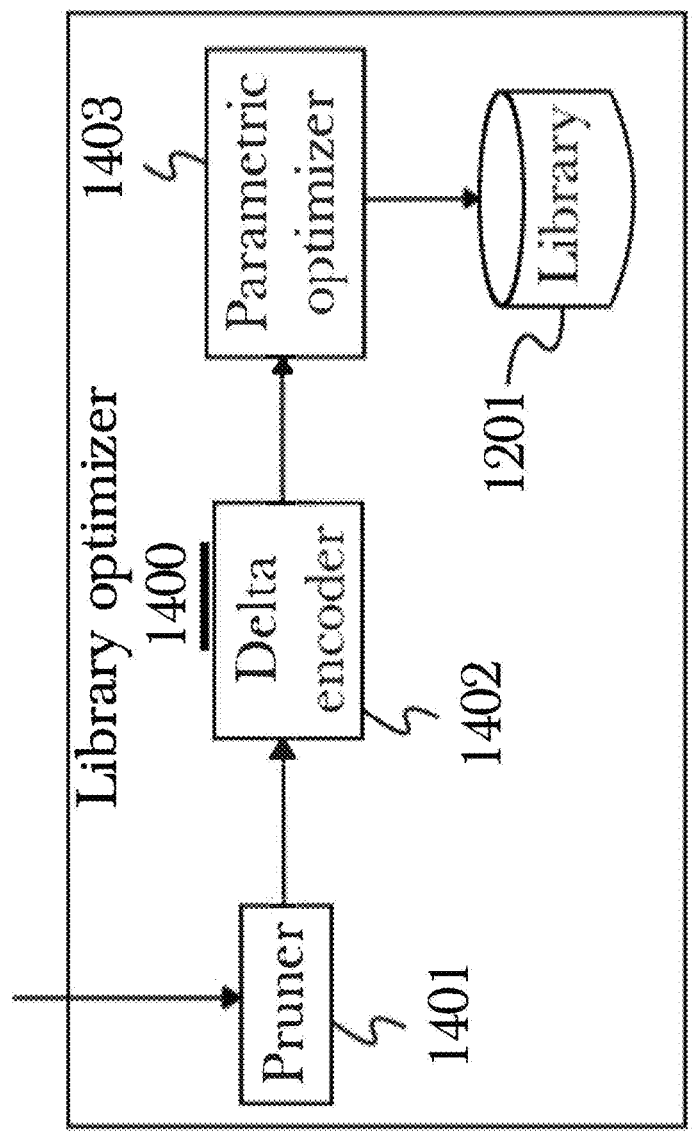
FIG. 14 is a diagram showing a more detailed architecture for a library optimizer.

FIG. 14 is a diagram showing a more detailed architecture for a library optimizer 1400. A pruner 1401 may be used to load a word library 1201 and reduce its size for efficient operation, for example by sorting the word library 1201 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1201 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1402 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1403 may load configuration parameters for operation to optimize the use of the word library 1201 during operation. Best-practice parameter/hyperparameter optimization strategies such as stochastic gradient descent, quasi-random grid search, and evolutionary search may be used to make optimal choices for all inter-dependent settings playing a role in the functionality of system 1200. In cases where lossless compression is not required, the delta value may be discarded at the expense of introducing some limited errors into any decoded (reconstructed) data.

Figure 15:
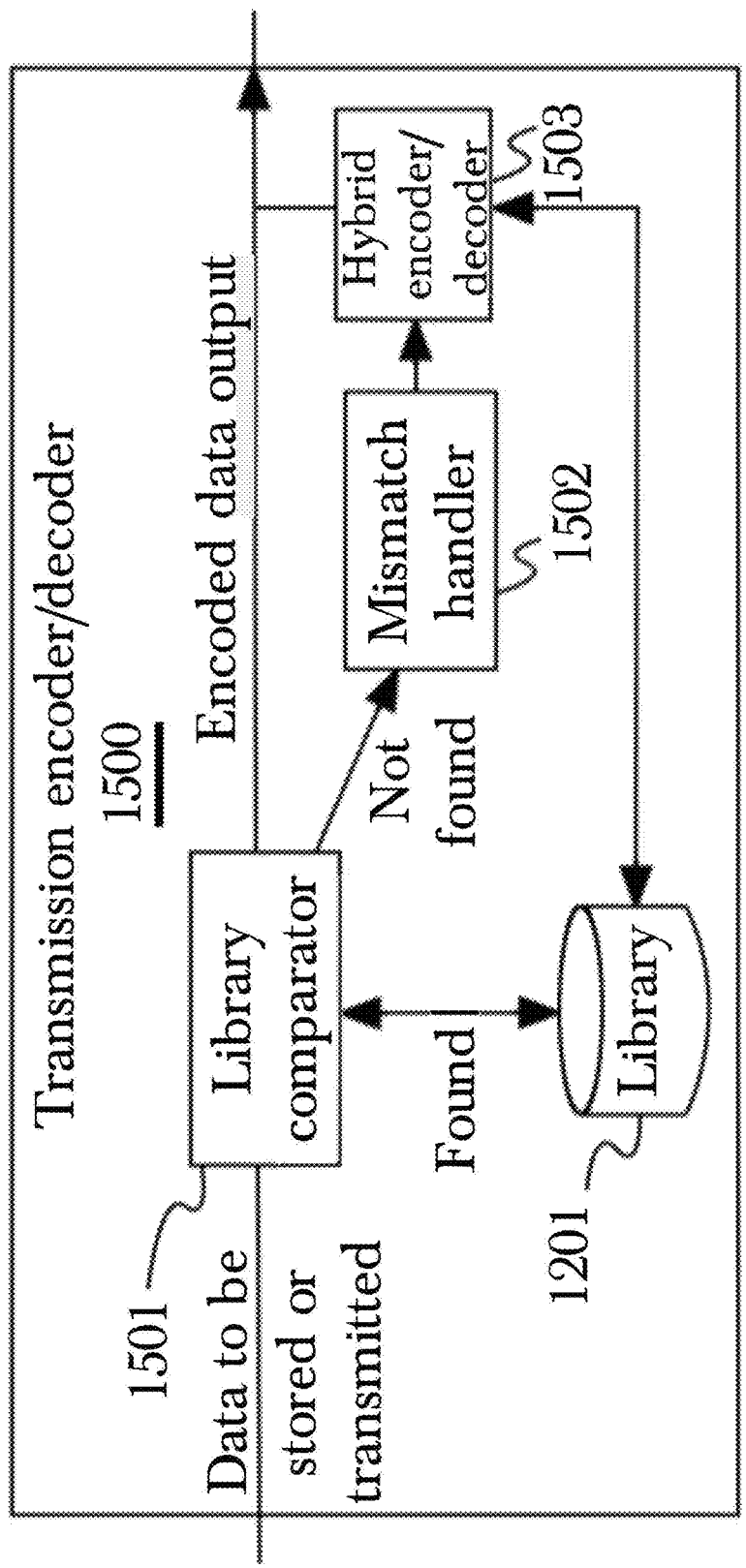
FIG. 15 is a diagram showing a more detailed architecture for a transmission and storage engine.

FIG. 15 is a diagram showing a more detailed architecture for a transmission encoder/decoder 1500. According to various arrangements, transmission encoder/decoder 1500 may be used to deconstruct data for storage or transmission, or to reconstruct data that has been received, using a word library 1201. A library comparator 1501 may be used to receive data comprising words or codewords, and compare against a word library 1201 by dividing the incoming stream into substrings of length t and using a fast hash to check word library 1201 for each substring. If a substring is found in word library 1201, the corresponding key/value (that is, the corresponding source word or codeword, according to whether the substring used in comparison was itself a word or codeword) is returned and appended to an output stream.

If a given substring is not found in word library 1201, a mismatch handler 1502 and hybrid encoder/decoder 1503 may be used to handle the mismatch similarly to operation during the construction or expansion of word library 1201. A mismatch handler 1502 may be utilized to identify words that do not match any existing entries in a word library 1201 and pass them to a hybrid encoder/decoder 1503, that then calculates a binary Huffman codeword for the mismatched word and adds the codeword and original data to the word library 1201 as a new key-value pair. The newly-produced codeword may then be appended to the output stream. In arrangements where a mismatch indicator is included in a received data stream, this may be used to preemptively identify a substring that is not in word library 1201 (for example, if it was identified as a mismatch on the transmission end), and handled accordingly without the need for a library lookup.

Figure 19:
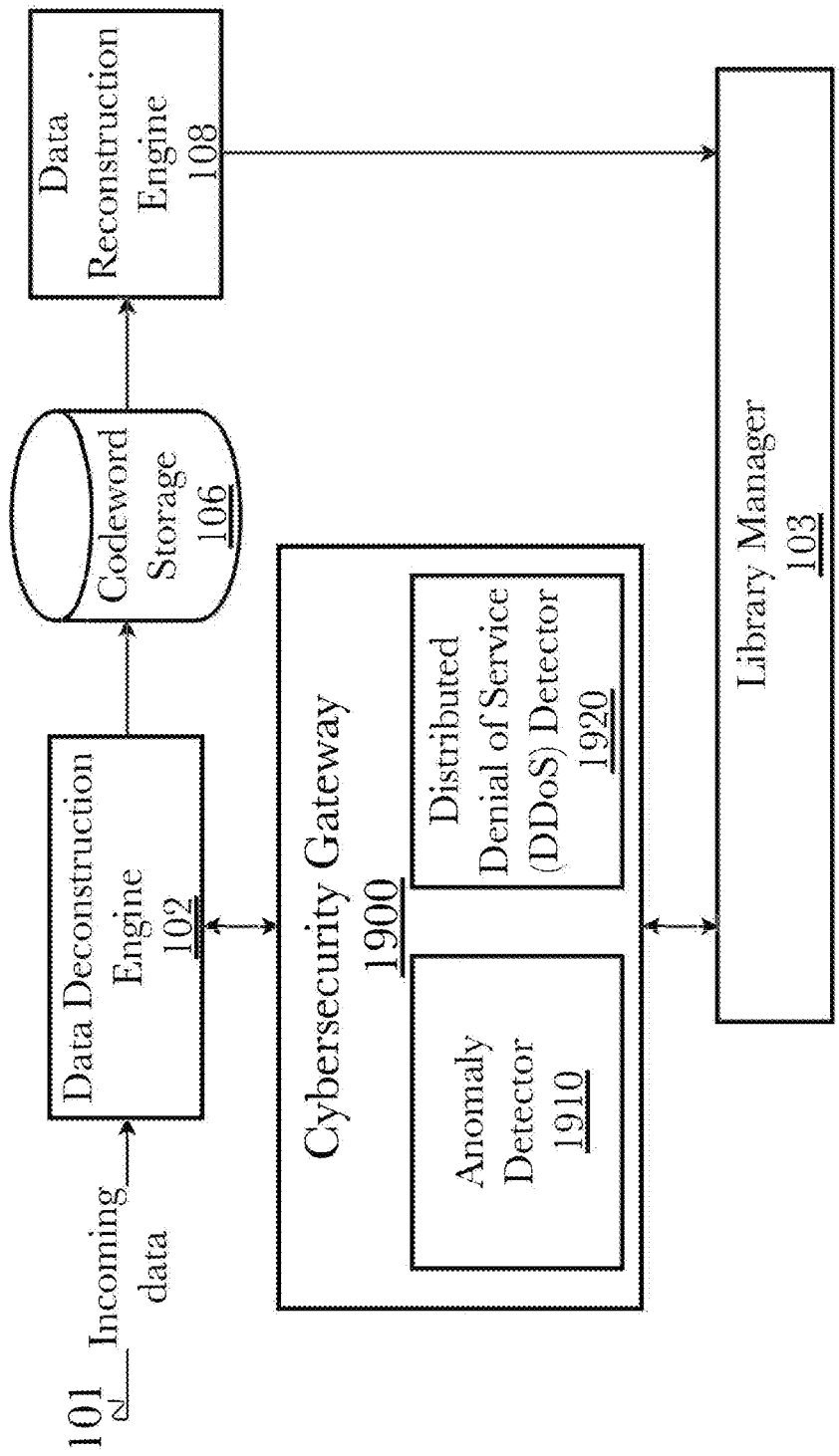
FIG. 19 is an exemplary system architecture of a data encoding system used for cyber security purposes.

FIG. 19 is an exemplary system architecture of a data encoding system used for cyber security purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. However, a cybersecurity gateway 1900 is present, communicating in-between a library manager 103 and a deconstruction engine 102, and containing an anomaly detector 1910 and distributed denial of service (DDoS) detector 1920. The anomaly detector examines incoming data to determine whether there is a disproportionate number of incoming reference codes that do not match reference codes in the existing library. A disproportionate number of non-matching reference codes may indicate that data is being received from an unknown source, of an unknown type, or contains unexpected (possibly malicious) data. If the disproportionate number of non-matching reference codes exceeds an established threshold or persists for a certain length of time, the anomaly detector 1910 raises a warning to a system administrator. Likewise, the DDoS detector 1920 examines incoming data to determine whether there is a disproportionate amount of repetitive data. A disproportionate amount of repetitive data may indicate that a DDoS attack is in progress. If the disproportionate amount of repetitive data exceeds an established threshold or persists for a certain length of time, the DDoS detector 1910 raises a warning to a system administrator. In this way, a data encoding system may detect and warn users of, or help mitigate, common cyber-attacks that result from a flow of unexpected and potentially harmful data, or attacks that result from a flow of too much irrelevant data meant to slow down a network or system, as in the case of a DDoS attack.

Figure 22:
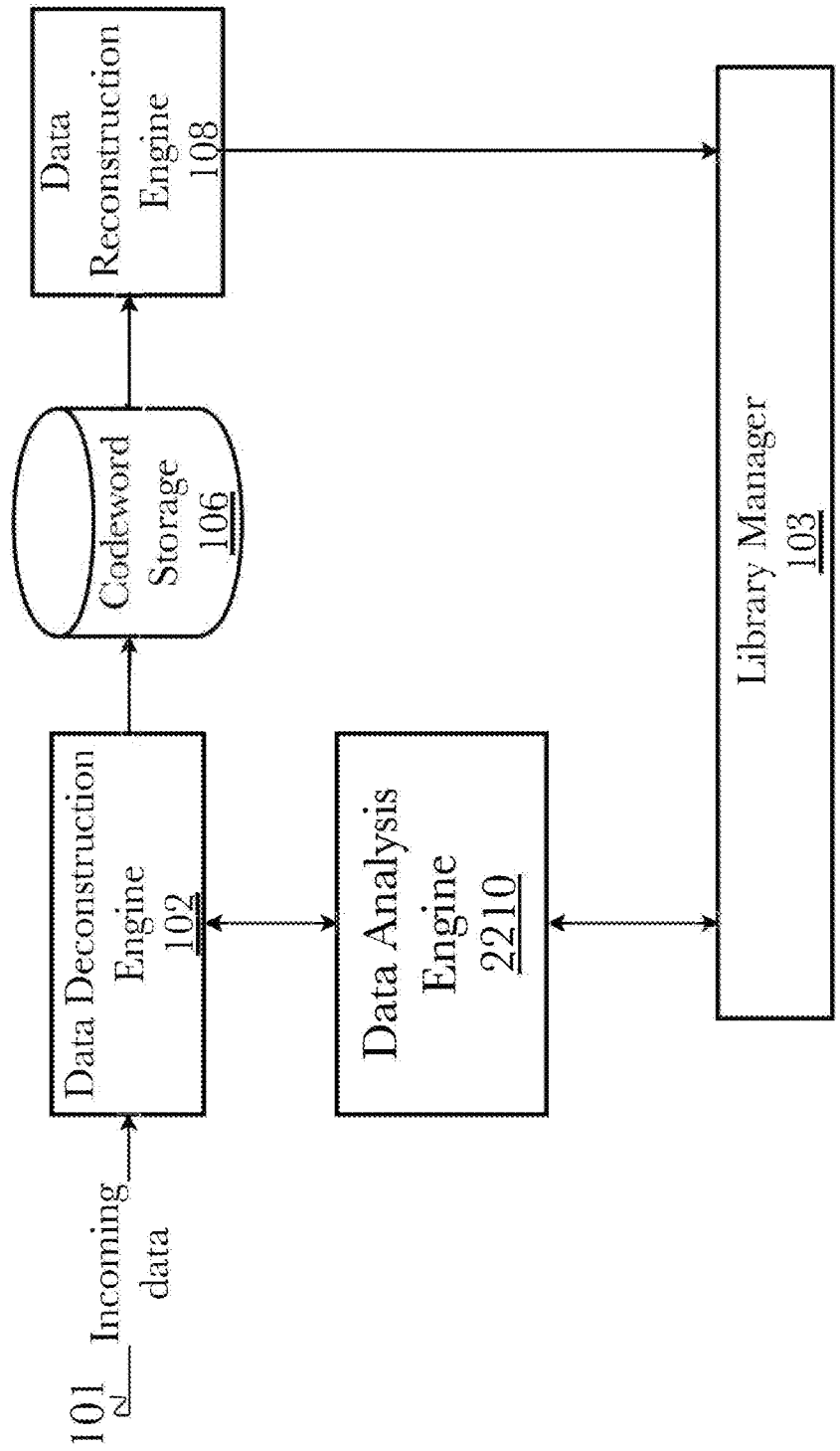
FIG. 22 is an exemplary system architecture of a data encoding system used for data mining and analysis purposes.

FIG. 22 is an exemplary system architecture of a data encoding system used for data mining and analysis purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. A data analysis engine 2210, typically operating while the system is otherwise idle, sends requests for data to the data reconstruction engine 108, which retrieves the codewords representing the requested data from codeword storage 106, reconstructs them into the data represented by the codewords, and sends the reconstructed data to the data analysis engine 2210 for analysis and extraction of useful data (i.e., data mining). Because the speed of reconstruction is significantly faster than decompression using traditional compression technologies (i.e., significantly less decompression latency), this approach makes data mining feasible. Very often, data stored using traditional compression is not mined precisely because decompression lag makes it unfeasible, especially during shorter periods of system idleness. Increasing the speed of data reconstruction broadens the circumstances under which data mining of stored data is feasible.

Figure 24:
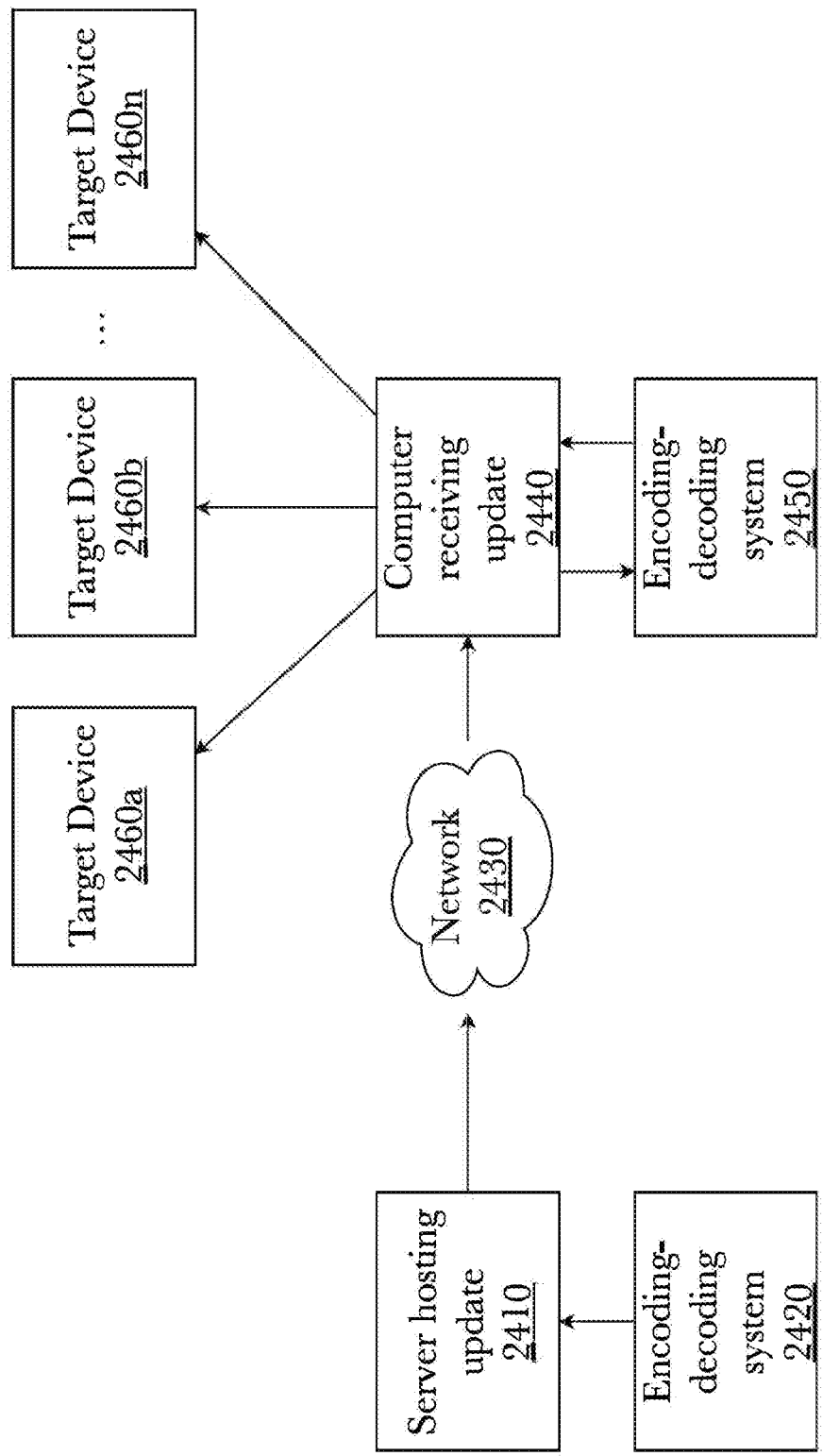
FIG. 24 is an exemplary system architecture of a data encoding system used for remote software and firmware updates.

FIG. 24 is an exemplary system architecture of a data encoding system used for remote software and firmware updates. Software and firmware updates typically require smaller, but more frequent, file transfers. A server which hosts a software or firmware update 2410 may host an encoding-decoding system 2420, allowing for data to be encoded into, and decoded from, sourceblocks or codewords, as disclosed in previous figures. Such a server may possess a software update, operating system update, firmware update, device driver update, or any other form of software update, which in some cases may be minor changes to a file, but nevertheless necessitate sending the new, completed file to the recipient. Such a server is connected over a network 2430, which is further connected to a recipient computer 2440, which may be connected to a server 2410 for receiving such an update to its system. In this instance, the recipient device 2440 also hosts the encoding and decoding system 2450, along with a codebook or library of reference codes that the hosting server 2410 also shares. The updates are retrieved from storage at the hosting server 2410 in the form of codewords, transferred over the network 2430 in the form of codewords, and reconstructed on the receiving computer 2440. In this way, a far smaller file size, and smaller total update size, may be sent over a network. The receiving computer 2440 may then install the updates on any number of target computing devices 2460*a-n*, using a local network or other high-bandwidth connection.

Figure 26:
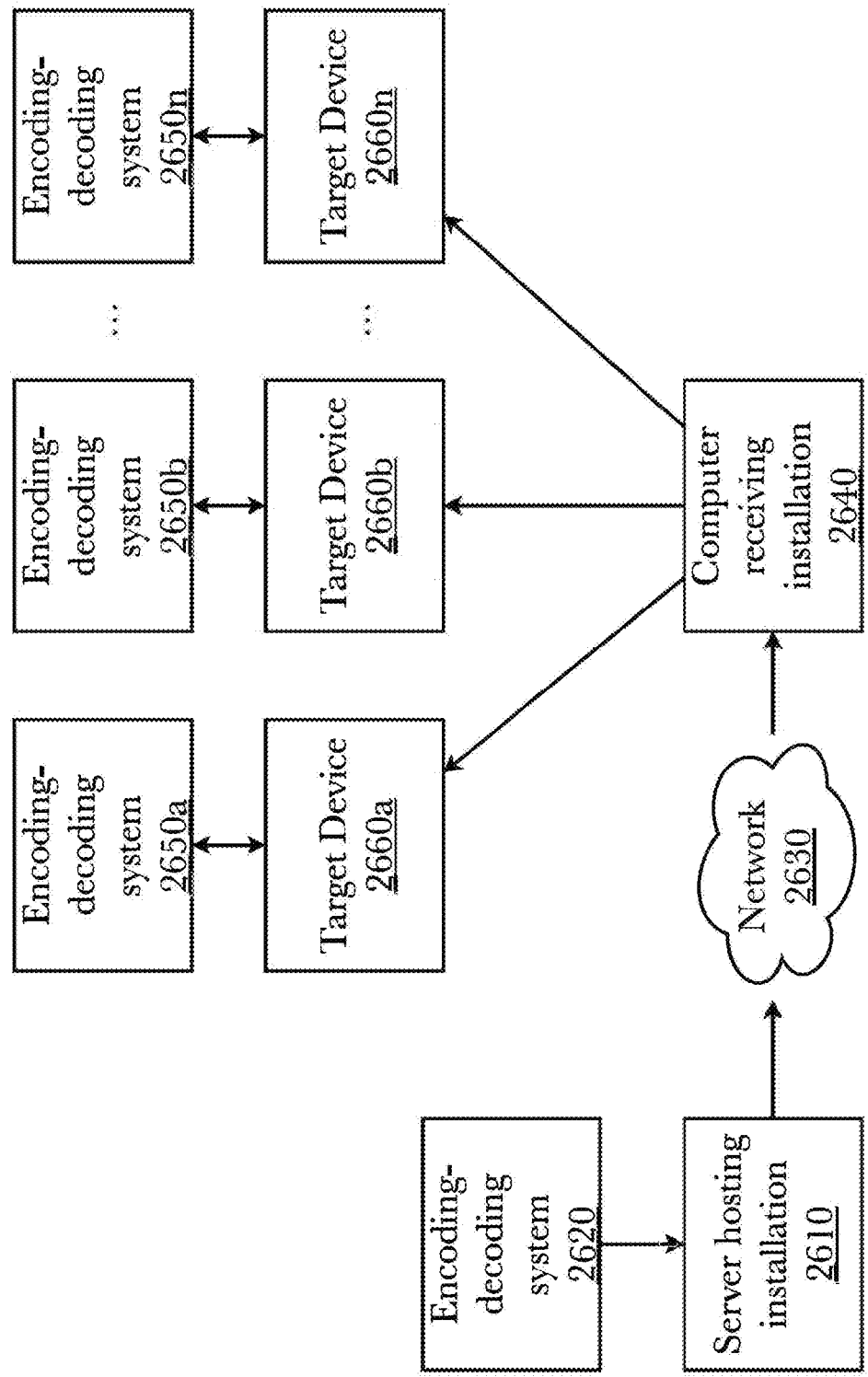
FIG. 26 is an exemplary system architecture of a data encoding system used for large-scale software installation such as operating systems.

FIG. 26 is an exemplary system architecture of a data encoding system used for large-scale software installation such as operating systems. Large-scale software installations typically require very large, but infrequent, file transfers. A server which hosts an installable software 2610 may host an encoding-decoding system 2620, allowing for data to be encoded into, and decoded from, sourceblocks or codewords, as disclosed in previous figures. The files for the large scale software installation are hosted on the server 2610, which is connected over a network 2630 to a recipient computer 2640. In this instance, the encoding and decoding system 2650*a-n* is stored on or connected to one or more target devices 2660*a-n*, along with a codebook or library of reference codes that the hosting server 2610 shares. The software is retrieved from storage at the hosting server 2610 in the form of codewords, and transferred over the network 2630 in the form of codewords to the receiving computer 2640. However, instead of being reconstructed at the receiving computer 2640, the codewords are transmitted to one or more target computing devices, and reconstructed and installed directly on the target devices 2660*a-n*. In this way, a far smaller file size, and smaller total update size, may be sent over a network or transferred between computing devices, even where the network 2630 between the receiving computer 2640 and target devices 2660*a-n* is low bandwidth, or where there are many target devices 2660*a-n*.

Figure 28:
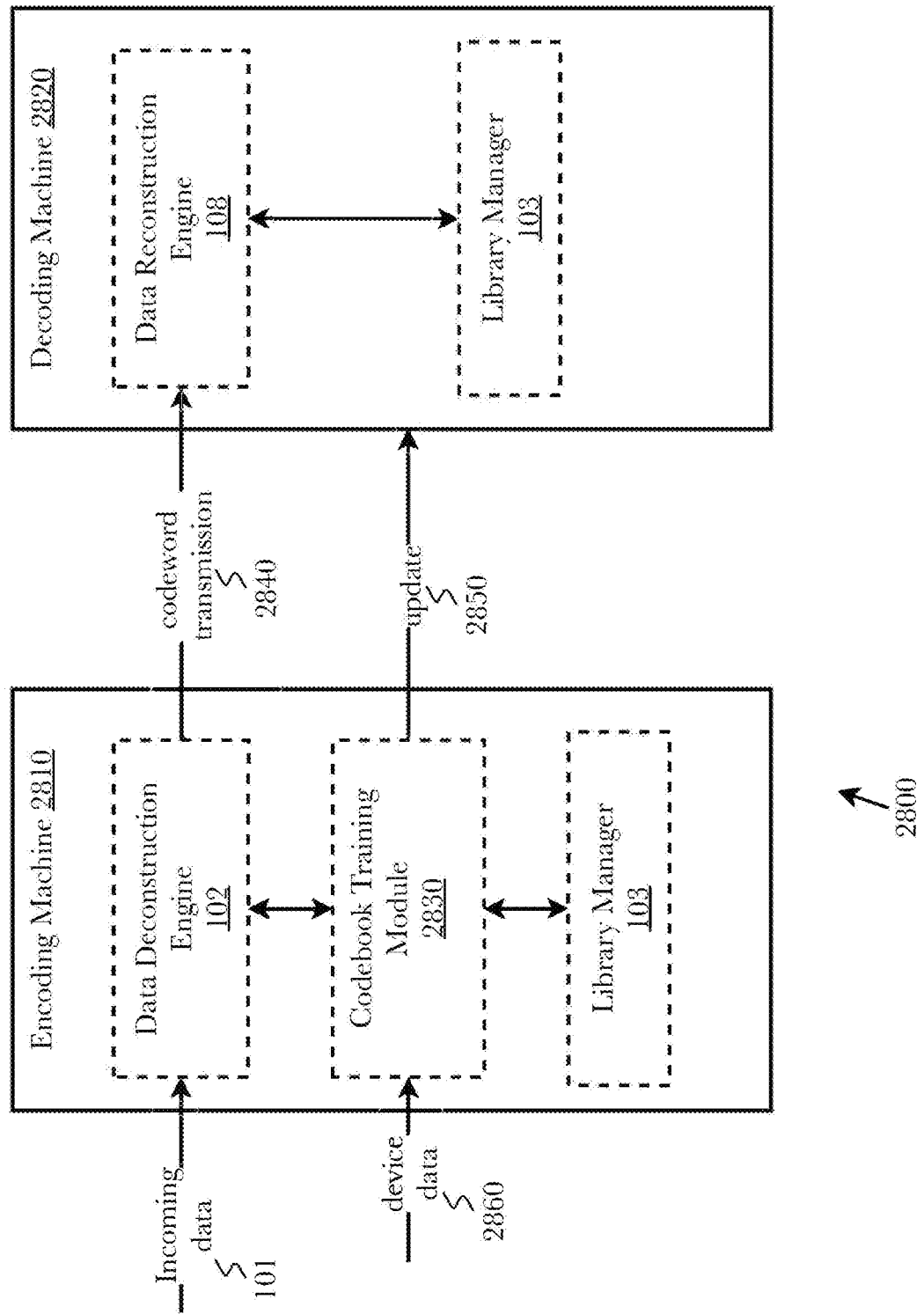
FIG. 28 is a block diagram of an exemplary system architecture of a codebook training system for a data encoding system, according to an embodiment.

FIG. 28 is a block diagram of an exemplary system architecture 2800 of a codebook training system for a data encoding system, according to an embodiment. According to this embodiment, two separate machines may be used for encoding 2810 and decoding 2820. Much like in FIG. 1, incoming data 101 to be deconstructed is sent to a data deconstruction engine 102 residing on encoding machine 2810, which may attempt to deconstruct the data and turn it into a collection of codewords using a library manager 103. Codewords may be transmitted 2840 to a data reconstruction engine 108 residing on decoding machine 2820, which may reconstruct the original data from the codewords, using a library manager 103. However, according to this embodiment, a codebook training module 2830 is present on the decoding machine 2810, communicating in-between a library manager 103 and a deconstruction engine 102. According to other embodiments, codebook training module 2830 may reside instead on decoding machine 2820 if the machine has enough computing resources available; which machine the module 2830 is located on may depend on the system user's architecture and network structure. Codebook training module 2830 may send requests for data to the data reconstruction engine 2810, which routes incoming data 101 to codebook training module 2830. Codebook training module 2830 may perform analyses on the requested data in order to gather information about the distribution of incoming data 101 as well as monitor the encoding/decoding model performance. Additionally, codebook training module 2830 may also request and receive device data 2860 to supervise network connected devices and their processes and, according to some embodiments, to allocate training resources when requested by devices running the encoding system. Devices may include, but are not limited to, encoding and decoding machines, training machines, sensors, mobile computing devices, and Internet-of-things ("IoT") devices. Based on the results of the analyses, the codebook training module 2830 may create a new training dataset from a subset of the requested data in order to counteract the effects of data drift on the encoding/decoding models, and then publish updated 2850 codebooks to both the encoding machine 2810 and decoding machine 2820.

Figure 29:
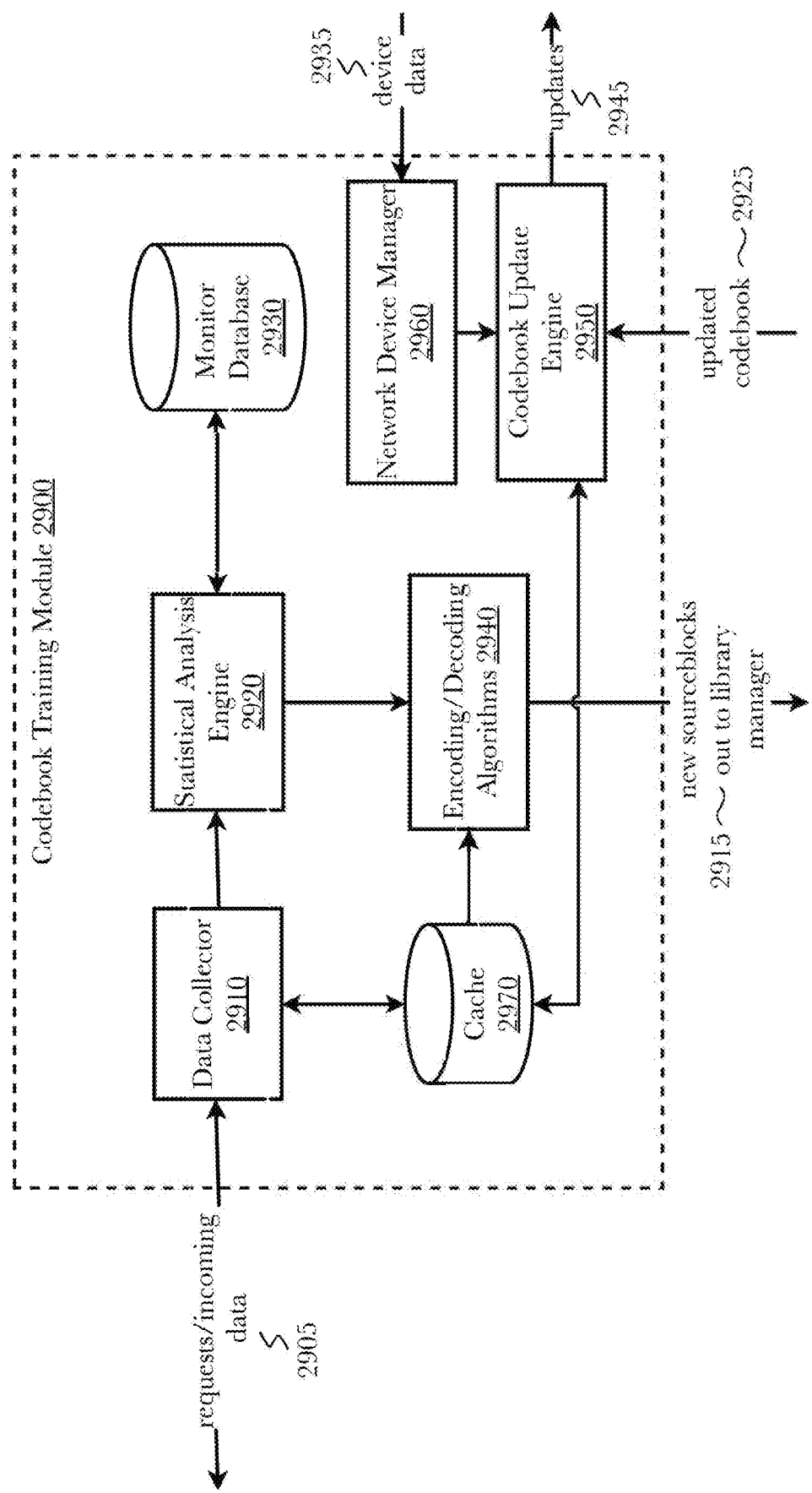
FIG. 29 is a block diagram of an exemplary architecture for a codebook training module, according to an embodiment.

FIG. 29 is a block diagram of an exemplary architecture for a codebook training module 2900, according to an embodiment. According to the embodiment, a data collector 2910 is present which may send requests for incoming data 2905 to a data deconstruction engine 102 which may receive the request and route incoming data to codebook training module 2900 where it may be received by data collector 2910. Data collector 2910 may be configured to request data periodically such as at schedule time intervals, or for example, it may be configured to request data after a certain amount of data has been processed through the encoding machine 2810 or decoding machine 2820. The received data may be a plurality of sourceblocks, which are a series of binary digits, originating from a source packet otherwise referred to as a datagram. The received data may be compiled into a test dataset and temporarily stored in a cache 2970. Once stored, the test dataset may be forwarded to a statistical analysis engine 2920 which may utilize one or more algorithms to determine the probability distribution of the test dataset. Best-practice probability distribution algorithms such as Kullback-Leibler divergence, adaptive windowing, and Jensen-Shannon divergence may be used to compute the probability distribution of training and test datasets. A monitoring database 2930 may be used to store a variety of statistical data related to training datasets and model performance metrics in one place to facilitate quick and accurate system monitoring capabilities as well as assist in system debugging functions. For example, the original or current training dataset and the calculated probability distribution of this training dataset used to develop the current encoding and decoding algorithms may be stored in monitor database 2930.

Since data drifts involve statistical change in the data, the best approach to detect drift is by monitoring the incoming data's statistical properties, the model's predictions, and their correlation with other factors. After statistical analysis engine 2920 calculates the probability distribution of the test dataset it may retrieve from monitor database 2930 the calculated and stored probability distribution of the current training dataset. It may then compare the two probability distributions of the two different datasets in order to verify if the difference in calculated distributions exceeds a predetermined difference threshold. If the difference in distributions does not exceed the difference threshold, that indicates the test dataset, and therefore the incoming data, has not experienced enough data drift to cause the encoding/decoding system performance to degrade significantly, which indicates that no updates are necessary to the existing codebooks. However, if the difference threshold has been surpassed, then the data drift is significant enough to cause the encoding/decoding system performance to degrade to the point where the existing models and accompanying codebooks need to be updated. According to an embodiment, an alert may be generated by statistical analysis engine 2920 if the difference threshold is surpassed or if otherwise unexpected behavior arises.

In the event that an update is required, the test dataset stored in the cache 2970 and its associated calculated probability distribution may be sent to monitor database 2930 for long term storage. This test dataset may be used as a new training dataset to retrain the encoding and decoding algorithms 2940 used to create new sourceblocks based upon the changed probability distribution. The new sourceblocks may be sent out to a library manager 2915 where the sourceblocks can be assigned new codewords. Each new sourceblock and its associated codeword may then be added to a new codebook and stored in a storage device. The new and updated codebook may then be sent back 2925 to codebook training module 2900 and received by a codebook update engine 2950. Codebook update engine 2950 may temporarily store the received updated codebook in the cache 2970 until other network devices and machines are ready, at which point codebook update engine 2950 will publish the updated codebooks 2945 to the necessary network devices.

A network device manager 2960 may also be present which may request and receive network device data 2935 from a plurality of network connected devices and machines. When the disclosed encoding system and codebook training system 2800 are deployed in a production environment, upstream process changes may lead to data drift, or other unexpected behavior. For example, a sensor being replaced that changes the units of measurement from inches to centimeters, data quality issues such as a broken sensor always reading 0, and covariate shift which occurs when there is a change in the distribution of input variables from the training set. These sorts of behavior and issues may be determined from the received device data 2935 in order to identify potential causes of system error that is not related to data drift and therefore does not require an updated codebook. This can save network resources from being unnecessarily used on training new algorithms as well as alert system users to malfunctions and unexpected behavior devices connected to their networks. Network device manager 2960 may also utilize device data 2935 to determine available network resources and device downtime or periods of time when device usage is at its lowest. Codebook update engine 2950 may request network and device availability data from network device manager 2960 in order to determine the most optimal time to transmit updated codebooks (i.e., trained libraries) to encoder and decoder devices and machines.

Figure 30:
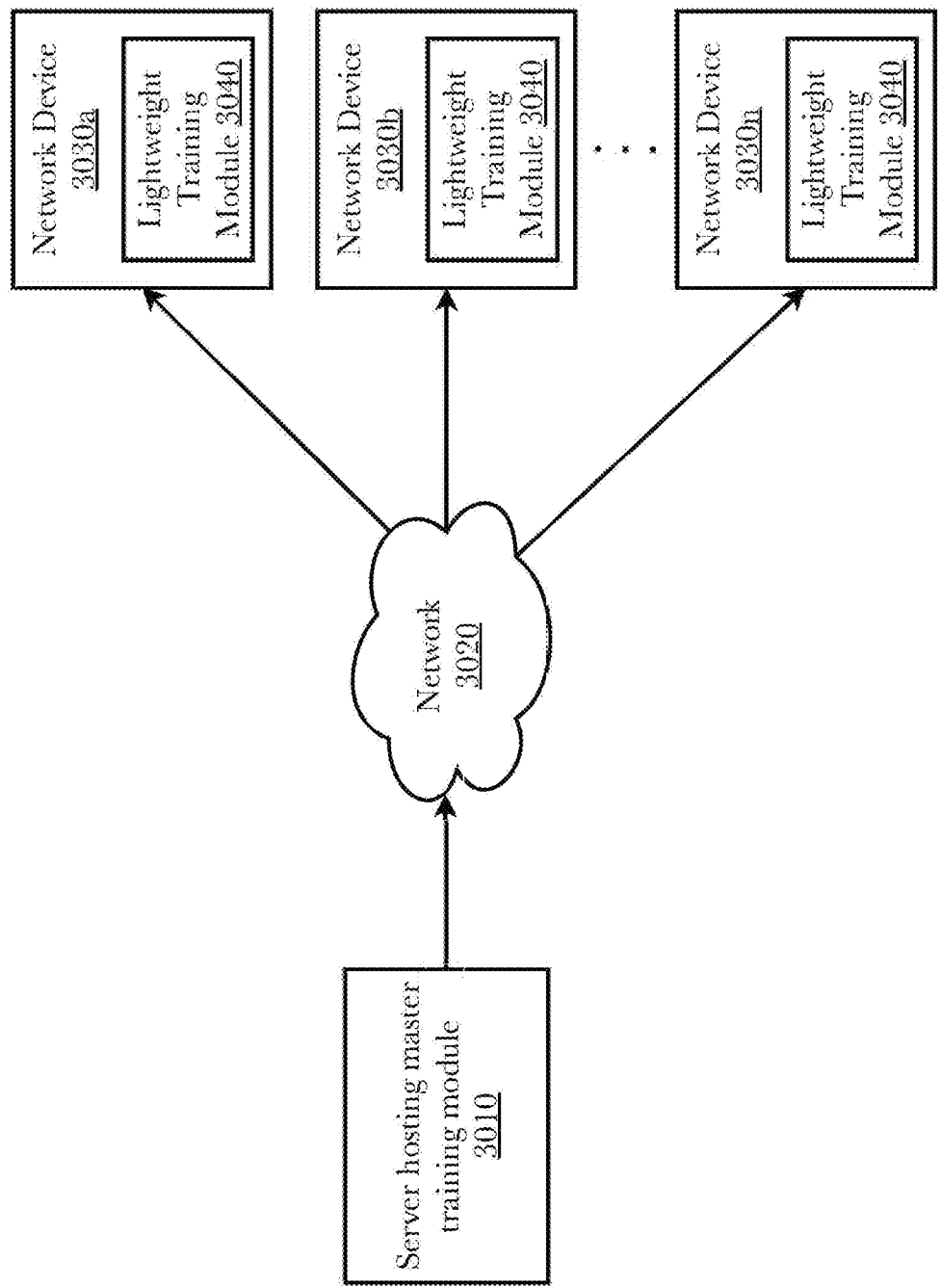
FIG. 30 is a block diagram of another embodiment of the codebook training system using a distributed architecture and a modified training module.

FIG. 30 is a block diagram of another embodiment of the codebook training system using a distributed architecture and a modified training module. According to an embodiment, there may be a server which maintains a master supervisory process over remote training devices hosting a master training module 3010 which communicates via a network 3020 to a plurality of connected network devices 3030a-n. The server may be located at the remote training end such as, but not limited to, cloud-based resources, a user-owned data center, etc. The master training module located on the server operates similarly to the codebook training module disclosed in FIG. 29 above, however, the server 3010 utilizes the master training module via the network device manager 2960 to farm out training resources to network devices 3030a-n. The server 3010 may allocate resources in a variety of ways, for example, round-robin, priority-based, or other manner, depending on the user needs, costs, and number of devices running the encoding/decoding system. Server 3010 may identify elastic resources which can be employed if available to scale up training when the load becomes too burdensome. On the network devices 3030a-n may be present a lightweight version of the training module 3040 that trades a little suboptimality in the codebook for training on limited machinery and/or makes training happen in low-priority threads to take advantage of idle time. In this way the training of new encoding/decoding algorithms may take place in a distributed manner which allows data gathering or generating devices to process and train on data gathered locally, which may improve system latency and optimize available network resources.

Figure 32:
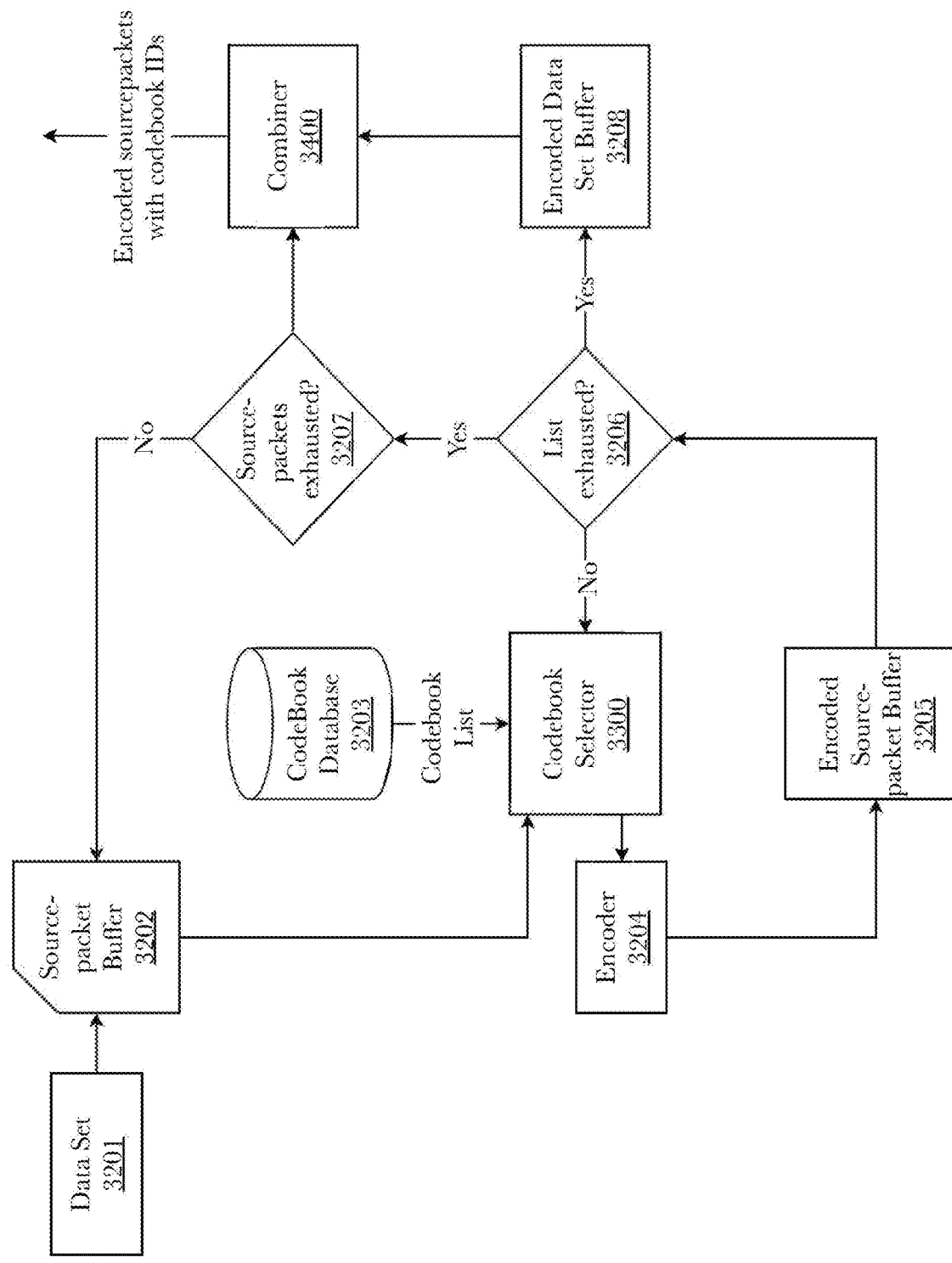
FIG. 32 is an exemplary system architecture for an encoding system with multiple codebooks.

FIG. 32 is an exemplary system architecture for an encoding system with multiple codebooks. A data set to be encoded 3201 is sent to a source packet buffer 3202. The source packet buffer is an array which stores the data which is to be encoded and may contain a plurality of source packets. Each source packet is routed to a codebook selector 3300, which retrieves a list of codebooks from a codebook database 3203. The source packet is encoded using the first codebook on the list via an encoder 3204, and the output is stored in an encoded source packet buffer 3205. The process is repeated with the same source packet using each subsequent codebook on the list until the list of codebooks is exhausted 3206, at which point the most compact encoded version of the source packet is selected from the encoded source packet buffer 3205 and sent to an encoded data set buffer 3208 along with the ID of the codebook used to produce it. The source packet buffer 3202 is determined to be exhausted 3207, a notification is sent to a combiner 3400, which retrieves all of the encoded source packets and codebook IDs from the encoded data set buffer 3208, and combines them into a single file for output.

According to an embodiment, the list of codebooks used in encoding the data set may be consolidated to a single codebook which is provided to the combiner 3400 for output along with the encoded source packets and codebook IDs. In this case, the single codebook will contain the data from, and codebook IDs of, each of the codebooks used to encode the data set. This may provide a reduction in data transfer time, although it is not required since each source packet (or sourceblock) will contain a reference to a specific codebook ID which references a codebook that can be pulled from a database or be sent alongside the encoded data to a receiving device for the decoding process.

In some embodiments, each source packet of a data set 3201 arriving at the encoder 3204 is encoded using a different sourceblock length. Changing the sourceblock length changes the encoding output of a given codebook. Two source packets encoded with the same codebook but using different sourceblock lengths would produce different encoded outputs. Therefore, changing the sourceblock length of some or all source packets in a data set 3201 provides additional security. Even if the codebook was known, the sourceblock length would have to be known or derived for each sourceblock in order to decode the data set 3201. Changing the sourceblock length may be used in conjunction with the use of multiple codebooks.

Figure 33:
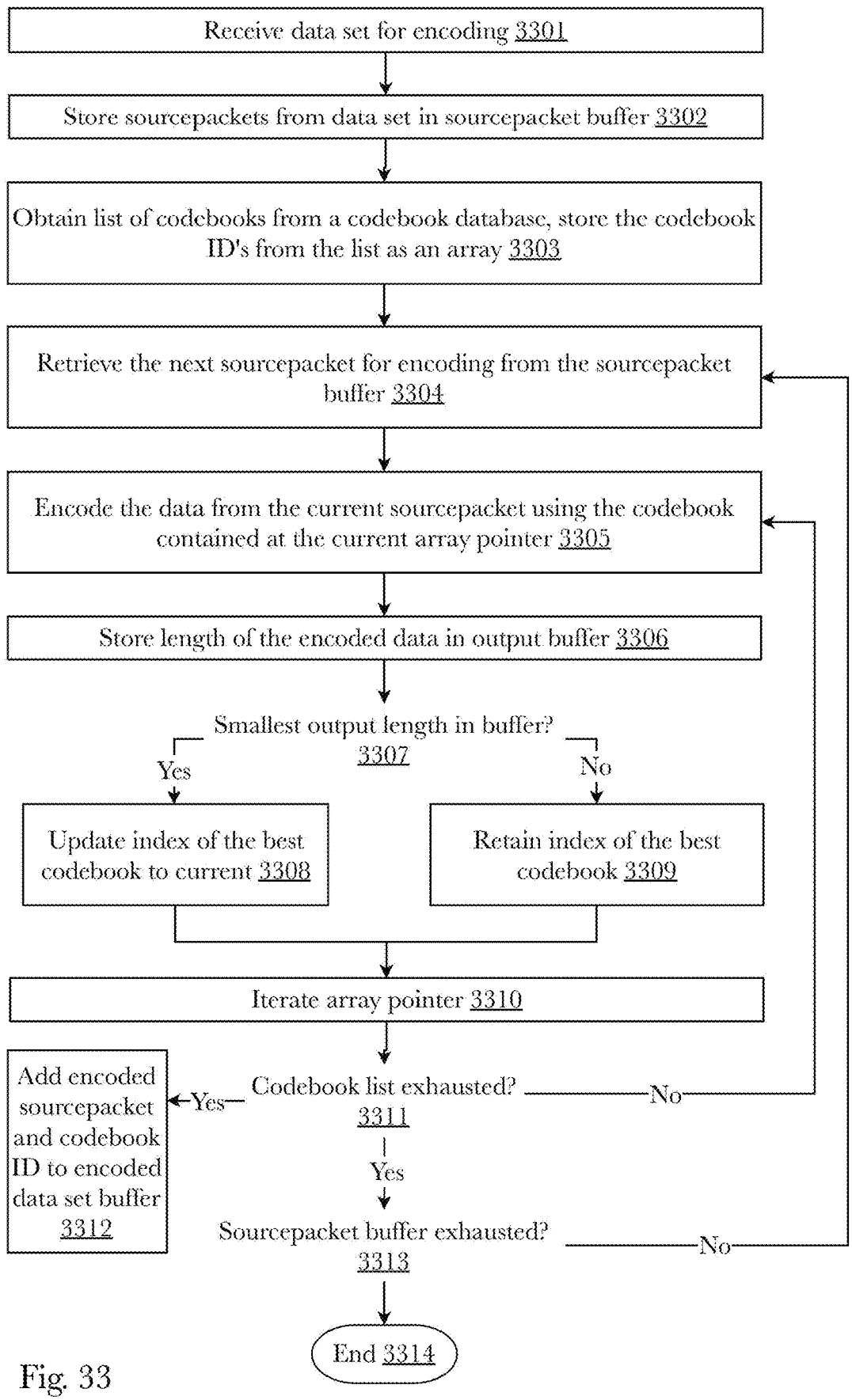
FIG. 33 is a flow diagram describing an exemplary algorithm for encoding of data using multiple codebooks.

FIG. 33 is a flow diagram describing an exemplary algorithm for encoding of data using multiple codebooks. A data set is received for encoding 3301, the data set comprising a plurality of source packets. The source packets are stored in a source packet buffer 3302. A list of codebooks to be used for multiple codebook encoding is retrieved from a codebook database (which may contain more codebooks than are contained in the list) and the codebook IDs for each codebook on the list are stored as an array 3303. The next source packet in the source packet buffer is retrieved from the source packet buffer for encoding 3304. The source packet is encoded using the codebook in the array indicated by a current array pointer 3305. The encoded source packet and length of the encoded source packet is stored in an encoded source packet buffer 3306. If the length of the most recently stored source packet is the shortest in the buffer 3307, an index in the buffer is updated to indicate that the codebook indicated by the current array pointer is the most efficient codebook in the buffer for that source packet. If the length of the most recently stored source packet is not the shortest in the buffer 3307, the index in the buffer is not updated 3308 because a previous codebook used to encode that source packet was more efficient 3309. The current array pointer is iterated to select the next codebook in the list 3310. If the list of codebooks has not been exhausted 3311, the process is repeated for the next codebook in the list, starting at step 3305. If the list of codebooks has been exhausted 3311, the encoded source packet in the encoded source packet buffer (the most compact version) and the codebook ID for the codebook that encoded it are added to an encoded data set buffer 3312 for later combination with other encoded source packets from the same data set. At that point, the source packet buffer is checked to see if any source packets remain to be encoded 3313. If the source packet buffer is not exhausted, the next source packet is retrieved 3304 and the process is repeated starting at step 3304. If the source packet buffer is exhausted 3313, the encoding process ends 3314. In some embodiments, rather than storing the encoded source packet itself in the encoded source packet buffer, a universal unique identification (UUID) is assigned to each encoded source packet, and the UUID is stored in the encoded source packet buffer instead of the entire encoded source packet.

Figure 34:
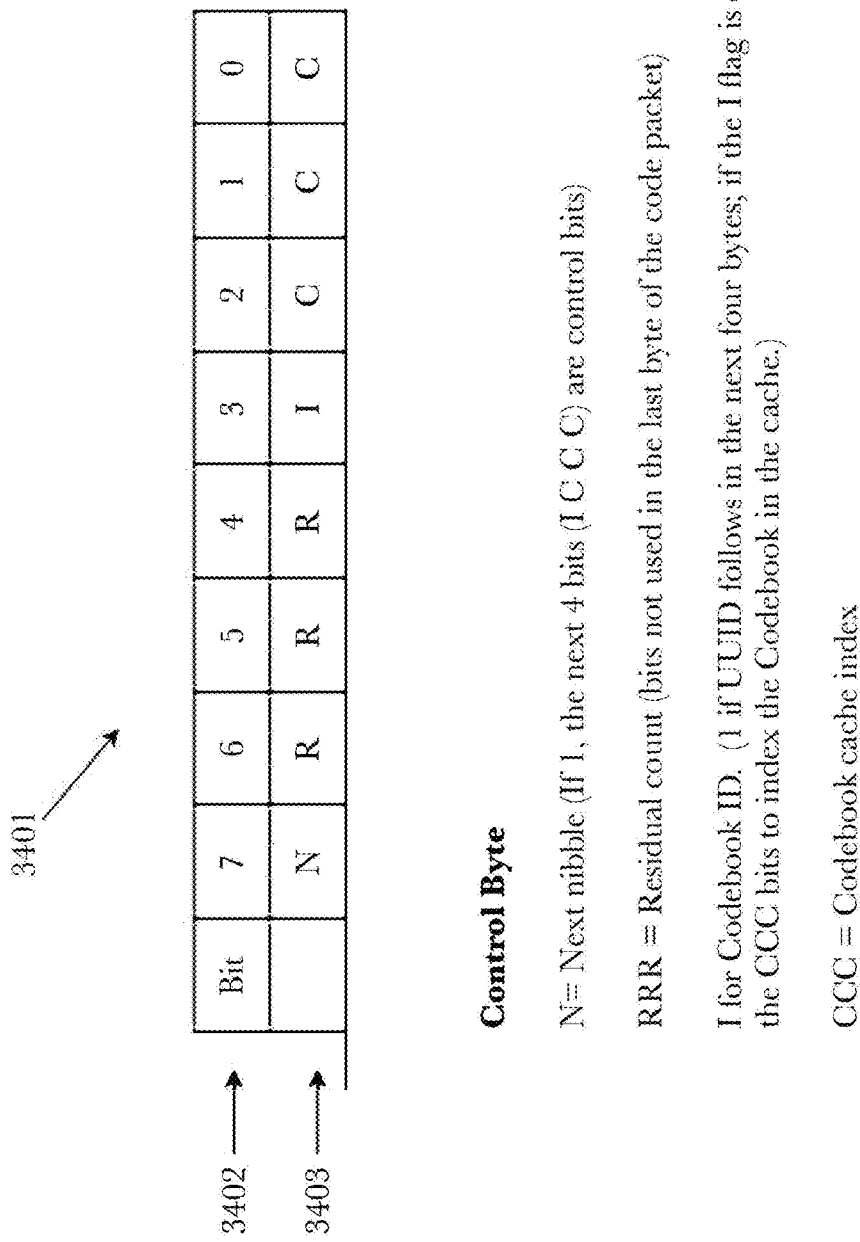
FIG. 34 is a flow diagram describing an exemplary codebook sorting algorithm for determining a plurality of codebooks to be shuffled between during the encoding process.

FIG. 34 is a diagram showing an exemplary control byte used to combine source packets encoded with multiple codebooks. In this embodiment, a control byte 3401 (i.e., a series of 8 bits) is inserted at the before (or after, depending on the configuration) the encoded source packet with which it is associated, and provides information about the codebook that was used to encode the source packet. In this way, source packets of a data set encoded using multiple codebooks can be combined into a data structure comprising the encoded source packets, each with a control byte that tells the system how the source packet can be decoded. The data structure may be of numerous forms, but in an embodiment, the data structure comprises a continuous series of control bytes followed by the source packet associated with the control byte. In some embodiments, the data structure will comprise a continuous series of control bytes followed by the UUID of the source packet associated with the control byte (and not the encoded source packet, itself). In some embodiments, the data structure may further comprise a UUID inserted to identify the codebook used to encode the source packet, rather than identifying the codebook in the control byte. Note that, while a very short control code (one byte) is used in this example, the control code may be of any length, and may be considerably longer than one byte in cases where the sourceblocks size is large or in cases where a large number of codebooks have been used to encode the source packet or data set.

In this embodiment, for each bit location 3402 of the control byte 3401, a data bit or combinations of data bits 3403 provide information necessary for decoding of the source packet associated with the control byte. Reading in reverse order of bit locations, the first bit N (location 7) indicates whether the entire control byte is used or not. If a single codebook is used to encode all source packets in the data set, N is set to 0, and bits 3 to 0 of the control byte 3401 are ignored. However, where multiple codebooks are used, N is set to 1 and all 8 bits of the control byte 3401 are used. The next three bits RRR (locations 6 to 4) are a residual count of the number of bits that were not used in the last byte of the source packet. Unused bits in the last byte of a source packet can occur depending on the sourceblock size used to encode the source packet. The next bit I (location 3) is used to identify the codebook used to encode the source packet. If bit I is 0, the next three bits CCC (locations 2 to 0) provide the codebook ID used to encode the source packet. The codebook ID may take the form of a codebook cache index, where the codebooks are stored in an enumerated cache. If bit I is 1, then the codebook is identified using a four-byte UUID that follows the control byte.

Figure 35:
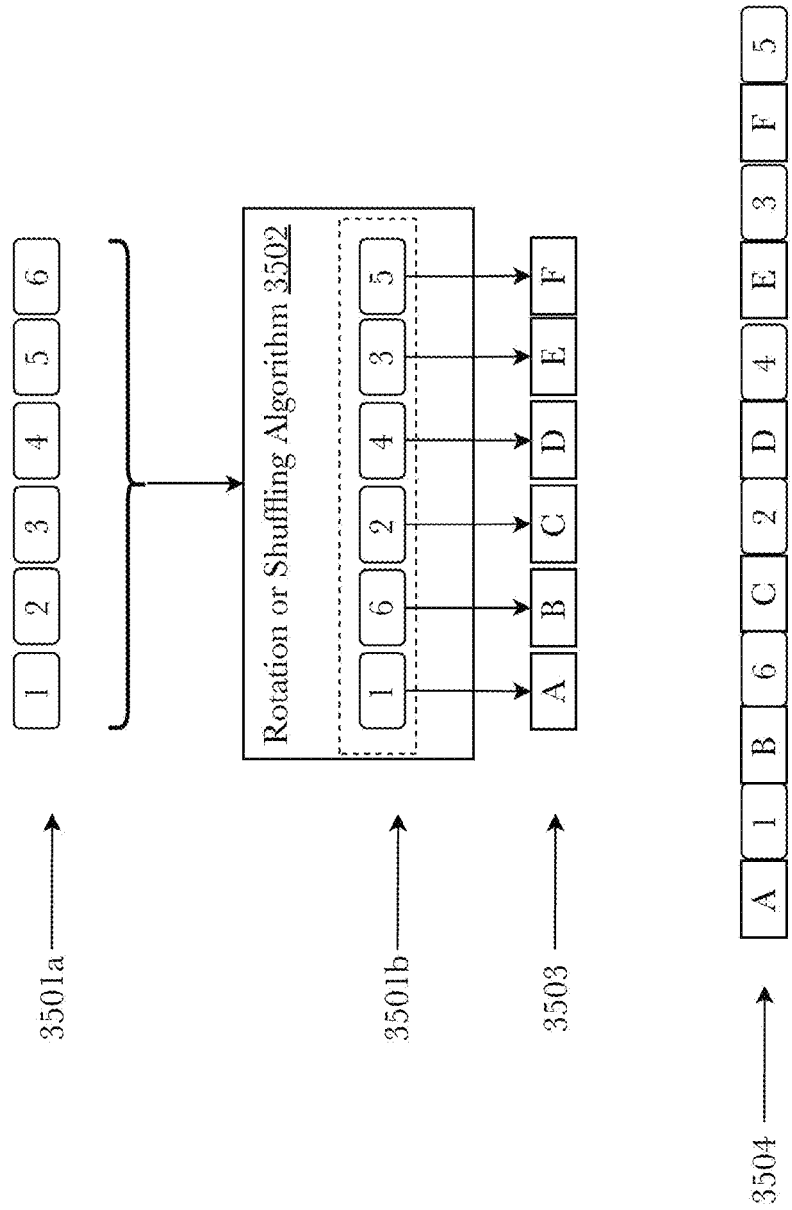
FIG. 35 is a diagram showing an exemplary codebook shuffling method.

FIG. 35 is a diagram showing an exemplary codebook shuffling method. In this embodiment, rather than selecting codebooks for encoding based on their compaction efficiency, codebooks are selected either based on a rotating list or based on a shuffling algorithm. The methodology of this embodiment provides additional security to compacted data, as the data cannot be decoded without knowing the precise sequence of codebooks used to encode any given source packet or data set.

Here, a list of six codebooks is selected for shuffling, each identified by a number from 1 to 6 3501a. The list of codebooks is sent to a rotation or shuffling algorithm 3502, and reorganized according to the algorithm 3501b. The first six of a series of source packets, each identified by a letter from A to E, 3503 is each encoded by one of the algorithms, in this case A is encoded by codebook 1, B is encoded by codebook 6, C is encoded by codebook 2, D is encoded by codebook 4, E is encoded by codebook 13 A is encoded by codebook 5. The encoded source packets 3503 and their associated codebook identifiers 3501b are combined into a data structure 3504 in which each encoded source packet is followed by the identifier of the codebook used to encode that particular source packet.

According to an embodiment, the codebook rotation or shuffling algorithm 3502 may produce a random or pseudo-random selection of codebooks based on a function. Some non-limiting functions that may be used for shuffling include:

1. given a function f(n) which returns a codebook according to an input parameter n in the range 1 to N are, and given t the number of the current source packet or sourceblock: f(t*M modulo p), where M is an arbitrary multiplying factor (1<=M<=p-1) which acts as a key, and p is a large prime number less than or equal to N;
2. f(A^t modulo p), where A is a base relatively prime to p-1 which acts as a key, and p is a large prime number less than or equal to N;
3. f(floor(t*x) modulo N), and x is an irrational number chosen randomly to act as a key; and
4. f(t XOR K) where the XOR is performed bit-wise on the binary representations of t and a key K with same number of bits in its representation of N. The function f(n) may return the nth codebook simply by referencing the nth element in a list of codebooks, or it could return the nth codebook given by a formula chosen by a user.

In one embodiment, prior to transmission, the endpoints (users or devices) of a transmission agree in advance about the rotation list or shuffling function to be used, along with any necessary input parameters such as a list order, function code, cryptographic key, or other indicator, depending on the requirements of the type of list or function being used. Once the rotation list or shuffling function is agreed, the endpoints can encode and decode transmissions from one another using the encodings set forth in the current codebook in the rotation or shuffle plus any necessary input parameters.

In some embodiments, the shuffling function may be restricted to permutations within a set of codewords of a given length.

Note that the rotation or shuffling algorithm is not limited to cycling through codebooks in a defined order. In some embodiments, the order may change in each round of encoding. In some embodiments, there may be no restrictions on repetition of the use of codebooks.

In some embodiments, codebooks may be chosen based on some combination of compaction performance and rotation or shuffling. For example, codebook shuffling may be repeatedly applied to each source packet until a codebook is found that meets a minimum level of compaction for that source packet. Thus, codebooks are chosen randomly or pseudo-randomly for each source packet, but only those that produce encodings of the source packet better than a threshold will be used.

Figure 36:
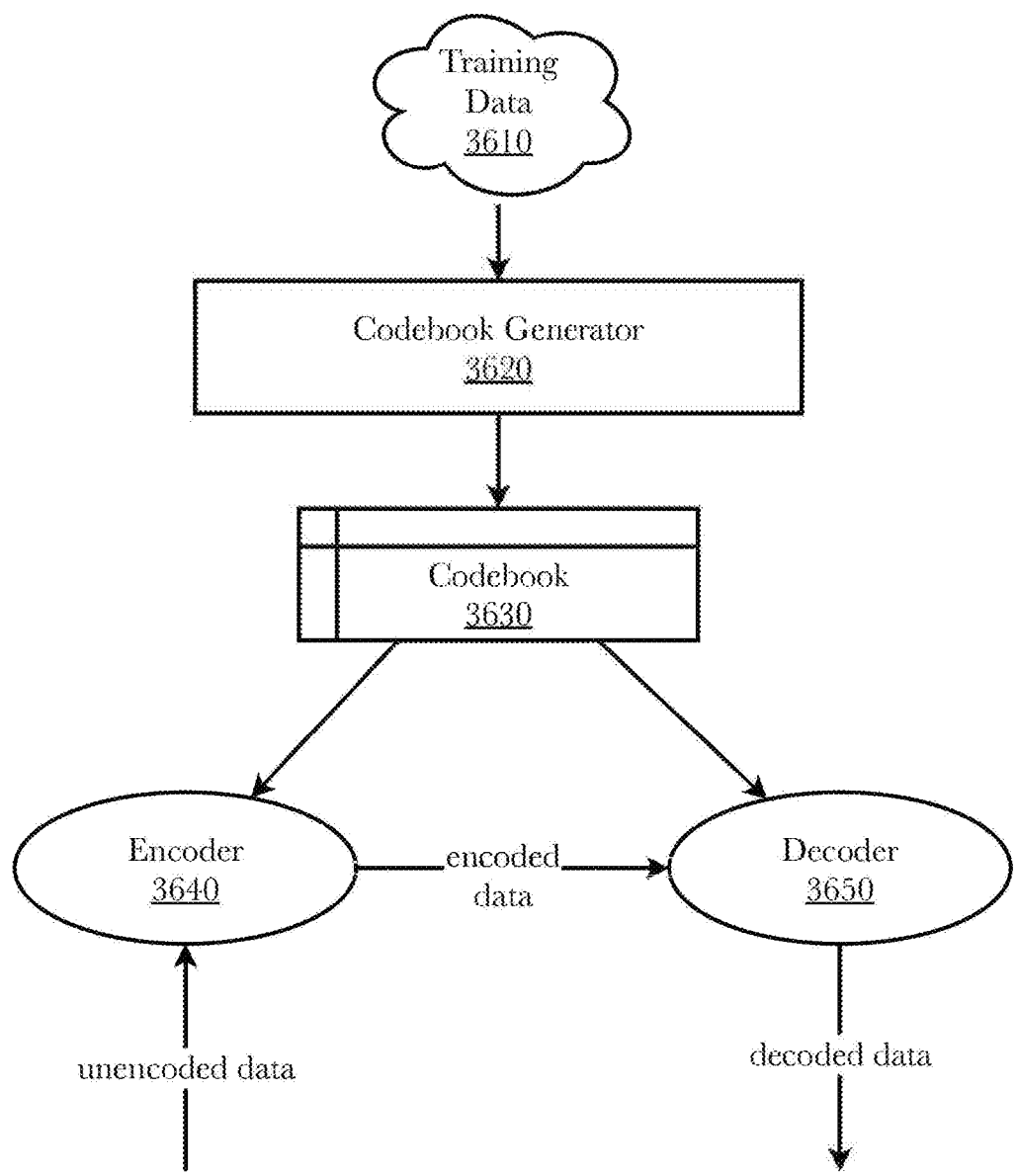
FIG. 36 shows an exemplary encoding/decoding configuration as previously described in an embodiment.

FIG. 36 shows an encoding/decoding configuration as previously described in an embodiment. In certain previously-described embodiments, training data 3610 is fed to a codebook generator 3620, which generates a codebook based on the training data. The codebook 3630 is sent to both an encoder 3640 and a decoder 3650 which may be on the same computer or on different computers, depending on the configuration. The encoder 3640 receives unencoded data, encodes it into codewords using the codebook 3630, and sends encoded data in the form of codewords to the decoder 3650. The decoder 3650 receives the encoded data in the form of codewords, decodes it using the same codebook 3630 (which may be a different copy of the codebook in some configurations), and outputs decoded data which is identical to the unencoded data received by the encoder 3640.

Figure 37:
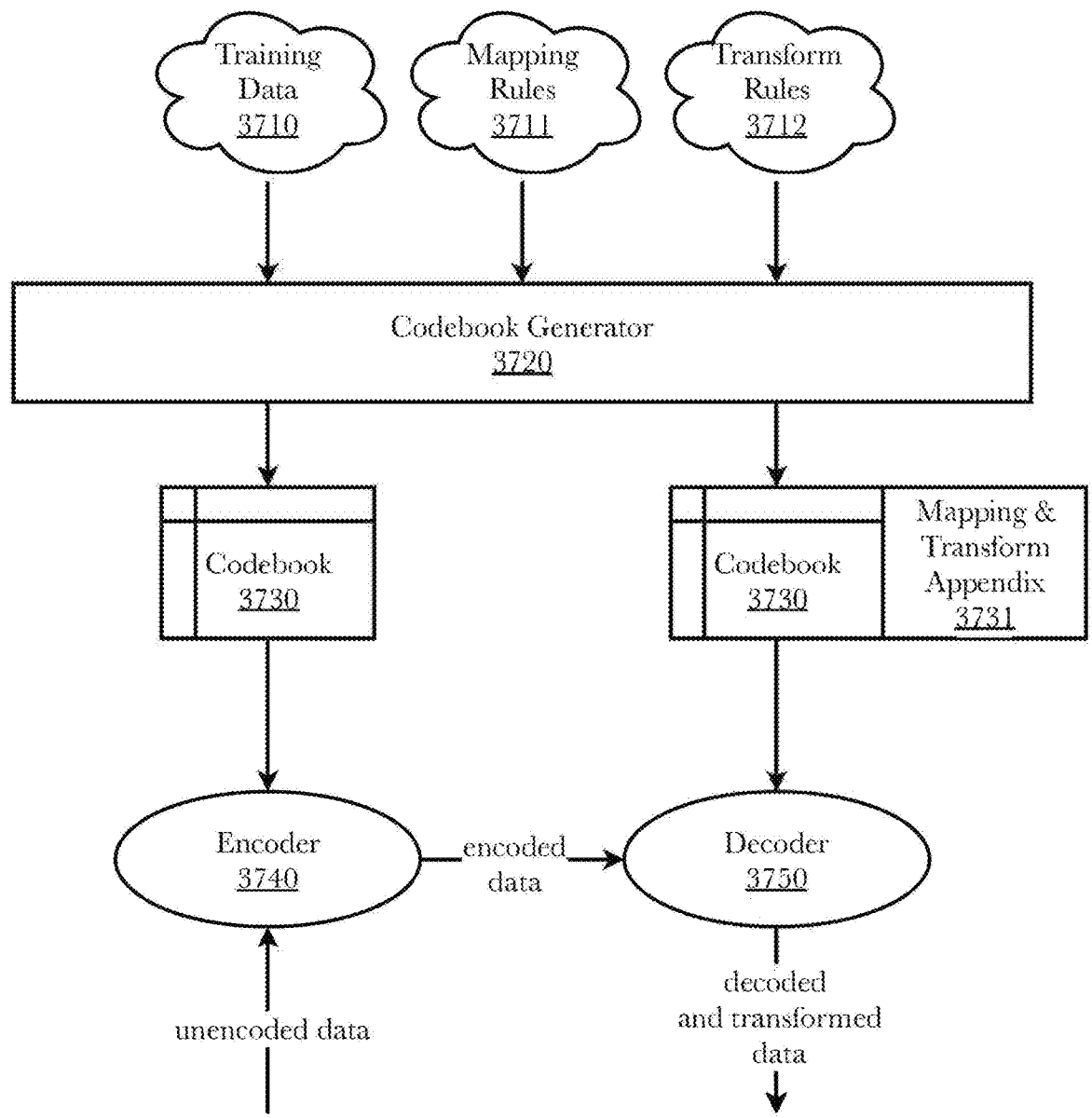
FIG. 37 shows an exemplary encoding/decoding configuration with extended functionality suitable to derive a different data set at the decoder from the data arriving at the encoder.

FIG. 37 shows an encoding/decoding configuration with extended functionality suitable to derive a different data set at the decoder from the data arriving at the encoder. In this configuration, mapping rules 3711 and data transformation rules 3712 are combined with the training data 3710 fed into the codebook generator. The codebook generator 3720 creates a codebook 3730 from the training data. The codebook 3730 is sent to the encoder 3740 which receives unencoded data, encodes it into codewords using the codebook 3730, and sends encoded data in the form of codewords to the decoder 3750. In this configuration, however, the codebook generator 3720 also creates a mapping and transformation appendix 3731 which it appends to the copy of the codebook 3730 sent to the decoder. The appendix 3731 may be a separate file or document, or may be integrated into the codebook 3730, such as in the form of bit extensions appended to each sourceblock in the codebook 3730 or an additional dimensional array to the codebook 3730 which provides instructions as to mapping and transformations.

The decoder 3750 receives the encoded data in the form of codewords, decodes it using the same codebook 3730 (which may be a different copy of the codebook in some configurations), but instead of outputting decoded data which is identical to the unencoded data received by the encoder 3740, the decoder maps and/or transforms the decoded data according to the mapping and transformation appendix, converting the decoded data into a transformed data output. As a simple example of the operation of this configuration, the unencoded data received by the encoder 3740 might be a list of geographical location names, and the decoded and transformed data output by the decoder based on the mapping and transformation appendix 3731 might be a list of GPS coordinates for those geographical location names.

In some embodiments, artificial intelligence or machine learning algorithms might be used to develop or generate the mapping and transformation rules. For example, the training data might be processed through a machine learning algorithm trained (on a different set of training data) to identify certain characteristics within the training data such as unusual numbers of repetitions of certain bit patterns, unusual amounts of gaps in the data (e.g., large numbers of zeros), or even unusual amounts of randomness, each of which might indicate a problem with the data such as missing or corrupted data, possible malware, possible encryption, etc. As the training data is processed, the mapping and transform appendix 3731 is generated by the machine learning algorithm based on the identified characteristics. In this example, the output of the decoder might be indications of the locations of possible malware in the decoded data or portions of the decoded data that are encrypted. In some embodiments, direct encryption (e.g., SSL) might be used to further protect the encoded data during transmission.

Figure 38:
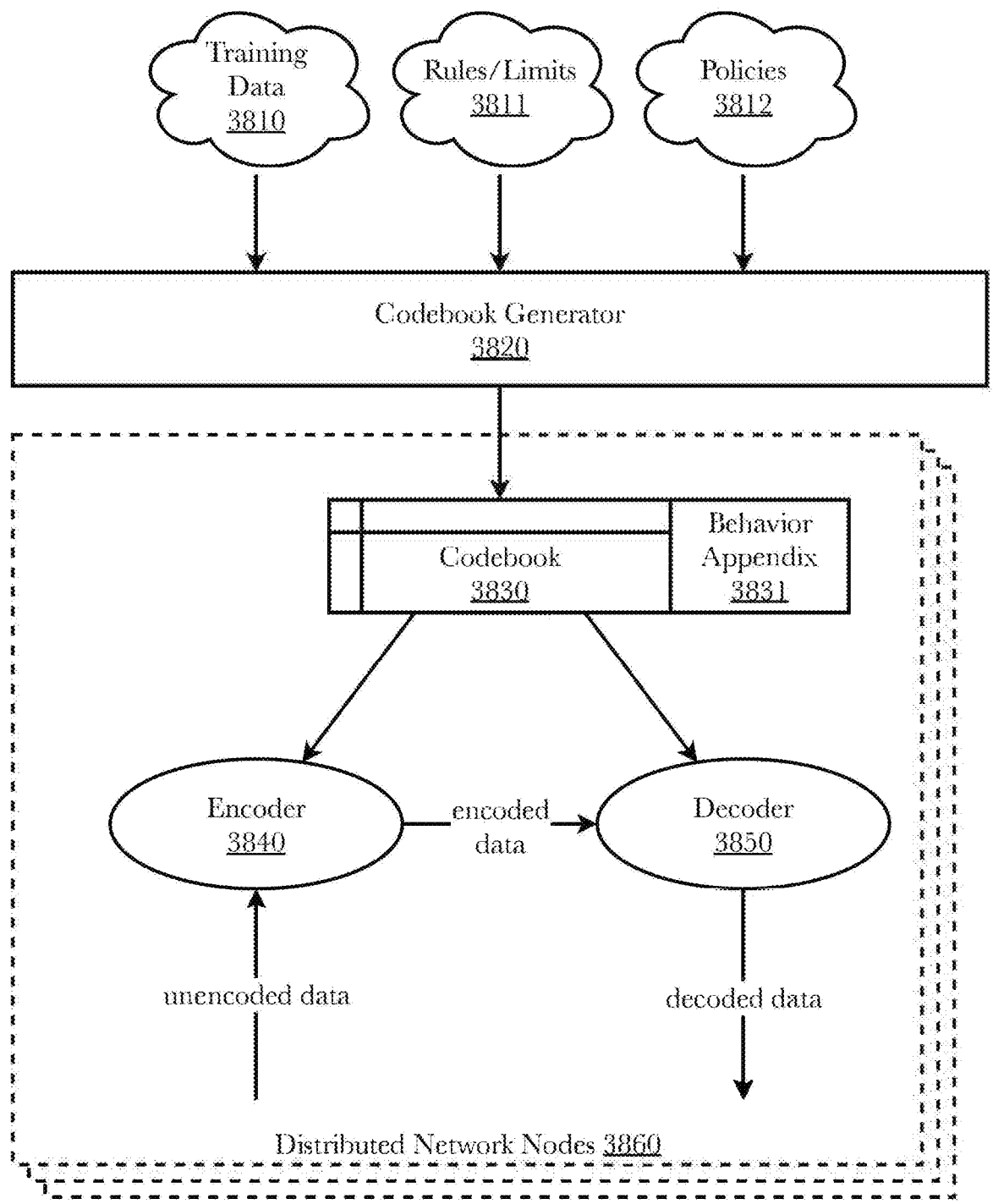
FIG. 38 shows an exemplary encoding/decoding configuration with extended functionality suitable for using in a distributed computing environment.

FIG. 38 shows an encoding/decoding configuration with extended functionality suitable for using in a distributed computing environment comprising a plurality of distributed network nodes 3860. In this configuration, network rules and limits 3811 and network policies 3812 are combined with the training data 3810 fed into the codebook generator. The codebook generator 3820 creates a codebook 3830 from the training data. The codebook generator 3820 also creates a behavior appendix 3831 which it appends to the copies of the codebook 3830 sent to both the encoder 3840 and decoder 3850. The appendix 3831 may be a separate file or document, or may be integrated into the codebook 3830, such as in the form of bit extensions appended to each sourceblock in the codebook 3830 which provide instructions as to mapping and transformations. In some embodiments, the behavior appendix 3831 may be sent only to the encoder 3840 or decoder 3850, depending on network configuration and other parameters.

The encoder 3840 receives unencoded data, implements any behaviors required by the behavior appendix 3831 such as limit checking, network policies, data prioritization, permissions, etc., as encodes it into codewords using the codebook 3830. For example, as data is encoded, the encoder may check the behavior appendix for each sourceblock within the data to determine whether that sourceblock (or a combination of sourceblocks) violates any network rules. As a couple of non-limiting examples, certain sourceblocks may be identified, for example, as fingerprints for malware or viruses, and may be blocked from further encoding or transmission, or certain sourceblocks or combinations of sourceblocks may be restricted to encoding on some nodes of the network, but not others. The decoder works in a similar manner. The decoder 3850 receives encoded data, implements any behaviors required by the behavior appendix 3831 such as limit checking, network policies, data prioritization, permissions, etc., as decodes it into decoded data using the codebook 3830 resulting in data identical to the unencoded data received by the encoder 3840. For example, as data is decoded, the decoder may check the behavior appendix for each sourceblock within the data to determine whether that sourceblock (or a combination of sourceblocks) violates any network rules. As a couple of non-limiting examples, certain sourceblocks may be identified, for example, as fingerprints for malware or viruses, and may be blocked from further decoding or transmission, or certain sourceblocks or combinations of sourceblocks may be restricted to decoding on some nodes of the network, but not others.

In some embodiments, artificial intelligence or machine learning algorithms might be used to develop or generate the behavioral appendix 3831. For example, the training data might be processed through a machine learning algorithm trained (on a different set of training data) to identify certain characteristics within the training data such as unusual numbers of repetitions of certain bit patterns, unusual amounts of gaps in the data (e.g., large numbers of zeros), or even unusual amounts of randomness, each of which might indicate a problem with the data such as missing or corrupted data, possible malware, possible encryption, etc. As the training data is processed, the mapping and transform appendix 3831 is generated by the machine learning algorithm based on the identified characteristics. As a couple of non-limiting examples, the machine learning algorithm might generate a behavior appendix 3831 in which certain sourceblocks are identified, for example, as fingerprints for malware or viruses, and are blocked from further decoding or transmission, or in which certain sourceblocks or combinations of sourceblocks are restricted to decoding on some nodes of the network, but not others.

Figure 39:
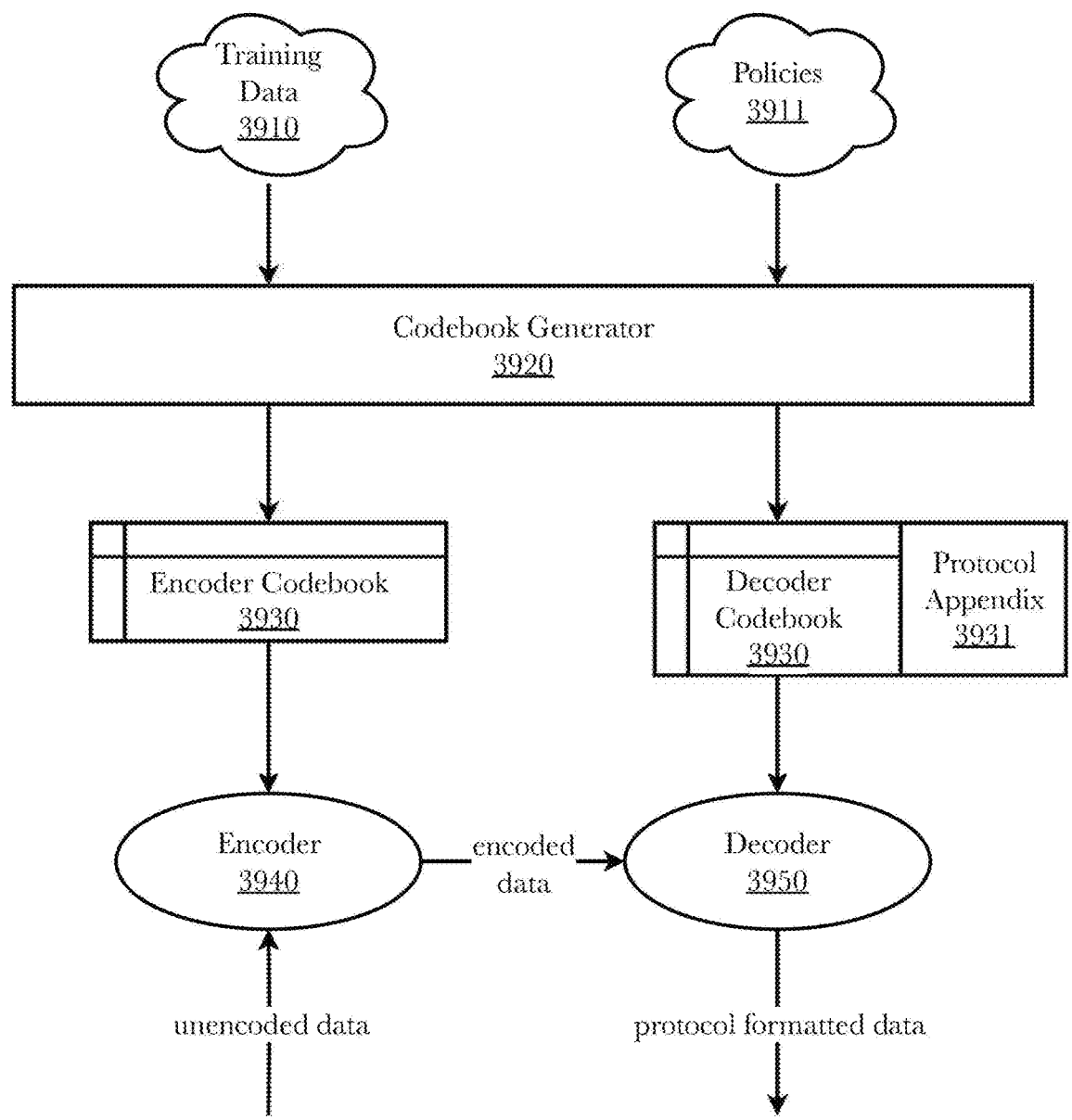
FIG. 39 shows an exemplary encoding/decoding configuration with extended functionality suitable for generating protocol formatted data at the decoder derived from data arriving at the encoder.

FIG. 39 shows an encoding/decoding configuration with extended functionality suitable for generating protocol formatted data at the decoder derived from data arriving at the encoder. In this configuration, protocol formatting policies 3911 are combined with the training data 3910 fed into the codebook generator. The codebook generator 3920 creates a codebook 3930 from the training data. The codebook 3930 is sent to the encoder 3940 which receives unencoded data, encodes it into codewords using the codebook 3930, and sends encoded data in the form of codewords to the decoder 3950. In this configuration, however, the codebook generator 3920 also creates a protocol appendix 3931 which it appends to the copy of the codebook 3930 sent to the decoder. The appendix 3931 may be a separate file or document, or may be integrated into the codebook 3930, such as in the form of bit extensions appended to each sourceblock in the codebook 3930 or an additional dimensional array to the codebook 3930 which provides instructions as to protocol formatting.

The decoder 3950 receives the encoded data in the form of codewords, decodes it using the same codebook 3930 (which may be a different copy of the codebook in some configurations), but instead of outputting decoded data which is identical to the unencoded data received by the encoder 3940, the decoder converts the decoded data according to the protocol appendix, converting the decoded data into a protocol formatted data output. As a simple example of the operation of this configuration, the unencoded data received by the encoder 3940 might be a data to be transferred over a TCP/IP connection, and the decoded and transformed data output by the decoder based on the protocol appendix 3931 might be the data formatted according to the TCP/IP protocol.

In some embodiments, artificial intelligence or machine learning algorithms might be used to develop or generate the protocol policies. For example, the training data might be processed through a machine learning algorithm trained (on a different set of training data) to identify certain characteristics within the training data such as types of files or portions of data that are typically sent to a particular port on a particular node of a network, etc. As the training data is processed, the protocol appendix 3931 is generated by the machine learning algorithm based on the identified characteristics. In this example, the output of the decoder might be the unencoded data formatted according to the TCP/IP protocol in which the TCP/IP destination is changed based on the contents of the data or portions of the data (e.g., portions of data of one type are sent to one port on a node and portions of data of a different type are sent to a different port on the same node). In such an example, the training data set may comprise a dataset that includes network traffic data captured from different nodes and ports, wherein the dataset includes labeled data instances based on the characteristics which are to be identified (e.g., file type, purpose of data sent to specific ports, etc.). In some embodiments, direct encryption (e.g., SSL) might be used to further protect the encoded data during transmission.

Figure 40:
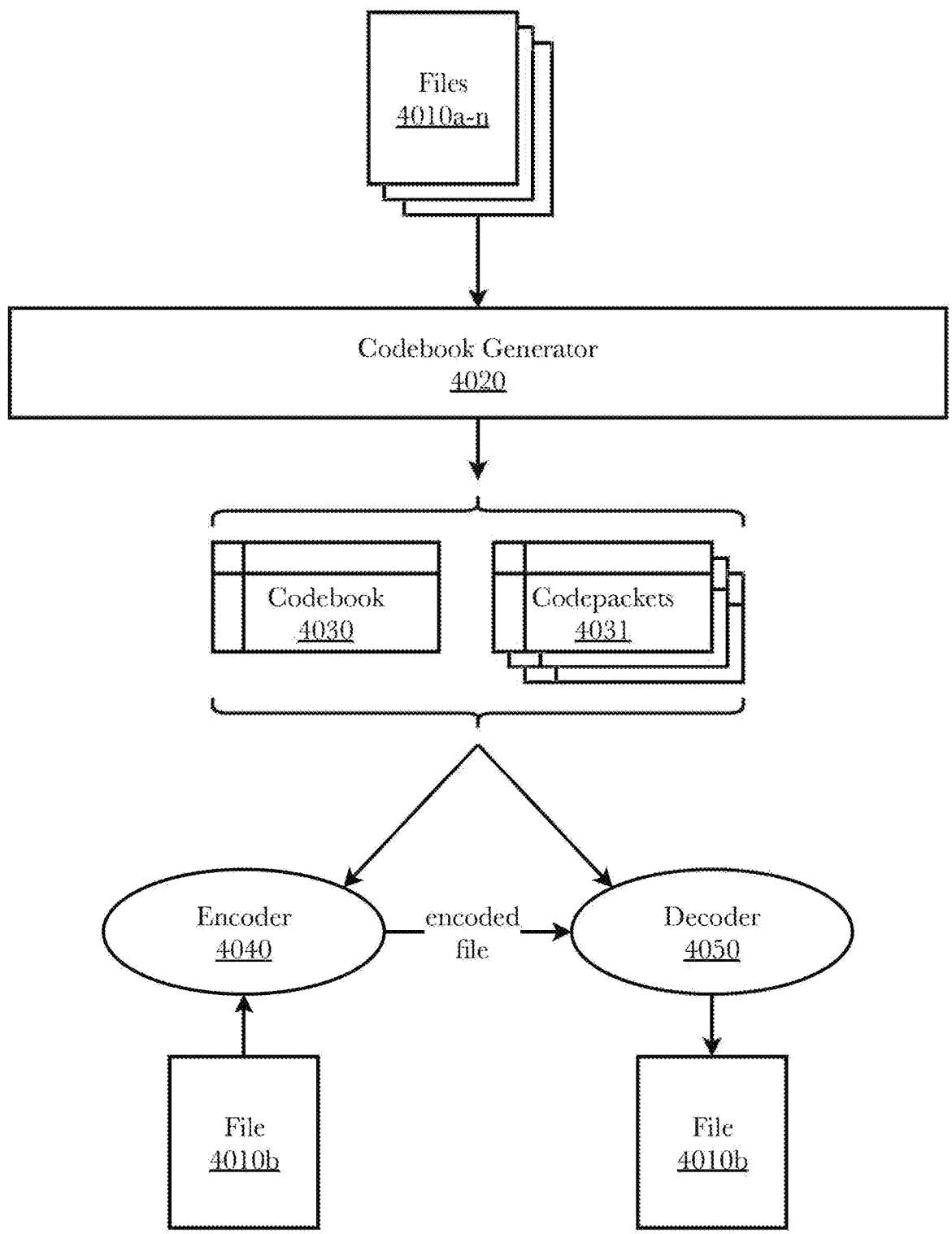
FIG. 40 shows an exemplary encoding/decoding configuration with extended functionality suitable for file-based encoding/decoding.

FIG. 40 shows an exemplary encoding/decoding configuration with extended functionality suitable for file-based encoding/decoding. In this configuration, training data in the form of a set of files 4010 is fed to a codebook generator 4020, which generates a codebook based on the files 4010. The codebook may comprise a single codebook 4030 generated from all the files, or a set of smaller codebooks called code packets 4031, each code packet 4031 being generated from one of the files, or a combination of both. The codebook 4030 and/or code packets 4031 are sent to both an encoder 4040 and a decoder 4050 which may be on the same computer or on different computers, depending on the configuration. The encoder 4040 receives a file, encodes it into codewords using the codebook 4030 or one of the code packets 4031, and sends encoded file in the form of codewords to the decoder 4050. The decoder 4050 receives the encoded file in the form of codewords, decodes it using the same codebook 4030 (which may be a different copy of the codebook in some configurations), and outputs a decoded file which is identical to the unencoded data received by the encoder 4040. Any codebook miss (a codeword that can't be found either in the codebook 4030 or the relevant code packet 4031) that occurs during decoding indicates that the file 4011 has been changed between encoding and decoding, thus providing the file-based encoding/decoding with inherent protection against changes.

Figure 41:
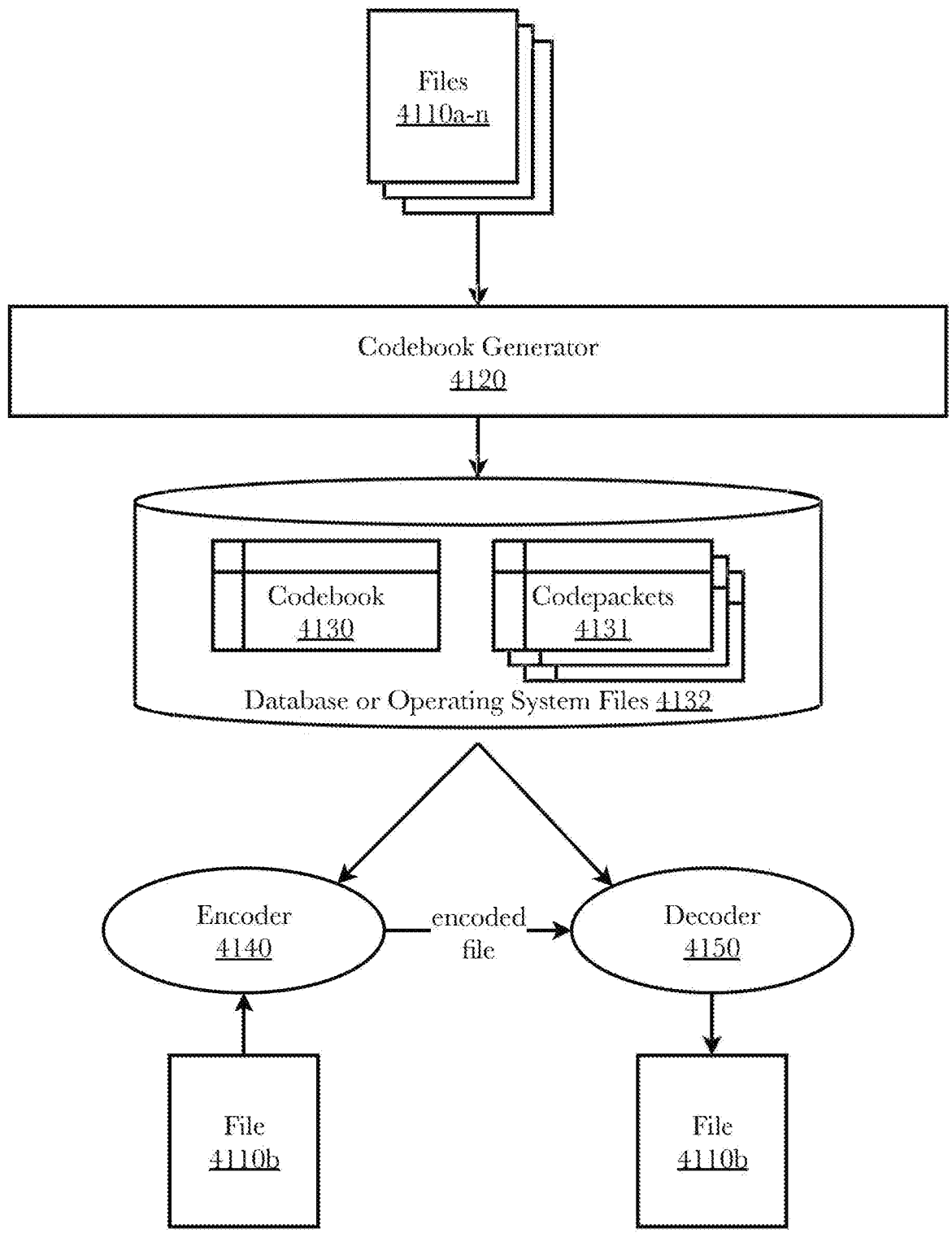
FIG. 41 shows an exemplary encoding/decoding configuration with extended functionality suitable for file-based encoding/decoding or operating system files.

FIG. 41 shows an exemplary encoding/decoding configuration with extended functionality suitable for file-based encoding/decoding or operating system files. File-based encoding/decoding of operating system files is a variant of the file-based encoding/decoding configuration described above. In file-based encoding/decoding of operating systems, one or more operating system files 4010*a-n* are used to create a codebook 4030 or a set of smaller files called code packets 4031, each code packet 4031 being created from a particular operating system file. Encoding and decoding of those same operating system files 4110*a-n* would be performed using the codebook 4130 or code packets 4131 created from the operating system files 4110*a-n*. Consequently, encoding and decoding would be expected to produce no encoding misses (i.e., all possible sourceblocks of an operating system file to be encoded would be as sourceblocks in the codebook 4130 or the code packet 4131 corresponding to the operating system file). A miss during encoding would indicate that the operating system file is either not one of those used to generate the codebook 4130 or has been changed. A miss during decoding (assuming that the operating system file encoded without a miss) will be flagged as an indication the operating system file has been changed between encoding and decoding. Access to operating system files would be required to pass through the encoding/decoding process, thus protecting operating system files from tampering.

In this configuration, training data in the form of a set of operating system files 4110 is fed to a codebook generator 4120, which generates a codebook based on the operating system files 4110. The codebook may comprise a single codebook 4130 generated from all of the operating system files, or a set of smaller codebooks called code packets 4131, each code packet 4131 being generated from one of the operating system files, or a combination of both. The codebook 4130 and/or code packets 4131 are sent to both an encoder 4141 and a decoder 4150 which may be on the same computer or on different computers, depending on the configuration. The encoder 4141 receives an operating system file 4110*b* from the set of operating system files 4110*a-n* used to generate the codebook 4130, encodes it into codewords using the codebook 4130 or one of the code packets 4131, and sends encoded operating system file 4110*b* in the form of codewords to the decoder 4150. The decoder 4150 receives the encoded operating system file 4110*b* in the form of codewords, decodes it using the same codebook 4130 (which may be a different copy of the codebook in some configurations), and outputs a decoded operating system file 4110*b* which is identical to the unencoded operating system file 4110*b* received by the encoder 4141. Any codebook miss (a codeword that can't be found either in the codebook 4130 or the relevant code packet 4131) that occurs during decoding indicates that the operating system file 4110*b* has been changed between encoding and decoding, thus providing the operating system file-based encoding/decoding with inherent protection against changes.

Figure 42:
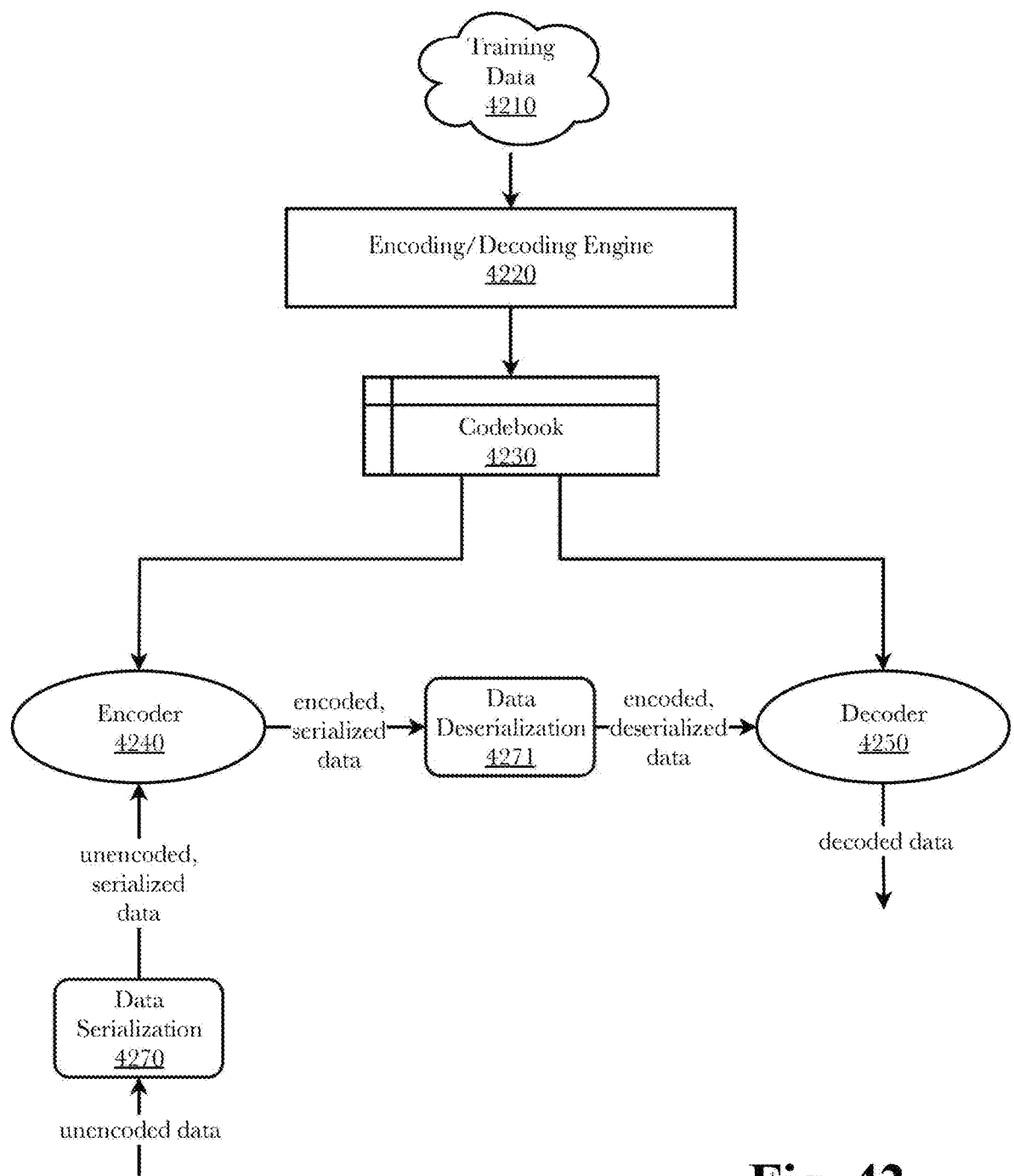
FIG. 42 shows an exemplary encoding/decoding configuration with data serialization and deserialization.

FIG. 42 shows an exemplary encoding/decoding configuration with data serialization and deserialization. In this embodiment, training data 4210 is fed to a codebook generator 4220, which generates a codebook based on the training data. The codebook 4230 is sent to both an encoder 4240 and a decoder 4250 which may be on the same computer or on different computers, depending on the configuration. Unencoded data is sent to a data serializer 4270, which serializes the data according to a serialization protocol (e.g., BeBop, Google Protocol Buffers, MessagePack) to create a wrapper or connector for the unencoded data. The encoder 4240 receives unencoded, serialized data, encodes it into codewords using the codebook 4230, and sends the encoded, serialized data to a destination, at which destination the data is received by a data deserializer 4271 which deserializes the data using the same serialization protocol as was used to serialize the data, and the encoded, deserialized data is then to a decoder 4250, which receives the encoded, unserialized data in the form of codewords, decodes it using the same codebook 4230 (which may be a different copy of the codebook in some configurations), and outputs decoded data which is identical to the unencoded data received by the encoder 4240.

The combination of data compaction with data serialization can be used to maximize compaction and data transfer with extremely low latency and no loss. For example, a wrapper or connector may be constructed using certain serialization protocols (e.g., BeBop, Google Protocol Buffers, MessagePack). The idea is to use known, deterministic file structure (schemes, grammars, etc.) to reduce data size first via token abbreviation and serialization, and then to use the data compaction methods described herein to take advantage of stochastic/statistical structure by training it on the output of serialization. The encoding process can be summarized as: serialization-encode->compact-encode, and the decoding process would be the reverse: compact-decode->serialization-decode. The deterministic file structure could be automatically discovered or encoded by the user manually as a scheme/grammar. Another benefit of serialization in addition to those listed above is deeper obfuscation of data, further hardening the cryptographic benefits of encoding using codebooks.

Figure 47:
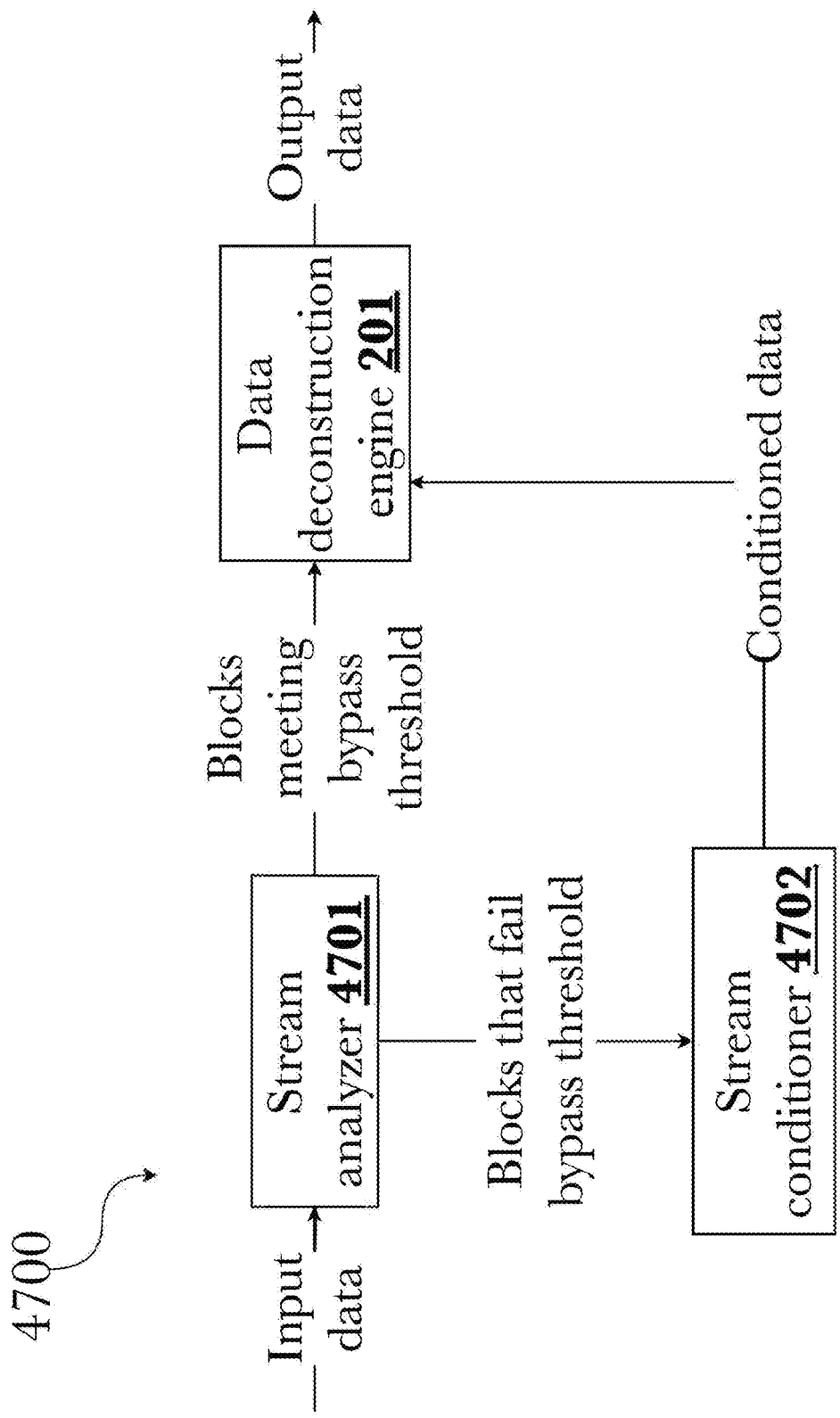
FIG. 47 is a block diagram illustrating an exemplary system architecture for combining data compression with encryption using split-stream processing.

FIG. 47 is a block diagram illustrating an exemplary system architecture 4700 for combining data compression with encryption using split-stream processing. According to the embodiment, an incoming data stream can be compressed and encrypted simultaneously through the use of split-stream processing, wherein the data stream is broken into blocks that are compared against the stream as a whole to determine their frequency (i.e., their probability distribution within the data stream). Huffman coding works provably ideally when the elements being encoded have dyadic probabilities, that is probabilities that are all of the form $1/(2^x)$; in actual practice, not all data blocks will have a dyadic probability, and thus the efficiency of Huffman coding decreases. To improve efficiency while also providing encryption of the data stream, those blocks that have non-dyadic probability may be identified and replaced with other blocks, effectively shuffling the data blocks until all blocks present in the output stream have dyadic probability by using some blocks more frequently and others less frequently to "adjust" their probability within the output stream. For purposes of reconstruction, a second error stream is produced that contains the modifications made, so that the recipient need only compare the error stream against the received data stream to reverse the process and restore the data.

A stream analyzer 4701 receives an input data stream and analyzes it to determine the frequency of each unique data block within the stream. A bypass threshold may be used to determine whether the data stream deviates sufficiently from an idealized value (for example, in a hypothetical data stream with all-dyadic data block probabilities), and if this threshold is met the data stream may be sent directly to a data deconstruction engine 201 for deconstruction into codewords as described below in greater detail (with reference to FIG. 2). If the bypass threshold is not met, the data stream is instead sent to a stream conditioner 4702 for conditioning.

Stream conditioner 4702 receives a data stream from stream analyzer 4701 when the bypass threshold is not met, and handles the encryption process of swapping data blocks to arrive at a more-ideal data stream with a higher occurrence of dyadic probabilities; this facilitates both encryption of the data and greater compression efficiency by improving the performance of the Huffman coding employed by data deconstruction engine 201. To achieve this, each data block in the data stream is checked against a conditioning threshold using the algorithm $|(P_1-P_2)|>T_C$, where $P_1$ is the actual probability of the data block, $P_2$ is the ideal probability of the block (generally, the nearest dyadic probability), and $T_C$ is the conditioning threshold value. If the threshold value is exceeded (that is, the data block's real probability is "too far" from the nearest ideal probability), a conditioning rule is applied to the data block. After conditioning, a logical XOR operation may be applied to the conditioned data block against the original data block, and the result (that is, the difference between the original and conditioned data) is appended to an error stream. The conditioned data stream (containing both conditioned and unconditioned blocks that did not meet the threshold) and the error stream are then sent to the data deconstruction engine 201 to be compressed, as described below in FIG. 2.

To condition a data block, a variety of approaches may be used according to a particular setup or desired encryption goal. One such exemplary technique may be to selectively replace, or "shuffle" data blocks based on their real probability as compared to an idealized probability: if the block occurs less-frequently than desired or anticipated, it may be added to a list of "swap blocks" and left in place in the data stream; if a data block occurs more frequently than desired, it is replaced with a random block from the swap block list. This increases the frequency of blocks that were originally "too low", and decreases it for those that were originally "too high", bringing the data stream closer in line with the idealized probability and thereby improving compression efficiency while simultaneously obfuscating the data. Another approach may be to simply replace too-frequent data blocks with any random data block from the original data stream, eliminating the need for a separate list of swap blocks, and leaving any too-low data blocks unmodified. This approach does not necessarily increase the probability of blocks that were originally too-low (apart from any that may be randomly selected to replace a block that was too-high), but it may improve system performance due to the elimination of the swap block list and associated operations.

It should be appreciated that both the bypass and conditioning thresholds used may vary, for example, one or both may be a manually-configured value set by a system operator, a stored value retrieved from a database as part of an initial configuration, or a value that may be adjusted on-the-fly as the system adjusts to operating conditions and live data.

Figure 48:
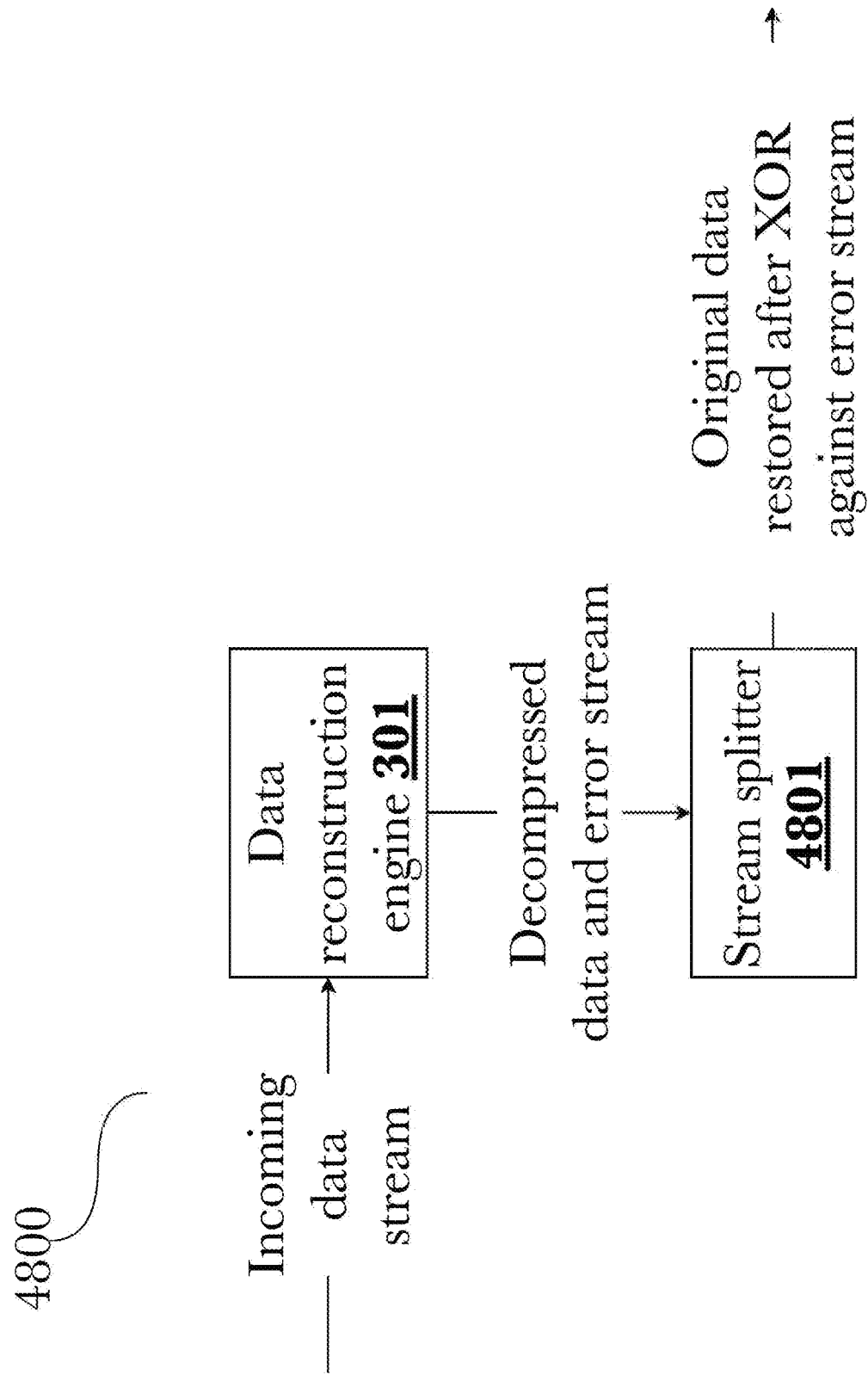
FIG. 48 is a block diagram illustrating an exemplary system architecture for decompressing and decrypting incoming data that was processed using split-stream processing.

FIG. 48 is a block diagram illustrating an exemplary system architecture 4800 for decompressing and decrypting incoming data that was processed using split-stream processing. To decompress and decrypt received data, a data reconstruction engine 301 may first be used to reverse the compression on a data stream as described below in FIG. 3, passing the decompressed (but still encrypted) data to a stream splitter 4801. The corresponding error stream may be separated from the data stream (for example, the two streams may have been combined during compression but during decompression they are separated) or it may be received independently as a second data stream. Stream splitter 4801 applies XOR logical operations to each data block according to the error stream, reversing the original block conditioning process and restoring the original data on a block-by-block basis.

Description of Method Aspects

Since the library consists of re-usable building sourceblocks, and the actual data is represented by reference codes to the library, the total storage space of a single set of data would be much smaller than conventional methods, wherein the data is stored in its entirety. The more data sets that are stored, the larger the library becomes, and the more data can be stored in reference code form.

As an analogy, imagine each data set as a collection of printed books that are only occasionally accessed. The amount of physical shelf space required to store many collections would be quite large, and is analogous to conventional methods of storing every single bit of data in every data set. Consider, however, storing all common elements within and across books in a single library, and storing the books as references codes to those common elements in that library. As a single book is added to the library, it will contain many repetitions of words and phrases. Instead of storing the whole words and phrases, they are added to a library, and given a reference code, and stored as reference codes. At this scale, some space savings may be achieved, but the reference codes will be on the order of the same size as the words themselves. As more books are added to the library, larger phrases, quotations, and other words patterns will become common among the books. The larger the word patterns, the smaller the reference codes will be in relation to them as not all possible word patterns will be used. As entire collections of books are added to the library, sentences, paragraphs, pages, or even whole books will become repetitive. There may be many duplicates of books within a collection and across multiple collections, many references and quotations from one book to another, and much common phraseology within books on particular subjects. If each unique page of a book is stored only once in a common library and given a reference code, then a book of 1,000 pages or more could be stored on a few printed pages as a string of codes referencing the proper full-sized pages in the common library. The physical space taken up by the books would be dramatically reduced. The more collections that are added, the greater the likelihood that phrases, paragraphs, pages, or entire books will already be in the library, and the more information in each collection of books can be stored in reference form. Accessing entire collections of books is then limited not by physical shelf space, but by the ability to reprint and recycle the books as needed for use.

The projected increase in storage capacity using the method herein described is primarily dependent on two factors: 1) the ratio of the number of bits in a block to the number of bits in the reference code, and 2) the amount of repetition in data being stored by the system.

With respect to the first factor, the number of bits used in the reference codes to the sourceblocks must be smaller than the number of bits in the sourceblocks themselves in order for any additional data storage capacity to be obtained. As a simple example, 16-bit sourceblocks would require $2^{16}$, or 65536, unique reference codes to represent all possible patterns of bits. If all possible 65536 blocks patterns are utilized, then the reference code itself would also need to contain sixteen bits in order to refer to all possible 65,536 blocks patterns. In such case, there would be no storage savings. However, if only 16 of those block patterns are utilized, the reference code can be reduced to 4 bits in size, representing an effective compression of 4 times (16 bits/4 bits=4) versus conventional storage. Using a typical block size of 512 bytes, or 4,096 bits, the number of possible block patterns is $2^{4,096}$, which for all practical purposes is unlimited. A typical hard drive contains one terabyte (TB) of physical storage capacity, which represents 1,953,125,000, or roughly $2^{31}$, 512 byte blocks. Assuming that 1 TB of unique 512-byte sourceblocks were contained in the library, and that the reference code would thus need to be 31 bits long, the effective compression ratio for stored data would be on the order of 132 times ($4,096/31 \approx 132$) that of conventional storage.

With respect to the second factor, in most cases it could be assumed that there would be sufficient repetition within a data set such that, when the data set is broken down into sourceblocks, its size within the library would be smaller than the original data. However, it is conceivable that the initial copy of a data set could require somewhat more storage space than the data stored in a conventional manner, if all or nearly all sourceblocks in that set were unique. For example, assuming that the reference codes are $\frac{1}{10}^{th}$ the size of a full-sized copy, the first copy stored as sourceblocks in the library would need to be 1.1 megabytes (MB), (1 MB for the complete set of full-sized sourceblocks in the library and 0.1 MB for the reference codes). However, since the sourceblocks stored in the library are universal, the more duplicate copies of something you save, the greater efficiency versus conventional storage methods. Conventionally, storing 10 copies of the same data requires 10 times the storage space of a single copy. For example, ten copies of a 1 MB file would take up 10 MB of storage space. However, using the method described herein, only a single full-sized copy is stored, and subsequent copies are stored as reference codes. Each additional copy takes up only a fraction of the space of the full-sized copy. For example, again assuming that the reference codes are $\frac{1}{10}^{th}$ the size of the full-size copy, ten copies of a 1 MB file would take up only 2 MB of space (1 MB for the full-sized copy, and 0.1 MB each for ten sets of reference codes). The larger the library, the more likely that part or all of incoming data will duplicate sourceblocks already existing in the library.

The size of the library could be reduced in a manner similar to storage of data. Where sourceblocks differ from each other only by a certain number of bits, instead of storing a new sourceblock that is very similar to one already existing in the library, the new sourceblock could be represented as a reference code to the existing sourceblock, plus information about which bits in the new block differ from the existing block. For example, in the case where 512 byte sourceblocks are being used, if the system receives a new sourceblock that differs by only one bit from a sourceblock already existing in the library, instead of storing a new 512 byte sourceblock, the new sourceblock could be stored as a reference code to the existing sourceblock, plus a reference to the bit that differs. Storing the new sourceblock as a reference code plus changes would require only a few bytes of physical storage space versus the 512 bytes that a full sourceblock would require. The algorithm could be optimized to store new sourceblocks in this reference code plus changes form unless the changes portion is large enough that it is more efficient to store a new, full sourceblock.

It will be understood by one skilled in the art that transfer and synchronization of data would be increased to the same extent as for storage. By transferring or synchronizing reference codes instead of full-sized data, the bandwidth requirements for both types of operations are dramatically reduced.

In addition, the method described herein is inherently a form of encryption. When the data is converted from its full form to reference codes, none of the original data is contained in the reference codes. Without access to the library of sourceblocks, it would be impossible to reconstruct any portion of the data from the reference codes. This inherent property of the method described herein could obviate the need for traditional encryption algorithms, thereby offsetting most or all of the computational cost of conversion of data back and forth to reference codes. In theory, the method described herein should not utilize any additional computing power beyond traditional storage using encryption algorithms. Alternatively, the method described herein could be in addition to other encryption algorithms to increase data security even further.

In other embodiments, additional security features could be added, such as: creating a proprietary library of sourceblocks for proprietary networks, physical separation of the reference codes from the library of sourceblocks, storage of the library of sourceblocks on a removable device to enable easy physical separation of the library and reference codes from any network, and incorporation of proprietary sequences of how sourceblocks are read and the data reassembled.

Figure 7:
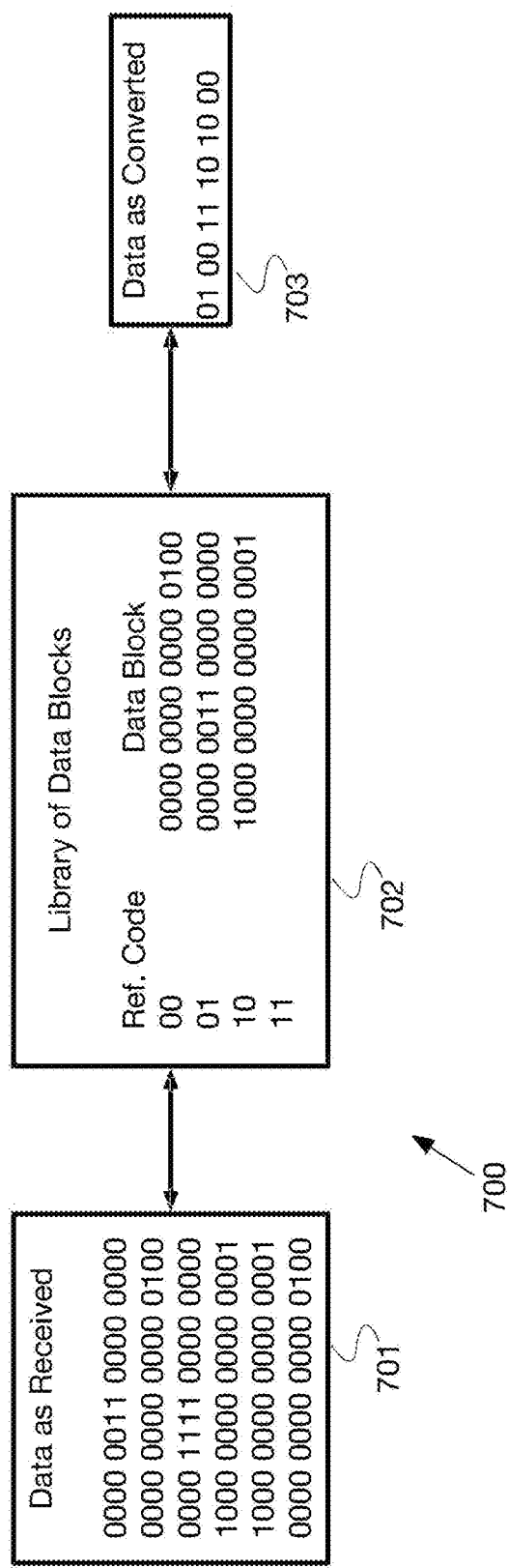
FIG. 7 is a diagram showing an example of how data might be converted into reference codes using an aspect of an embodiment.

FIG. 7 is a diagram showing an example of how data might be converted into reference codes using an aspect of an embodiment 700. As data is received 701, it is read by the processor in sourceblocks of a size dynamically determined by the previously disclosed sourceblock size optimizer 410. In this example, each sourceblock is 16 bits in length, and the library 702 initially contains three sourceblocks with reference codes 00, 01, and 10. The entry for reference code 11 is initially empty. As each 16 bit sourceblock is received, it is compared with the library. If that sourceblock is already contained in the library, it is assigned the corresponding reference code. So, for example, as the first line of data (0000 0011 0000 0000) is received, it is assigned the reference code (01) associated with that sourceblock in the library. If that sourceblock is not already contained in the library, as is the case with the third line of data (0000 1111 0000 0000) received in the example, that sourceblock is added to the library and assigned a reference code, in this case 11. The data is thus converted 703 to a series of reference codes to sourceblocks in the library. The data is stored as a collection of codewords, each of which contains the reference code to a sourceblock and information about the location of the sourceblocks in the data set. Reconstructing the data is performed by reversing the process. Each stored reference code in a data collection is compared with the reference codes in the library, the corresponding sourceblock is read from the library, and the data is reconstructed into its original form.

Figure 8:
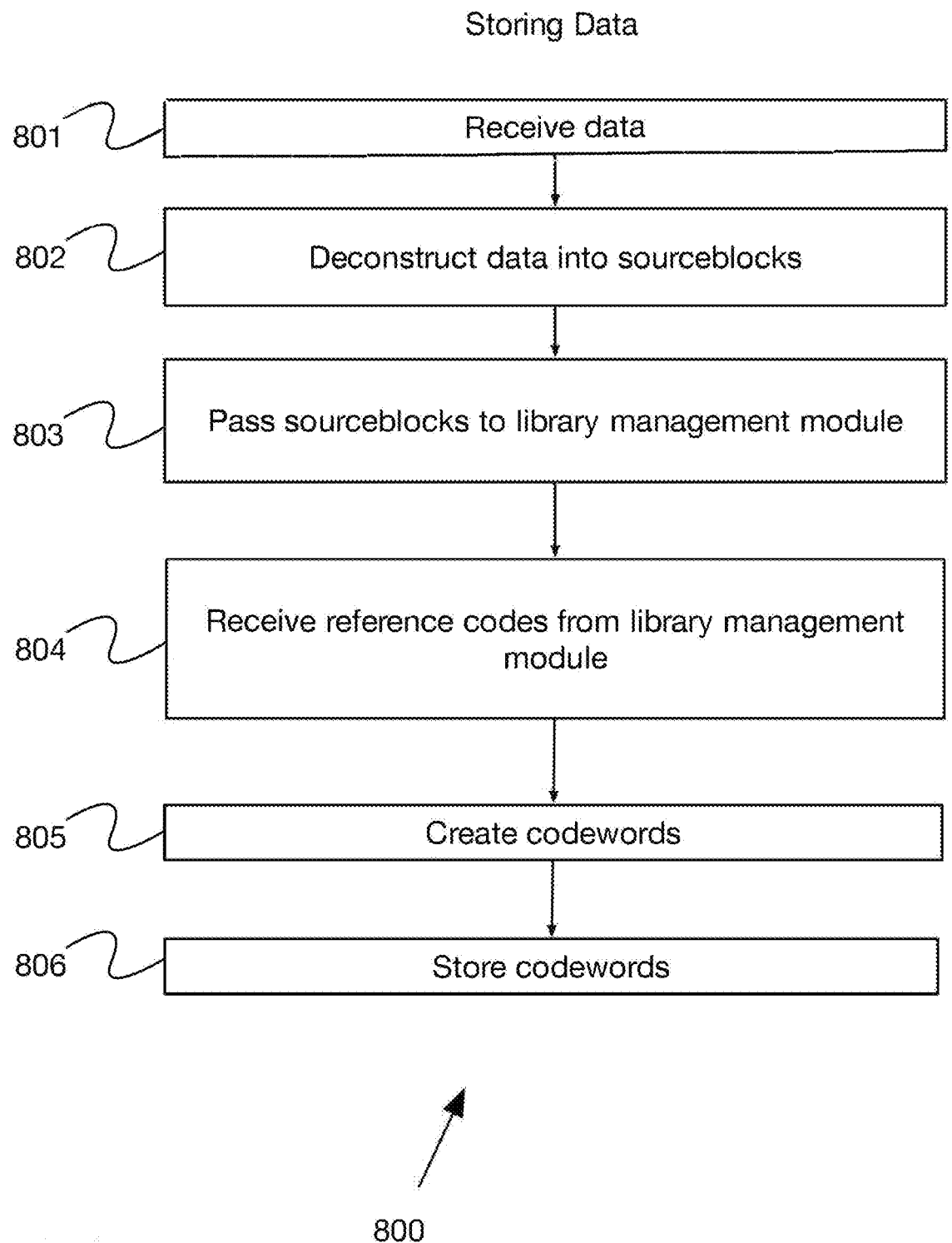
FIG. 8 is a method diagram showing the steps involved in using an embodiment to store data.

FIG. 8 is a method diagram showing the steps involved in using an embodiment 800 to store data. As data is received 801, it would be deconstructed into sourceblocks 802, and passed 803 to the library management module for processing. Reference codes would be received back 804 from the library management module, and could be combined with location information to create codewords 805, which would then be stored 806 as representations of the original data.

Figure 9:
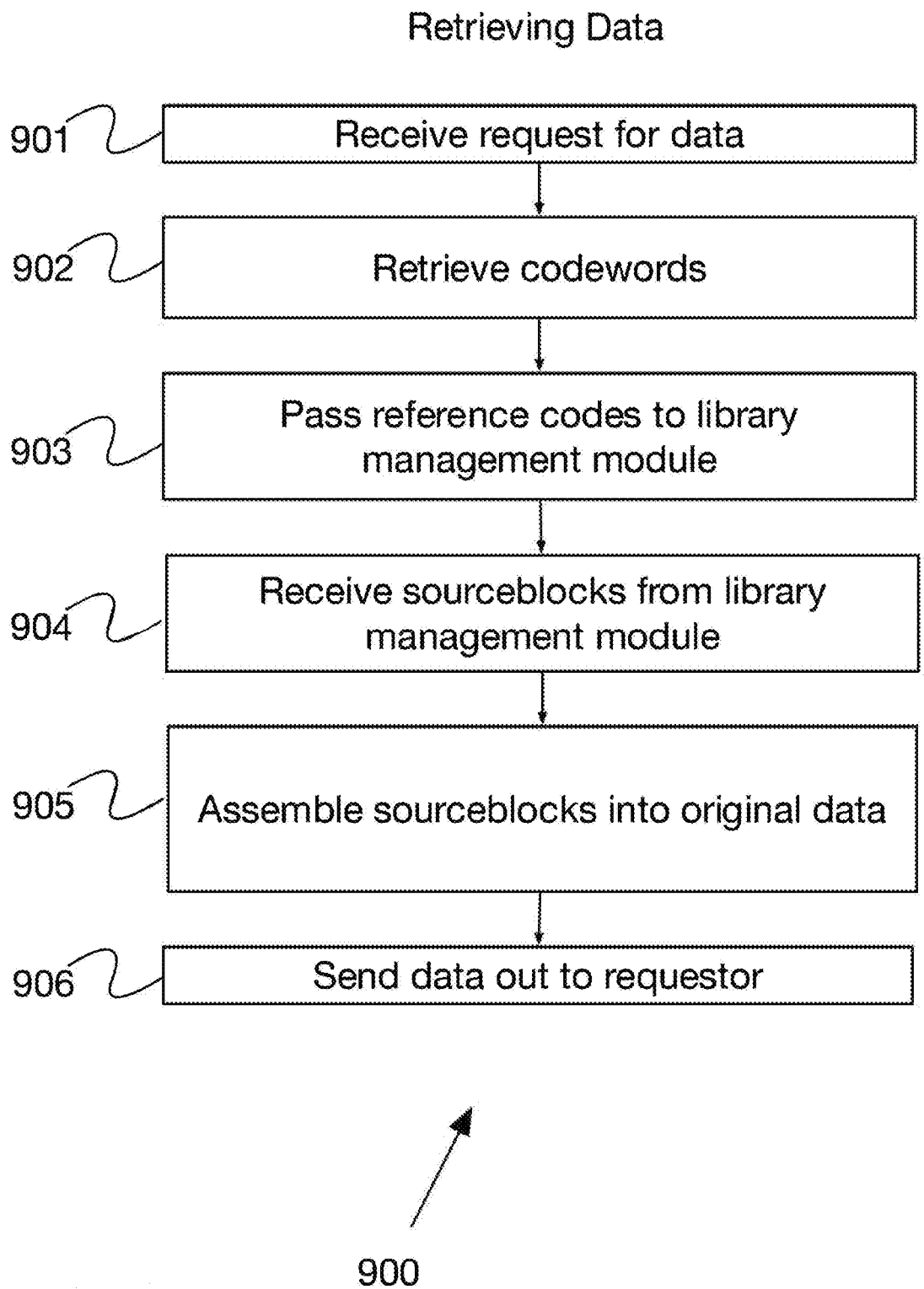
FIG. 9 is a method diagram showing the steps involved in using an embodiment to retrieve data.

FIG. 9 is a method diagram showing the steps involved in using an embodiment 900 to retrieve data. When a request for data is received 901, the associated codewords would be retrieved 902 from the library. The codewords would be passed 903 to the library management module, and the associated sourceblocks would be received back 904. Upon receipt, the sourceblocks would be assembled 905 into the original data using the location data contained in the codewords, and the reconstructed data would be sent out 906 to the requestor.

Figure 10:
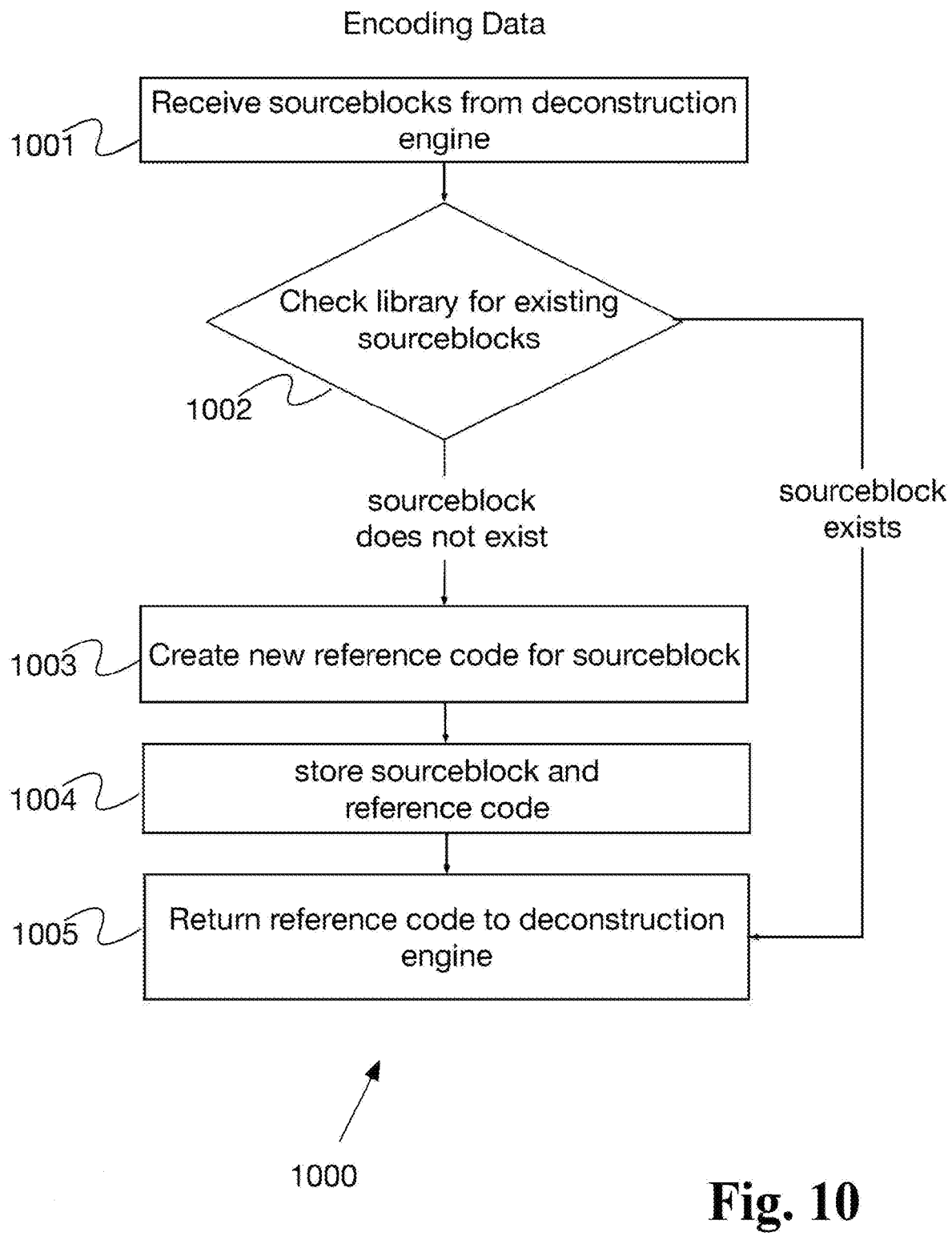
FIG. 10 is a method diagram showing the steps involved in using an embodiment to encode data.

FIG. 10 is a method diagram showing the steps involved in using an embodiment 1000 to encode data. As sourceblocks are received 1001 from the deconstruction engine, they would be compared 1002 with the sourceblocks already contained in the library. If that sourceblock already exists in the library, the associated reference code would be returned 1005 to the deconstruction engine. If the sourceblock does not already exist in the library, a new reference code would be created 1003 for the sourceblock. The new reference code and its associated sourceblock would be stored 1004 in the library, and the reference code would be returned to the deconstruction engine.

Figure 11:
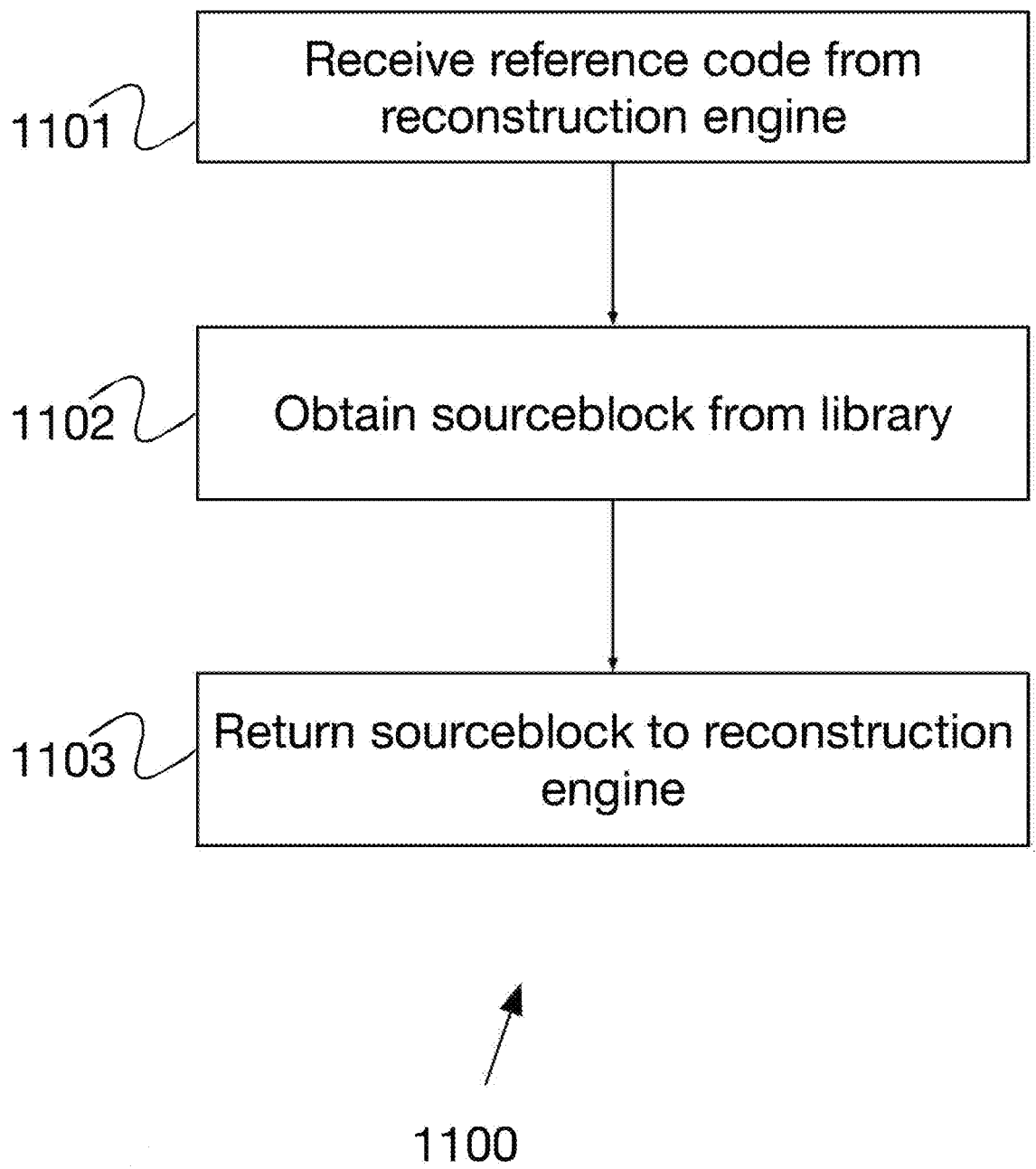
FIG. 11 is a method diagram showing the steps involved in using an embodiment to decode data.

FIG. 11 is a method diagram showing the steps involved in using an embodiment 1100 to decode data. As reference codes are received 1101 from the reconstruction engine, the associated sourceblocks are retrieved 1102 from the library, and returned 1103 to the reconstruction engine.

Figure 16:
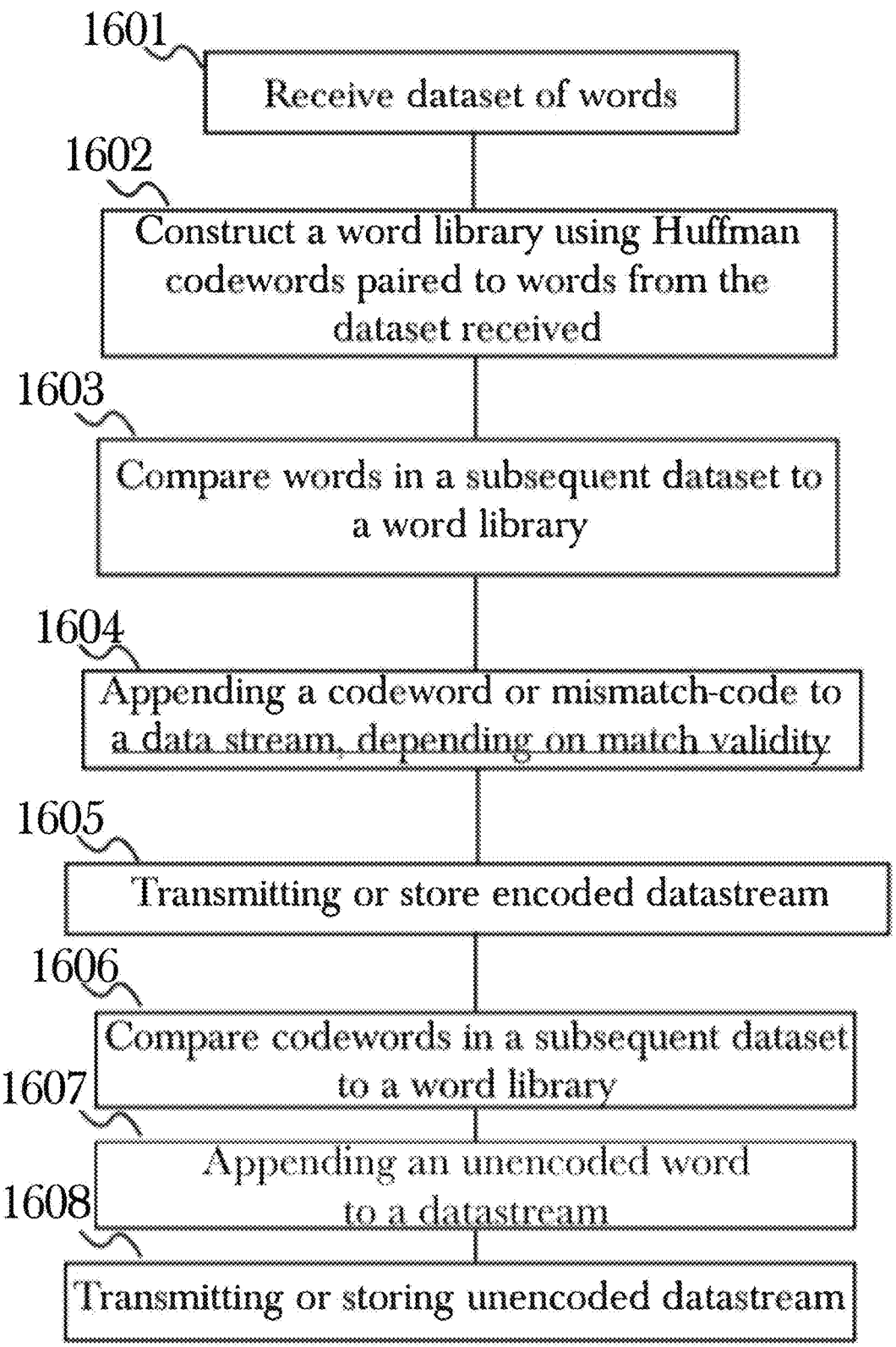
FIG. 16 is a method diagram illustrating key system functionality utilizing an encoder and decoder pair.

FIG. 16 is a method diagram illustrating key system functionality utilizing an encoder and decoder pair, according to a preferred embodiment. In a first step 1601, at least one incoming data set may be received at a customized library generator 1300 that then 1602 processes data to produce a customized word library 1201 comprising key-value pairs of data words (each comprising a string of bits) and their corresponding calculated binary Huffman codewords. A subsequent dataset may be received, and compared to the word library 1603 to determine the proper codewords to use in order to encode the dataset. Words in the dataset are checked against the word library and appropriate encodings are appended to a data stream 1604. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 1605 to a destination as desired. For the purposes of decoding, an already-encoded data stream may be received and compared 1606, and un-encoded words may be appended to a new data stream 1607 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream, the inverse of the process of encoding described earlier. Such a data stream may then be stored or transmitted 1608 as desired.

Figure 17:
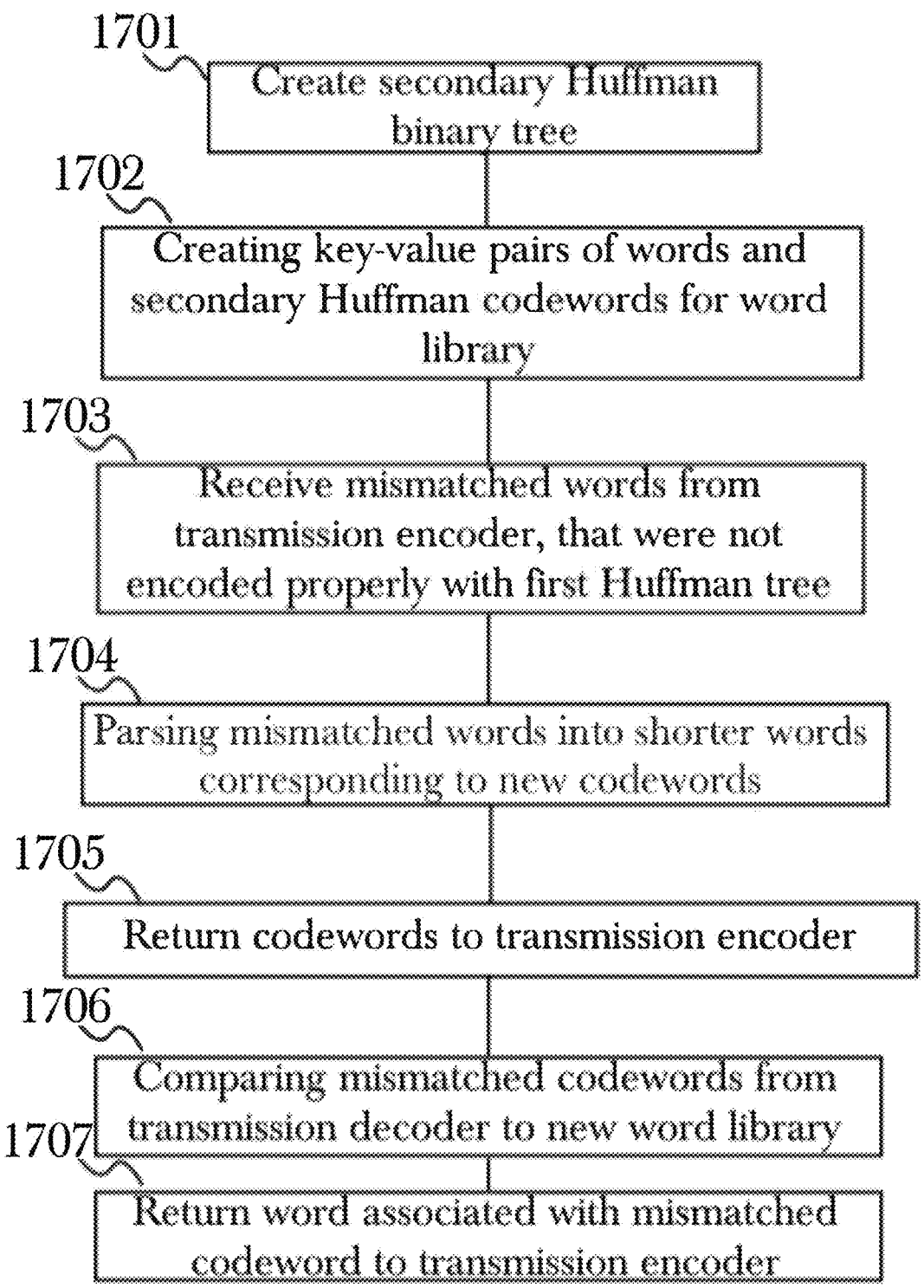
FIG. 17 is a method diagram illustrating possible use of a hybrid encoder/decoder to improve the compression ratio.

FIG. 17 is a method diagram illustrating possible use of a hybrid encoder/decoder to improve the compression ratio, according to a preferred aspect. A second Huffman binary tree may be created 1701, having a shorter maximum length of codewords than a first Huffman binary tree 1602, allowing a word library to be filled with every combination of codeword possible in this shorter Huffman binary tree 1702. A word library may be filled with these Huffman codewords and words from a dataset 1702, such that a hybrid encoder/decoder 1304, 1503 may receive any mismatched words from a dataset for which encoding has been attempted with a first Huffman binary tree 1703, 1604 and parse previously mismatched words into new partial codewords (that is, codewords that are each a substring of an original mismatched codeword) using the second Huffman binary tree 1704. In this way, an incomplete word library may be supplemented by a second word library. New codewords attained in this way may then be returned to a transmission encoder 1705, 1500. In the event that an encoded dataset is received for decoding, and there is a mismatch code indicating that additional coding is needed, a mismatch code may be removed and the unencoded word used to generate a new codeword as before 1706, so that a transmission encoder 1500 may have the word and newly generated codeword added to its word library 1707, to prevent further mismatching and errors in encoding and decoding.

It will be recognized by a person skilled in the art that the methods described herein can be applied to data in any form. For example, the method described herein could be used to store genetic data, which has four data units: C, G, A, and T. Those four data units can be represented as 2-bit sequences: 00, 01, 10, and 11, which can be processed and stored using the method described herein.

It will be recognized by a person skilled in the art that certain embodiments of the methods described herein may have uses other than data storage. For example, because the data is stored in reference code form, it cannot be reconstructed without the availability of the library of source-blocks. This is effectively a form of encryption, which could be used for cyber security purposes. As another example, an embodiment of the method described herein could be used to store backup copies of data, provide for redundancy in the event of server failure, or provide additional security against cyberattacks by distributing multiple partial copies of the library among computers are various locations, ensuring that at least two copies of each sourceblock exist in different locations within the network.

Figure 18:
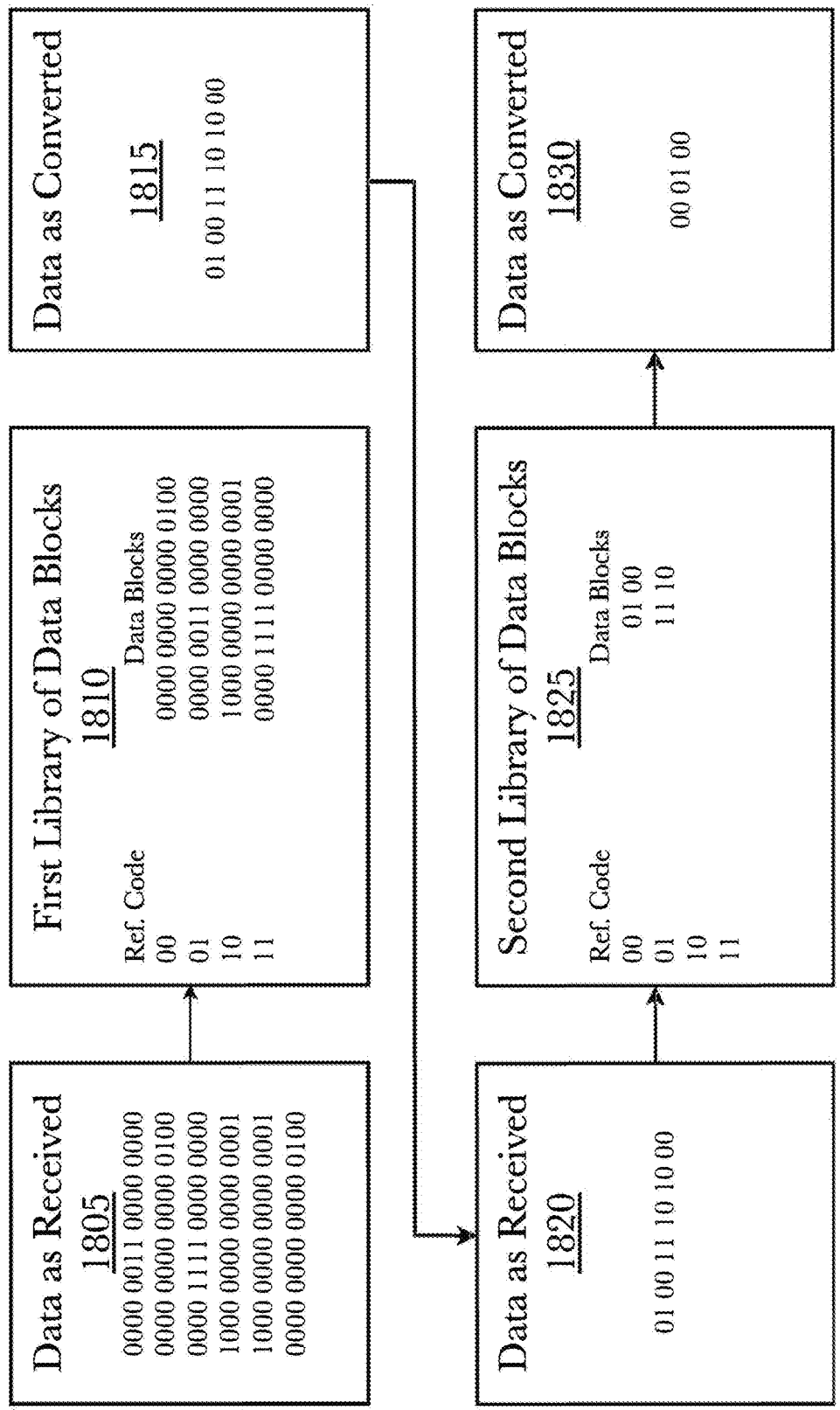
FIG. 18 is a flow diagram illustrating the use of a data encoding system used to recursively encode data to further reduce data size.

FIG. 18 is a flow diagram illustrating the use of a data encoding system used to recursively encode data to further reduce data size. Data may be input 1805 into a data deconstruction engine 102 to be deconstructed into code references, using a library of code references based on the input 1810. Such example data is shown in a converted, encoded format 1815, highly compressed, reducing the example data from 96 bits of data to 12 bits of data, before sending this newly encoded data through the process again 1820, to be encoded by a second library 1825, reducing it even further. The newly converted data 1830 is shown as only 6 bits in this example, thus a size of 6.25% of the original data packet. With recursive encoding, then, it is possible and implemented in the system to achieve increasing compression ratios, using multi-layered encoding, through recursively encoding data. Both initial encoding libraries 1810 and subsequent libraries 1825 may be achieved through machine learning techniques to find optimal encoding patterns to reduce size, with the libraries being distributed to recipients prior to transfer of the actual encoded data, such that only the compressed data 1830 must be transferred or stored, allowing for smaller data footprints and bandwidth requirements. This process can be reversed to reconstruct the data. While this example shows only two levels of encoding, recursive encoding may be repeated any number of times. The number of levels of recursive encoding will depend on many factors, a non-exhaustive list of which includes the type of data being encoded, the size of the original data, the intended usage of the data, the number of instances of data being stored, and available storage space for codebooks and libraries. Additionally, recursive encoding can be applied not only to data to be stored or transmitted, but also to the codebooks and/or libraries, themselves. For example, many installations of different libraries could take up a substantial amount of storage space. Recursively encoding those different libraries to a single, universal library would dramatically reduce the amount of storage space required, and each different library could be reconstructed as necessary to reconstruct incoming streams of data.

Figure 20:
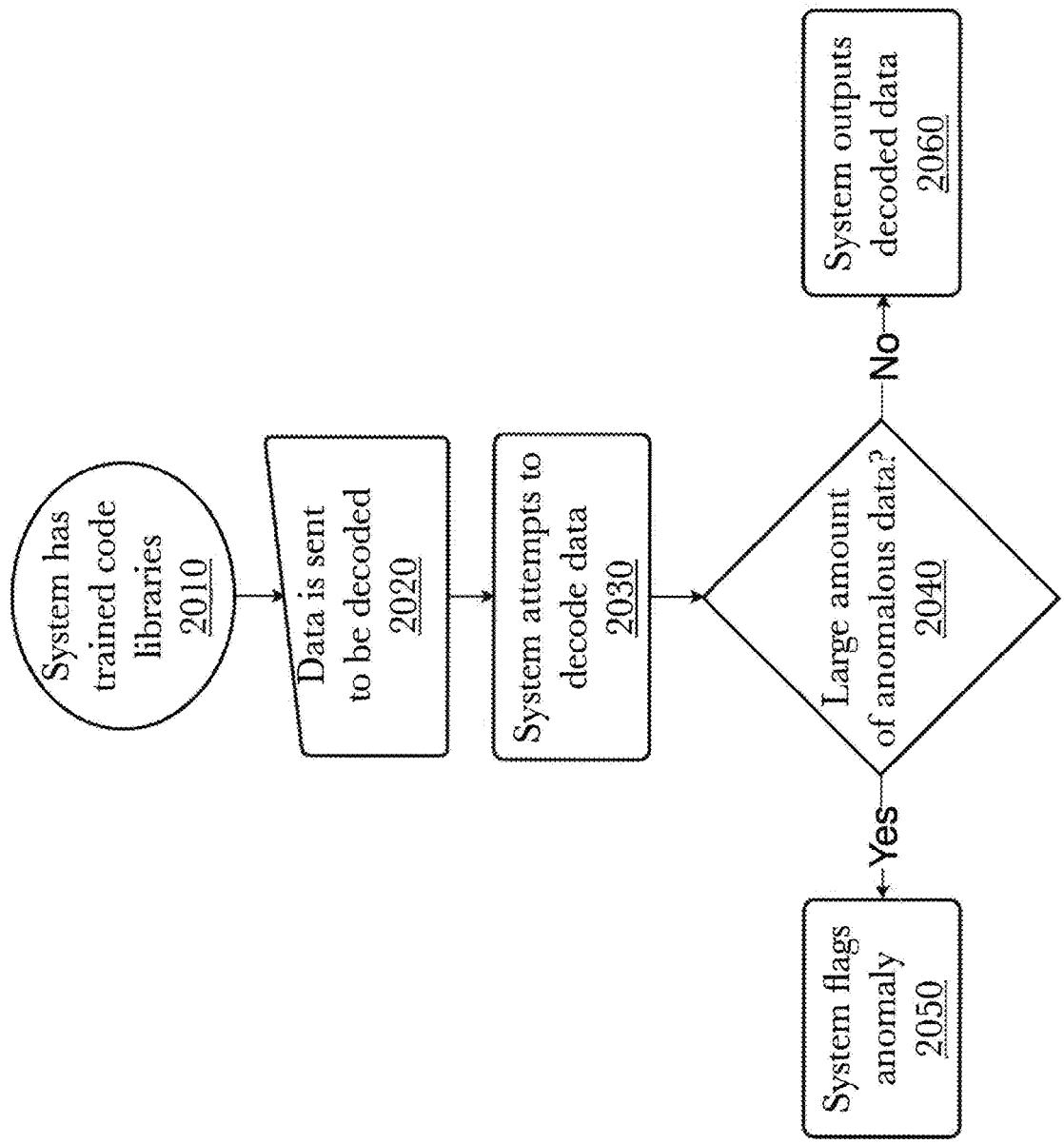
FIG. 20 is a flow diagram of an exemplary method used to detect anomalies in received encoded data and producing a warning.

FIG. 20 is a flow diagram of an exemplary method used to detect anomalies in received encoded data and producing a warning. A system may have trained encoding libraries 2010, before data is received from some source such as a network connected device or a locally connected device including USB connected devices, to be decoded 2020. Decoding in this context refers to the process of using the encoding libraries to take the received data and attempt to use encoded references to decode the data into its original source 2030, potentially more than once if recursive encoding was used, but not necessarily more than once. An anomaly detector 1910 may be configured to detect a large amount of un-encoded data 2040 in the midst of encoded data, by locating data or references that do not appear in the encoding libraries, indicating at least an anomaly, and potentially data tampering or faulty encoding libraries. A flag or warning is set by the system 2050, allowing a user to be warned at least of the presence of the anomaly and the characteristics of the anomaly. However, if a large number of invalid references or unencoded data are not present in the encoded data that is attempting to be decoded, the data may be decoded and output as normal 2060, indicating no anomaly has been detected.

Figure 21:
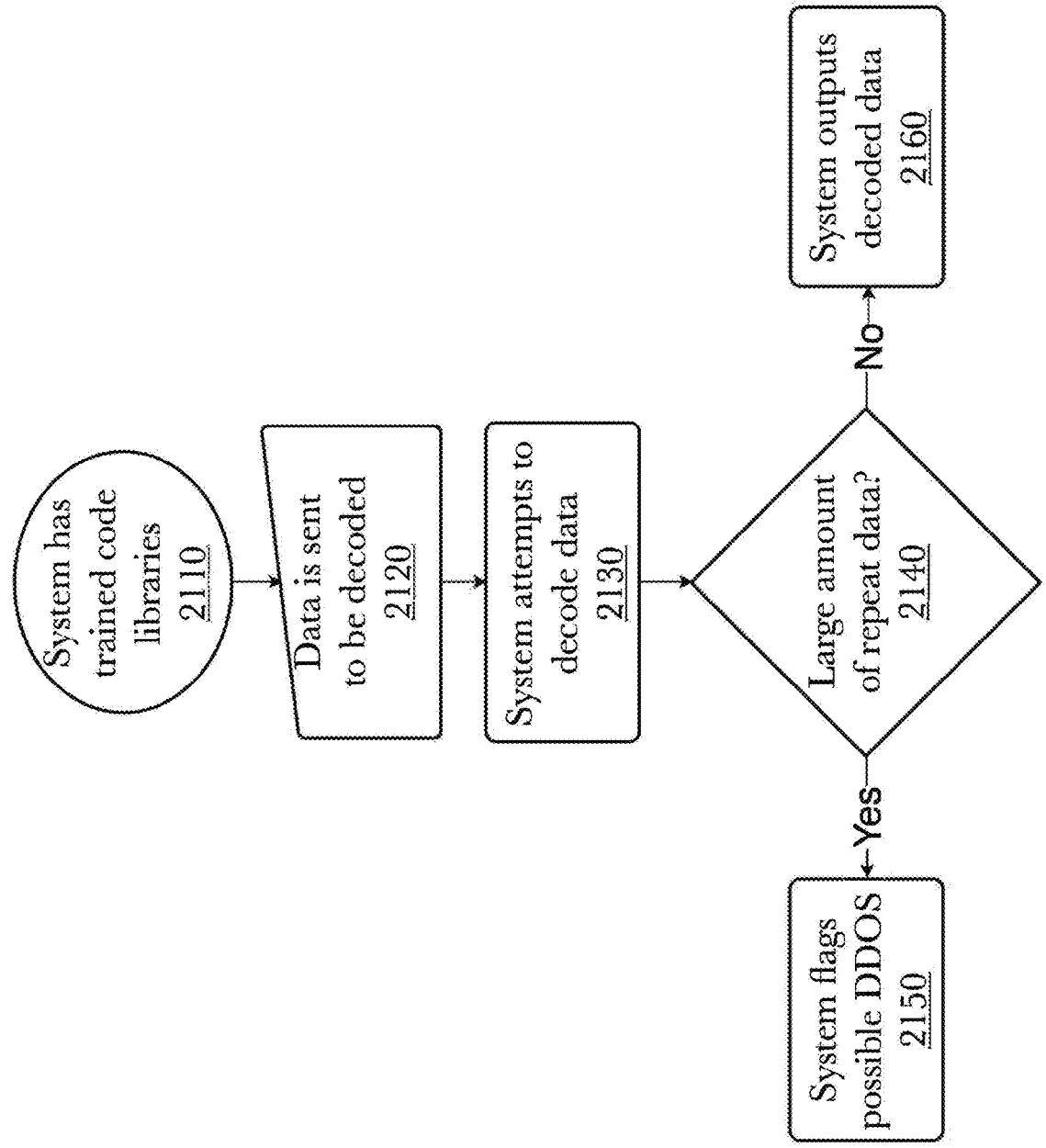
FIG. 21 is a flow diagram of a data encoding system used for Distributed Denial of Service (DDoS) attack denial.

FIG. 21 is a flow diagram of a method used for Distributed Denial of Service (DDoS) attack denial. A system may have trained encoding libraries 2110, before data is received from some source such as a network connected device or a locally connected device including USB connected devices, to be decoded 2120. Decoding in this context refers to the process of using the encoding libraries to take the received data and attempt to use encoded references to decode the data into its original source 2130, potentially more than once if recursive encoding was used, but not necessarily more than once. A DDoS detector 1920 may be configured to detect a large amount of repeating data 2140 in the encoded data, by locating data or references that repeat many times over (the number of which can be configured by a user or administrator as need be), indicating a possible DDoS attack. A flag or warning is set by the system 2150, allowing a user to be warned at least of the presence of a possible DDoS attack, including characteristics about the data and source that initiated the flag, allowing a user to then block incoming data from that source. However, if a large amount of repeat data in a short span of time is not detected, the data may be decoded and output as normal 2160, indicating no DDoS attack has been detected.

Figure 23:
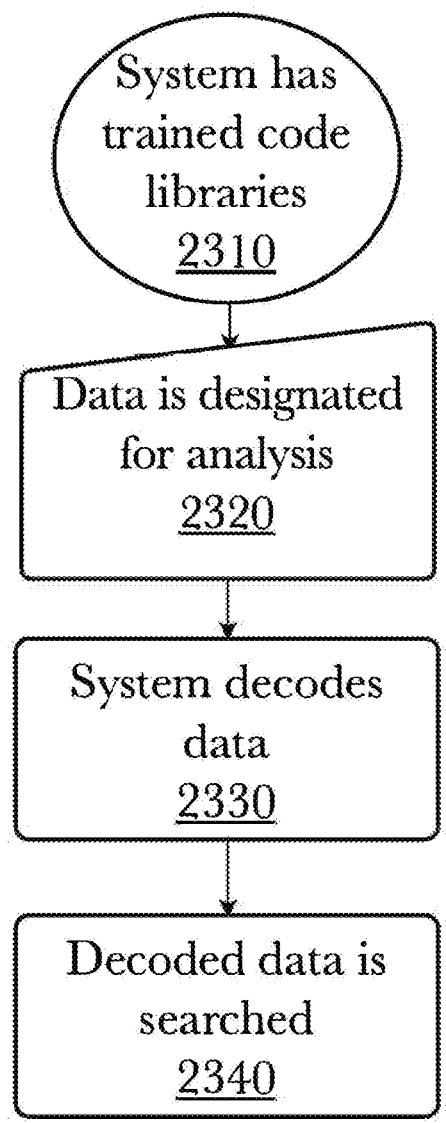
FIG. 23 is a flow diagram of an exemplary method used to enable high-speed data mining of repetitive data.

FIG. 23 is a flow diagram of an exemplary method used to enable high-speed data mining of repetitive data. A system may have trained encoding libraries 2310, before data is received from some source such as a network connected device or a locally connected device including USB connected devices, to be analyzed 2320 and decoded 2330. When determining data for analysis, users may select specific data to designate for decoding 2330, before running any data mining or analytics functions or software on the decoded data 2340. Rather than having traditional decryption and decompression operate over distributed drives, data can be regenerated immediately using the encoding libraries disclosed herein, as it is being searched. Using methods described in FIG. 9 and FIG. 11, data can be stored, retrieved, and decoded swiftly for searching, even across multiple devices, because the encoding library may be on each device. For example, if a group of servers host codewords relevant for data mining purposes, a single computer can request these codewords, and the codewords can be sent to the recipient swiftly over the bandwidth of their connection, allowing the recipient to locally decode the data for immediate evaluation and searching, rather than running slow, traditional decompression algorithms on data stored across multiple devices or transfer larger sums of data across limited bandwidth.

Figure 25:
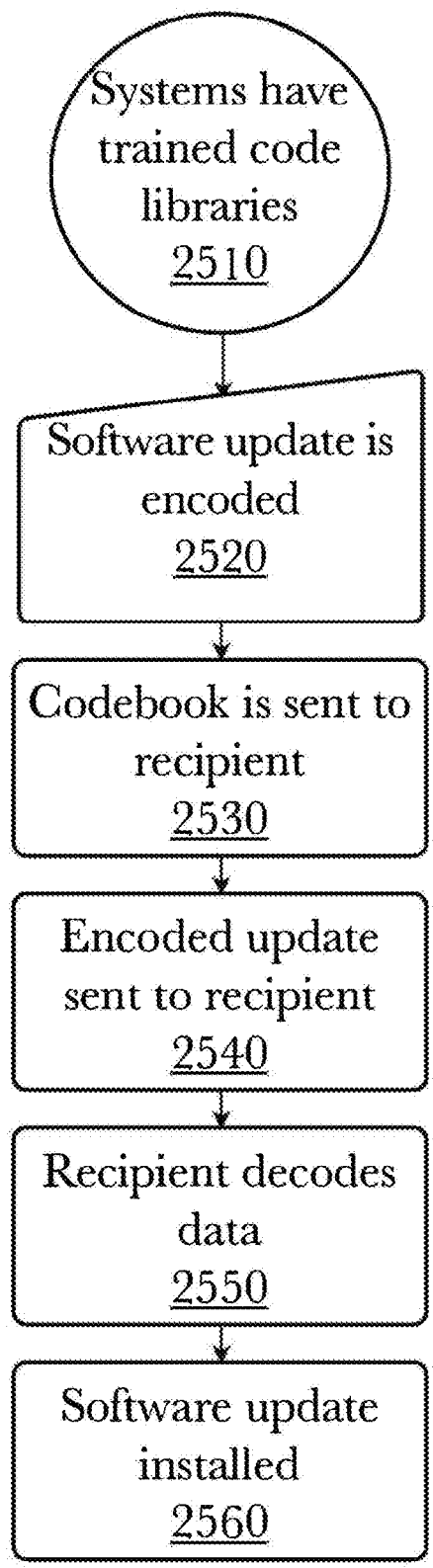
FIG. 25 is a flow diagram of an exemplary method used to encode and transfer software and firmware updates to a device for installation, for the purposes of reduced bandwidth consumption.

FIG. 25 is a flow diagram of an exemplary method used to encode and transfer software and firmware updates to a device for installation, for the purposes of reduced bandwidth consumption. A first system may have trained code libraries or "codebooks" present 2510, allowing for a software update of some manner to be encoded 2520. Such a software update may be a firmware update, operating system update, security patch, application patch or upgrade, or any other type of software update, patch, modification, or upgrade, affecting any computer system. A codebook for the patch must be distributed to a recipient 2530, which may be done beforehand and either over a network or through a local or physical connection, but must be accomplished at some point in the process before the update may be installed on the recipient device 2560. An update may then be distributed to a recipient device 2540, allowing a recipient with a codebook distributed to them 2530 to decode the update 2550 before installation 2560. In this way, an encoded and thus heavily compressed update may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 27:
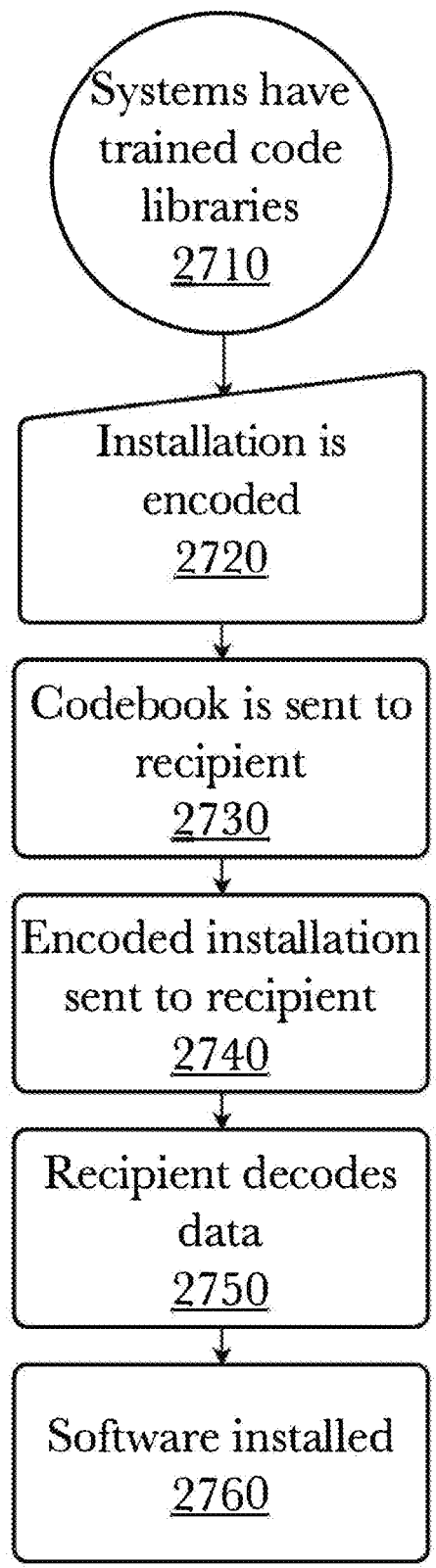
FIG. 27 is a flow diagram of an exemplary method used to encode new software and operating system installations for reduced bandwidth required for transference.

FIG. 27 is a flow diagram of an exemplary method used to encode new software and operating system installations for reduced bandwidth required for transference. A first system may have trained code libraries or "codebooks" present 2710, allowing for a software installation of some manner to be encoded 2720. Such a software installation may be a software update, operating system, security system, application, or any other type of software installation, execution, or acquisition, affecting a computer system. An encoding library or "codebook" for the installation must be distributed to a recipient 2730, which may be done beforehand and either over a network or through a local or physical connection, but must be accomplished at some point in the process before the installation can begin on the recipient device 2760. An installation may then be distributed to a recipient device 2740, allowing a recipient with a codebook distributed to them 2730 to decode the installation 2750 before executing the installation 2760. In this way, an encoded and thus heavily compressed software installation may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 31:
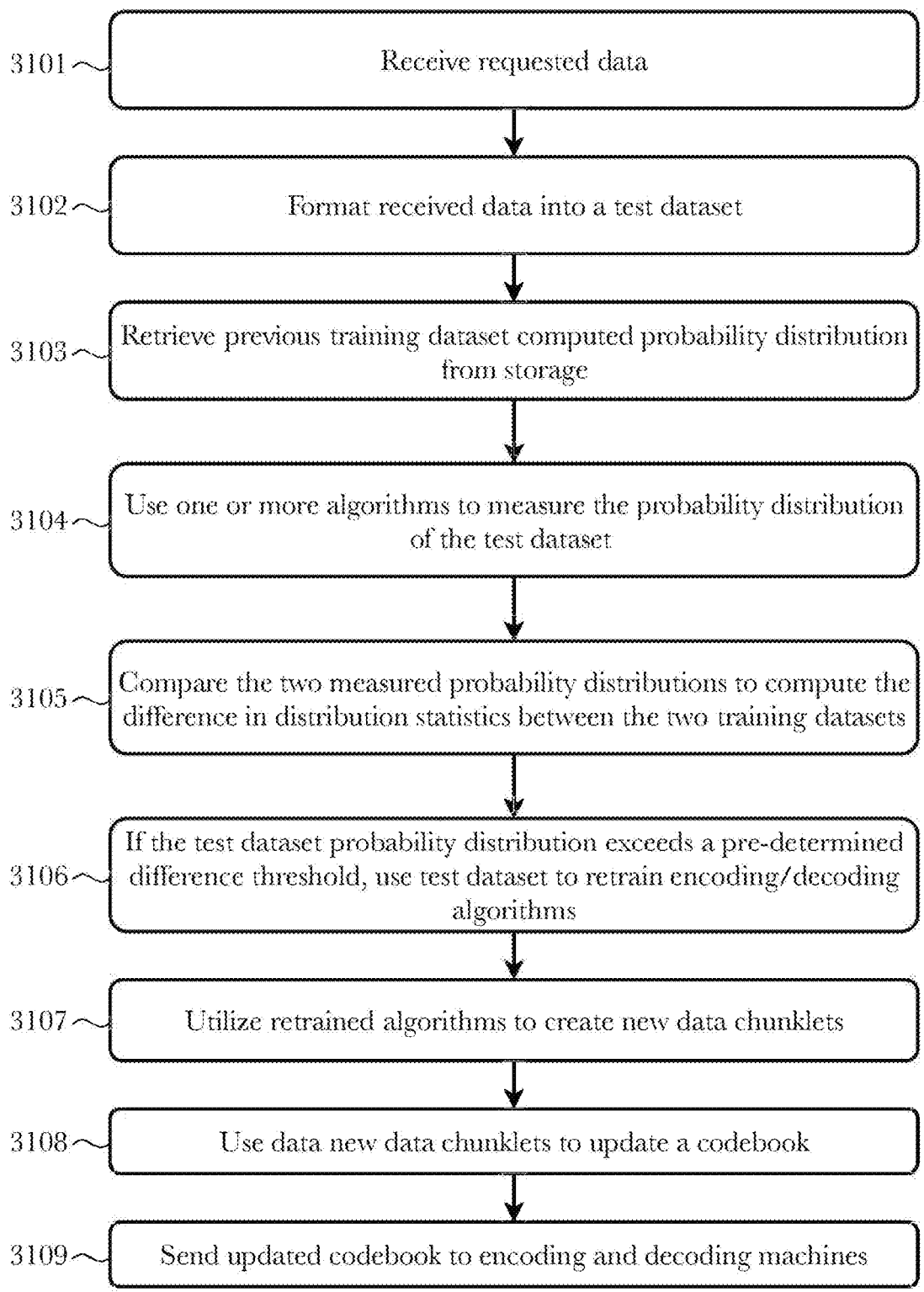
FIG. 31 is a method diagram illustrating the steps involved in using an embodiment of the codebook training system to update a codebook.

FIG. 31 is a method diagram illustrating the steps 3100 involved in using an embodiment of the codebook training system to update a codebook. The process begins when requested data is received 3101 by a codebook training module. The requested data may comprise a plurality of sourceblocks. Next, the received data may be stored in a cache and formatted into a test dataset 3102. The next step is to retrieve the previously computed probability distribution associated with the previous (most recent) training dataset from a storage device 3103. Using one or more algorithms, measure and record the probability distribution of the test dataset 3104. The step after that is to compare the measured probability distributions of the test dataset and the previous training dataset to compute the difference in distribution statistics between the two datasets 3105. If the test dataset probability distribution exceeds a pre-determined difference threshold, then the test dataset will be used to retrain the encoding/decoding algorithms 3106 to reflect the new distribution of the incoming data to the encoder/decoder system. The retrained algorithms may then be used to create new data sourceblocks 3107 that better capture the nature of the data being received. These newly created data sourceblocks may then be used to create new codewords and update a codebook 3108 with each new data sourceblock and its associated new codeword. Last, the updated codebooks may be sent to encoding and decoding machines 3109 in order to ensure the encoding/decoding system function properly.

Figure 49:
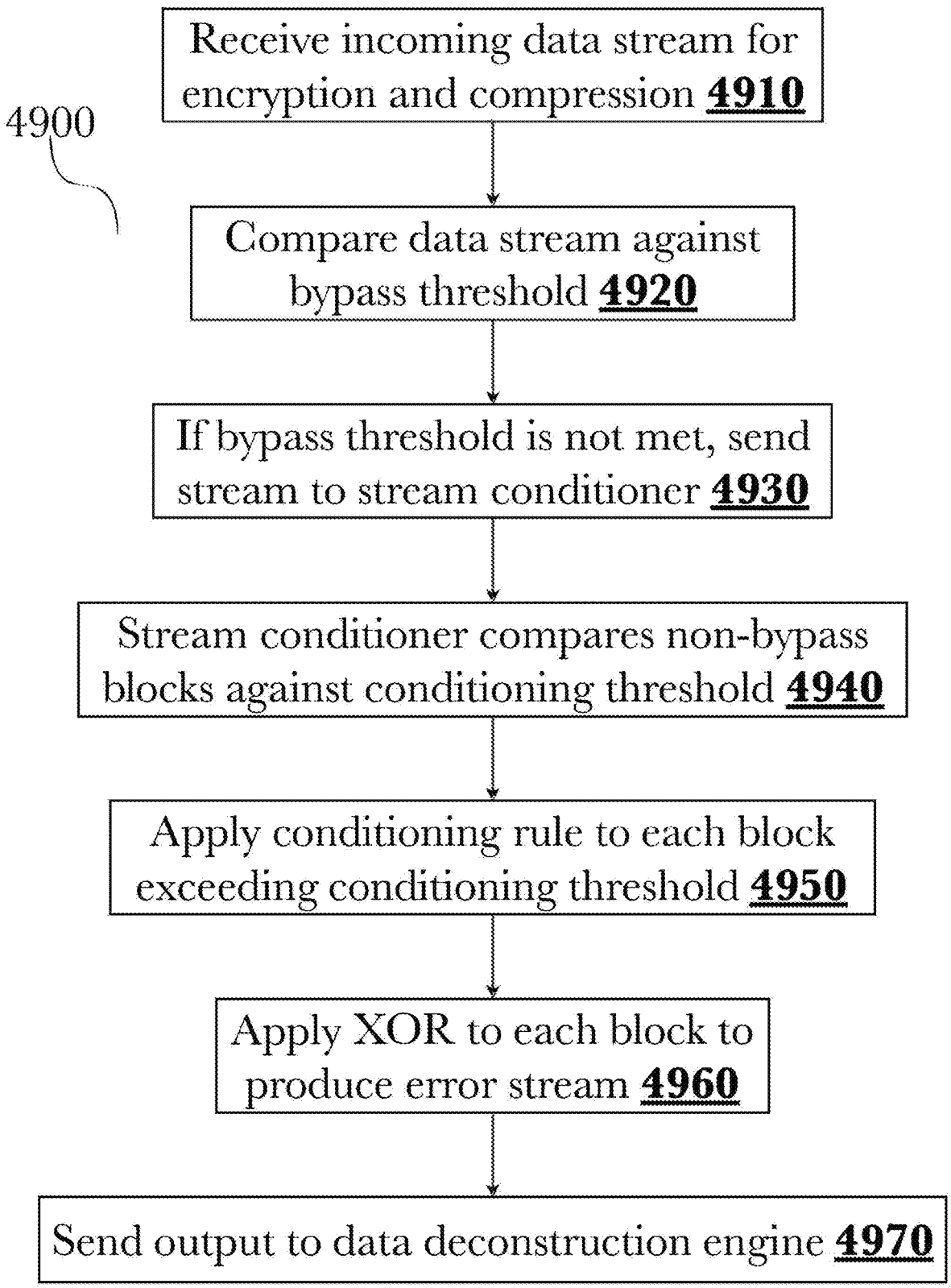
FIG. 49 is a flow diagram illustrating an exemplary method for compressing and encrypting data using split-stream processing.

FIG. 49 is a flow diagram illustrating an exemplary method 4900 for compressing and encrypting data using split-stream processing. In an initial step 4910, a data stream is received for compression and encryption. Each block in the data stream may be compared against a bypass threshold 4920 to determine whether the stream should be conditioned, and if so, the stream is then passed 4930 to a stream conditioner 4702. The stream conditioner 4702 then compares each block 4940 against a conditioning threshold based on the block's actual vs. ideal frequency, and those blocks that exceed the threshold have a conditioning rule applied 4950. Each block may then be processed using an XOR logical operation 4960, and the output appended to an error stream that correspond to the difference between the original data and the conditioned data. The conditioned data and the error stream are then sent as output 4970 for compression as described in further detail below, with reference to at least FIG. 10.

Figure 50:
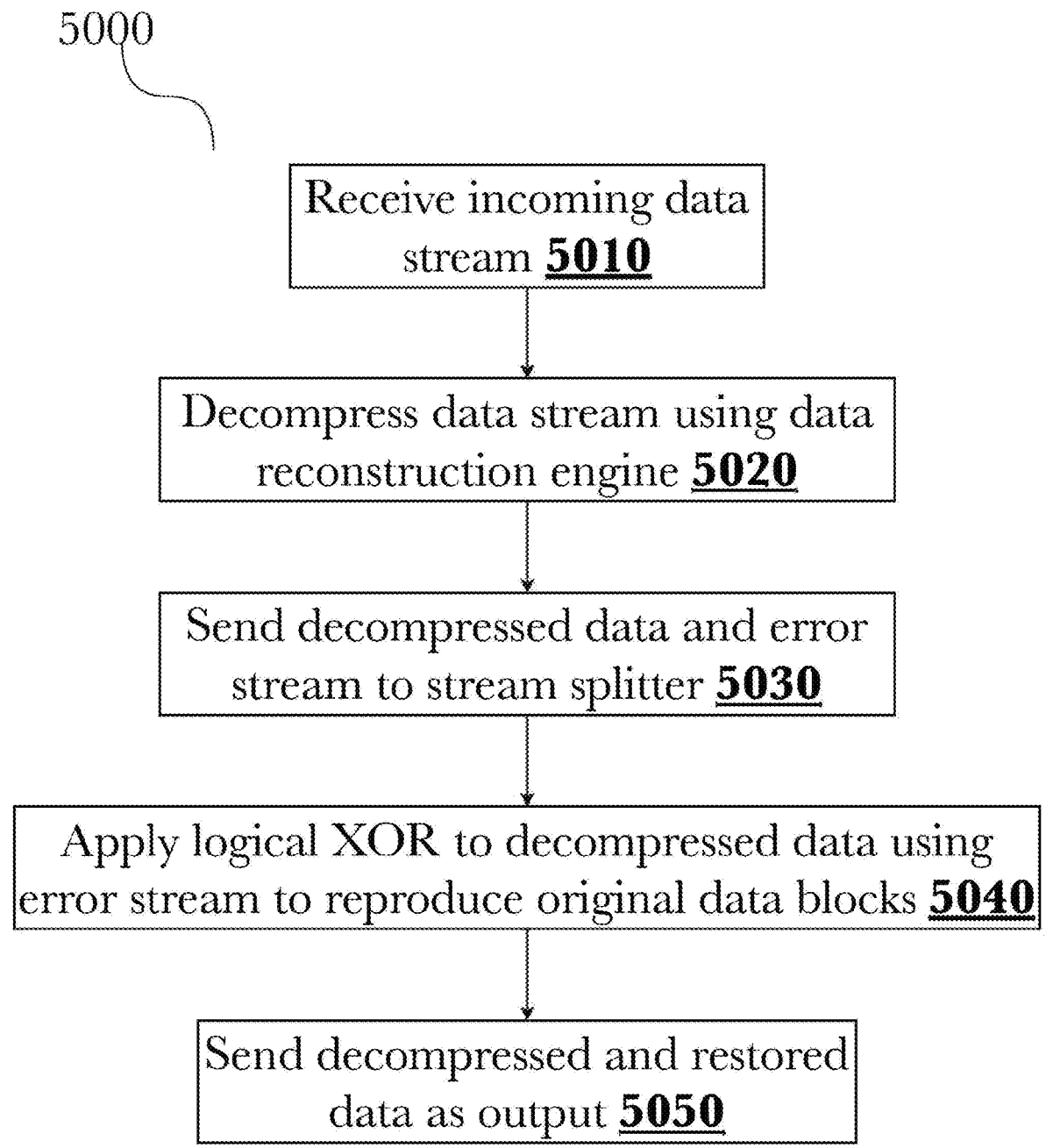
FIG. 50 is a flow diagram illustrating an exemplary method for decrypting and decompressing split-stream data.

FIG. 50 is a flow diagram illustrating an exemplary method 5000 for decrypting and decompressing split-stream data. In an initial step 5010, a data stream is received at a data decompression engine 301. The data stream is decompressed 5020 by reversing the encoding as described below with reference to FIG. 11, and the decompressed (but still encrypted) data and error stream are passed 5030 to a stream splitter 4801. The stream splitter performs logical XOR operations on each data block 5040 using the error stream, reversing any conditioning done to each data block, producing the original data as output 5050.

Adaptive Protocol Cache Optimization System Architecture

Figure 62:
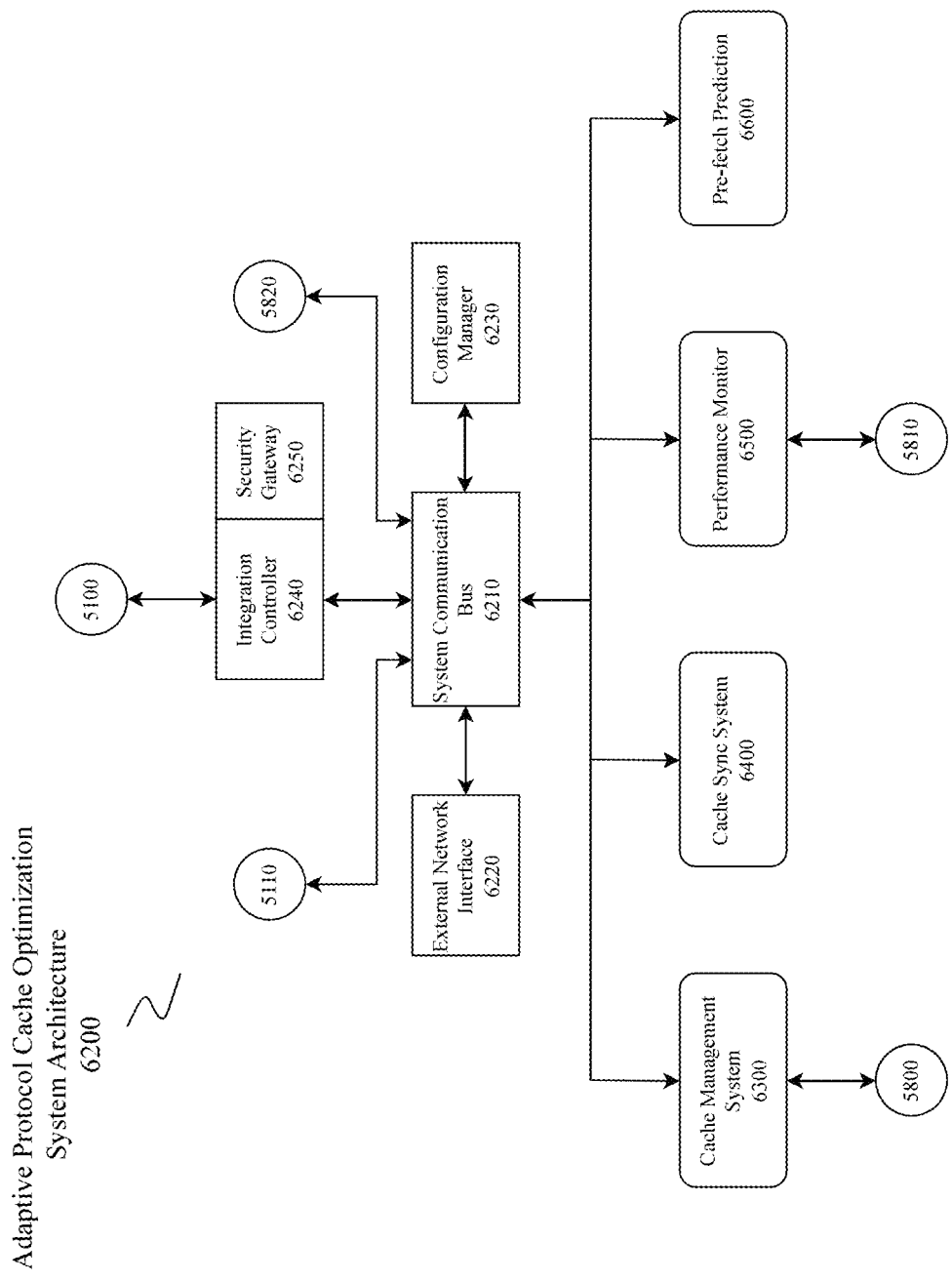
FIG. 62 is a block diagram illustrating exemplary architecture of adaptive protocol cache optimization system.

FIG. 62 illustrates one embodiment of the adaptive protocol cache optimization system 6200, representing a comprehensive architecture that integrates multiple subsystems to optimize caching, synchronization, and protocol prediction. It will be appreciated by one skilled in the art that various embodiments may be adapted to suit specific use case scenarios, including but not limited to distributed computing environments, high-demand transaction systems, or secure communication networks. The specific configuration and interactions of the subsystems described in this embodiment may vary depending on the operational requirements, resource constraints, and performance goals of the deployment environment. These variations are within the scope of the system, which is designed to be modular and flexible to address diverse implementation needs.

System communication bus 6210 forms core infrastructure for connecting major subsystems and components, enabling efficient data exchange and coordination across system 6200. Integration controller 6240 manages interactions between system 6200 and existing network infrastructure, coordinating with enhanced transaction manager 5800 and protocol prediction subsystem 5810 to facilitate seamless protocol management.

Cache management system 6300 implements multi-level protocol caching through local, regional and global cache hierarchies, storing frequently used protocols while maintaining cache coherency across distributed nodes. Cache synchronization system 6400 utilizes Merkle tree structures to enable efficient verification and updating of cache contents across network nodes, minimizing data transfer requirements during synchronization operations.

Performance monitoring system 6500 tracks key metrics including cache hit rates, protocol negotiation latency, and resource utilization across cache levels. This monitoring data feeds into pre-fetch prediction system 6600, which analyzes usage patterns to anticipate future protocol requirements and trigger proactive cache operations. ML/AI engine 5110 enhances prediction capabilities by incorporating pattern recognition and machine learning techniques.

External network interface 6220 manages communication between distributed cache system components and enables integration with protocol repositories. System configuration manager 6230 provides centralized control over cache system behavior, allowing administrators to tune performance parameters and optimization strategies. Security gateway 6250 ensures cache operations comply with network security policies while protecting cached protocol data.

Integration with codebook generator 5100 enables compression of cached protocols using existing codebooks, reducing storage requirements while maintaining rapid access capabilities. Protocol translation subsystem 5820 interfaces with cache management system 6300 to store and retrieve common translation patterns, reducing computational overhead of repeated translation operations.

Cache management system 6300 maintains detailed protocol cache entries containing descriptors, performance metrics, and usage statistics. When protocol requests arrive through enhanced transaction manager 5800, cache lookups occur before engaging protocol prediction subsystem 5810. Success rates and performance data flow back through performance monitoring system 6500 to continuously optimize cache operations.

Pre-fetch prediction system 6600 coordinates with protocol prediction subsystem 5810 and ML/AI engine 5110 to identify protocols likely to be needed, triggering cache warming operations through cache management system 6300. Protocol translation patterns from protocol translation subsystem 5820 inform caching decisions for commonly used protocol conversions.

System communication bus 6210 enables coordinated operation of all subsystems while maintaining separation of concerns. Integration controller 6240 manages data flow between cache optimization system 6200 and external components through standardized interfaces. This architecture allows system 6200 to enhance protocol management capabilities while maintaining compatibility with existing network infrastructure.

When enhanced transaction manager 5800 initiates protocol requests, integration controller 6240 receives them via system communication bus 6210 and routes them to cache management system 6300 for initial cache lookup. Upon cache hit, cache management system 6300 returns cached protocols directly through system communication bus 6210 to integration controller 6240. During cache misses, integration controller 6240 forwards requests to protocol prediction subsystem 5810, while simultaneously triggering pre-fetch prediction system 6600 to update predictive models. Performance monitoring system 6500 collects metrics on cache operations and feeds this data through system communication bus 6210 to ML/AI engine 5110 and system configuration manager 6230 for optimization. When new protocols or translations are identified by protocol translation subsystem 5820, they flow through integration controller 6240 to cache management system 6300 for storage. Cache synchronization system 6400 continuously monitors cache states across distributed nodes through external network interface 6220, initiating synchronization operations when inconsistencies are detected. Security gateway 6250 validates all data flows across system communication bus 6210, ensuring protocol cache operations maintain security compliance. Codebook generator 5100 provides compression codebooks to cache management system 6300 through system communication bus 6210, enabling efficient storage of cached protocols while maintaining rapid access capabilities.

Figure 63:
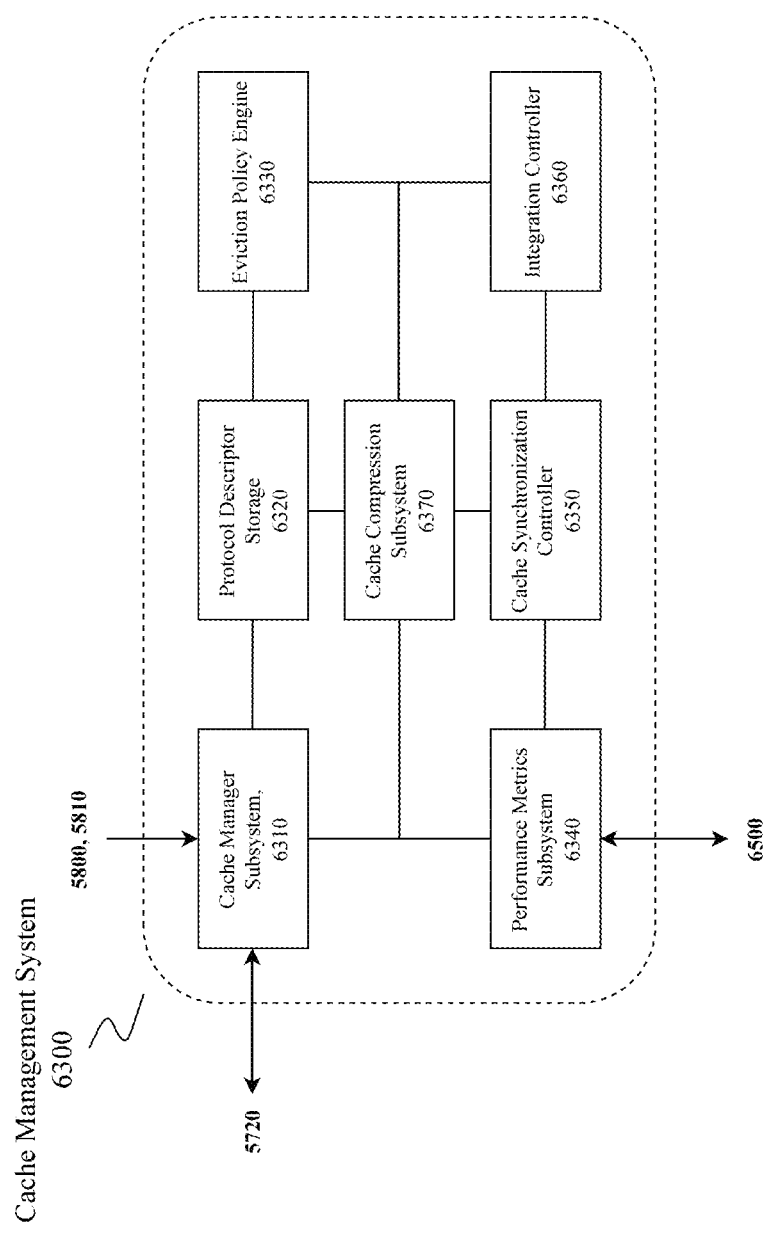
FIG. 63 is a block diagram illustrating exemplary architecture of cache management system.

FIG. 63 is a block diagram illustrating exemplary architecture of cache management system 6300, in an embodiment. Cache management system 6300, part of the adaptive protocol caching framework, operates to store, retrieve, manage, and update protocol cache entries across distributed network environments. Cache management system 6300 includes multiple interconnected subsystems that coordinate to maintain cache performance, synchronize entries, and interface with other systems such as enhanced transaction manager 5800 and protocol prediction module 5810.

Cache manager subsystem 6310 serves as the central control unit within cache management system 6300. It coordinates cache entry lifecycle operations, which may include creation, updates, and retirement of protocol cache entries. For example, during the creation of a new cache entry, cache manager subsystem 6310 may validate the entry against dependencies, assign priority levels, and allocate necessary resources. Updates may involve integrating real-time performance metrics, updating usage statistics, or recalculating validity conditions based on environmental factors. In an embodiment, cache manager subsystem 6310 interacts with protocol predictor interface 5720 to ensure that protocols predicted to be used in upcoming transactions are pre-fetched and incorporated into the appropriate levels of the cache hierarchy. This interaction may involve analyzing historical usage patterns or network conditions to prioritize cache entries. Cache manager subsystem 6310 also handles dependencies and configurations for each protocol cache entry, which may include ensuring compatibility with protocol versions, resolving interdependencies among cached protocols, and applying environmental conditions such as geographic constraints or resource availability to maintain accuracy during protocol retrieval.

Protocol descriptor storage subsystem 6320 manages the storage of protocol-specific information, which may include protocol identifiers, versioning data, required capabilities, and configuration parameters. This subsystem organizes protocol descriptors into a structured format to optimize lookup speed and minimize storage overhead. For example, protocol descriptors may be indexed using unique protocol IDs, allowing for rapid searches during cache lookups. In an embodiment, protocol descriptor storage subsystem 6320 integrates with codebook generator 5100 to apply compression techniques such as delta encoding for closely related protocols and shared parameter pooling to reduce redundancy. This integration may also involve metadata optimization to further enhance storage efficiency, for instance, by grouping common metadata elements across multiple protocol descriptors into a single shared entry.

Eviction policy engine subsystem 6330 determines which cache entries are removed when capacity thresholds are reached, employing a multi-factor scoring system to evaluate metrics such as success rates, access frequency, entry age, and resource costs. For example, entries with low success rates or infrequent usage may be given lower scores and marked for eviction before more frequently accessed or higher-performing entries. The scoring system may be dynamically adjusted to prioritize eviction criteria based on current network conditions or resource constraints. In an embodiment, eviction policy engine subsystem 6330 collaborates with cache synchronization system 6400 to propagate eviction decisions across distributed nodes, ensuring consistency and avoiding scenarios where evicted entries are redundantly re-cached by other nodes. Additionally, selective eviction strategies, such as partial eviction of low-value components or temporary retention based on predicted near-term usage, may be employed to maximize resource utilization.

Performance metrics subsystem 6340 continuously monitors and evaluates key performance indicators, such as cache hit rates, negotiation latency, resource consumption, and bandwidth utilization. This subsystem collects and processes data to inform adjustments to caching strategies. For example, if cache hit rates fall below a predefined threshold, performance metrics subsystem 6340 may trigger changes in pre-fetching priorities or initiate updates to the eviction policy. In an embodiment, this subsystem interfaces with performance monitoring system 6500 to aggregate metrics across multiple nodes, enabling system-wide trend analysis and optimization. Metrics may be presented as real-time dashboards or alerts, highlighting potential bottlenecks or resource constraints for further action.

Cache synchronization controller subsystem 6350 coordinates the synchronization of cache contents across local, regional, and global levels. Synchronization may involve propagating updates or modifications to ensure consistency between distributed nodes. For example, cache synchronization controller subsystem 6350 may use Merkle tree structures from cache synchronization system 6400 to efficiently verify and propagate changes, allowing updates to be transmitted as compact differentials rather than complete replacements. In an embodiment, synchronization controller subsystem 6350 prioritizes updates based on factors such as bandwidth availability or the importance of specific cache entries, ensuring that critical updates are applied promptly while minimizing network overhead. It may also initiate periodic consistency checks or employ hashing techniques to detect and resolve discrepancies between nodes.

Integration controller subsystem 6360 manages interactions between cache management system 6300 and external systems, such as enhanced transaction manager 5800 and protocol translation module 5820. For example, during a transaction, integration controller subsystem 6360 may intercept a protocol request, query cache management system 6300 for the required entry, and provide the result to the enhanced transaction manager 5800, bypassing protocol prediction module 5810 in the event of a cache hit. In an embodiment, integration controller subsystem 6360 facilitates bidirectional feedback from protocol prediction module 5810 and ML/AI engine 5110, ensuring that prediction data, such as historical usage patterns or network conditions, informs caching operations. Additionally, this subsystem may handle configuration updates or status reporting for external systems, enabling seamless integration across the broader system architecture.

Cache compression subsystem 6370 applies codebook-based compression to cache entries to minimize storage requirements and optimize synchronization efficiency. Compression may involve encoding protocol descriptors using existing codebooks, leveraging delta compression for similar protocols, or pooling shared parameters to reduce redundancy. For example, closely related protocol entries may be compressed by storing only the differences between their configurations rather than duplicating the entire data set. In an embodiment, cache compression subsystem 6370 dynamically adjusts its compression strategies based on real-time resource constraints or usage patterns. This may include balancing trade-offs between compression ratio and retrieval latency, ensuring that frequently accessed entries remain quickly accessible even when compressed.

In an embodiment, machine learning models may be employed to enhance various operations within cache management system 6300, including protocol prediction, eviction decision-making, cache compression, and synchronization optimization. These models may include supervised, unsupervised, or reinforcement learning architectures, depending on the specific application. For example, supervised learning models such as decision trees, random forests, or neural networks may be used to predict protocol requirements based on historical usage patterns, while unsupervised models like k-means clustering or Gaussian mixture models may analyze data trends to group protocols by similarity or usage context.

Training these models may involve a diverse set of data, collected from operational environments, to ensure robust and accurate performance. For example, historical transaction logs may be used to train supervised learning models for protocol prediction, where input features may include protocol identifiers, timestamps, geographic locations, and system conditions, and the output labels may correspond to the protocols selected during previous transactions. In another embodiment, reinforcement learning models may, for example, use real-time feedback from system performance metrics to iteratively refine eviction policies or pre-fetching strategies, balancing trade-offs between resource utilization and latency.

The training process for such models may include preprocessing and feature engineering to optimize the data for machine learning. For example, numerical features such as cache hit rates, negotiation latency, or bandwidth utilization may be normalized to standardize their ranges, while categorical features like protocol types or node locations may be encoded using techniques such as one-hot encoding. Training datasets may be split into training, validation, and testing subsets to ensure the model generalizes well to unseen data. In an embodiment, training may occur offline using stored historical data, while updates to the model weights or parameters may be performed periodically or as part of a continuous learning pipeline.

To improve model accuracy and reliability, the system may, for example, employ cross-validation techniques to minimize overfitting or hyperparameter tuning to optimize model configurations. For instance, a grid search or random search method may be used to identify the best combination of hyperparameters, such as learning rate, tree depth, or the number of layers in a neural network. Additionally, transfer learning may be applied in an embodiment to leverage pre-trained models for related tasks, reducing the amount of data and computational resources needed for training.

The machine learning models may also incorporate real-time data as part of their operations, enabling dynamic adaptation to changing conditions. For example, a reinforcement learning model may adjust eviction thresholds or cache synchronization priorities based on the current load on the system, while a supervised model may refine its predictions using incremental learning techniques as new transaction data becomes available. In an embodiment, the models may interact with other subsystems, such as performance metrics subsystem 6340, to receive continuous feedback on their decision-making effectiveness and update their parameters accordingly.

To ensure that the models operate effectively within the system, the training datasets may, for example, include data from diverse network environments and conditions to account for variations in usage patterns, protocol types, and system configurations. In an embodiment, synthetic data may be generated to augment real-world datasets, simulating edge cases or rare events that may not be adequately represented in the collected data. These measures may help ensure that the machine learning models are robust, scalable, and capable of supporting the diverse requirements of cache management system 6300.

Data flow within cache management system 6300 begins with requests for protocol data, either from enhanced transaction manager 5800 or protocol prediction module 5810. Requests are received by cache manager subsystem 6310, which queries protocol descriptor storage subsystem 6320 for the corresponding cache entry. If the entry exists, it is retrieved and provided to the requesting system. If the entry is absent, cache manager subsystem 6310 triggers pre-fetching through protocol predictor interface 5720 and updates protocol descriptor storage subsystem 6320 with the newly fetched protocol.

Updates to cache entries are processed by cache manager subsystem 6310, which coordinates incremental updates with eviction policy engine subsystem 6330 and synchronization controller subsystem 6350. Performance metrics subsystem 6340 monitors the impact of these updates, providing feedback for system-wide optimization via performance monitoring system 6500. When synchronization is required, synchronization controller subsystem 6350 initiates differential updates and ensures consistency using Merkle tree verification.

Cache management system 6300 interacts dynamically with other components in the system architecture, enhancing protocol caching and retrieval while maintaining compatibility with existing systems and infrastructures. By integrating with external systems, cache management system 6300 supports efficient operation and ensures protocol availability across distributed network environments.

Figure 64:
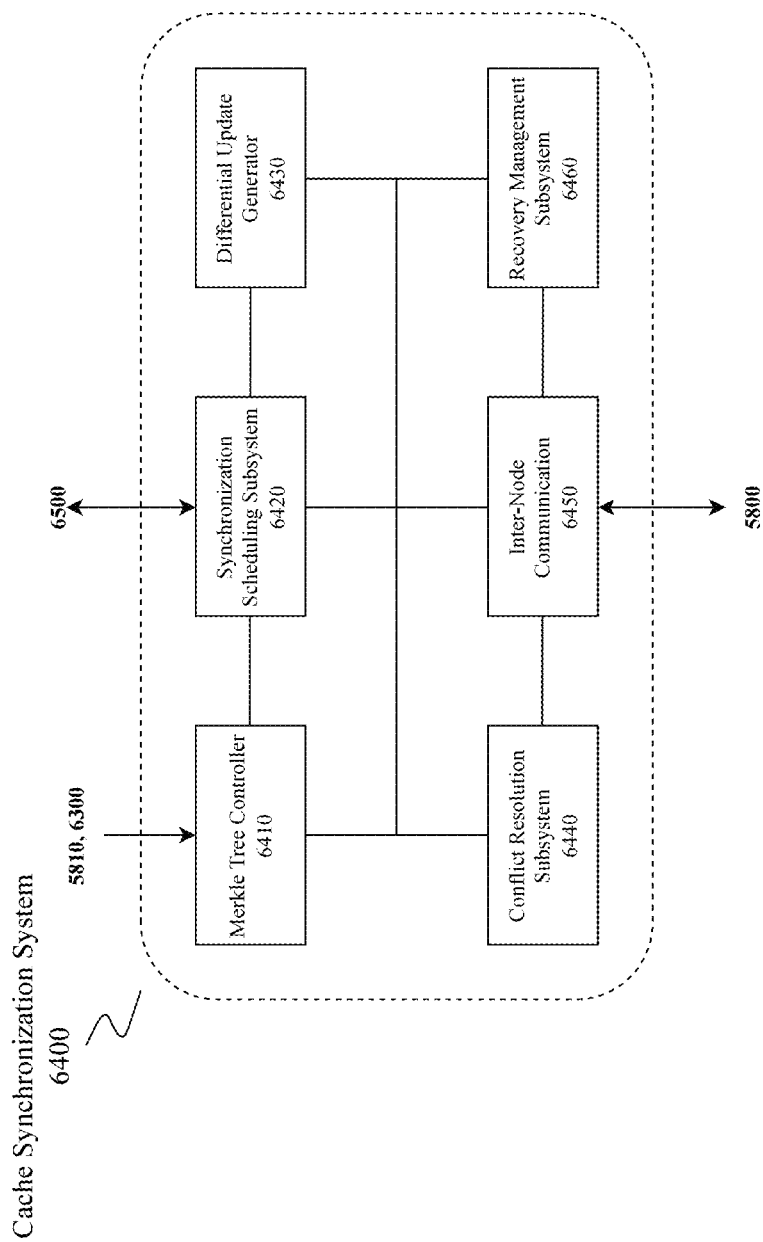
FIG. 64 is a block diagram illustrating exemplary architecture of cache synchronization system.

FIG. 64 is a block diagram illustrating exemplary architecture of cache synchronization system 6400, in an embodiment. Cache synchronization system 6400 operates to maintain consistency of cache contents across distributed nodes within the network, ensuring that local, regional, and global caches remain coherent while minimizing resource consumption. Cache synchronization system 6400 includes multiple subsystems that coordinate to detect changes, propagate updates, resolve conflicts, and handle recovery operations.

Merkle tree controller subsystem 6410 organizes cache data into a hierarchical tree structure to represent local, regional, and global cache levels, enabling efficient detection of changes to protocol entries. In an embodiment, this subsystem generates hash values for protocol entries, which may include metadata such as protocol identifiers, version numbers, and configuration parameters, allowing each cache entry to be uniquely identified. For example, hash generation may incorporate elements of performance metrics or timestamps to ensure that even small modifications to a protocol entry produce a new hash. By comparing hash values at various levels of the tree, Merkle tree controller subsystem 6410 may identify changes to specific protocol entries without requiring a full traversal of the entire cache. This selective comparison enables rapid detection of inconsistencies while minimizing computational overhead. The subsystem communicates with synchronization scheduling subsystem 6420 to initiate updates when changes are detected, passing details about the modified entries and their hierarchical position within the cache.

Synchronization scheduling subsystem 6420 determines the timing and priority of cache synchronization operations, ensuring that updates are applied efficiently while minimizing disruption to system performance. This subsystem may use a range of metrics to guide scheduling decisions, such as available network bandwidth, the priority of specific cache entries, and current resource usage at participating nodes. For example, high-priority cache entries, such as those frequently accessed or critical for upcoming transactions, may be scheduled for immediate synchronization, while lower-priority updates may be batched and deferred. Synchronization scheduling subsystem 6420 coordinates with differential update generator subsystem 6430 to propagate only the necessary changes, reducing the amount of data transmitted during synchronization. In an embodiment, this subsystem may dynamically adjust synchronization intervals based on network conditions, such as congestion or latency, to optimize the timing of updates and avoid performance bottlenecks.

Differential update generator subsystem 6430 identifies differences between cache entries at various nodes and creates compact update packages that contain only the data required to reconcile inconsistencies. This subsystem may use hash comparisons provided by Merkle tree controller subsystem 6410 to pinpoint specific changes, allowing updates to focus on modified entries rather than the entire cache. For example, differential updates may include new or modified protocol descriptors, updated performance metrics, or usage statistics associated with a specific entry. By generating compact update packages, this subsystem reduces the amount of bandwidth required for synchronization operations, particularly in large-scale distributed networks. In an embodiment, differential update generator subsystem 6430 collaborates with conflict resolution subsystem 6440 to ensure that discrepancies identified during synchronization are addressed before updates are propagated, maintaining cache consistency across nodes.

Conflict resolution subsystem 6440 ensures that inconsistencies between cache entries are resolved in a way that preserves data integrity and minimizes disruption to ongoing operations. This subsystem may employ version control mechanisms, such as timestamp-based versioning, vector clocks, or sequence numbers, to determine the most recent version of a protocol entry. For example, a vector clock implementation may track the state of a protocol entry across multiple nodes, enabling the system to resolve conflicts by identifying the latest consistent version. When conflicts arise, resolution strategies may include rule-based reconciliation, where predefined rules dictate how discrepancies are resolved, or manual intervention by an administrator for complex cases. In an embodiment, conflict resolution subsystem 6440 interfaces with performance metrics subsystem 6340 to monitor the impact of resolution strategies, ensuring that the selected approach does not degrade overall system performance.

Inter-node communication subsystem 6450 facilitates the exchange of data between nodes participating in cache synchronization. This subsystem manages peer discovery, connection establishment, and message exchange protocols required for update propagation. In an embodiment, inter-node communication subsystem 6450 may use health-checking mechanisms, such as periodic pings or heartbeat messages, to verify the availability and responsiveness of nodes before initiating synchronization. For example, nodes experiencing high latency or resource constraints may be temporarily excluded from synchronization operations to avoid introducing bottlenecks. This subsystem works closely with synchronization scheduling subsystem 6420 to prioritize communication with nodes based on factors such as network topology, geographic proximity, or resource availability, optimizing the efficiency of synchronization tasks.

Recovery management subsystem 6460 addresses failure scenarios during synchronization operations to ensure that cache integrity is maintained even under adverse conditions. This subsystem detects errors such as network partitions, node unresponsiveness, or synchronization timeouts, and initiates recovery procedures to address these issues. For example, recovery management subsystem 6460 may perform incremental synchronization, where only the most recent changes are applied, to rebuild affected cache entries without requiring a full synchronization cycle. In an embodiment, this subsystem may trigger failover to redundant nodes to maintain continuous operation during node failures, ensuring that protocol data remains accessible. Recovery management subsystem 6460 collaborates with Merkle tree controller subsystem 6410 to validate restored entries, comparing their hash values to ensure consistency before reintroducing them into the cache hierarchy.

Cache synchronization system 6400 integrates with other components of the adaptive protocol caching framework to support seamless operation. Merkle tree controller subsystem 6410 interacts with cache manager subsystem 6310 to retrieve and validate protocol descriptors during synchronization. Differential update generator subsystem 6430 collaborates with eviction policy engine subsystem 6330 to remove obsolete entries from synchronization operations. Performance metrics collected by synchronization scheduling subsystem 6420 are shared with performance monitoring system 6500 to evaluate synchronization efficiency and identify potential optimization opportunities. Inter-node communication subsystem 6450 exchanges data with integration controller subsystem 6360 to coordinate synchronization tasks with external systems such as enhanced transaction manager 5800 and protocol prediction module 5810.

In an embodiment, machine learning models may be employed within cache synchronization system 6400 to enhance various operations, including update prioritization, conflict resolution, and failure recovery. These models may include supervised learning algorithms, unsupervised clustering methods, reinforcement learning, or hybrid approaches that combine these techniques. For example, supervised learning models such as gradient-boosted decision trees or neural networks may be used to predict synchronization priorities based on historical data, while unsupervised methods like k-means clustering may identify patterns in node behavior or resource usage to optimize synchronization schedules. Reinforcement learning models may, in an embodiment, dynamically adapt recovery strategies by learning from past synchronization failures or network anomalies.

The machine learning models may be trained using diverse datasets that capture the operational behavior of the cache synchronization system under different conditions. For example, training data may include metrics such as synchronization timing, bandwidth usage, update sizes, and success rates, along with contextual information such as network topology, node availability, and system load. In an embodiment, labeled datasets may be used to train supervised models, where labels correspond to successful or unsuccessful synchronization scenarios. Unsupervised models may, for example, process unlabeled data to identify clusters or anomalies, such as nodes with consistently high latency or frequent synchronization failures.

Training these models may involve data preprocessing and feature engineering to extract meaningful patterns from raw synchronization data. For example, numerical features such as latency, bandwidth, or resource consumption may be normalized to ensure consistency across different nodes, while categorical features like node types or geographic regions may be encoded using techniques such as one-hot encoding. Training datasets may be split into subsets for training, validation, and testing to evaluate model performance and ensure generalizability. In an embodiment, historical data collected from past synchronization operations may serve as the primary training source, augmented by simulated data to account for edge cases or rare conditions, such as widespread node failures or network partitions.

Model optimization during training may involve hyperparameter tuning to identify the best configuration for a given machine learning algorithm. For example, hyperparameters such as the number of layers in a neural network, the learning rate for gradient descent, or the number of clusters in an unsupervised model may be optimized using techniques like grid search, random search, or Bayesian optimization. Cross-validation may be employed to reduce overfitting and improve the robustness of the trained models. In an embodiment, transfer learning may be applied to reuse pre-trained models for related tasks, such as using a model trained on node availability patterns to predict synchronization success rates.

The trained models may be deployed within the subsystems of cache synchronization system 6400, where they can operate on real-time data to improve decision-making. For example, synchronization scheduling subsystem 6420 may use a predictive model to prioritize updates based on estimated impact and resource constraints, while conflict resolution subsystem 6440 may use machine learning to dynamically select resolution strategies that minimize disruptions. In an embodiment, reinforcement learning models may interact with recovery management subsystem 6460 to optimize recovery actions by learning from previous failures, such as selecting the most effective failover nodes or adjusting recovery timing to avoid cascading failures.

Continuous learning mechanisms may, in an embodiment, allow the models to adapt to changing system conditions over time. For example, as new synchronization data becomes available, the models may be retrained or fine-tuned to reflect updated patterns in network behavior or node performance. This approach may involve incremental learning, where the models are updated periodically using small batches of recent data, or full retraining on a refreshed dataset. Additionally, synthetic data generation techniques may be used to augment training data, simulating scenarios such as extreme network congestion or large-scale node outages to improve model robustness and adaptability.

Data flow through cache synchronization system 6400 begins with Merkle tree controller subsystem 6410, which generates hash values for cache entries across local, regional, and global levels, incorporating metadata and versioning information. These hash values are periodically compared to identify changes or inconsistencies within the cache hierarchy. When changes are detected, synchronization scheduling subsystem 6420 determines the timing and priority of synchronization tasks, considering factors such as network bandwidth, node availability, and the priority of affected cache entries. The detected changes and scheduling decisions are passed to differential update generator subsystem 6430, which creates compact update packages by isolating the differences between cache states. These update packages are then transmitted to participating nodes through inter-node communication subsystem 6450, which establishes connections, manages message exchange protocols, and monitors node health to ensure successful delivery. If inconsistencies arise during synchronization, conflict resolution subsystem 6440 applies version control mechanisms and predefined strategies to reconcile discrepancies while preserving data integrity. Recovery management subsystem 6460 monitors the synchronization process for failures, such as network partitions or timeouts, and initiates corrective actions such as incremental synchronization or failover to redundant nodes. Throughout this process, data flows dynamically between subsystems, enabling efficient and consistent synchronization across distributed nodes while minimizing resource usage and maintaining system performance.

Figure 65:
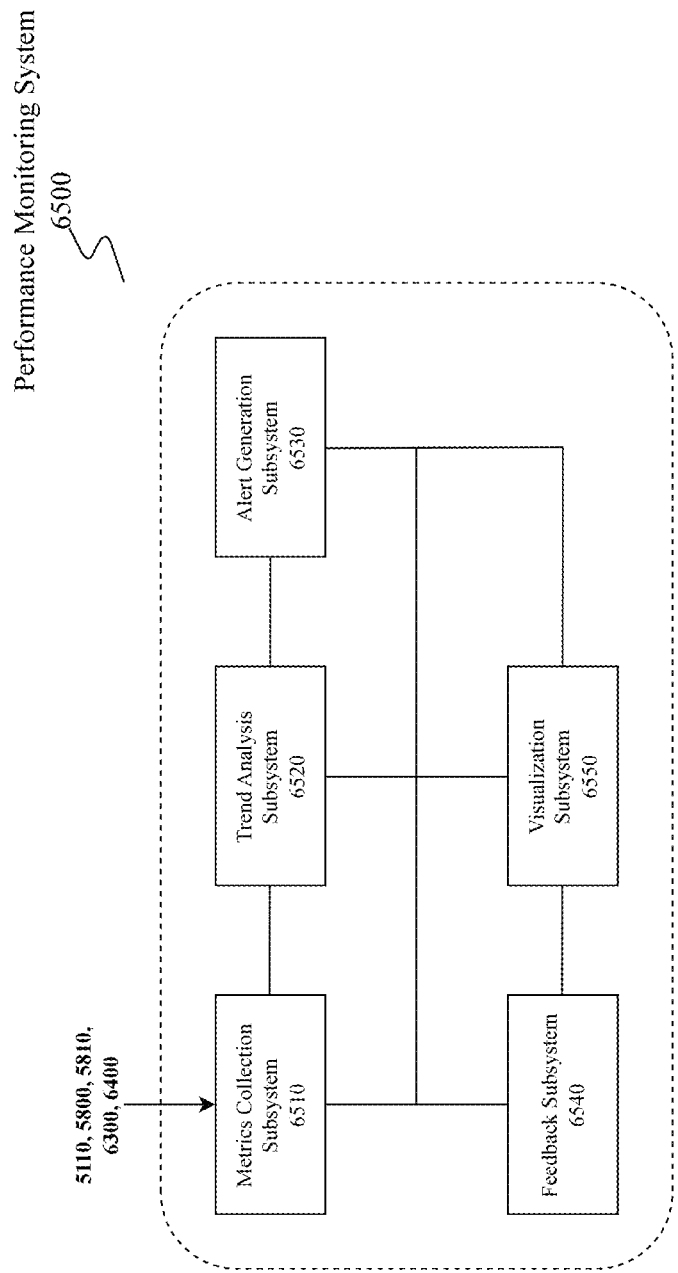
FIG. 65 is a block diagram illustrating exemplary architecture of performance monitoring system.

FIG. 65 is a block diagram illustrating exemplary architecture of performance monitoring system 6500, in an embodiment. Performance monitoring system 6500 operates to collect, analyze, and report performance metrics from various components within the adaptive protocol caching framework, enabling optimization and informed decision-making across distributed systems. Performance monitoring system 6500 includes multiple subsystems that gather data, evaluate system efficiency, and provide feedback to other interconnected systems.

Metrics collection subsystem 6510 gathers performance data from internal and external components, including cache management system 6300, cache synchronization system 6400, and enhanced transaction manager 5800, to provide a comprehensive view of system performance. This subsystem may, for example, retrieve metrics such as cache hit rates, negotiation latency, bandwidth utilization, and resource consumption from performance metrics subsystem 6340. Data collection may involve periodic polling, event-driven triggers, or real-time streaming to ensure that critical performance metrics are captured without imposing unnecessary overhead on the system. In an embodiment, metrics collection subsystem 6510 filters redundant or irrelevant data to reduce noise and improve the efficiency of downstream analysis. For example, duplicate metrics from multiple nodes or outdated data may be excluded before storage or analysis. This subsystem may also communicate directly with protocol prediction module 5810 to provide real-time performance feedback, enabling the module to adjust its predictions and pre-fetching strategies based on current system conditions.

Trend analysis subsystem 6520 processes the metrics collected by metrics collection subsystem 6510 to identify patterns, trends, and anomalies in system performance over time. This subsystem may, for example, apply statistical methods such as moving averages, standard deviation calculations, or regression analysis to detect long-term trends, such as declining cache hit rates or increasing latency in specific regions. In an embodiment, machine learning algorithms, such as clustering or anomaly detection models, may be employed to uncover hidden patterns or correlations within the data. For example, the subsystem may group nodes based on similar usage patterns or detect unusual resource consumption spikes that indicate potential issues. The insights generated by trend analysis subsystem 6520 may be used to recommend adjustments to caching strategies, such as pre-fetching frequently accessed protocols during peak usage times or redistributing cache resources based on geographic demand. This subsystem may also interface with synchronization scheduling subsystem 6420 to optimize synchronization intervals by identifying periods of low network activity, reducing the impact of synchronization on system performance.

Alert generation subsystem 6530 evaluates performance metrics against predefined thresholds and detects anomalies or violations that may impact system reliability or efficiency. For example, this subsystem may compare cache hit rates against a target percentage and generate alerts when they fall below acceptable levels, or monitor resource utilization metrics to identify nodes that are nearing capacity limits. Alerts generated by this subsystem may include detailed information about the issue, potential causes, and recommended corrective actions. In an embodiment, alert generation subsystem 6530 may interact with recovery management subsystem 6460 to initiate automated recovery procedures, such as redistributing traffic away from congested nodes or triggering incremental synchronization to address inconsistencies. This subsystem may also support escalation mechanisms, where critical alerts are prioritized and sent to administrators for immediate attention, while lower-priority alerts may be logged for later review.

Feedback subsystem 6540 distributes performance data and analysis results to other components within the adaptive protocol caching framework to enable dynamic adjustments and continuous optimization. For example, this subsystem may provide metrics on cache utilization and synchronization efficiency to cache compression subsystem 6370, allowing it to refine compression strategies based on current resource availability. Feedback may also be used to update configuration parameters, such as eviction thresholds or synchronization priorities, in response to changing system conditions. In an embodiment, feedback subsystem 6540 collaborates with ML/AI engine 5110 to supply training data or performance insights that enhance the accuracy of predictive models. For instance, real-time feedback on protocol usage patterns may improve the engine's ability to predict future protocol requirements, enabling more effective pre-fetching and caching operations.

Visualization subsystem 6550 processes metrics and analysis results to create user-friendly reports, dashboards, and visual representations of system performance. This subsystem may support customizable visualizations, allowing administrators to focus on specific metrics, time intervals, or system components based on their operational priorities. For example, a dashboard may display metrics such as cache hit rates, synchronization latency, or bandwidth utilization as interactive charts or heatmaps, enabling quick identification of performance bottlenecks or trends. In an embodiment, visualization subsystem 6550 may provide historical data overlays to help administrators compare current performance against past benchmarks, facilitating long-term planning and optimization. This subsystem may also interface with integration controller subsystem 6360 to share visual reports or performance summaries with external systems, such as network monitoring tools or administrative consoles, ensuring that relevant insights are accessible across the broader system architecture.

In an embodiment, machine learning models may be employed within performance monitoring system 6500 to enhance data analysis, anomaly detection, and system optimization. These models may include supervised learning algorithms, unsupervised clustering techniques, reinforcement learning frameworks, or hybrid approaches that combine these methods. For example, supervised learning models such as neural networks, decision trees, or gradient-boosted machines may be used to predict cache performance metrics or identify nodes at risk of exceeding resource limits. Unsupervised models, such as k-means clustering or density-based clustering algorithms, may analyze system behavior to group similar nodes or detect anomalous patterns in resource consumption, latency, or cache usage.

These models may be trained using historical performance data collected from metrics collection subsystem 6510, including data on cache hit rates, negotiation latencies, synchronization delays, bandwidth utilization, and node-level resource consumption. For example, a supervised learning model may be trained on labeled datasets where the target output corresponds to performance thresholds, such as high or low cache hit rates, with input features including protocol descriptors, time of day, or network topology. In an embodiment, reinforcement learning models may be trained in a simulated environment that mimics the behavior of the adaptive protocol caching framework, allowing the models to learn optimal actions for resource allocation, synchronization scheduling, or anomaly detection through trial and error.

Training these models may involve standard preprocessing techniques, such as feature scaling to normalize numerical values or encoding categorical features like protocol types or geographic regions. For example, time-series data on cache hit rates may be transformed using rolling averages or trend decomposition to capture temporal patterns and seasonality. The training process may include splitting the dataset into training, validation, and testing subsets to evaluate model performance and prevent overfitting. In an embodiment, synthetic data may be generated to supplement training datasets, simulating edge cases or rare scenarios, such as widespread synchronization failures or extreme resource contention, to improve model robustness and adaptability.

Hyperparameter tuning may be performed to optimize the performance of machine learning models. For example, grid search or random search methods may be used to identify the best combination of hyperparameters, such as learning rates, tree depths, or the number of layers in a neural network. Cross-validation techniques may be employed to ensure the models generalize well to unseen data. In an embodiment, transfer learning may be applied, where pre-trained models are adapted to new tasks within the performance monitoring system, such as using a model trained for anomaly detection to identify synchronization bottlenecks.

Machine learning models deployed in performance monitoring system 6500 may operate in real-time to provide actionable insights and system adjustments. For example, an anomaly detection model may continuously monitor resource utilization metrics to identify deviations from normal patterns, triggering alerts or recommending corrective actions through alert generation subsystem 6530. Predictive models may estimate future cache usage or synchronization delays, allowing synchronization scheduling subsystem 6420 or cache management system 6300 to preemptively adjust operations. In an embodiment, reinforcement learning models may guide dynamic adjustments to synchronization intervals or resource allocation policies, learning from feedback provided by feedback subsystem 6540.

The training and deployment pipeline for these models may include mechanisms for continuous learning and model updates. For example, as new performance data becomes available, the models may be incrementally updated to reflect recent system behavior and improve accuracy. Data from trend analysis subsystem 6520 or feedback subsystem 6540 may be used to refine the models, ensuring they remain effective under changing system conditions. Additionally, visualization subsystem 6550 may display model predictions or insights in user-friendly formats, helping administrators understand and act on the output of the machine learning models.

Data flow through performance monitoring system 6500 begins with metrics collection subsystem 6510, which gathers performance data from internal components such as cache management system 6300, cache synchronization system 6400, and external systems like enhanced transaction manager 5800. This data is filtered and organized into structured formats before being passed to trend analysis subsystem 6520, where statistical and machine learning techniques process the data to identify patterns, trends, or anomalies. Results from trend analysis subsystem 6520 are forwarded to alert generation subsystem 6530, which evaluates metrics against predefined thresholds or anomaly detection criteria, generating alerts or recommendations when necessary. These alerts and insights are shared with feedback subsystem 6540, which distributes the data and analysis results to other components, such as synchronization scheduling subsystem 6420 or ML/AI engine 5110, enabling real-time adjustments and optimization. Processed metrics and insights are also sent to visualization subsystem 6550, which transforms the data into interactive dashboards and reports, ensuring system administrators can quickly interpret performance trends and take appropriate actions. Throughout this process, data flows bidirectionally to enable feedback loops, facilitating continuous monitoring and system-wide performance improvements.

Figure 66:
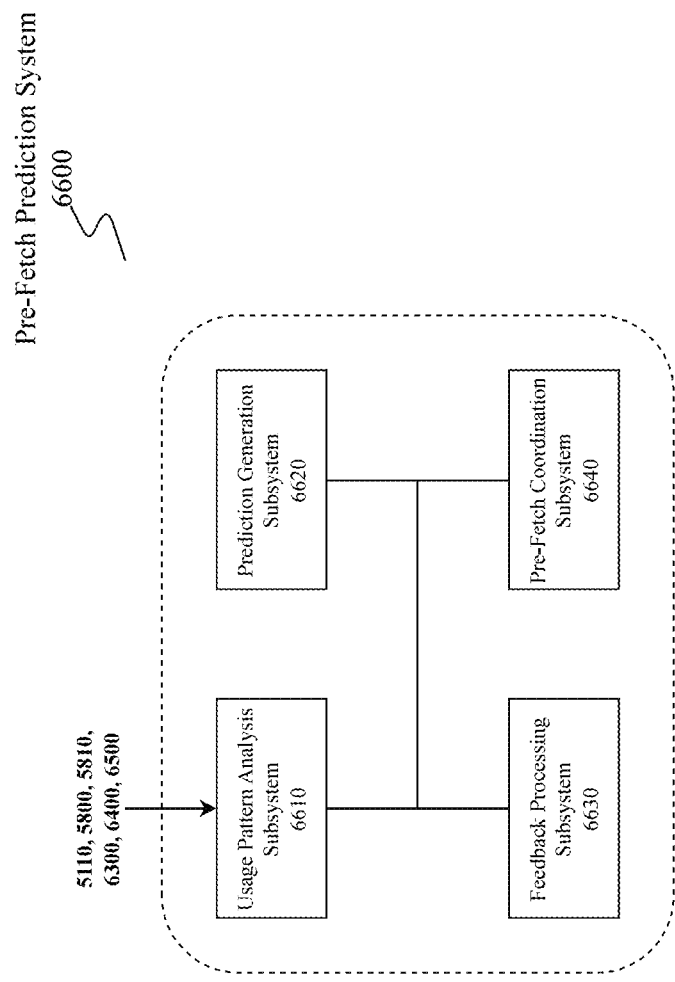
FIG. 66 is a block diagram illustrating exemplary architecture of pre-fetch prediction system.

FIG. 66 is a block diagram illustrating exemplary architecture of pre-fetch prediction system 6600, in an embodiment. Pre-fetch prediction system 6600 operates to anticipate future protocol requirements and optimize the placement of these protocols within the cache hierarchy to improve system performance and reduce latency. Pre-fetch prediction system 6600 includes multiple subsystems that analyze usage patterns, generate predictions, and coordinate with other components in the adaptive protocol caching framework to ensure efficient cache utilization.

Usage pattern analysis subsystem 6610 collects and evaluates both historical and real-time data on protocol access patterns, using this data to identify trends and behaviors that inform pre-fetching decisions. This subsystem may receive data from metrics collection subsystem 6510, including access frequency, protocol usage by geographic regions, and patterns correlated with specific times of day or days of the week. For example, usage pattern analysis subsystem 6610 may detect that certain protocols are frequently requested during high-traffic periods or are associated with specific transactions, such as login authentication during business hours. This subsystem organizes collected data into structured formats, such as time-series datasets that reflect temporal trends or usage heatmaps that highlight geographic or topological concentration of protocol requests. These structured representations allow prediction generation subsystem 6620 to analyze the data efficiently and develop targeted pre-fetching strategies.

Prediction generation subsystem 6620 applies data received from usage pattern analysis subsystem 6610 to generate recommendations for pre-fetching protocol entries. This subsystem may, in an embodiment, employ a variety of machine learning techniques, such as supervised learning models trained on historical protocol access data, or reinforcement learning models that iteratively refine their predictions based on real-time feedback. For example, a supervised learning model may be trained to predict the probability of specific protocols being accessed based on input features such as prior access frequency, protocol type, network conditions, or the current time. In another embodiment, a reinforcement learning model may use feedback on past pre-fetching outcomes to optimize decisions dynamically, improving its performance over time. Prediction generation subsystem 6620 sends these pre-fetching recommendations to cache manager subsystem 6310, ensuring that anticipated protocols are proactively placed in the appropriate levels of the cache hierarchy for optimal access.

Feedback processing subsystem 6630 monitors the effectiveness of pre-fetching operations by collecting performance data and feedback on the predictions generated by prediction generation subsystem 6620. This subsystem may, for example, analyze metrics such as cache hit and miss rates for pre-fetched protocols, as well as the impact of pre-fetching on system resource utilization, including memory, bandwidth, and CPU usage. By identifying discrepancies between predicted and actual protocol usage, feedback processing subsystem 6630 provides insights that improve future prediction accuracy. For example, if a protocol that was pre-fetched frequently results in cache misses, the subsystem may adjust the input features or retrain the model to better account for evolving usage patterns. By integrating with feedback subsystem 6540, feedback processing subsystem 6630 enables continuous learning, ensuring that the predictive models remain responsive to changes in protocol access behaviors or network conditions.

Pre-fetch coordination subsystem 6640 translates the predictions generated by prediction generation subsystem 6620 into actionable pre-fetching instructions that are communicated to cache synchronization system 6400 and cache manager subsystem 6310. This subsystem may prioritize pre-fetching tasks based on various metrics, such as protocol importance, resource constraints, or synchronization requirements. For example, pre-fetch coordination subsystem 6640 may assign higher priority to protocols predicted to be critical for upcoming transactions or those associated with time-sensitive operations. In an embodiment, this subsystem ensures that pre-fetched protocols are synchronized across distributed cache nodes to maintain consistency, reducing redundant fetch operations and ensuring that all nodes have access to the anticipated protocols. Pre-fetch coordination subsystem 6640 may also dynamically adjust pre-fetching schedules or task priorities based on feedback from metrics collection subsystem 6510, enabling efficient resource utilization and alignment with real-time system demands.

In an embodiment, machine learning models may be employed within pre-fetch prediction system 6600 to analyze protocol usage patterns, generate pre-fetching predictions, and adaptively refine strategies based on system feedback. These models may include supervised learning algorithms, unsupervised clustering techniques, reinforcement learning frameworks, or hybrid approaches that combine elements of these methodologies. For example, supervised learning models such as gradient-boosted decision trees, logistic regression models, or neural networks may be used to predict the likelihood of specific protocols being accessed within a certain time frame based on input features like prior access frequency, network conditions, and user behaviors. Unsupervised models, such as clustering algorithms or dimensionality reduction techniques, may group protocols based on similarity in access patterns or usage context to identify broader trends.

These machine learning models may be trained on a combination of historical and real-time data collected by metrics collection subsystem 6510. Training data may include attributes such as protocol identifiers, timestamps, geographic access locations, system conditions during protocol requests, and the frequency or recency of prior accesses. For example, a supervised model may be trained to predict protocol demand using a labeled dataset where input features represent access conditions, and output labels indicate whether a protocol was requested during a given interval. Reinforcement learning models may, in an embodiment, operate in a simulated environment, learning optimal pre-fetching strategies by receiving performance-related feedback, such as cache hit rates or resource utilization metrics, as a reward signal for each action taken.

The training process for these models may involve extensive data preprocessing and feature engineering to ensure high-quality inputs. For example, numeric features like access frequency or latency may be normalized to improve model performance, while categorical features such as protocol types or node locations may be encoded using techniques like one-hot encoding. Temporal patterns may be captured by deriving time-series features, such as moving averages or seasonal trends, from historical data. The training dataset may be split into training, validation, and testing subsets to evaluate model accuracy and generalizability. In an embodiment, synthetic data may be generated to simulate edge cases or rare scenarios, such as sudden surges in protocol demand or regional shifts in usage patterns, improving model robustness and reliability.

Machine learning models may also undergo hyperparameter tuning to optimize their performance. For example, grid search or Bayesian optimization methods may be used to identify optimal configurations for parameters such as learning rates, maximum tree depth, or the number of layers in a neural network. Cross-validation techniques may be applied to minimize overfitting and ensure that the models perform well across a variety of data distributions. Transfer learning may, in some cases, be employed, where a model pre-trained on a related task, such as cache performance prediction, is adapted to generate protocol pre-fetching recommendations.

Once deployed, these machine learning models may operate in real-time, continuously refining their predictions as new data becomes available. For example, usage pattern analysis subsystem 6610 may provide updated metrics on protocol demand, allowing the predictive models to dynamically adjust their forecasts. Feedback processing subsystem 6630 may analyze the effectiveness of prior pre-fetching actions and feed performance data back into the models, enabling incremental learning or periodic retraining to improve accuracy. This adaptive feedback loop ensures that the models remain effective under evolving system conditions, such as changes in network topology, usage behavior, or resource availability.

Data flow through pre-fetch prediction system 6600 begins with usage pattern analysis subsystem 6610, which collects historical and real-time protocol usage data from metrics collection subsystem 6510 and processes it to identify trends and patterns. This data, which may include metrics such as access frequency, geographic usage distribution, and temporal patterns, is structured into actionable formats, such as time-series datasets or usage heatmaps, and passed to prediction generation subsystem 6620. Prediction generation subsystem 6620 applies machine learning models or statistical methods to generate recommendations for protocols likely to be accessed in the near future, considering factors such as network conditions, protocol importance, and prior usage trends. These predictions are sent to pre-fetch coordination subsystem 6640, which translates the recommendations into pre-fetching instructions and communicates them to cache manager subsystem 6310 and cache synchronization system 6400. Pre-fetch coordination subsystem 6640 ensures that the protocols are positioned in the appropriate cache levels and synchronized across distributed nodes if necessary. Feedback processing subsystem 6630 continuously monitors the outcomes of pre-fetching operations, analyzing metrics such as cache hit rates and resource utilization to assess the accuracy and efficiency of predictions. The feedback is used to refine the prediction models and improve subsequent pre-fetching decisions, ensuring that the system dynamically adapts to changing usage patterns and operational conditions. This data flow enables pre-fetch prediction system 6600 to operate cohesively with other components in the adaptive protocol caching framework, enhancing overall system performance and responsiveness.

Figure 67:
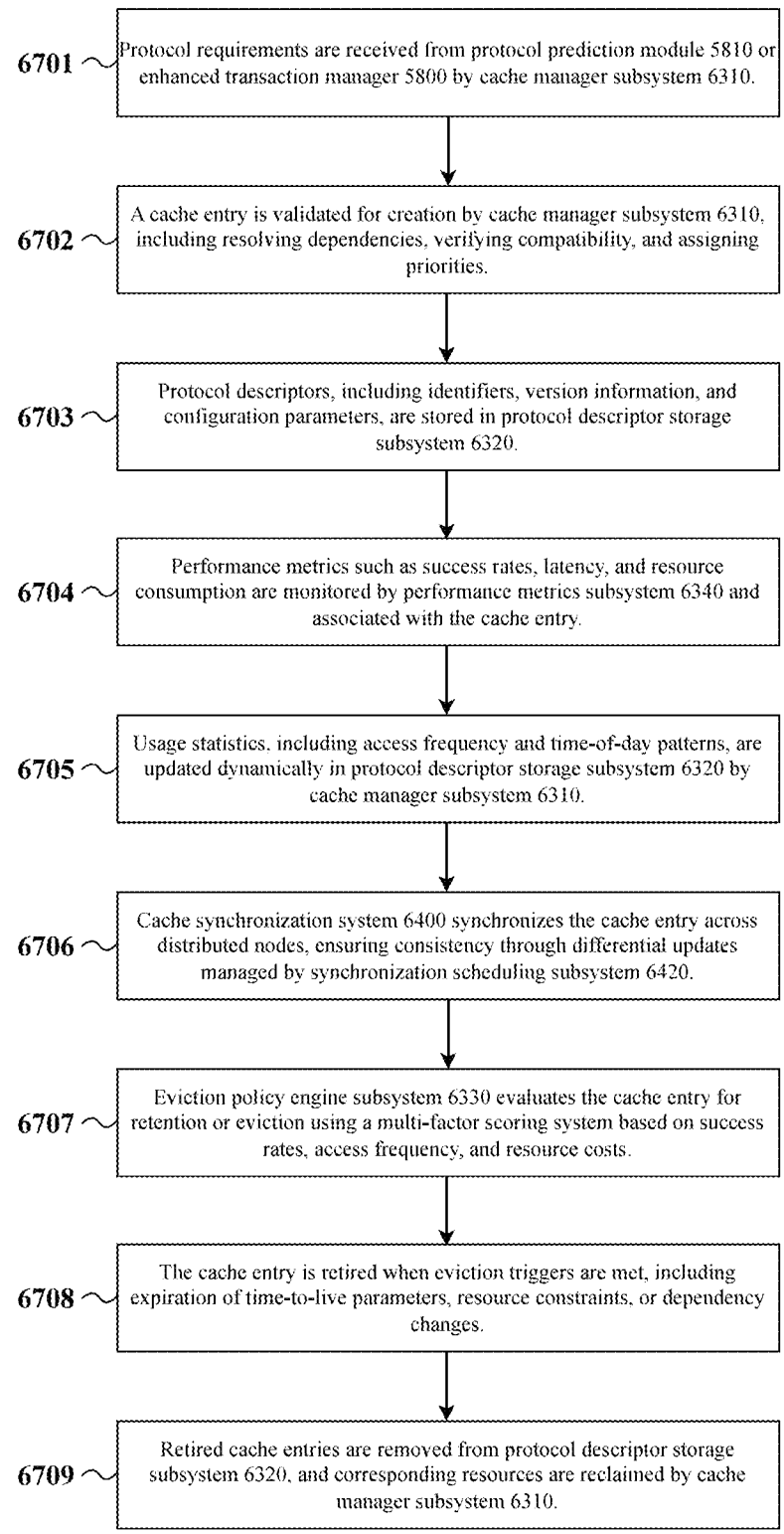
FIG. 67 is a method diagram illustrating the cache entry lifecycle management of adaptive protocol cache optimization system.

FIG. 67 is a method diagram illustrating the cache entry lifecycle management of adaptive protocol cache optimization system 6200, in an embodiment. Protocol requirements are received by cache manager subsystem 6310 from protocol prediction module 5810 or enhanced transaction manager 5800, where the requirements may include anticipated protocol needs or specific requests triggered by ongoing transactions. This data initiates the process of creating or updating a cache entry 6701. A cache entry is validated for creation by cache manager subsystem 6310, which performs dependency resolution to ensure compatibility with related protocols, verifies version compatibility, and assigns priorities based on system-defined criteria such as protocol importance or expected usage patterns 6702. Once validated, protocol descriptors, including unique identifiers, version information, configuration parameters, and dependency relationships, are stored in protocol descriptor storage subsystem 6320 to ensure efficient retrieval and accurate representation of the protocol in the cache hierarchy 6703.

Performance metrics, including success rates, negotiation latency, bandwidth utilization, and resource consumption, are monitored by performance metrics subsystem 6340 and associated with the corresponding cache entry to provide real-time feedback on the effectiveness of the cached protocol during use 6704. Usage statistics, such as access frequency, time-of-day trends, and geographic usage patterns, are dynamically updated in protocol descriptor storage subsystem 6320 by cache manager subsystem 6310 to reflect changing system demands and optimize future retrievals 6705. Cache synchronization system 6400 ensures that the cache entry is synchronized across distributed nodes, where synchronization scheduling subsystem 6420 manages differential updates to propagate changes efficiently while maintaining consistency within the cache hierarchy 6706.

Eviction policy engine subsystem 6330 evaluates the cache entry for retention or removal using a multi-factor scoring system that considers success rates, access frequency, resource costs, and cache entry age. Based on this scoring system, the subsystem determines whether the entry remains valuable to retain in the cache 6707. When eviction triggers are met, such as the expiration of time-to-live parameters, resource limitations, or changes to dependencies, the cache entry is marked for retirement by cache manager subsystem 6310 6708. Retired cache entries are subsequently removed from protocol descriptor storage subsystem 6320, and the associated resources, such as memory and bandwidth allocations, are reclaimed for future use, completing the lifecycle of the cache entry 6709.

Figure 68:
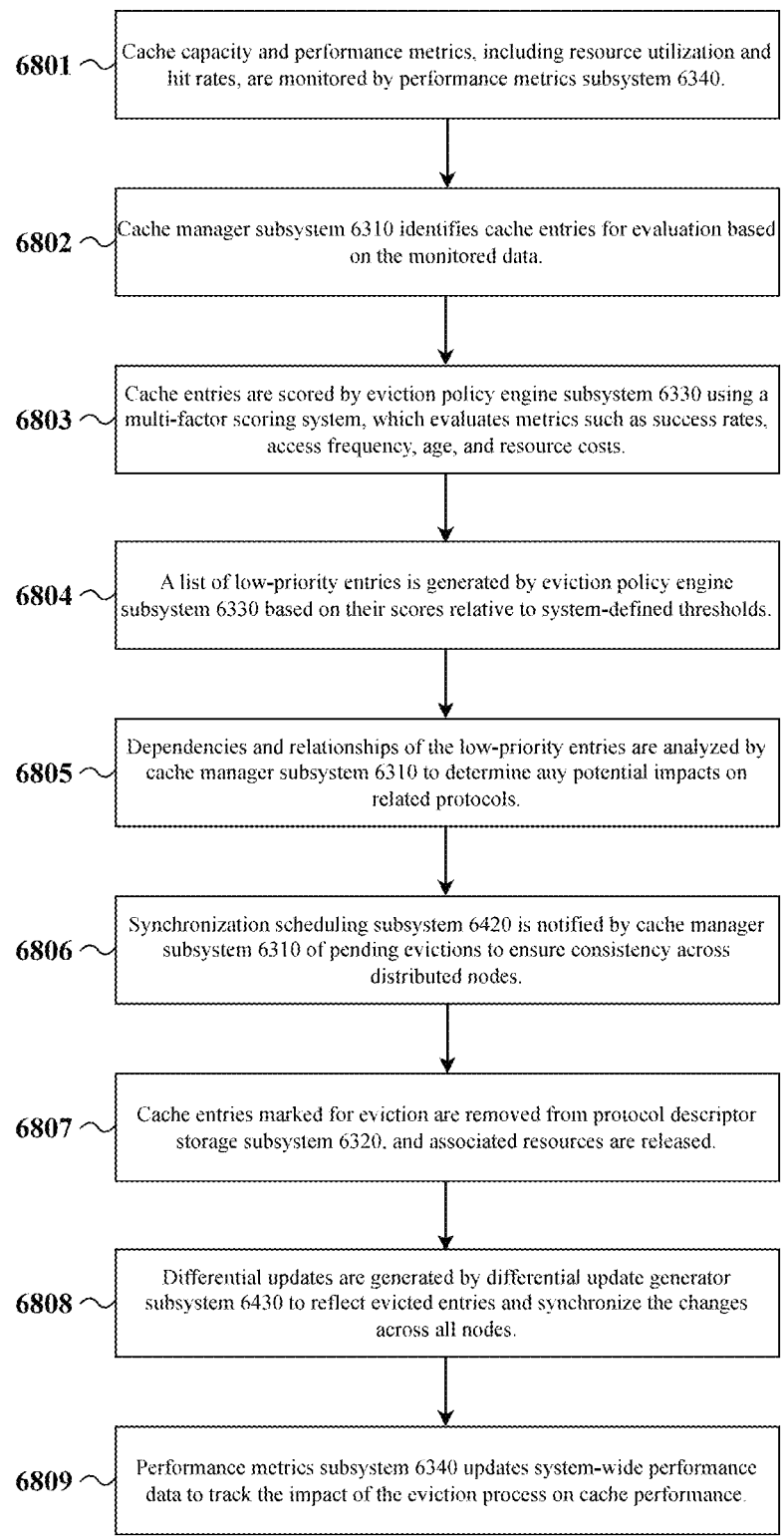
FIG. 68 is a method diagram illustrating the eviction process of adaptive protocol cache optimization system.

FIG. 68 is a method diagram illustrating the eviction process of adaptive protocol cache optimization system 6200, in an embodiment. Cache capacity and performance metrics, including resource utilization, cache hit rates, and negotiation latency, are continuously monitored by performance metrics subsystem 6340. This monitoring enables the identification of conditions where cache performance may degrade due to capacity constraints or resource contention 6801. Cache manager subsystem 6310 identifies specific cache entries for evaluation based on the monitored data, focusing on entries that contribute less to overall cache performance or are nearing their time-to-live expiration 6802.

Eviction policy engine subsystem 6330 scores the identified cache entries using a multi-factor scoring system, which evaluates metrics such as success rates, access frequency, resource costs, and entry age. This scoring system assigns a priority value to each entry, ensuring that decisions to evict are informed by comprehensive performance and resource data 6803. Based on these scores, a list of low-priority cache entries is generated by eviction policy engine subsystem 6330, with entries ranked relative to system-defined thresholds for retention or removal 6804. Cache manager subsystem 6310 analyzes the dependencies and relationships of the low-priority entries to identify any impacts their eviction might have on related protocols or system functionality. This analysis ensures that evicting an entry does not inadvertently disrupt dependencies critical to other cached protocols or ongoing transactions 6805.

Cache manager subsystem 6310 notifies synchronization scheduling subsystem 6420 of pending evictions, initiating the process of propagating these changes across distributed nodes. This notification ensures consistency throughout the cache hierarchy and prevents stale or removed entries from being accessed by other nodes 6806. Cache entries marked for eviction are removed from protocol descriptor storage subsystem 6320, and their associated resources, such as memory and bandwidth allocations, are released, making these resources available for new entries or other system processes 6807. Differential update generator subsystem 6430 creates compact update packages that reflect the evicted entries, which are then distributed to all nodes to synchronize the changes efficiently while minimizing network overhead 6808. Finally, performance metrics subsystem 6340 updates system-wide performance data, allowing administrators or automated systems to assess the impact of the eviction process on cache performance and refine eviction thresholds or strategies as necessary 6809.

Figure 69:
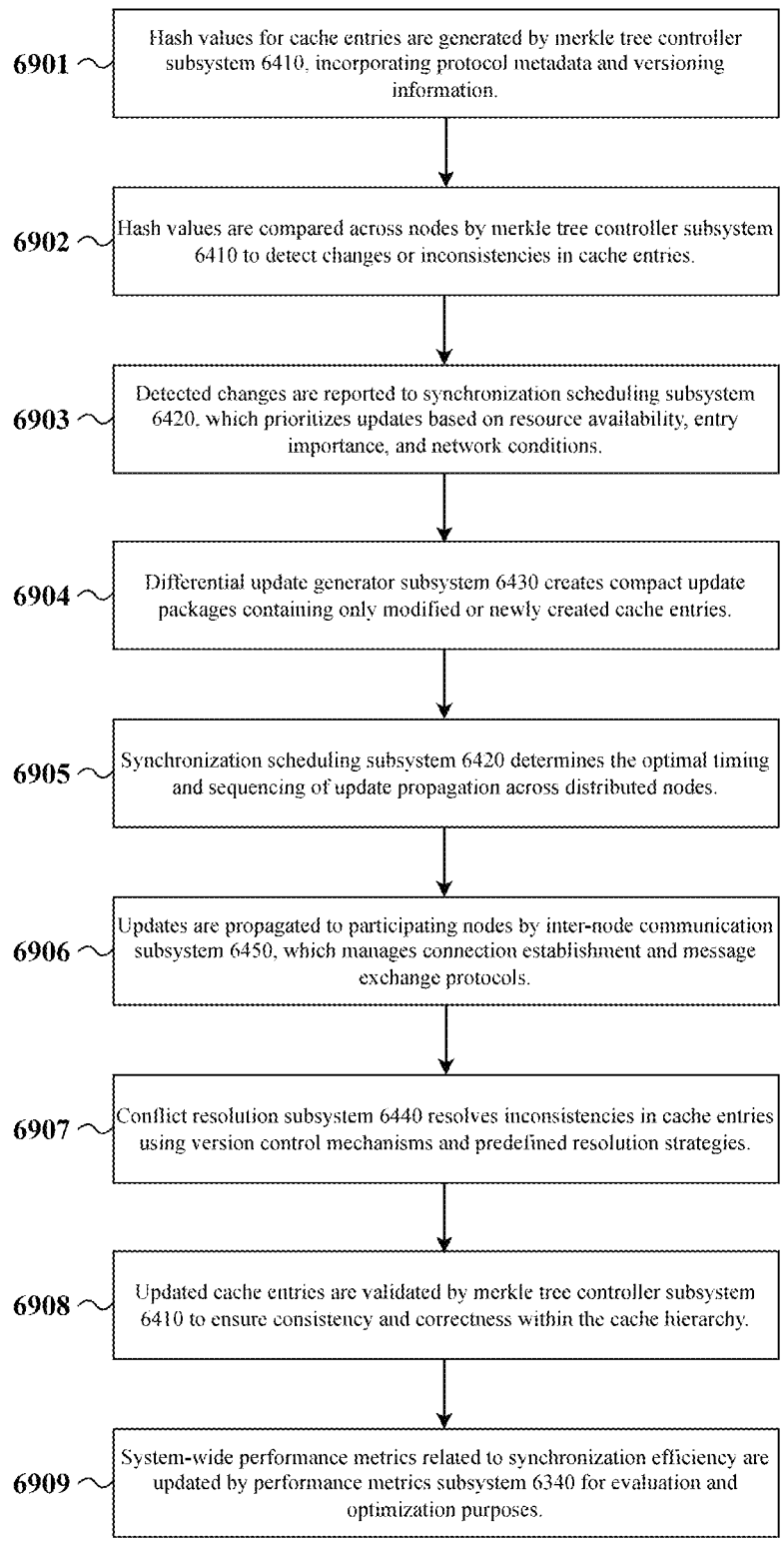
FIG. 69 is a method diagram illustrating the cache synchronization workflow of adaptive protocol cache optimization system.

FIG. 69 is a method diagram illustrating the cache synchronization workflow of adaptive protocol cache optimization system 6200, in an embodiment. Hash values for cache entries are generated by merkle tree controller subsystem 6410, with each hash incorporating protocol metadata, versioning information, and performance metrics to uniquely identify the state of each entry within the cache hierarchy 6901. These hash values are compared across nodes by merkle tree controller subsystem 6410 to detect changes or inconsistencies in cache entries, enabling efficient identification of specific entries that require synchronization without needing to compare the full cache contents 6902. Detected changes are reported to synchronization scheduling subsystem 6420, which evaluates the changes and prioritizes updates based on factors such as resource availability, the importance of the modified entries, and current network conditions, ensuring synchronization efforts are directed where they are most impactful 6903.

Differential update generator subsystem 6430 creates compact update packages containing only the modified or newly created cache entries. These update packages are designed to minimize the size of data transmitted during synchronization, reducing bandwidth usage and improving overall system efficiency 6904. Synchronization scheduling subsystem 6420 determines the optimal timing and sequencing of update propagation, considering constraints such as network load, node availability, and synchronization urgency to avoid bottlenecks or conflicts during the process 6905. Updates are propagated to participating nodes by inter-node communication subsystem 6450, which establishes connections, manages message exchanges, and ensures the secure delivery of update packages 6906.

Conflict resolution subsystem 6440 resolves any inconsistencies that arise during synchronization using version control mechanisms, such as timestamp-based versioning or vector clocks, and predefined resolution strategies, such as last-write-wins or rule-based reconciliation. These measures ensure that the most accurate and up-to-date version of each cache entry is retained across all nodes 6907. Updated cache entries are validated by merkle tree controller subsystem 6410, which verifies that the propagated changes are correctly applied and consistent with the cache hierarchy's state 6908. Finally, performance metrics subsystem 6340 updates system-wide metrics related to synchronization efficiency, such as latency, resource usage, and consistency rates, providing valuable feedback for evaluating and optimizing future synchronization operations 6909.

Figure 70:
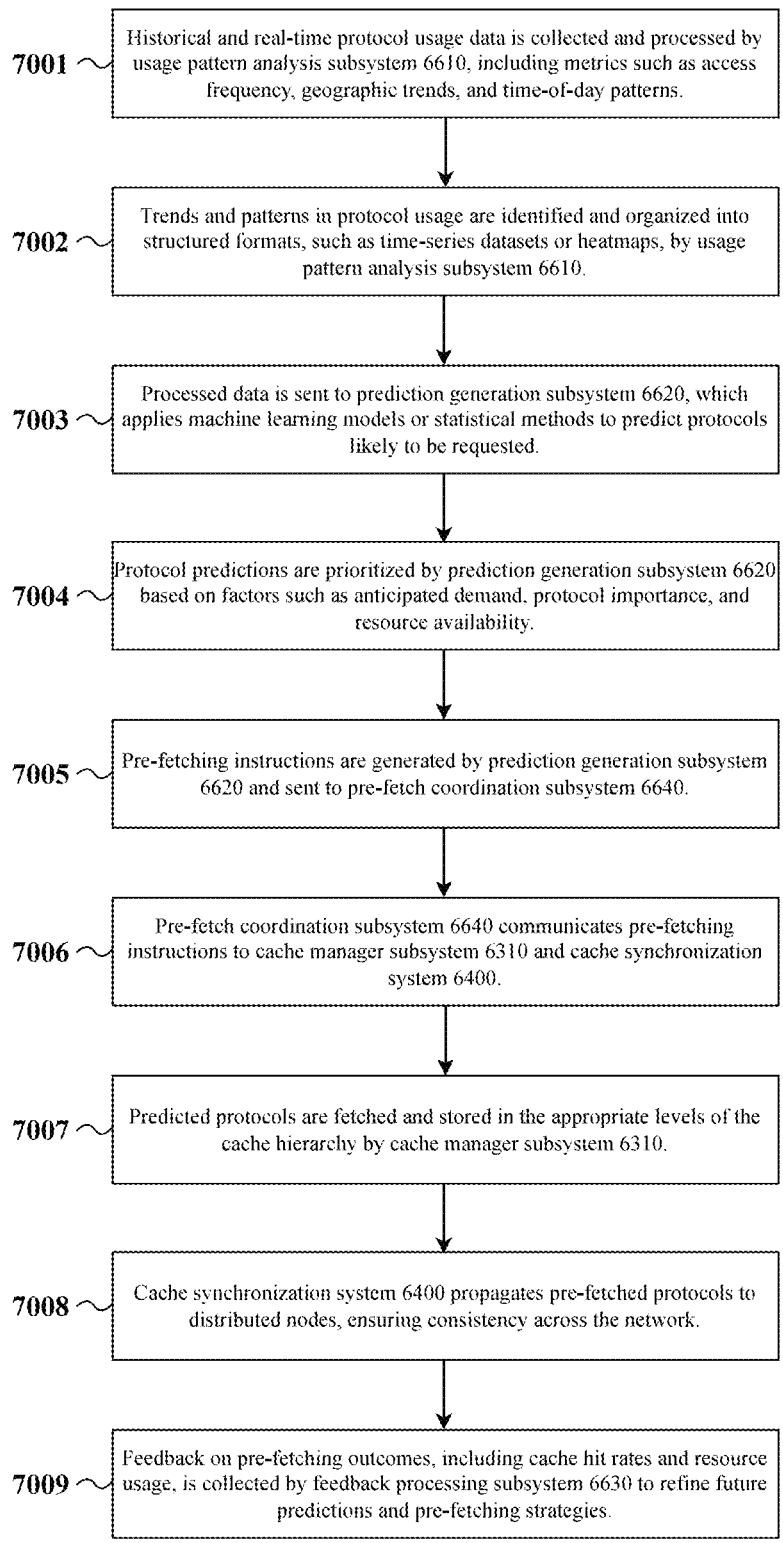
FIG. 70 is a method diagram illustrating the protocol pre-fetching of adaptive protocol cache optimization system.

FIG. 70 is a method diagram illustrating the protocol pre-fetching of adaptive protocol cache optimization system 6200, in an embodiment. Historical and real-time protocol usage data is collected and processed by usage pattern analysis subsystem 6610, including metrics such as access frequency, geographic trends, and time-of-day patterns. This data may be gathered from sources such as metrics collection subsystem 6510 or directly from system logs, ensuring that the data reflects current and historical usage behaviors across the network 7001. Trends and patterns in protocol usage are identified and organized into structured formats by usage pattern analysis subsystem 6610, which may create time-series datasets to capture temporal changes or generate heatmaps to represent regional protocol demand. These structured formats enable precise analysis and provide actionable insights for prediction generation subsystem 6620 7002.

The processed data is sent to prediction generation subsystem 6620, which applies machine learning models or statistical methods to predict protocols likely to be requested. Machine learning models may include supervised algorithms trained on historical access data or reinforcement learning models that adapt to real-time feedback. These models evaluate input features such as protocol type, prior access frequency, and network conditions to generate accurate predictions 7003. Protocol predictions are prioritized by prediction generation subsystem 6620 based on factors such as anticipated demand, protocol importance, and resource availability. For example, frequently accessed or high-priority protocols may be flagged for immediate pre-fetching, while lower-priority protocols may be deferred or excluded 7004.

Pre-fetching instructions are generated by prediction generation subsystem 6620 and sent to pre-fetch coordination subsystem 6640. These instructions specify which protocols to pre-fetch, their assigned priorities, and the cache levels where they should be stored 7005. Pre-fetch coordination subsystem 6640 communicates these instructions to cache manager subsystem 6310 and cache synchronization system 6400 to initiate the pre-fetching process. Coordination may involve determining resource availability, avoiding redundant fetch operations, and ensuring synchronization constraints are met 7006. Predicted protocols are fetched and stored in the appropriate levels of the cache hierarchy by cache manager subsystem 6310, which ensures that the protocols are readily accessible for anticipated requests 7007.

Cache synchronization system 6400 propagates pre-fetched protocols to distributed nodes, ensuring consistency across the network and preventing discrepancies between local, regional, and global cache levels. Synchronization scheduling subsystem 6420 may prioritize updates to reduce latency and optimize resource usage during this process 7008. Feedback on pre-fetching outcomes, including cache hit rates, resource usage, and the accuracy of predictions, is collected by feedback processing subsystem 6630. This feedback is used to refine machine learning models and adjust pre-fetching strategies, enabling the system to adapt dynamically to evolving usage patterns and operational conditions 7009.

Figure 71:
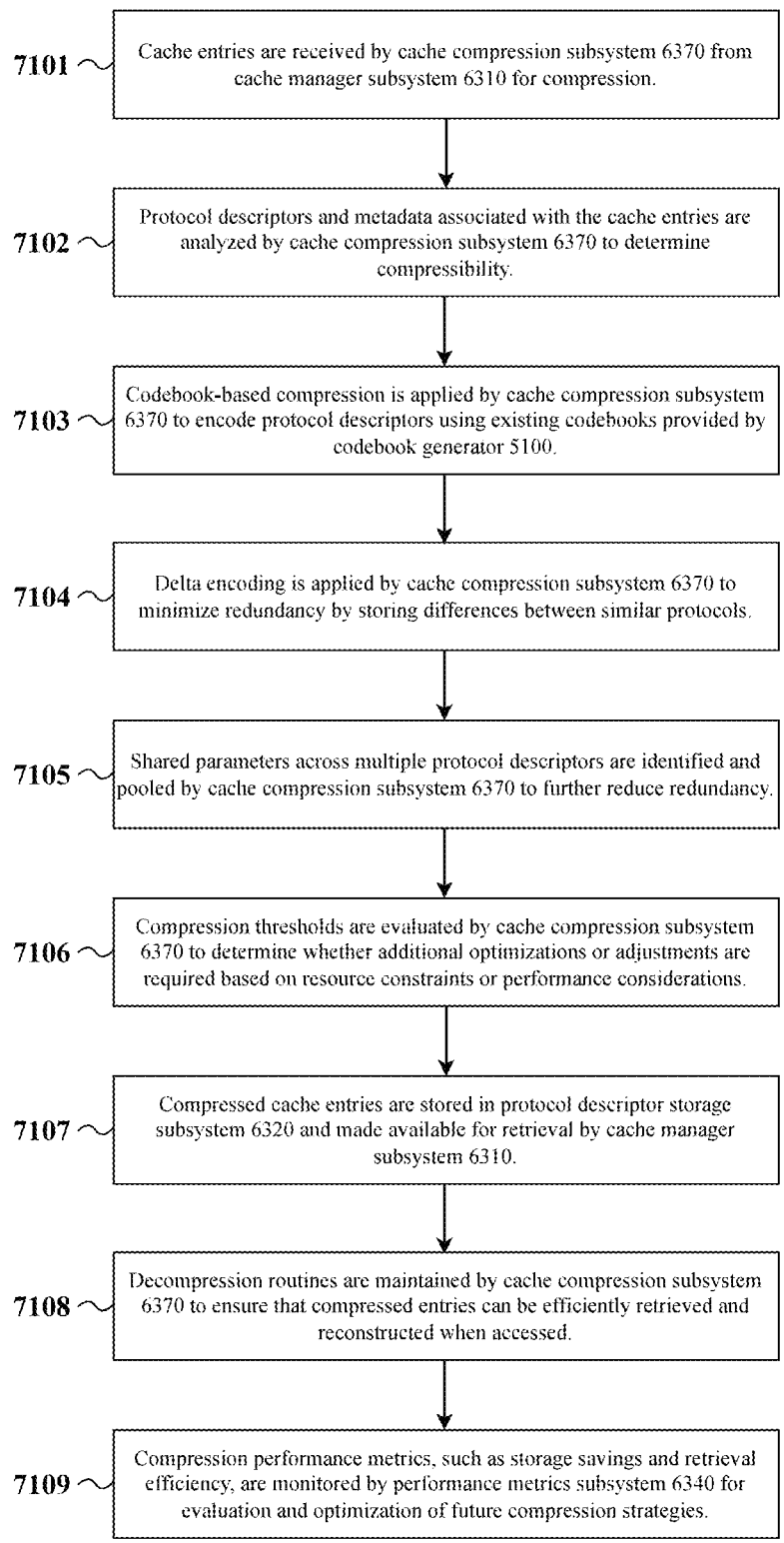
FIG. 71 is a method diagram illustrating the cache compression of adaptive protocol cache optimization system.

FIG. 71 is a method diagram illustrating the cache compression of adaptive protocol cache optimization system 6200, in an embodiment. Cache entries are received by cache compression subsystem 6370 from cache manager subsystem 6310, where they are prepared for compression to optimize storage and resource utilization. These entries may include protocol descriptors, metadata, and other associated data necessary for protocol retrieval and operation 7101. Protocol descriptors and metadata are analyzed by cache compression subsystem 6370 to determine compressibility, with the analysis considering factors such as data redundancy, structural patterns, and the potential for encoding optimization. This step ensures that the compression process targets the most significant opportunities for storage savings without compromising protocol accuracy or retrievability 7102.

Codebook-based compression is applied by cache compression subsystem 6370 to encode protocol descriptors using codebooks provided by codebook generator 5100. This process replaces redundant or frequently occurring data patterns with compact reference codes, significantly reducing the size of protocol descriptors while maintaining their functionality 7103. Delta encoding is then applied to minimize redundancy further by storing only the differences between similar protocols. For example, protocol versions with incremental changes may be compressed by representing only the modified portions, rather than duplicating the entire entry 7104. Shared parameters across multiple protocol descriptors are identified and pooled by cache compression subsystem 6370 to eliminate duplication and consolidate common data elements, which further reduces storage requirements 7105.

Compression thresholds are evaluated by cache compression subsystem 6370 to ensure that resource constraints and performance considerations are balanced effectively. This step determines whether additional optimizations, such as more aggressive compression techniques, are feasible or necessary based on the available storage, access latency requirements, or system workload 7106. Compressed cache entries are stored in protocol descriptor storage subsystem 6320, where they are indexed and made accessible for retrieval by cache manager subsystem 6310. This ensures that the compressed data can be seamlessly integrated into the caching workflow 7107.

Decompression routines are maintained by cache compression subsystem 6370 to enable the efficient retrieval and reconstruction of compressed entries when they are accessed. These routines ensure that the original protocol descriptors can be accurately restored in real-time for use in transactions or protocol negotiations 7108. Compression performance metrics, including storage savings, retrieval efficiency, and compression ratios, are monitored by performance metrics subsystem 6340. This monitoring provides valuable feedback for evaluating the effectiveness of the current compression strategies and optimizing future compression operations 7109.

Figure 72:
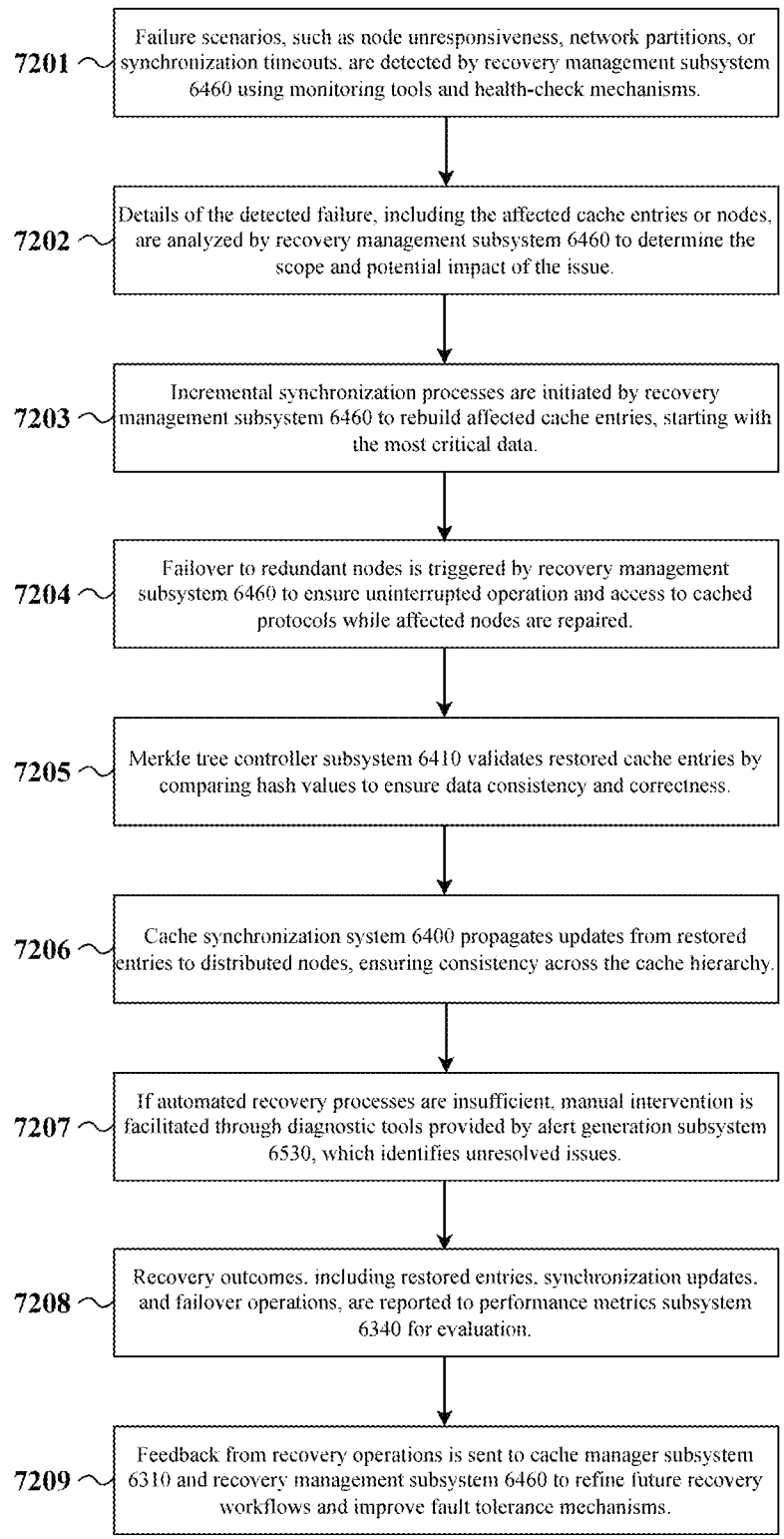
FIG. 72 is a method diagram illustrating the failure recovery workflow of adaptive protocol cache optimization system.

FIG. 72 is a method diagram illustrating the failure recovery workflow of adaptive protocol cache optimization system 6200, in an embodiment. Failure scenarios, such as node unresponsiveness, network partitions, or synchronization timeouts, are detected by recovery management subsystem 6460, which employs monitoring tools, health-check mechanisms, and diagnostic signals to continuously assess system stability and identify failures in real-time 7201. Details of the detected failure, including the affected cache entries, nodes, or synchronization processes, are analyzed by recovery management subsystem 6460 to determine the scope and potential impact of the issue on system operations. This analysis ensures that recovery actions are prioritized based on the criticality of the affected components and their dependencies within the system 7202.

Incremental synchronization processes are initiated by recovery management subsystem 6460 to rebuild affected cache entries efficiently. The process prioritizes the restoration of the most critical data, such as frequently accessed protocols or protocols required for ongoing transactions, to minimize disruptions to system functionality 7203. Failover to redundant nodes is triggered by recovery management subsystem 6460 to maintain uninterrupted operation while the affected nodes are repaired or restored. Redundant nodes ensure continued access to cached protocols and prevent service interruptions, even in cases of severe node failures 7204.

Merkle tree controller subsystem 6410 validates restored cache entries by comparing their hash values against the expected values to ensure that the data has been accurately reconstructed and remains consistent with the overall cache hierarchy. This validation step prevents corrupted or incomplete data from being reintroduced into the system 7205. Cache synchronization system 6400 propagates updates from the restored entries to all distributed nodes, ensuring that the cache hierarchy remains consistent and synchronized across the network. This propagation uses differential updates to minimize bandwidth usage and reduce latency during the synchronization process 7206.

If automated recovery processes are insufficient to fully resolve the failure, manual intervention is facilitated through diagnostic tools provided by alert generation subsystem 6530. These tools identify unresolved issues and provide system administrators with actionable insights to guide further recovery efforts, such as isolating problematic nodes or manually restoring specific cache entries 7207. Recovery outcomes, including restored entries, synchronization updates, and failover operations, are reported to performance metrics subsystem 6340 for evaluation. These metrics provide insight into the effectiveness of the recovery process and its impact on overall system performance 7208. Feedback from recovery operations, including lessons learned and identified bottlenecks, is sent to cache manager subsystem 6310 and recovery management subsystem 6460. This feedback is used to refine future recovery workflows, improve fault tolerance mechanisms, and enhance the system's ability to handle similar failure scenarios in the future 7209.

Figure 73:
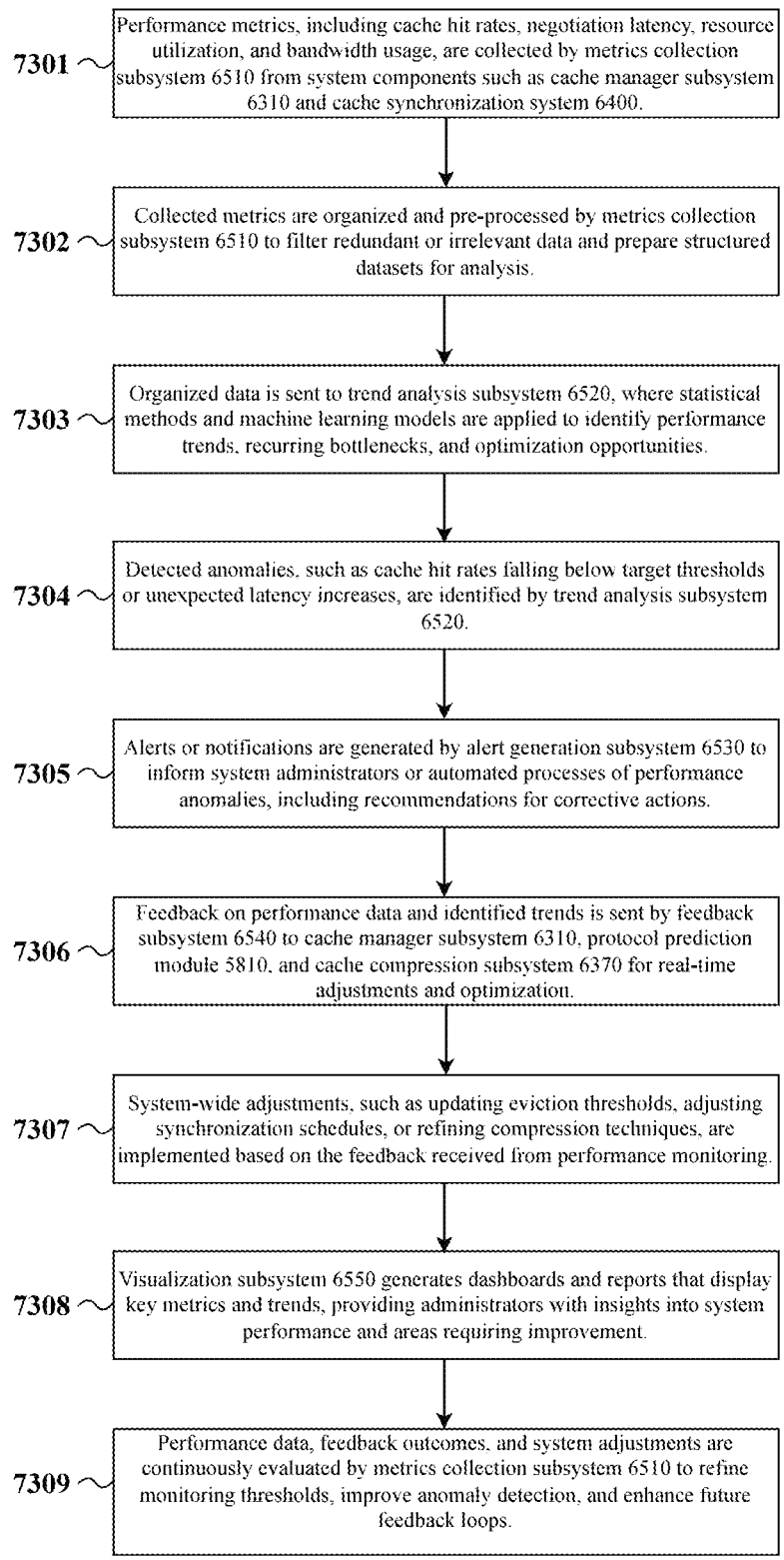
FIG. 73 is a method diagram illustrating the cache performance monitoring and feedback of adaptive protocol cache optimization system.

FIG. 73 is a method diagram illustrating the cache performance monitoring and feedback of adaptive protocol cache optimization system 6200, in an embodiment. Performance metrics, including cache hit rates, negotiation latency, resource utilization, and bandwidth usage, are collected by metrics collection subsystem 6510 from system components such as cache manager subsystem 6310 and cache synchronization system 6400. This data provides a comprehensive view of the system's operational efficiency and highlights areas requiring improvement 7301. Collected metrics are organized and pre-processed by metrics collection subsystem 6510, which filters redundant or irrelevant data, ensuring that only actionable information is retained. Structured datasets are prepared to facilitate downstream analysis and enable efficient processing by other subsystems 7302.

Organized data is sent to trend analysis subsystem 6520, where statistical methods and machine learning models are applied to identify performance trends, recurring bottlenecks, and opportunities for optimization. This subsystem may analyze historical data to detect patterns such as sustained drops in cache hit rates or regions experiencing consistent latency increases, enabling the system to address these issues proactively 7303. Detected anomalies, such as cache performance falling below pre-defined thresholds or unexpected spikes in resource usage, are identified by trend analysis subsystem 6520, which flags these events for immediate action 7304. Alerts or notifications are generated by alert generation subsystem 6530 to inform system administrators or automated processes of these anomalies. These alerts may include actionable recommendations, such as reallocating resources, adjusting synchronization schedules, or modifying caching policies to restore optimal performance 7305.

Feedback on performance data and identified trends is sent by feedback subsystem 6540 to cache manager subsystem 6310, protocol prediction module 5810, and cache compression subsystem 6370. This feedback enables real-time adjustments to caching operations, such as refining pre-fetching strategies, updating eviction policies, or dynamically modifying compression thresholds based on current system demands 7306. System-wide adjustments are implemented based on the received feedback, ensuring that changes to caching, synchronization, and resource allocation strategies align with the performance requirements of the system. For example, eviction thresholds may be updated to retain high-priority protocols, or synchronization intervals may be adjusted to minimize latency 7307.

Visualization subsystem 6550 generates dashboards and reports that display key metrics and trends, providing system administrators with insights into current performance and highlighting areas requiring attention. These visualizations may include graphs, heatmaps, or time-series data, enabling administrators to monitor real-time performance and make informed decisions 7308. Performance data, feedback outcomes, and implemented adjustments are continuously evaluated by metrics collection subsystem 6510 to refine monitoring thresholds and improve anomaly detection capabilities. This iterative feedback loop enhances the system's ability to respond to changes in usage patterns and resource availability, ensuring ongoing optimization of caching operations 7309.

Figure 74:
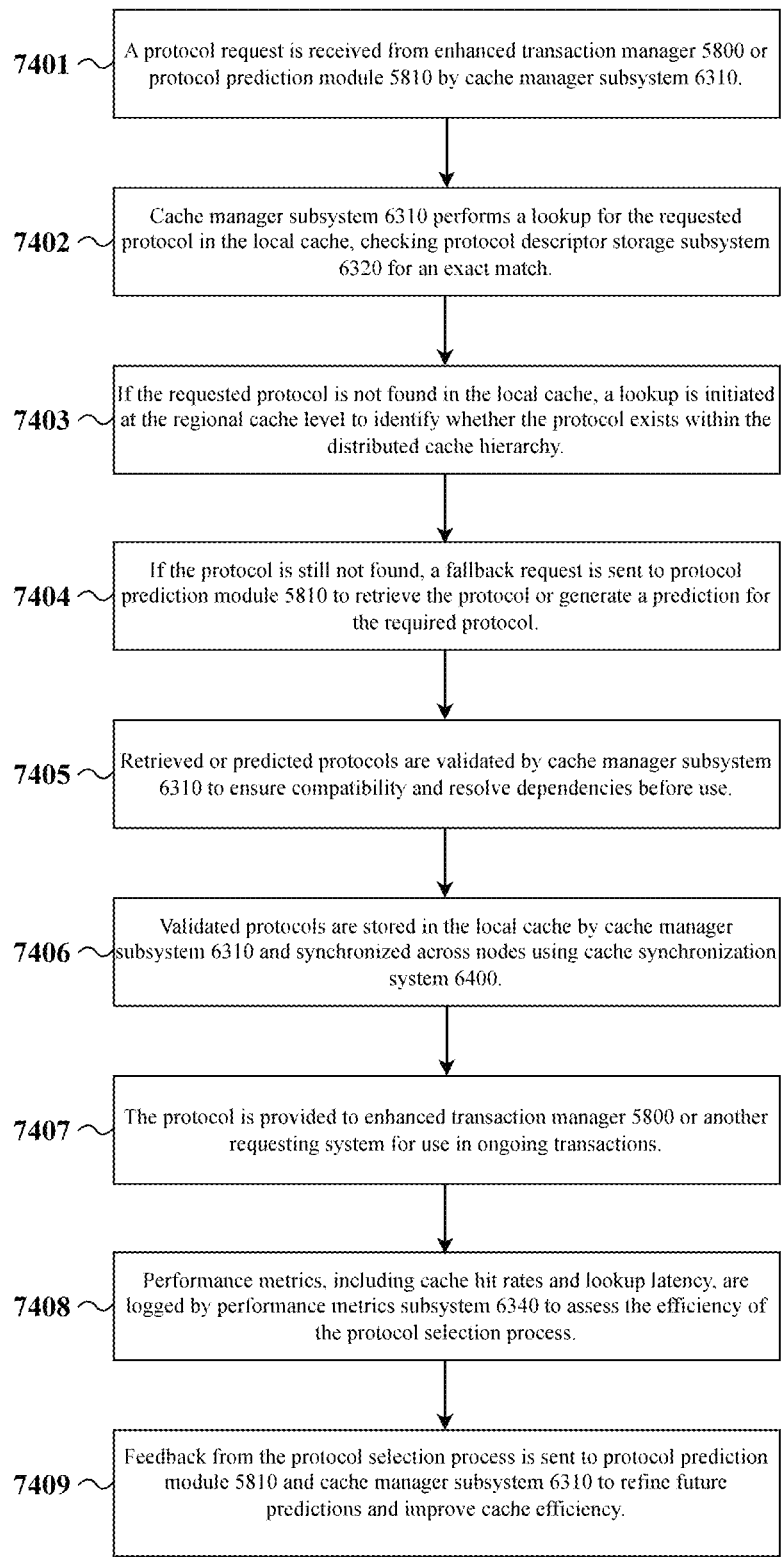
FIG. 74 is a method diagram illustrating the protocol selection workflow of adaptive protocol cache optimization system.

FIG. 74 is a method diagram illustrating the protocol selection workflow of adaptive protocol cache optimization system 6200, in an embodiment. A protocol request is received by cache manager subsystem 6310 from enhanced transaction manager 5800 or protocol prediction module 5810, typically in response to an ongoing transaction or predicted need for a specific protocol 7401. Cache manager subsystem 6310 performs a lookup in the local cache, searching protocol descriptor storage subsystem 6320 for an exact match to the requested protocol. If the protocol is found, it is retrieved immediately to minimize latency 7402. If the requested protocol is not found in the local cache, cache manager subsystem 6310 initiates a lookup at the regional cache level, leveraging the distributed cache hierarchy to identify whether the protocol is stored in a broader scope of the network 7403.

If the protocol is not found in either the local or regional cache, a fallback request is sent to protocol prediction module 5810, which attempts to retrieve the protocol from an external source or generate a prediction for the required protocol based on usage patterns and historical data. This ensures that the system can still fulfill the protocol request even if the protocol is not currently cached 7404. Once the protocol is retrieved or predicted, cache manager subsystem 6310 validates it to ensure compatibility with the requesting system. Dependencies and configuration parameters are checked to confirm that the protocol meets the requirements of the transaction or process it will support 7405.

After validation, the protocol is stored in the local cache by cache manager subsystem 6310, ensuring it is readily available for future requests. Cache synchronization system 6400 propagates the protocol to other nodes as needed to maintain consistency across the cache hierarchy 7406. The protocol is then provided to enhanced transaction manager 5800 or another requesting system, enabling the protocol to be used for ongoing or pending transactions without delay 7407. Performance metrics, such as cache hit rates, lookup latency, and resource usage during the protocol selection process, are logged by performance metrics subsystem 6340 to evaluate the effectiveness of the workflow and identify areas for improvement 7408. Feedback from the protocol selection process, including metrics and observed trends, is sent to protocol prediction module 5810 and cache manager subsystem 6310 to refine future predictions and improve the efficiency of caching operations, completing the workflow 7409.

Figure 75:
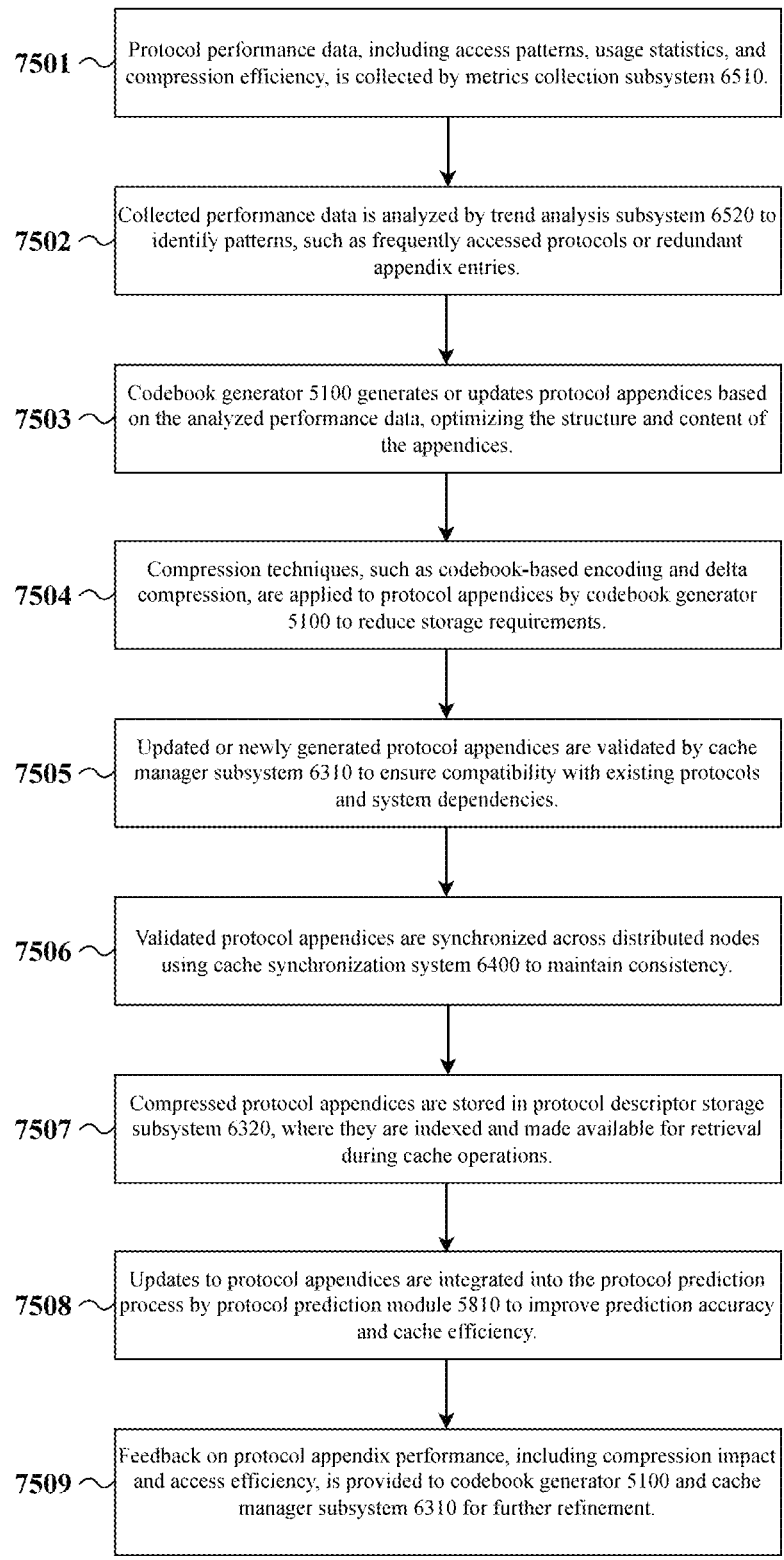
FIG. 75 is a method diagram illustrating the protocol appendix compression and management of adaptive protocol cache optimization system.

FIG. 75 is a method diagram illustrating the protocol appendix compression and management of adaptive protocol cache optimization system 6200, in an embodiment. Protocol performance data, including access patterns, usage statistics, and the efficiency of existing compression strategies, is collected by metrics collection subsystem 6510. This data provides a comprehensive view of protocol usage and identifies opportunities to optimize the structure and management of protocol appendices 7501. Collected data is analyzed by trend analysis subsystem 6520 to identify patterns, such as frequently accessed protocols, redundant entries within the appendices, or inefficient compression strategies. The analysis may include statistical methods or machine learning models to uncover trends and correlations that can inform appendix updates 7502.

Codebook generator 5100 generates new protocol appendices or updates existing ones based on the analyzed performance data. These updates may optimize the structure and organization of the appendices, prioritizing protocols that are frequently accessed or critical to ongoing operations. In some cases, low-priority or obsolete entries may be removed to streamline appendix functionality 7503. Compression techniques, such as codebook-based encoding and delta compression, are applied by codebook generator 5100 to minimize storage requirements. For example, similar protocols may be encoded using shared data structures or represented as differences from a base protocol version, reducing redundancy and optimizing memory utilization 7504.

Updated or newly generated protocol appendices are validated by cache manager subsystem 6310 to ensure compatibility with existing protocols, system dependencies, and transaction requirements. This validation process verifies that the appendices align with the system's operational needs and do not introduce conflicts or errors 7505. Once validated, protocol appendices are synchronized across distributed nodes using cache synchronization system 6400. Synchronization ensures that all nodes maintain consistent and up-to-date copies of the appendices, preventing discrepancies during protocol retrieval or compression operations 7506.

Compressed protocol appendices are stored in protocol descriptor storage subsystem 6320, where they are indexed for efficient retrieval during cache operations. This ensures that updated appendices can be accessed quickly when required for protocol selection, compression, or prediction tasks 7507. Updates to protocol appendices are integrated into the protocol prediction process by protocol prediction module 5810, enabling the module to utilize the most recent appendix data to improve prediction accuracy and refine cache efficiency strategies 7508. Feedback on the performance of protocol appendices, including metrics such as compression ratios, retrieval times, and access frequencies, is provided to codebook generator 5100 and cache manager subsystem 6310. This feedback is used to refine appendix management strategies further, ensuring that compression and retrieval operations remain effective and aligned with system performance goals 7509.

Figure 76:
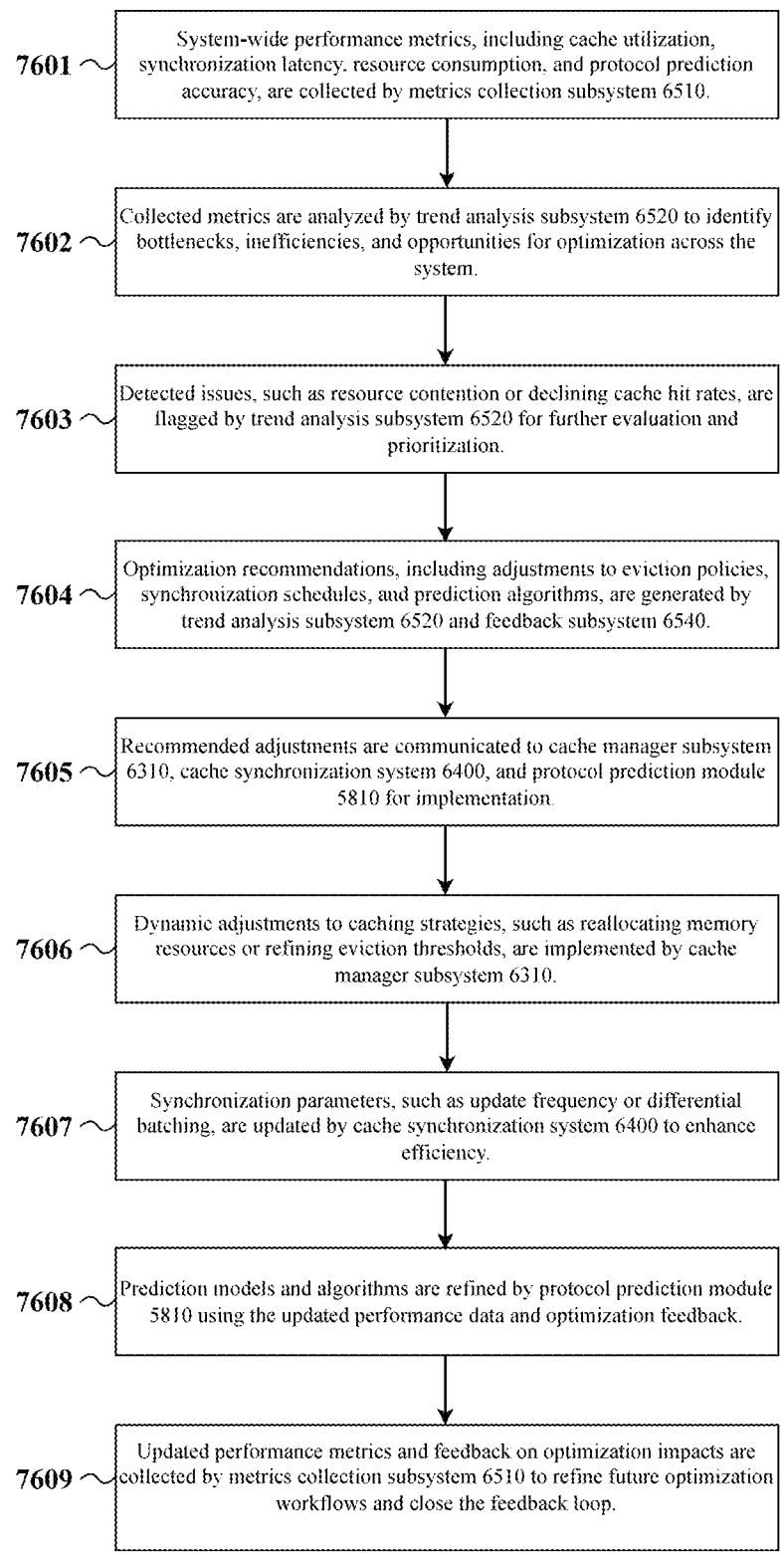
FIG. 76 is a method diagram illustrating the system-wide optimization workflow of adaptive protocol cache optimization system.

FIG. 76 is a method diagram illustrating the system-wide optimization workflow of adaptive protocol cache optimization system 6200, in an embodiment. System-wide performance metrics, including cache utilization, synchronization latency, resource consumption, and protocol prediction accuracy, are collected by metrics collection subsystem 6510. This data provides a comprehensive view of the operational state of the system, enabling detailed analysis of overall efficiency and potential areas of improvement 7601. Collected metrics are analyzed by trend analysis subsystem 6520 to identify bottlenecks, inefficiencies, and opportunities for optimization. For example, recurring delays in synchronization or declining cache hit rates may be detected, highlighting areas requiring immediate attention or long-term adjustment 7602.

Detected issues, such as resource contention or underutilized caches, are flagged by trend analysis subsystem 6520 for further evaluation and prioritization. This step ensures that the most critical issues are addressed first, focusing resources on areas with the greatest impact on system performance 7603. Optimization recommendations, such as adjustments to eviction policies, synchronization schedules, or protocol prediction algorithms, are generated collaboratively by trend analysis subsystem 6520 and feedback subsystem 6540. These recommendations are designed to balance resource usage, minimize latency, and enhance cache efficiency 7604.

Recommended adjustments are communicated to cache manager subsystem 6310, cache synchronization system 6400, and protocol prediction module 5810 for implementation. This coordination ensures that all relevant components are updated to reflect the optimized strategies, maintaining alignment across the system 7605. Dynamic adjustments to caching strategies are implemented by cache manager subsystem 6310, which may involve reallocating memory resources, refining eviction thresholds, or prioritizing specific protocols based on updated performance data 7606. Synchronization parameters, such as update frequency or differential batching techniques, are updated by cache synchronization system 6400 to enhance synchronization efficiency and reduce network overhead 7607.

Prediction models and algorithms are refined by protocol prediction module 5810 using the updated performance data and feedback provided by trend analysis subsystem 6520. These refinements improve the accuracy and effectiveness of protocol predictions, ensuring that caching and synchronization strategies remain aligned with evolving system demands 7608. Updated performance metrics and feedback on the impact of optimization measures are collected by metrics collection subsystem 6510. This data is used to evaluate the effectiveness of the implemented changes, refine future optimization workflows, and close the feedback loop, ensuring continuous improvement of the system 7609.

In a non-limiting use case example of system 6200, a large-scale distributed e-commerce platform utilizes the adaptive protocol cache optimization system to handle high volumes of transaction requests across geographically distributed data centers. During a promotional event, where a surge in user activity is expected, enhanced transaction manager 5800 begins handling a substantial number of requests for product searches, user authentication, and payment processing. Protocol prediction module 5810 analyzes historical data from previous events and identifies that specific authentication protocols and payment gateway protocols are likely to be in high demand.

Based on this prediction, cache manager subsystem 6310 pre-fetches the anticipated protocols and stores them in local caches at data centers near the expected user activity hotspots. Pre-fetch coordination subsystem 6640 ensures that these protocols are synchronized across regional and global cache levels using cache synchronization system 6400, maintaining consistency while minimizing latency for geographically dispersed users. For example, the authentication protocol is synchronized across nodes in North America and Europe, ensuring rapid access during login requests regardless of the user's location.

As users interact with the platform, cache manager subsystem 6310 handles protocol requests using a cache-first approach. When a login request is made, the system retrieves the authentication protocol from the local cache, reducing response time and alleviating load on the prediction module or backend systems. If a cache miss occurs, protocol prediction module 5810 generates a prediction for the required protocol in real-time, which is immediately validated and added to the cache hierarchy. Differential update generator subsystem 6430 ensures that any new or updated protocols are efficiently synchronized to all relevant nodes.

Meanwhile, cache compression subsystem 6370 reduces the memory footprint of frequently accessed protocols by applying codebook-based compression and delta encoding, enabling the platform to handle additional user requests without exceeding resource limits. Performance metrics subsystem 6340 continuously monitors system-wide metrics, such as cache hit rates, resource utilization, and synchronization latency, to identify and address potential bottlenecks during peak usage periods. Detected issues, such as an unusually high cache miss rate for specific protocols, trigger optimization workflows. For instance, eviction policy engine subsystem 6330 dynamically adjusts eviction thresholds to prioritize retention of high-demand protocols.

As the promotional event progresses, recovery management subsystem 6460 proactively addresses minor failures, such as node unresponsiveness due to high traffic, by triggering failover to redundant nodes. Incremental synchronization ensures that the cache hierarchy remains consistent, allowing users to continue transacting without interruptions. Feedback from these operations is used to refine protocol predictions and caching strategies, enhancing the system's performance for future events.

This use case demonstrates how system 6200 leverages its new capabilities to optimize protocol caching, synchronization, and compression dynamically. The integration of real-time monitoring, machine learning-driven predictions, and efficient recovery mechanisms ensures seamless operation and high performance, even under demanding conditions.

In another non-limiting use case example of system 6200, a global financial institution leverages the adaptive protocol cache optimization system to streamline secure communication between its data centers and client devices during peak transaction hours. The institution handles millions of requests daily for services such as account authentication, fund transfers, and fraud detection, all of which rely on a diverse set of protocols operating across geographically distributed nodes.

During the morning hours, when a surge in client activity is expected due to overlapping time zones, protocol prediction module 5810 analyzes historical transaction patterns and real-time usage data. Based on this analysis, it predicts that specific authentication protocols and fund transfer protocols will be heavily utilized. Pre-fetch coordination subsystem 6640, working in tandem with cache manager subsystem 6310, ensures that these protocols are pre-fetched and stored in local caches at regional hubs. Synchronization scheduling subsystem 6420 prioritizes the synchronization of these high-demand protocols across all relevant nodes using cache synchronization system 6400, ensuring consistent and rapid access for all client devices.

When a client initiates a secure login request, enhanced transaction manager 5800 sends the protocol request to cache manager subsystem 6310, which retrieves the required authentication protocol from the local cache. This cache-first retrieval minimizes latency, ensuring a smooth user experience. In cases where protocols are missing from the local cache, cache manager subsystem 6310 initiates a fallback request to protocol prediction module 5810, which dynamically generates or retrieves the required protocol. The newly fetched protocol is validated and added to the cache hierarchy for future use.

To optimize resource usage, cache compression subsystem 6370 applies codebook-based compression to reduce the storage footprint of frequently accessed protocols. Delta encoding is used to handle protocol updates efficiently, allowing minor changes, such as new security parameters, to be synchronized across nodes without transmitting full protocol definitions. As a result, the institution reduces bandwidth consumption while maintaining secure and accurate communication across its network.

Throughout the day, performance metrics subsystem 6340 monitors key indicators such as cache hit rates, resource utilization, and synchronization efficiency. Detected anomalies, such as increased latency in a particular region or resource contention at specific nodes, are flagged for analysis. Recovery management subsystem 6460 handles failure scenarios, such as a regional node experiencing downtime due to hardware issues, by initiating failover to redundant nodes and performing incremental synchronization to restore cache integrity.

Feedback subsystem 6540 shares performance data with protocol prediction module 5810 and cache manager subsystem 6310, enabling real-time adjustments to caching strategies and prediction models. For example, if the system detects that a fraud detection protocol is being accessed more frequently than anticipated, it dynamically adjusts eviction policies to retain this protocol in the local cache for faster access.

This use case highlights how system 6200 enables the financial institution to ensure secure, efficient, and reliable communication during high-demand periods. By dynamically optimizing protocol caching, synchronization, and recovery, the system reduces latency, maximizes resource efficiency, and enhances overall user satisfaction.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 43:
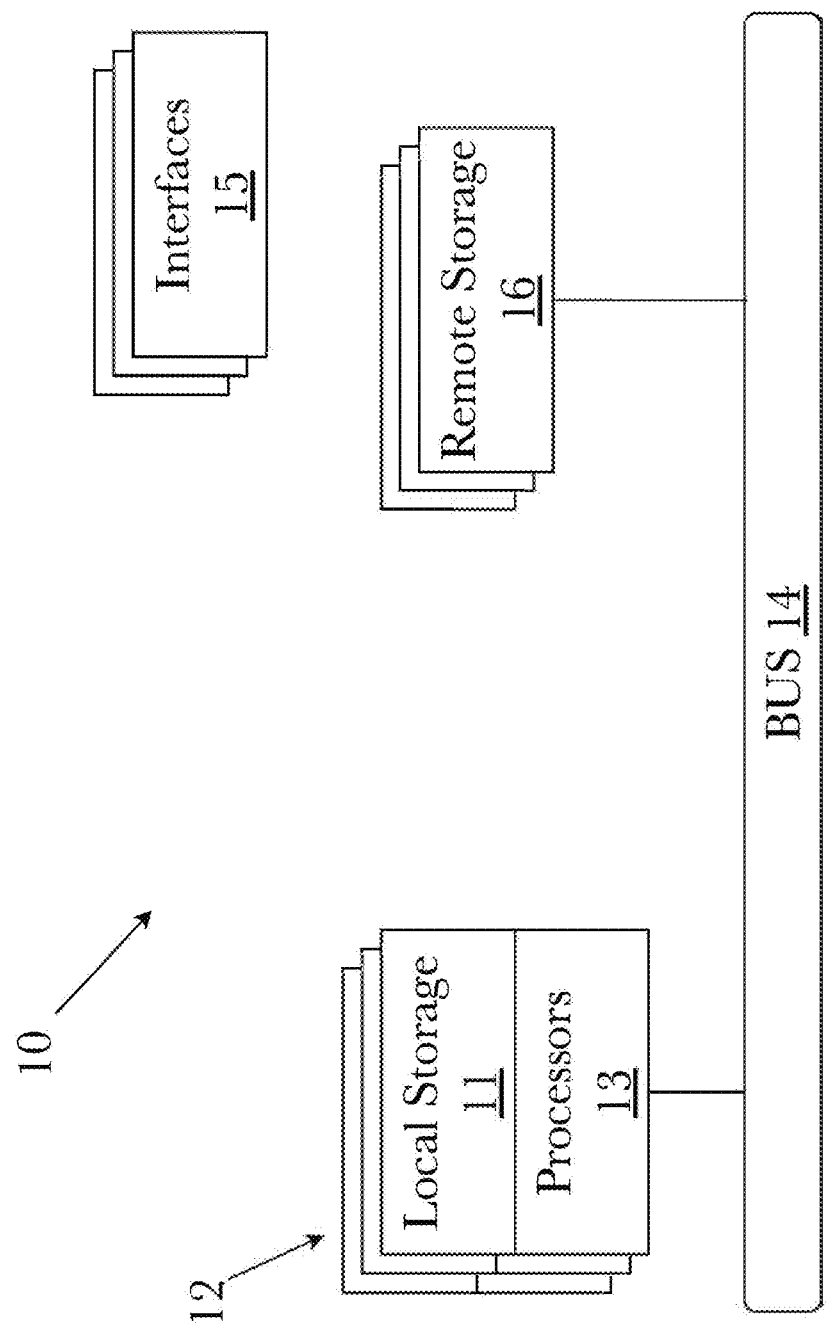
FIG. 43 is a block diagram illustrating an exemplary hardware architecture of a computing device.

Referring now to FIG. 43, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some aspects, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 43 illustrates one specific architecture for a computing device 10 for implementing one or more of the aspects described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, a single processor 13 handles communications as well as routing computations, while in other aspects a separate dedicated communications processor may be provided. In various aspects, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the aspects described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device aspects may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 44:
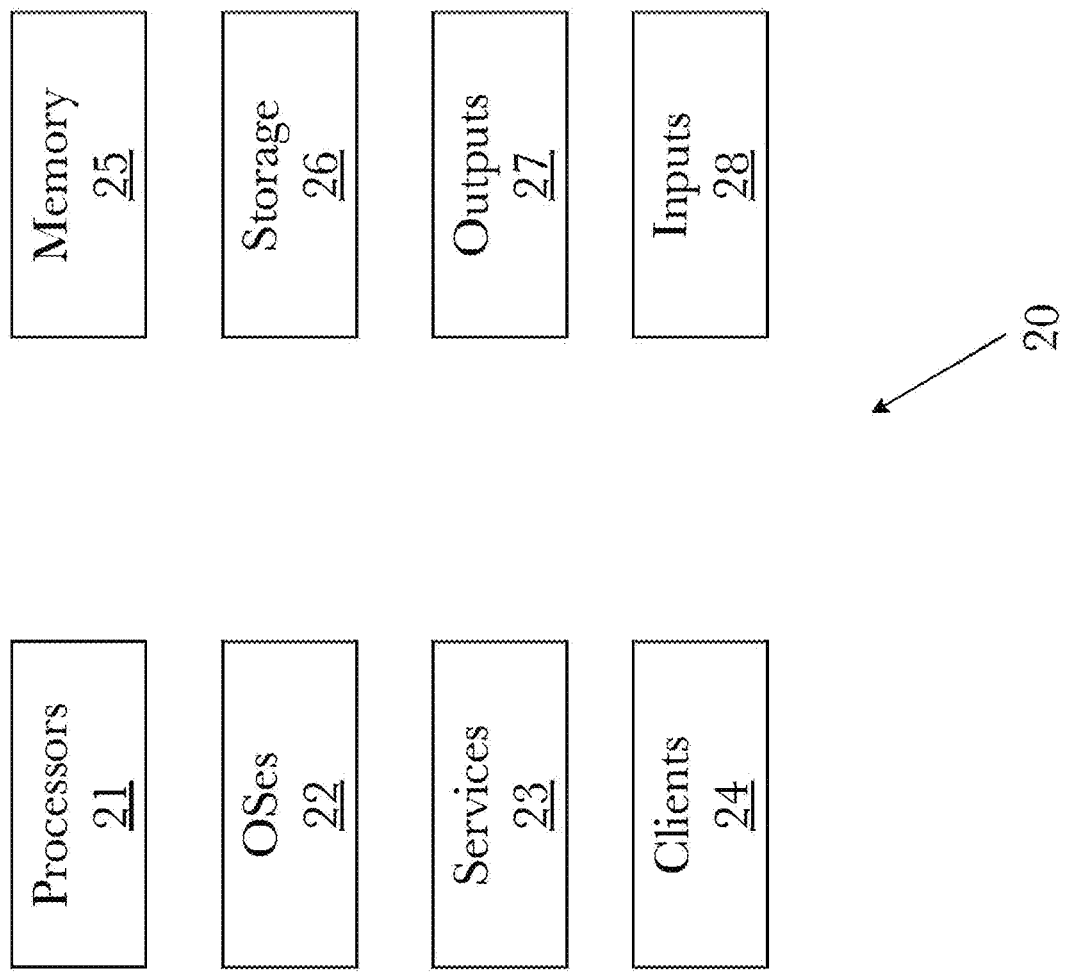
FIG. 44 is a block diagram illustrating an exemplary logical architecture for a client device.

In some aspects, systems may be implemented on a standalone computing system. Referring now to FIG. 44, there is shown a block diagram depicting a typical exemplary architecture of one or more aspects or components thereof on a standalone computing system. Computing device 20 includes processors 21 that may run software that carry out one or more functions or applications of aspects, such as for example a client application B4. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 43). Examples of storage devices 26 include flash memory, magnetic hard drive, CD-ROM, and/or the like.

Figure 45:
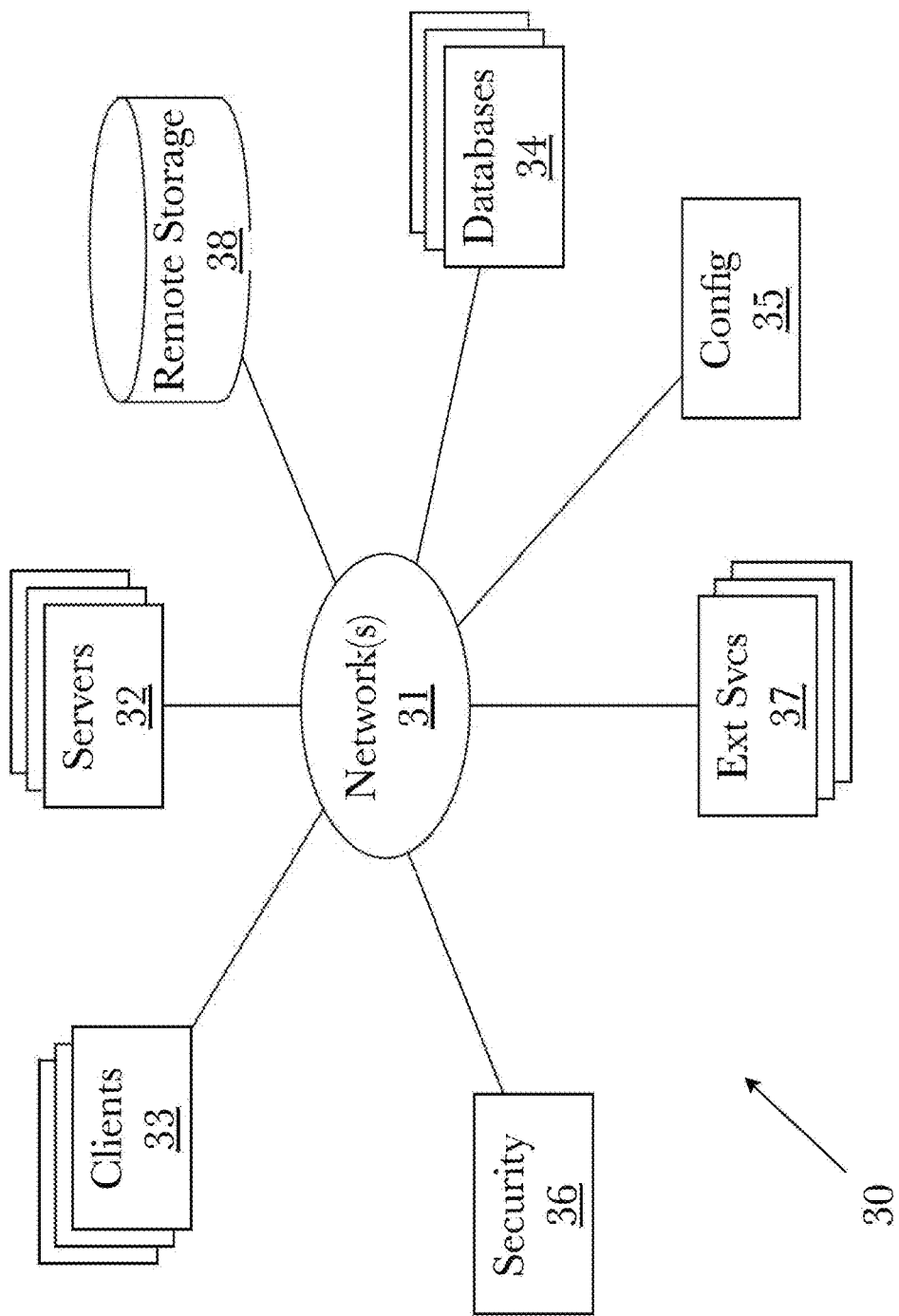
FIG. 45 is a block diagram showing an exemplary architectural arrangement of clients, servers, and external services.

In some aspects, systems may be implemented on a distributed computing network, such as one having any number of clients and/or servers. Referring now to FIG. 45, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 44. In addition, any number of servers 32 may be provided for handling requests received from one or more clients 33. Clients 33 and servers 32 may communicate with one another via one or more electronic networks 31, which may be in various aspects any of the Internet, a wide area network, a mobile telephony network (such as CDMA or GSM cellular networks), a wireless network (such as WiFi, WiMAX, LTE, and so forth), or a local area network (or indeed any network topology known in the art; the aspect does not prefer any one network topology over any other). Networks 31 may be implemented using any known network protocols, including for example wired and/or wireless protocols.

In addition, in some aspects, servers 32 may call external services 37 when needed to obtain additional information, or to refer to additional data concerning a particular call. Communications with external services 37 may take place, for example, via one or more networks 31. In various aspects, external services 37 may comprise web-enabled services or functionality related to or installed on the hardware device itself. For example, in one aspect where client applications 24 are implemented on a smartphone or other electronic device, client applications 24 may obtain information stored in a server system 32 in the cloud or on an external service 37 deployed on one or more of a particular enterprise's or user's premises. In addition to local storage on servers 32, remote storage 38 may be accessible through the network(s) 31.

In some aspects, clients 33 or servers 32 (or both) may make use of one or more specialized services or appliances that may be deployed locally or remotely across one or more networks 31. For example, one or more databases 34 in either local or remote storage 38 may be used or referred to by one or more aspects. It should be understood by one having ordinary skill in the art that databases in storage 34 may be arranged in a wide variety of architectures and using a wide variety of data access and manipulation means. For example, in various aspects one or more databases in storage 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some aspects, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some aspects may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with aspects without limitation, unless a specific security 36 or configuration system 35 or approach is specifically required by the description of any specific aspect.

Figure 46:
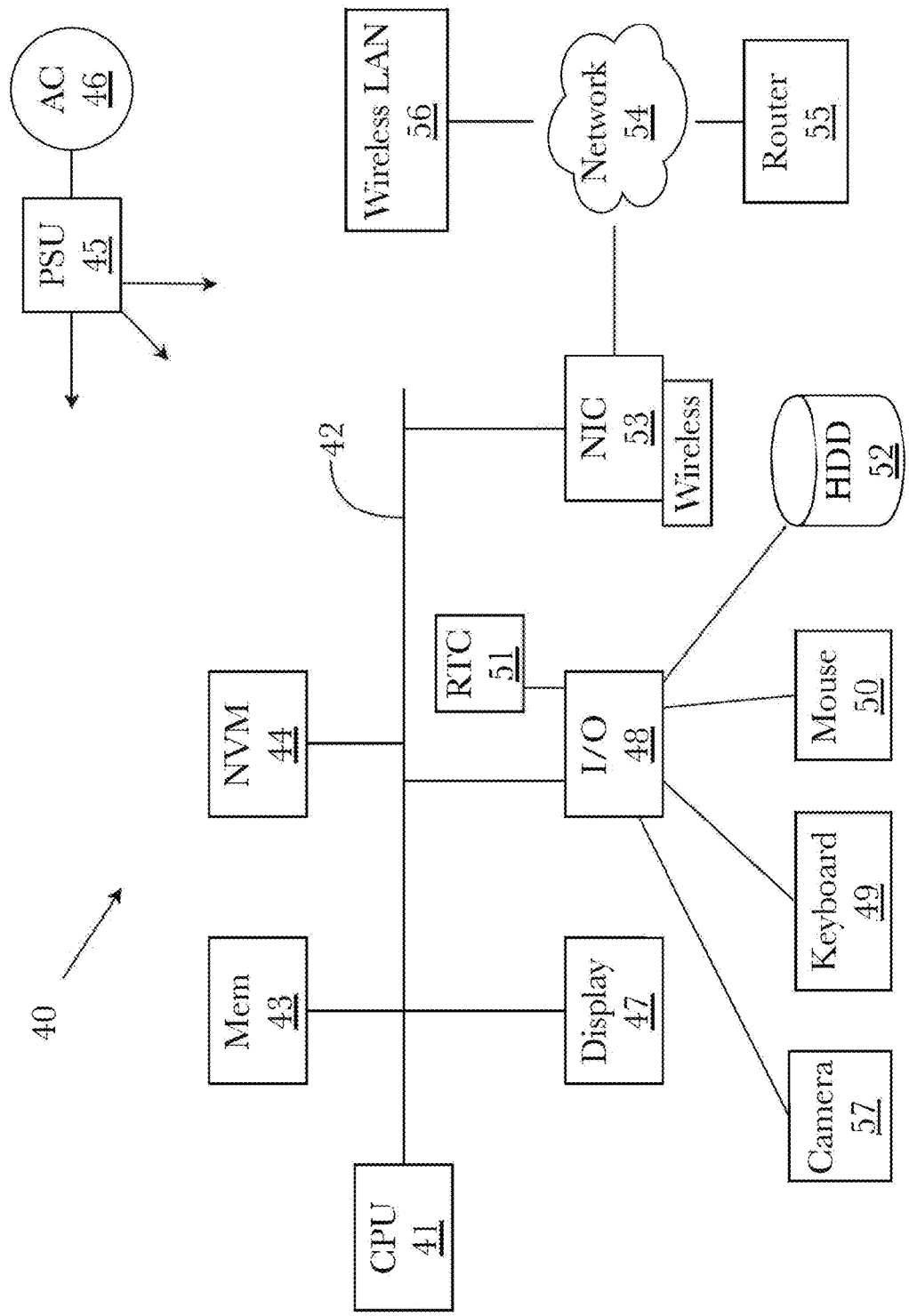
FIG. 46 is another block diagram illustrating an exemplary hardware architecture of a computing device.

FIG. 46 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to peripherals such as a keyboard 49, pointing device 50, hard disk 52, real-time clock 51, a camera 57, and other peripheral devices. NIC 53 connects to network 54, which may be the Internet or a local network, which local network may or may not have connections to the Internet. The system may be connected to other computing devices through the network via a router 55, wireless local area network 56, or any other network connection. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various aspects, functionality for implementing systems or methods of various aspects may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various aspects described above. Accordingly, the present invention is defined by the claims and their equivalents.

What is claimed is:

1. A computer system comprising a hardware memory, wherein the computer system is configured to execute software instructions stored on nontransitory machine-readable storage media that:
   receive requests for propagation information;
   generate protocol descriptors;
   encapsulate the protocol descriptors into packets;
   transmit the packets between applications;
   decode received protocol descriptors;
   process communication protocols based on the decoded protocol descriptors;
   analyze network traffic;
   predict communication needs based on historical patterns and current network context;
   determine protocol optimization opportunities;
   update protocol descriptors when optimization is beneficial;
   translate between protocols when required for communication; and
   facilitate communication using optimized protocols.

2. The computer system of claim 1, wherein the computer system maintains a multi-level protocol cache structure comprising local, regional, and global cache levels.

3. The computer system of claim 2, wherein the computer system monitors cache performance metrics comprising protocol cache hit rates and protocol negotiation latency and generates alerts when the performance metrics deviate from predetermined thresholds.

4. The computer system of claim 2, wherein the computer system synchronizes the cache contents across distributed nodes using a Merkle tree structure.

5. The computer system of claim 4, wherein the computer system performs incremental updates to minimize network bandwidth usage.

6. The computer system of claim 2, wherein the computer system implements cache eviction policies based on protocol usage frequency and resource constraints.

7. The computer system of claim 1, wherein facilitating communication comprises interfacing with a transaction manager and coordinating with a protocol predictor.

8. The computer system of claim 1, wherein predicting communication needs comprises analyzing historical usage patterns and current network conditions to determine future protocol requirements.

9. The computer system of claim 1, wherein the computer system compresses protocol descriptors using codebooks and implements delta compression between similar protocols.

10. A method comprising:
receiving requests for propagation information;
generating protocol descriptors;
encapsulating the protocol descriptors into packets;
transmitting the packets between applications;
decoding received protocol descriptors;
processing communication protocols based on the decoded protocol descriptors;
analyzing network traffic;
predicting communication needs based on historical patterns and current network context;
determining protocol optimization opportunities;
updating protocol descriptors when optimization is beneficial;
translating between protocols when required for communication; and
facilitating communication using optimized protocols.

11. The method of claim 10, wherein the method maintains a multi-level protocol cache structure comprising local, regional, and global cache levels.

12. The method of claim 11, wherein the method monitors cache performance metrics comprising protocol cache hit rates and protocol negotiation latency and generates alerts when the performance metrics deviate from predetermined thresholds.

13. The method of claim 11, wherein the method synchronizes the cache contents across distributed nodes using a Merkle tree structure.

14. The method of claim 13, wherein the method performs incremental updates to minimize network bandwidth usage.

15. The method of claim 11, wherein the method implements cache eviction policies based on protocol usage frequency and resource constraints.

16. The method of claim 10, wherein facilitating communication comprises interfacing with a transaction manager and coordinating with a protocol predictor.

17. The method of claim 10, wherein predicting communication needs comprises analyzing historical usage patterns and current network conditions to determine future protocol requirements.

18. The method of claim 10, wherein the method compresses protocol descriptors using codebooks and implements delta compression between similar protocols.

* * * * *